US010642139B2

(12) United States Patent
Pousthomis et al.

(10) Patent No.: US 10,642,139 B2
(45) Date of Patent: May 5, 2020

(54) ILLUMINATION SOURCE COMPRISING NANOPLATELETS AND DISPLAY APPARATUS HAVING THE SAME

(71) Applicant: NEXDOT, Romainville (FR)

(72) Inventors: Marc Pousthomis, Deuil-La-Barre (FR); Michele D'Amico, Romainville (FR); Yu-Pu Lin, Versailles (FR)

(73) Assignee: NEXDOT, Romainville (FR)

( * ) Notice: Subject to any disclaimer, the term of this patent is extended or adjusted under 35 U.S.C. 154(b) by 0 days.

(21) Appl. No.: 15/995,447

(22) Filed: Jun. 1, 2018

(65) Prior Publication Data

US 2019/0004369 A1 Jan. 3, 2019

Related U.S. Application Data

(60) Provisional application No. 62/514,422, filed on Jun. 2, 2017, provisional application No. 62/514,297, filed (Continued)

(30) Foreign Application Priority Data

Sep. 22, 2017 (EP) .................................... 17306241
Sep. 22, 2017 (EP) .................................... 17306246

(Continued)

(51) Int. Cl.
*H01L 25/075* (2006.01)
*G02F 1/1335* (2006.01)

(Continued)

(52) U.S. Cl.
CPC .......... *G03B 21/204* (2013.01); *C09K 11/025* (2013.01); *C09K 11/06* (2013.01);

(Continued)

(58) Field of Classification Search
CPC ..... G03B 21/204; G03B 21/008; H01L 33/50; H01L 25/0753; H01L 33/505;

(Continued)

(56) References Cited

U.S. PATENT DOCUMENTS

2006/0255711 A1 11/2006 Dejima et al.
2011/0068321 A1 3/2011 Pickett et al.

(Continued)

FOREIGN PATENT DOCUMENTS

EP 3 072 940 9/2016
JP 2014-175498 9/2014

(Continued)

OTHER PUBLICATIONS

Search report wo2018220161 (Year: 2018).*

*Primary Examiner* — Tracie Y Green
(74) *Attorney, Agent, or Firm* — Young & Thompson

(57) ABSTRACT

Disclosed is a color conversion layer including at least one light emitting material including at least one composite particle surrounded partially or totally by at least one surrounding medium; wherein the light emitting material is configured to emit light in response to an excitation and the at least one composite particle includes a plurality of nanoparticles encapsulated in an inorganic material; and wherein the inorganic material has a difference of refractive index compared to the at least one surrounding medium superior or equal to 0.02 at 450 nm. Also disclosed is an illumination source and a display apparatus.

18 Claims, 14 Drawing Sheets

Related U.S. Application Data on Jun. 2, 2017, provisional application No. 62/609,932, filed on Dec. 22, 2017, provisional application No. 62/710,298, filed on Feb. 16, 2018, provisional application No. 62/642,370, filed on Mar. 13, 2018.

(30) Foreign Application Priority Data

| | | |
|---|---|---|
| Sep. 22, 2017 | (EP) | 17306247 |
| Sep. 22, 2017 | (EP) | 17306248 |
| Dec. 11, 2017 | (EP) | 17206479 |

(51) Int. Cl.

| | |
|---|---|
| ***H01L 33/50*** | (2010.01) |
| ***F21V 8/00*** | (2006.01) |
| ***G03B 21/20*** | (2006.01) |
| ***H01L 27/32*** | (2006.01) |
| ***H01L 51/52*** | (2006.01) |
| ***G02F 1/13357*** | (2006.01) |
| ***C09K 11/02*** | (2006.01) |
| ***C09K 11/06*** | (2006.01) |
| ***C09K 11/56*** | (2006.01) |
| ***C09K 11/70*** | (2006.01) |
| ***C09K 11/88*** | (2006.01) |
| ***G03B 21/00*** | (2006.01) |
| *B82Y 20/00* | (2011.01) |

(52) U.S. Cl.

CPC .......... *C09K 11/565* (2013.01); *C09K 11/703* (2013.01); *C09K 11/883* (2013.01); *G02B 6/0026* (2013.01); *G02F 1/133504* (2013.01); *G02F 1/133514* (2013.01); *G02F 1/133603* (2013.01); *G02F 1/133605* (2013.01); *G02F 1/133617* (2013.01); *G03B 21/008* (2013.01); *H01L 25/0753* (2013.01); *H01L 27/322* (2013.01); *H01L 33/50* (2013.01); *H01L 33/501* (2013.01); *H01L 33/502* (2013.01); *H01L 33/505* (2013.01); *H01L 51/5284* (2013.01); *B82Y 20/00* (2013.01); *C09K 2211/10* (2013.01); *G02F 2001/133614* (2013.01); *G02F 2201/501* (2013.01); *G02F 2202/10* (2013.01); *H01L 2251/5369* (2013.01)

(58) Field of Classification Search

CPC . H01L 33/502; H01L 33/501; H01L 51/5284; H01L 27/322; H01L 2251/5369; G02F 1/133605; G02F 1/133504; G02F 1/133617; G02F 1/133514; G02F 1/133603; G02F 2001/133614; G02F 2201/501; G02F 2202/10; G02B 6/0026; C09K 11/703; C09K 11/025; C09K 11/06; C09K 11/883; C09K 11/565; C09K 2211/10; B82Y 20/00

See application file for complete search history.

(56) References Cited

U.S. PATENT DOCUMENTS

| | | | | |
|---|---|---|---|---|
| 2015/0285444 | A1 | 10/2015 | Choi et al. | |
| 2017/0066963 | A1 | 3/2017 | Nick | |
| 2017/0317246 | A1* | 11/2017 | Kang | C08G 75/045 |
| 2018/0106813 | A1 | 4/2018 | Heuclin et al. | |
| 2018/0348577 | A1* | 12/2018 | Pousthomis | |
| 2019/0002719 | A1* | 1/2019 | Pousthomis | B01J 13/043 |
| 2019/0004407 | A1* | 1/2019 | Pousthomis | |

FOREIGN PATENT DOCUMENTS

| | | |
|---|---|---|
| WO | WO 2013/140083 | 9/2013 |
| WO | WO 2015/077372 | 5/2015 |

* cited by examiner

ILLUMINATION SOURCE COMPRISING NANOPLATELETS AND DISPLAY APPARATUS HAVING THE SAME

FIELD OF INVENTION

This invention relates to a color conversion layer using luminescent composite particles for realizing high efficiency, a display device and a lighting device having the same.

BACKGROUND OF INVENTION

Luminescent or backlit displays such as LCD screens are widely used in various devices such as computers, mobile phones and television sets. Liquid Crystal Displays (LCD) are multi-layered systems comprising: a color filter layer, a liquid crystal layer and a backlight unit. The backlight unit is configured to produce a primary light which is guided towards the liquid crystal layer, while said liquid crystal layer is configured to modulate the transmission of light towards the color filters layer. Conventional color filters generally comprise an array of color filters, while each color filter form a sub-pixel and allow transmitting a defined range of wavelengths of the light and absorbing the other wavelengths of the light. A combination of color filters of different wavelength ranges generally forms a pixel from which a polychromatic light can be obtained. When colored lights are obtained from an array of pixels, an image can be viewed by the viewer.

In LCD displayer for example, the backlight unit comprises light sources configured to emit primary light and a polarizer configured to polarize said primary light. The backlight unit is configured to provide said polarized light to the liquid crystal layer, the color filter layer and the second polarizer. As said polarized light pass through the liquid crystal layer and the color filter layer, only the selected protion of the primary light will be transmitted through the second polarizer, such that an image can be viewed by the viewer.

The backlight unit is provided with multiple light sources. With the development of technologies, light-emitting diodes (LEDs) have started to be used for the backlight unit, which replace cold cathode fluorescent lamps (CCFLs). The LED has many advantages, as compared with the CCFL, in view of less power consumption, an extended lifespan, and a facilitated fabrication in a small size.

Furthermore, the color filter should be illuminated by a light with narrow luminescence spectra to increase the color purity and decrease the loss of energy. This will result in highly saturated shades with vivid, intense colors, while less saturated shades appear rather bland and gray.

We know from the prior art an illumination source comprising a light source coupled to a layer of phosphors. However, those phosphors have a rather large full width half maximum, typically larger than 70 nm. This results in poor color purity, leading to non-saturated colors and energy loss in the final display and lighting devices.

We also know an illumination source comprising a light source coupled to a color conversion layer, wherein the conversion layer comprises quantum dots. Indeed, quantum dots are currently used in display devices like phosphors. Quantum dots have a narrow fluorescence spectrum, approximately 30 nm full width at half maximum, and offer the possibility to emit in the entire visible spectrum as well as in the infrared with a single excitation source in the ultraviolet.

However, there is a real need for materials having a high stability for long term use when deposited on diodes, or LED, i.e. having a high stability in time and in temperature under a high photon flux. Indeed, when used on LED, nanoparticles must resist to temperatures higher than 100° C. and constant high-intensity illumination.

To ensure a high longterm stability, further chemical reaction between the surface of nanoparticles and environmental deteriorating species, such as water, oxygen or other harmful compounds, must be prevented during their use. However, the ligands commonly used to functionalize the surface of quantum dots do not protect efficiently said surface against reactions with deteriorating species or harmful compounds and thus do not enable the long-term performance required for display or lighting devices.

It is therefore an object of the present invention to provide an illumination source comprising a light source coupled to a color conversion layer comprising composite particles. Said composite particles comprise a plurality of nanoparticles, especially fluorescent nanoparticles, encapsulated in an inorganic material. The inorganic material forms a protective shell: i) to prevent degradation due to deteriorating species, harmful compounds or high temperature; ii) to drain away the heat and the electrical charges originating from the inorganic nanoparticles and the LED. Furthermore, composite particles can act as scatterers so that resulting light can be emitted in all directions. This illumination source will provide an intense resulting light comprising narrow fluorescence spectra as an alternative to the use of quantum dots.

SUMMARY

The present invention relates to a color conversion layer comprising at least one light emitting material comprising at least one composite particle surrounded partially or totally by at least one surrounding medium; wherein said light emitting material is configured to emit a secondary light in response to an excitation and the at least one composite particle comprises a plurality of nanoparticles encapsulated in an inorganic material; and wherein said inorganic material has a difference of refractive index compared to the at least one surrounding medium superior or equal to 0.02 at 450 nm.

According to one embodiment, the inorganic material limits or prevents the diffusion of outer molecular species or fluids (liquid or gas) into said inorganic material.

According to one embodiment, the at least one composite particle in the at least one surrounding medium is configured to scatter light.

According to one embodiment, the nanoparticles comprised in the at least one composite particle are semiconductor nanocrystals comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystals comprise at least one shell comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystals are semiconductor nanoplatelets.

According to one embodiment, the at least one surrounding medium is optically transparent.

According to one embodiment, the at least one surrounding medium has a thermal conductivity at standard conditions of at least 0.1 W/(m·K).

The invention further relates to an illumination source comprising at least one light source and at least one color conversion layer according to the invention.

According to one embodiment, the illumination source further comprises a light guide, wherein the at least one color conversion layer is located between the light source and said light guide.

According to one embodiment, the illumination source further comprises a reflector configured to reflect the light from the light source and/or from the at least one color conversion layer.

According to one embodiment, the light source comprises at least one light-emitting diode (LED) or an array of LEDs.

The invention further relates to a display apparatus comprising the illumination source according to the present invention.

According to one embodiment, said display apparatus further comprises at least one color filter.

According to one embodiment, the display apparatus comprises at least one layer of activation between the illumination source and the at least one color filter.

DEFINITIONS

In the present invention, the following terms have the following meanings:

- "Array" refers to a series, a matrix, an assemblage, an organization, a succession, a collection or an arrangement of elements or items, wherein said elements or items are arranged in a particular way.
- "Backlight unit" refers to a unit comprising at least one light source configured to emit primary light and a polarizer configured to polarize said primary light. Said "backlight unit" is configured to provide said polarized light to the liquid crystal layer, the color filter layer and the second polarizer. As said polarized light pass through the liquid crystal layer and the color filter layer, only the selected protion of the primary light will be transmitted through the second polarizer, such that an image can be viewed by the viewer. Said "backlight unit" is preferably located to the back of a LCD Panel, before the liquid crystal layer.
- "Core" refers to the innermost space within a particle.
- "Shell" refers to at least one monolayer of material coating partially or totally a core.
- "Encapsulate" refers to a material that coats, surrounds, embeds, contains, comprises, wraps, packs, or encloses a plurality of nanoparticles.
- "Uniformly dispersed" refers to particles that are not aggregated, do not touch, are not in contact, and are separated by an inorganic material. Each nanoparticle is spaced from their adjacent nanoparticles by an average minimal distance.
- "Colloidal" refers to a substance in which particles are diserpsed, suspended and do not settle or would take a very long time to settle appreciably, but are not soluble in said substance.
- "Colloidal particles" refers to particles that may be dispersed, suspended and which would not settle or would take a very long time to settle appreciably in another substance, typically in an aqueous or organic solvent, and which are not soluble in said substance. "Colloidal particles" does not refer to particles grown on substrate.
- "Impermeable" refers to a material that limits or prevents the diffusion of outer molecular species or fluids (liquid or gas) into said material.
- "Permeable" refers to a material that allows the diffusion of outer molecular species or fluids (liquid or gas) into said material.
- "Outer molecular species or fluids (liquid or gas)" refers to molecular species or fluids (liquid or gas) coming from outside a material or a particle.
- "Adjacent nanoparticle" refers to neighbouring nanoparticles in a space or a volume, without any other nanoparticle between said adjacent nanoparticles.
- "Packing fraction" refers to the volume ratio between the volume filled by an ensemble of objects into a space and the volume of said space. The terms packing fraction, packing density and packing factor are interchangeable in the present invention.
- "Loading charge" refers to the mass ratio between the mass of an ensemble of objects comprised in a space and the mass of said space.
- "Population of particles" refers to a statistical set of particles having the same maximum emission wavelength.
- "Statistical set" refers to a collection of at least 2, 3, 4, 5, 6, 7, 8, 9, 10, 11, 12, 13, 14, 15, 16, 17, 18, 19, 20, 30, 40, 50, 60, 70, 80, 90, 100, 150, 200, 250, 300, 350, 400, 450, 500, 550, 600, 650, 700, 750, 800, 850, 900, 950, or 1000 objects obtained by the strict same process. Such statistical set of objects allows determining average characteristics of said objects, for example their average size, their average size distribution or the average distance between them.
- "Surfactant-free" refers to a particle that does not comprise any surfactant and was not synthesized by a method comprising the use of surfactants.
- "Optically transparent" refers to a material that absorbs less than 10%, 5%, 2.5%, 1%, 0.99%, 0.98%, 0.97%, 0.96%, 0.95%, 0.94%, 0.93%, 0.92%, 0.91%, 0.9%, 0.89%, 0.88%, 0.87%, 0.86%, 0.85%, 0.84%, 0.83%, 0.82%, 0.81%, 0.8%, 0.79%, 0.78%, 0.77%, 0.76%, 0.75%, 0.74%, 0.73%, 0.72%, 0.71%, 0.7%, 0.69%, 0.68%, 0.67%, 0.66%, 0.65%, 0.64%, 0.63%, 0.62%, 0.61%, 0.6%, 0.59%, 0.58%, 0.57%, 0.56%, 0.55%, 0.54%, 0.53%, 0.52%, 0.51%, 0.5%, 0.49%, 0.48%, 0.47%, 0.46%, 0.45%, 0.44%, 0.43%, 0.42%, 0.41%, 0.4%, 0.39%, 0.38%, 0.37%, 0.36%, 0.35%, 0.34%, 0.33%, 0.32%, 0.31%, 0.3%, 0.29%, 0.28%, 0.27%, 0.26%, 0.25%, 0.24%, 0.23%, 0.22%, 0.21%, 0.2%, 0.19%, 0.18%, 0.17%, 0.16%, 0.15%, 0.14%, 0.13%, 0.12%, 0.11%, 0.1%, 0.09%, 0.08%, 0.07%, 0.06%, 0.05%, 0.04%, 0.03%, 0.02%, 0.01%, 0.009%, 0.008%, 0.007%, 0.006%, 0.005%, 0.004%, 0.003%, 0.002%, 0.001%, 0.0009%, 0.0008%, 0.0007%, 0.0006%, 0.0005%, 0.0004%, 0.0003%, 0.0002%, 0.0001%, or 0% of light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

"Roughness" refers to a surface state of a particle. Surface irregularities can be present at the surface of particles and are defined as peaks or cavities depending on their relative position respect to the average particle surface. All said irregularities constitute the particle roughness. Said roughness is defined as the height difference between the highest peak and the deepest cavity on the surface. The surface of a particle is smooth if they are no irregularities on said surface, i.e. the roughness is equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said particle.

"Polydisperse" refers to particles or droplets of varied sizes, wherein the size difference is superior or equal to 20%.

"Monodisperse" refers to particles or droplets, wherein the size difference is inferior than 20%, 15%, 10%, preferably 5%.

"Narrow size distribution" refers to a size distribution of a statistical set of particles less than 1%, 2%, 3%, 4%, 5%, 6%, 7%, 8%, 9%, 10%, 15%, 20%, 25%, 30%, 35%, or 40% of the average size.

"Partially" means incomplete. In the case of a ligand exchange, partially means that 5%, 10%, 15%, 20%, 25%, 30%, 35%, 40%, 45%, 50%, 55%, 60%, 65%, 70%, 75%, 80%, 85%, 90%, 95% of the ligands at the surface of a particle have been successfully exchanged.

The terms "Film", "Layer" or "Sheet" are interchangeable in the present invention.

"Nanoplatelet" refers to a 2D shaped nanoparticle, wherein the smallest dimension of said nanoplatelet is smaller than the largest dimension of said nanoplatelet by a factor (aspect ratio) of at least 1.5, at least 2, at least 2.5, at least 3, at least 3.5, at least 4, at least 4.5, at least 5, at least 5.5, at least 6, at least 6.5, at least 7, at least 7.5, at least 8, at least 8.5, at least 9, at least 9.5 or at least 10.

"Free of oxygen" refers to a formulation, a solution, a film, or a composition that is free of molecular oxygen, $O_2$, i.e. wherein molecular oxygen may be present in said formulation, solution, film, or composition in an amount of less than about 10 ppm, 5 ppm, 4 ppm, 3 ppm, 2 ppm, 1 ppm, 500 ppb, 300 ppb or in an amount of less than about 100 ppb in weight.

"Free of water" refers to a formulation, a solution, a film, or a composition that is free of molecular water, $H_2O$, i.e. wherein molecular water may be present in said formulation, solution, film, or composition in an amount of less than about 100 ppm, 50 ppm, 10 ppm, 5 ppm, 4 ppm, 3 ppm, 2 ppm, 1 ppm, 500 ppb, 300 ppb or in an amount of less than about 100 ppb in weight.

"Pixel pitch" refers to the distance from the center of a pixel to the center of the next pixel.

"Sub-pixel pitch" refers to the distance from the center of a sub-pixel to the center of the next sub-pixel.

"Curvature" refers to the reciprocal of the radius.

"ROHS compliant" refers to a material compliant with Directive 2011/65/EU of the European Parliament and of the Council of 8 Jun. 2011 on the restriction of the use of certain hazardous substances in electrical and electronic equipment.

"Aqueous solvent" is defined as a unique-phase solvent wherein water is the main chemical species in terms of molar ratio and/or in terms of mass and/or in terms of volume in respect to the other chemical species contained in said aqueous solvent. The aqueous solvent includes but is not limited to: water, water mixed with an organic solvent miscible with water such as for example methanol, ethanol, acetone, tetrahydrofuran, n-methylformamide, n,n-dimethylformamide, dimethylsulfoxide or a mixture thereof.

"Vapor" refers to a substance in a gaseous state, while said substance is in a liquid or a solid state in standard conditions of pressure and temperature.

"Gas" refers to a substance in a gaseous state in standard conditions of pressure and temperature.

"Standard conditions" refers to the standard conditions of temperature and pressure, i.e. 273.15 K and $10^5$ Pa respectively.

"Display apparatus" refers to an apparatus or a device that displays an image signal. Display devices or display apparatus include all devices that display an image, a succession of pictures or a video such as, non-limitatively, a LCD display, a television, a projector, a computer monitor, a personal digital assistant, a mobile phone, a laptop computer, a tablet PC, an MP3 player, a CD player, a DVD player, a Blu-Ray player, a head mounted display, glasses, a helmet, a headgear, a headwear, a smart watch, a watch phone or a smart device.

"Primary light" refers to the light supplied by a light source. For example, primary light refers to the light supplied to the light emitting material by the light source.

"Secondary light" refers to the light emitted by a material in response to an excitation. Said excitation is generally provided by the light source, i.e. the excitation is the primary light. For example, secondary light refers to the light emitted by the composite particles, the light emitting material or the color conversion layer in response to an excitation of the nanoparticles comprised in said composite particles.

"Resulting light" refers to the light supplied by a material after excitation by a primary light and emission of a secondary light. For example, resulting light refers to the light supplied by by the composite particles, the light emitting material or the color conversion layer and is a combination of a part of the primary light and the secondary light.

"Surrounding medium" refers to the medium in which the composite particles of the present invention are dispersed, or the medium which surrounds partially or totally said composite particles. It may be a fluid (liquid, gas) or a solid host material.

DETAILED DESCRIPTION

The following detailed description will be better understood when read in conjunction with the drawings. For the purpose of illustrating, the color conversion layer, the display apparatus and the composite particle are shown in the preferred embodiments. It should be understood, however that the application is not limited to the precise arrangements, structures, features, embodiments, and aspect shown. The drawings are not drawn to scale and are not intended to limit the scope of the claims to the embodiments depicted. Accordingly it should be understood that where features mentioned in the appended claims are followed by reference signs, such signs are included solely for the purpose of enhancing the intelligibility of the claims and are in no way limiting on the scope of the claims.

In a first aspect, illustrated in FIG. 7A-B, the invention relates to a color conversion layer 4, which could be used to replace a color filter for a display apparatus or to be used in addition of a color filter for a display apparatus. The color conversion layer 4 comprises at least one light emitting material 7 comprising at least one composite particle 1 surrounded partially or totally by at least one surrounding medium 71. Said at least one light emitting material 7 is configured to emit a secondary light in response to excitation, especially to excitation from a light source. The at least one composite particle 1 comprises a plurality of nanoparticles 3 encapsulated in an inorganic material 2. Said inorganic material 2 has a difference of refractive index compared to the at least one surrounding medium 71 superior or equal to 0.02.

In one embodiment, the at least one composite particle 1 has a difference of refractive index compared to the at least one surrounding medium 71 superior or equal to 0.02.

The difference of refractive index was measured at 450 nm.

When primary light from a light source goes through the at least one surrounding medium 71 and meets at least one composite particle 1, said primary light may be divided. A first portion of this primary light may be transmitted through said composite particle 1. A second portion of this primary light may be absorbed by the nanoparticles 3. A third portion of this primary light may be scattered and/or reflected at the boundary between the at least one surrounding medium 71 and the composite particle 1 and then may meet another composite particle 1.

Efficiency of the light emitting material 7 is associated directly with unit cost, performance and size product. Only the use of the light emitting material 7 with high fluorescence efficiency may result in reduced unit cost of the product and in reduced quantity of fluorophores in display devices. The light emitting material 7 having a high efficiency refers to sufficient intense secondary light by using a small number of nanoparticles 3.

The inorganic material 2 has a difference of refractive index compared to the at least one surrounding medium 71, meaning that the at least one composite particle 1 embedded in the at least one surrounding medium 71 is able to scatter light. It is then possible to: i) decrease the amount of nanoparticles 3 for the same geometry and dimensions of filters compared to color filters or color converters with bare nanoparticles; ii) decrease the dimensions of the color filter or color converter while retaining the same concentration of nanoparticles 3 as in color filters or color converter layers compared to bare nanoparticles. In both cases, the amount of nanoparticles 3 required decreases and therefore the cost of the final product decreases.

The composite particle 1 may also limit or prevent the oxidation of the nanoparticles 3; allow to control the distance between said nanoparticles 3 encapsulated in the inorganic material 2; allow to drain away the heat and the electrical charges originating from the inorganic nanoparticles 3 encapsulated in the inorganic material 2 or from the at least one surrounding medium; increase the emission light angle of the secondary light; improve light emission efficiency through the light emitting material 7 or the color conversion layer 4; and increase the color purity by decreasing the full-width at half maximum of light transmitted compared to the color filters or color converters known in the prior art. Also, the concentration of the composite particle 1 needed in the final product may be decreased. Accordingly, the employment of the composite particle 1 may result in an enhancement of the efficiency of the color conversion layer 4 compared to conventional color conversion layers in terms of optical performances and resistance against oxidative environment.

Composite particles 1 of the invention are also particularly interesting as they can easily comply with ROHS requirements depending on the inorganic material 2 selected. It is then possible to have ROHS compliant particles while preserving the properties of nanoparticles 3 that may not be ROHS compliant themselves.

The light emitting material 7 allows the protection of the composite particle 1 from molecular oxygen, ozone, water and/or high temperature by the at least one surrounding medium 71. Therefore, deposition of a supplementary protective layer on top of said light emitting material 7 is not compulsory, which can save time, money and loss of luminescence.

According to one embodiment, the composite particle 1 is air processable. This embodiment is particularly advantageous for the manipulation or the transport of said composite particle 1 and for the use of said composite particle 1 in a device such as an optoelectronic device.

According to one embodiment, the composite particle 1 is compatible with standard lithography processes. This embodiment is particularly advantageous for the use of said composite particle 1 in a device such as an optoelectronic device.

According to one embodiment, the light emitting material 7 comprises at least one composite particle 1 surrounded by or embedded in at least one surrounding medium 71. Said at least one composite particle 1 is configured to emit a secondary light in response to excitation, and scatter primary light emitted from a light source if the refractive index between said composite particle 1 and said surrounding medium 71 is different.

According to one embodiment, in the composite particle 1, the plurality of nanoparticles 3 is uniformly dispersed in an inorganic material 2 (as illustrated in FIG. 1). The uniform dispersion of the plurality of nanoparticles 3 in the inorganic material 2 prevents the aggregation of said nanoparticles 3, thereby preventing the degradation of their properties. For example, in the case of inorganic fluorescent nanoparticles, a uniform dispersion will allow the optical properties of said nanoparticles to be preserved, and light quenching can be avoided.

According to one embodiment, the composite particle 1 has a largest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the composite particle 1 has a smallest dimension of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 82 m, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 250 µm, 300 µm, 350 µm, 400 µm, 450 µm, 500 µm, 550 µm, 600 µm, 650 µm, 700 µm, 750 µm, 800 µm, 850 µm, 900 µm, 950 µm, or 1 mm.

According to one embodiment, the size ratio between the composite particle 1 and the nanoparticles 3 ranges from 1.25 to 1 000, preferably from 2 to 500, more preferably from 5 to 250, even more preferably from 5 to 100.

According to one embodiment, the smallest dimension of the composite particle 1 is smaller than the largest dimension of said composite particle 1 by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the composite particles 1 have an average size of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

Composite particles 1 with an average size less than 1 μm have several advantages compared to bigger particles comprising the same number of nanoparticles 3: i) increasing the light scattering compared to bigger particles; ii) obtaining more stable colloidal suspensions compared to bigger particles, when they are dispersed in a solvent; iii) having a size compatible with pixels of at least 100 nm.

Composite particles 1 with an average size larger than 1 μm have several advantages compared to smaller particles comprising the same number of nanoparticles 3: i) reducing light scattering compared to smaller particles; ii) having whispering-gallery wave modes; iii) having a size compatible with pixels larger than or equal to 1 μm; iv) increasing the average distance between nanoparticles 3 comprised in said composite particles 1, resulting in a better heat draining; v) increasing the average distance between nanoparticles 3 comprised in said composite particles 1 and the surface of said composite particles 1, thus better protecting the nanoparticles 3 against oxidation, or delaying oxidation resulting from a chemical reaction with chemical species coming from the outer space of said composite particles 1; vi) increasing the mass ratio between composite particle 1 and nanoparticles 3 comprised in said composite particle 1 compared to smaller composite particles 1, thus reducing the mass concentration of chemical elements subject to ROHS standards, making it easier to comply with ROHS requirements.

According to one embodiment, the composite particle 1 is ROHS compliant.

According to one embodiment, the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the composite particle 1 comprises heavier chemical elements than the main chemical element present in the inorganic material 2. In this embodiement, said heavy chemical elements in the composite particle 1 will lower the mass concentration of chemical elements subject to ROHS standards, allowing said composite particle 1 to be ROHS compliant.

According to one embodiment, examples of heavy elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the composite particle 1 has a smallest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the composite particle 1 has a largest curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the composite particles 1 are polydisperse.

According to one embodiment, the composite particles 1 are monodisperse.

According to one embodiment, the composite particles 1 have a narrow size distribution.

According to one embodiment, the composite particles 1 are not aggregated.

According to one embodiment, the surface roughness of the composite particle 1 is less or equal to 0%, 0.0001%, 0.0002%, 0.0003%, 0.0004%, 0.0005%, 0.0006%, 0.0007%, 0.0008%, 0.0009%, 0.001%, 0.002%, 0.003%, 0.004%, 0.005%, 0.006%, 0.007%, 0.008%, 0.009%, 0.01%, 0.02%, 0.03%, 0.04%, 0.05%, 0.06%, 0.07%, 0.08%, 0.09%, 0.1%, 0.11%, 0.12%, 0.13%, 0.14%, 0.15%, 0.16%, 0.17%, 0.18%, 0.19%, 0.2%, 0.21%, 0.22%, 0.23%, 0.24%, 0.25%, 0.26%, 0.27%, 0.28%, 0.29%, 0.3%, 0.31%, 0.32%, 0.33%, 0.34%, 0.35%, 0.36%, 0.37%, 0.38%, 0.39%, 0.4%, 0.41%, 0.42%, 0.43%, 0.44%, 0.45%, 0.46%, 0.47%, 0.48%, 0.49%, 0.5%, 1%, 1.5%, 2%, 2.5% 3%, 3.5%, 4%, 4.5%, or 5% of the largest dimension of said composite particle 1, meaning that the surface of said composite particles 1 is completely smooth.

According to one embodiment, the surface roughness of the composite particle 1 is less or equal to 0.5% of the largest dimension of said composite particle 1, meaning that the surface of said composite particles 1 is completely smooth.

According to one embodiment, the composite particle 1 has a spherical shape, an ovoid shape, a discoidal shape, a cylindrical shape, a faceted shape, a hexagonal shape, a triangular shape, a cubic shape, or a platelet shape.

According to one embodiment, the composite particle 1 has a raspberry shape, a prism shape, a polyhedron shape, a snowflake shape, a flower shape, a thorn shape, a hemisphere shape, a cone shape, a urchin shape, a filamentous shape, a biconcave discoid shape, a worm shape, a tree shape, a dendrite shape, a necklace shape, a chain shape, or a bush shape.

According to one embodiment, the composite particle 1 has a spherical shape, or the composite particle 1 is a bead.

According to one embodiment, the composite particle 1 is hollow, i.e. the composite particle 1 is a hollow bead.

According to one embodiment, the composite particle 1 does not have a core/shell structure.

According to one embodiment, the composite particle 1 has a core/shell structure as described hereafter.

According to one embodiment, the composite particle 1 is not a fiber.

According to one embodiment, the composite particle 1 is not a matrix with undefined shape.

According to one embodiment, the composite particle 1 is not macroscopical piece of glass. In this embodiment, a piece of glass refers to glass obtained from a bigger glass entity for example by cutting it, or to glass obtained by using a mold. In one embodiment, a piece of glass has at least one dimension exceeding 1 mm.

According to one embodiment, the composite particle 1 is not obtained by reducing the size of the inorganic material 2. For example, composite particle 1 is not obtained by milling a piece of inorganic material 2, nor by cutting it, nor by firing it with projectiles like particles, atomes or electrons, or by any other method.

According to one embodiment, the composite particle 1 is not obtained by milling bigger particles or by spraying a powder.

According to one embodiment, the composite particle 1 is not a piece of nanometer pore glass doped with nanoparticles 3.

According to one embodiment, the composite particle 1 is not a glass monolith.

According to one embodiment, the composite particle 1 has a spherical shape. The spherical shape may permit to the light to circulate in the composite particle 1 without leaving said composite particle 1 such as to operate as a waveguide. The spherical shape may permit to the light to have whispering-gallery wave modes. Furthermore, a perfect spherical shape prevents fluctuations of the intensity of the scattered light.

According to one embodiment, the spherical composite particle 1 has a diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, a statistical set of spherical composite particles 1 has an average diameter of at least 5 nm, 10 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the average diameter of a statistical set of spherical composite particles 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 20%, 30%, 40%, 50%, 60%, 70%, 80%, 85%, 90%, 95%, 100%, 105%, 110%, 115%, 120%, 125%, 130%, 135%, 140%, 145%, 150%, 155%, 160%, 165%, 170%, 175%, 180%, 185%, 190%, 195%, or 200%.

According to one embodiment, the spherical composite particle 1 has a unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727

μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, a statistical set of the spherical composite particles 1 has an average unique curvature of at least 200 μm$^{-1}$, 100 μm$^{-1}$, 66.6 μm$^{-1}$, 50 μm$^{-1}$, 33.3 μm$^{-1}$, 28.6 μm$^{-1}$, 25 μm$^{-1}$, 20 μm$^{-1}$, 18.2 μm$^{-1}$, 16.7 μm$^{-1}$, 15.4 μm$^{-1}$, 14.3 μm$^{-1}$, 13.3 μm$^{-1}$, 12.5 μm$^{-1}$, 11.8 μm$^{-1}$, 11.1 μm$^{-1}$, 10.5 μm$^{-1}$, 10 μm$^{-1}$, 9.5 μm$^{-1}$, 9.1 μm$^{-1}$, 8.7 μm$^{-1}$, 8.3 μm$^{-1}$, 8 μm$^{-1}$, 7.7 μm$^{-1}$, 7.4 μm$^{-1}$, 7.1 μm$^{-1}$, 6.9 μm$^{-1}$, 6.7 μm$^{-1}$, 5.7 μm$^{-1}$, 5 μm$^{-1}$, 4.4 μm$^{-1}$, 4 μm$^{-1}$, 3.6 μm$^{-1}$, 3.3 μm$^{-1}$, 3.1 μm$^{-1}$, 2.9 μm$^{-1}$, 2.7 μm$^{-1}$, 2.5 μm$^{-1}$, 2.4 μm$^{-1}$, 2.2 μm$^{-1}$, 2.1 μm$^{-1}$, 2 μm$^{-1}$, 1.3333 μm$^{-1}$, 0.8 μm$^{-1}$, 0.6666 μm$^{-1}$, 0.5714 μm$^{-1}$, 0.5 μm$^{-1}$, 0.4444 μm$^{-1}$, 0.4 μm$^{-1}$, 0.3636 μm$^{-1}$, 0.3333 μm$^{-1}$, 0.3080 μm$^{-1}$, 0.2857 μm$^{-1}$, 0.2667 μm$^{-1}$, 0.25 μm$^{-1}$, 0.2353 μm$^{-1}$, 0.2222 μm$^{-1}$, 0.2105 μm$^{-1}$, 0.2 μm$^{-1}$, 0.1905 μm$^{-1}$, 0.1818 μm$^{-1}$, 0.1739 μm$^{-1}$, 0.1667 μm$^{-1}$, 0.16 μm$^{-1}$, 0.1538 μm$^{-1}$, 0.1481 μm$^{-1}$, 0.1429 μm$^{-1}$, 0.1379 μm$^{-1}$, 0.1333 μm$^{-1}$, 0.1290 μm$^{-1}$, 0.125 μm$^{-1}$, 0.1212 μm$^{-1}$, 0.1176 μm$^{-1}$, 0.1176 μm$^{-1}$, 0.1143 μm$^{-1}$, 0.1111 μm$^{-1}$, 0.1881 μm$^{-1}$, 0.1053 μm$^{-1}$, 0.1026 μm$^{-1}$, 0.1 μm$^{-1}$, 0.0976 μm$^{-1}$, 0.9524 μm$^{-1}$, 0.0930 μm$^{-1}$, 0.0909 μm$^{-1}$, 0.0889 μm$^{-1}$, 0.870 μm$^{-1}$, 0.0851 μm$^{-1}$, 0.0833 μm$^{-1}$, 0.0816 μm$^{-1}$, 0.08 μm$^{-1}$, 0.0784 μm$^{-1}$, 0.0769 μm$^{-1}$, 0.0755 μm$^{-1}$, 0.0741 μm$^{-1}$, 0.0727 μm$^{-1}$, 0.0714 μm$^{-1}$, 0.0702 μm$^{-1}$, 0.0690 μm$^{-1}$, 0.0678 μm$^{-1}$, 0.0667 μm$^{-1}$, 0.0656 μm$^{-1}$, 0.0645 μm$^{-1}$, 0.0635 μm$^{-1}$, 0.0625 μm$^{-1}$, 0.0615 μm$^{-1}$, 0.0606 μm$^{-1}$, 0.0597 μm$^{-1}$, 0.0588 μm$^{-1}$, 0.0580 μm$^{-1}$, 0.0571 μm$^{-1}$, 0.0563 μm$^{-1}$, 0.0556 μm$^{-1}$, 0.0548 μm$^{-1}$, 0.0541 μm$^{-1}$, 0.0533 μm$^{-1}$, 0.0526 μm$^{-1}$, 0.0519 μm$^{-1}$, 0.0513 μm$^{-1}$, 0.0506 μm$^{-1}$, 0.05 μm$^{-1}$, 0.0494 μm$^{-1}$, 0.0488 μm$^{-1}$, 0.0482 μm$^{-1}$, 0.0476 μm$^{-1}$, 0.0471 μm$^{-1}$, 0.0465 μm$^{-1}$, 0.0460 μm$^{-1}$, 0.0455 μm$^{-1}$, 0.0450 μm$^{-1}$, 0.0444 μm$^{-1}$, 0.0440 μm$^{-1}$, 0.0435 μm$^{-1}$, 0.0430 μm$^{-1}$, 0.0426 μm$^{-1}$, 0.0421 μm$^{-1}$, 0.0417 μm$^{-1}$, 0.0412 μm$^{-1}$, 0.0408 μm$^{-1}$, 0.0404 μm$^{-1}$, 0.04 μm$^{-1}$, 0.0396 μm$^{-1}$, 0.0392 μm$^{-1}$, 0.0388 μm$^{-1}$, 0.0385 μm$^{-1}$; 0.0381 μm$^{-1}$, 0.0377 μm$^{-1}$, 0.0374 μm$^{-1}$, 0.037 μm$^{-1}$, 0.0367 μm$^{-1}$, 0.0364 μm$^{-1}$, 0.0360 μm$^{-1}$, 0.0357 μm$^{-1}$, 0.0354 μm$^{-1}$, 0.0351 μm$^{-1}$, 0.0348 μm$^{-1}$, 0.0345 μm$^{-1}$, 0.0342 μm$^{-1}$, 0.0339 μm$^{-1}$, 0.0336 μm$^{-1}$, 0.0333 μm$^{-1}$, 0.0331 μm$^{-1}$, 0.0328 μm$^{-1}$, 0.0325 μm$^{-1}$, 0.0323 μm$^{-1}$, 0.032 μm$^{-1}$, 0.0317 μm$^{-1}$, 0.0315 μm$^{-1}$, 0.0312 μm$^{-1}$, 0.031 μm$^{-1}$, 0.0308 μm$^{-1}$, 0.0305 μm$^{-1}$, 0.0303 μm$^{-1}$, 0.0301 μm$^{-1}$, 0.03 μm$^{-1}$, 0.0299 μm$^{-1}$, 0.0296 μm$^{-1}$, 0.0294 μm$^{-1}$, 0.0292 μm$^{-1}$, 0.029 μm$^{-1}$, 0.0288 μm$^{-1}$, 0.0286 μm$^{-1}$, 0.0284 μm$^{-1}$, 0.0282 μm$^{-1}$, 0.028 μm$^{-1}$, 0.0278 μm$^{-1}$, 0.0276 μm$^{-1}$, 0.0274 μm$^{-1}$, 0.0272 μm$^{-1}$; 0.0270 μm$^{-1}$, 0.0268 μm$^{-1}$, 0.02667 μm$^{-1}$, 0.0265 μm$^{-1}$, 0.0263 μm$^{-1}$, 0.0261 μm$^{-1}$, 0.026 μm$^{-1}$, 0.0258 μm$^{-1}$, 0.0256 μm$^{-1}$, 0.0255 μm$^{-1}$, 0.0253 μm$^{-1}$, 0.0252 μm$^{-1}$, 0.025 μm$^{-1}$, 0.0248 μm$^{-1}$, 0.0247 μm$^{-1}$, 0.0245 μm$^{-1}$, 0.0244 μm$^{-1}$, 0.0242 μm$^{-1}$, 0.0241 μm$^{-1}$, 0.024 μm$^{-1}$, 0.0238 μm$^{-1}$, 0.0237 μm$^{-1}$, 0.0235 μm$^{-1}$, 0.0234 μm$^{-1}$, 0.0233 μm$^{-1}$, 0.231 μm$^{-1}$, 0.023 μm$^{-1}$, 0.0229 μm$^{-1}$, 0.0227 μm$^{-1}$, 0.0226 μm$^{-1}$, 0.0225 μm$^{-1}$, 0.0223 μm$^{-1}$, 0.0222 μm$^{-1}$, 0.0221 μm$^{-1}$, 0.022 μm$^{-1}$, 0.0219 μm$^{-1}$, 0.0217 μm$^{-1}$, 0.0216 μm$^{-1}$, 0.0215 μm$^{-1}$, 0.0214 μm$^{-1}$, 0.0213 μm$^{-1}$, 0.0212 μm$^{-1}$, 0.0211 μm$^{-1}$, 0.021 μm$^{-1}$, 0.0209 μm$^{-1}$, 0.0208 μm$^{-1}$, 0.0207 μm$^{-1}$, 0.0206 μm$^{-1}$, 0.0205 μm$^{-1}$, 0.0204 μm$^{-1}$, 0.0203 μm$^{-1}$, 0.0202 μm$^{-1}$, 0.0201 μm$^{-1}$, 0.02 μm$^{-1}$, or 0.002 μm$^{-1}$.

According to one embodiment, the curvature of the spherical composite particle 1 has no deviation, meaning that said composite particle 1 has a perfect spherical shape. A perfect spherical shape prevents fluctuations of the intensity of the scattered light.

According to one embodiment, the unique curvature of the spherical composite particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, or 10% along the surface of said composite particle 1.

According to one embodiment, the composite particle 1 is luminescent.

According to one embodiment, the composite particle 1 is fluorescent.

According to one embodiment, the composite particle 1 is phosphorescent.

According to one embodiment, the composite particle 1 is electroluminescent.

According to one embodiment, the composite particle 1 is chemiluminescent.

According to one embodiment, the composite particle 1 is triboluminescent.

According to one embodiment, the features of the light emission of composite particle 1 are sensible to external pressure variations. In this embodiment, "sensible" means that the features of the light emission can be modified by external pressure variations.

According to one embodiment, the wavelength emission peak of composite particle 1 is sensible to external pressure variations. In this embodiment, "sensible" means that the wavelength emission peak can be modified by external pressure variations, i.e. external pressure variations can induce a wavelength shift.

According to one embodiment, the FWHM of composite particle 1 is sensible to external pressure variations. In this embodiment, "sensible" means that the FWHM can be modified by external pressure variations, i.e. FWHM can be reduced or increased.

According to one embodiment, the PLQY of composite particle 1 is sensible to external pressure variations. In this embodiment, "sensible" means that the PLQY can be modified by external pressure variations, i.e. PLQY can be reduced or increased.

According to one embodiment, the features of the light emission of composite particle 1 are sensible to external temperature variations.

According to one embodiment, the wavelength emission peak of composite particle 1 is sensible to external temperature variations. In this embodiment, "sensible" means that the wavelength emission peak can be modified by external temperature variations, i.e. external temperature variations can induce a wavelength shift.

According to one embodiment, the FWHM of composite particle 1 is sensible to external temperature variations. In this embodiment, "sensible" means that the FWHM can be modified by external temperature variations, i.e. FWHM can be reduced or increased.

According to one embodiment, the PLQY of composite particle 1 is sensible to external temperature variations. In this embodiment, "sensible" means that the PLQY can be modified by external temperature variations, i.e. PLQY can be reduced or increased.

According to one embodiment, the features of the light emission of composite particle 1 are sensible to external variations of pH.

According to one embodiment, the wavelength emission peak of composite particle 1 is sensible to external variations of pH. In this embodiment, "sensible" means that the wavelength emission peak can be modified by external variations of pH, i.e. external variations of pH can induce a wavelength shift.

According to one embodiment, the FWHM of composite particle 1 is sensible to e external variations of pH. In this embodiment, "sensible" means that the FWHM can be modified by external variations of pH, i.e. FWHM can be reduced or increased.

According to one embodiment, the PLQY of composite particle 1 is sensible to external variations of pH. In this embodiment, "sensible" means that the PLQY can be modified by external variations of pH, i.e. PLQY can be reduced or increased.

According to one embodiment, the composite particle 1 comprise at least one nanoparticle 3 wherein the wavelength emission peak is sensible to external temperature variations; and at least one nanoparticle 3 wherein the wavelength emission peak is not or less sensible to external temperature variations. In this embodiment, "sensible" means that the wavelength emission peak can be modified by external temperature variations, i.e. wavelength emission peak can be reduced or increased. This embodiment is particularly advantageous for temperature sensor applications.

According to one embodiment, the composite particle 1 exhibits an emission spectrum with at least one emission peak, wherein said emission peak has a maximum emission wavelength ranging from 400 nm to 50 μm.

According to one embodiment, the composite particle 1 exhibits an emission spectrum with at least one emission peak, wherein said emission peak has a maximum emission wavelength ranging from 400 nm to 500 nm. In this embodiment, the composite particle 1 emits blue light.

According to one embodiment, the composite particle 1 exhibits an emission spectrum with at least one emission peak, wherein said emission peak has a maximum emission wavelength ranging from 500 nm to 560 nm, more preferably ranging from 515 nm to 545 nm. In this embodiment, the composite particle 1 emits green light.

According to one embodiment, the composite particle 1 exhibits an emission spectrum with at least one emission peak, wherein said emission peak has a maximum emission wavelength ranging from 560 nm to 590 nm. In this embodiment, the composite particle 1 emits yellow light.

According to one embodiment, the composite particle 1 exhibits an emission spectrum with at least one emission peak, wherein said emission peak has a maximum emission wavelength ranging from 590 nm to 750 nm, more preferably ranging from 610 nm to 650 nm. In this embodiment, the composite particle 1 emits red light.

According to one embodiment, the composite particle 1 exhibits an emission spectrum with at least one emission peak, wherein said emission peak has a maximum emission wavelength ranging from 750 nm to 50 μm. In this embodiment, the composite particle 1 emits near infra-red, mid-infra-red, or infra-red light.

According to one embodiment, the composite particle 1 emits a secondary light having a different wavelength as the primary light.

According to one embodiment, the composite particle 1 is a light scatterer.

According to one embodiment, the composite particle 1 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the composite particle 1 is an electrical insulator. In this embodiment, the quenching of fluorescent properties for fluorescent nanoparticles 3 encapsulated in the inorganic material 2 is prevented when it is due to electron transport. In this embodiment, the composite particle 1 may be used as an electrical insulator material exhibiting the same properties as the nanoparticles 3 encapsulated in the inorganic material 2.

According to one embodiment, the composite particle 1 is an electrical conductor. This embodiment is particularly advantageous for an application of the composite particle 1 in photovoltaics or LEDs.

According to one embodiment, the composite particle 1 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the composite particle 1 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the composite particle 1 may be measured for example with an impedance spectrometer.

According to one embodiment, the composite particle 1 is a thermal insulator.

According to one embodiment, the composite particle 1 comprises a refractory material.

According to one embodiment, the composite particle 1 is a thermal conductor. In this embodiment, the composite particle 1 is capable of draining away the heat originating from the nanoparticles 3 encapsulated in the inorganic material 2, or from the environment.

According to one embodiment, the composite particle 1 has a thermal conductivity at standard conditions ranging from 0.1 to 450 W/(m·K), preferably from 1 to 200 W/(m·K), more preferably from 10 to 150 W/(m·K).

According to one embodiment, the composite particle 1 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the composite particle 1 may be measured for example by steady-state methods or transient methods.

According to one embodiment, the composite particle 1 is a local high temperature heating system.

According to one embodiment, the composite particle 1 is hydrophobic.

According to one embodiment, the composite particle 1 is hydrophilic.

According to one embodiment, the composite particle 1 is dispersible in aqueous solvents, organic solvents and/or mixture thereof.

According to one embodiment, the composite particle 1 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the composite particle 1 exhibits emission spectra with at least one emission peak having a full width half maximum strictly lower than 90 nm, 80 nm, 70 nm, 60 nm, 50 nm, 40 nm, 30 nm, 25 nm, 20 nm, 15 nm, or 10 nm.

According to one embodiment, the composite particle 1 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the composite particle 1 exhibits emission spectra with at least one emission peak having a full width at quarter maximum strictly lower than 90 nm, 80 nm, 70 nm, 60 nm, 50 nm, 40 nm, 30 nm, 25 nm, 20 nm, 15 nm, or 10 nm.

According to one embodiment, the composite particle 1 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

In one embodiment, the composite particle 1 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $nW \cdot cm^{-2}$ and 100 $kW \cdot cm^{-2}$, more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the light illumination described herein provides continuous lighting.

According to one embodiment, the light illumination described herein provides pulsed light. This embodiment is particularly advantageous as it allows the evacuation of heat and/or electrical charges from nanoparticles 3. This embodiment is also particularly advantageous as using pulsed light allow a longer lifespan of the nanoparticles 3, thus of the composite particles 1, indeed under continuous light, nanoparticles 3 degrade faster than under pulsed light.

According to one embodiment, the light illumination described herein provides pulsed light. In this embodiment, if a continuous light illuminates a material with regular periods during which said material is voluntary removed from the illumination, said light may be considered as pulsed light. This embodiment is particularly advantageous as it allows the evacuation of heat and/or electrical charges from nanoparticles 3.

According to one embodiment, said pulsed light has a time off (or time without illumination) of at least 1 µsecond, 2 µseconds, 3 µseconds, 4 µseconds, 5 µseconds, 6 µseconds, 7 µseconds, 8 µseconds, 9 µseconds, 10 µseconds, 11 µseconds, 12 µseconds, 13 µseconds, 14 µseconds, 15 µseconds, 16 µseconds, 17 µseconds, 18 µseconds, 19 µseconds, 20 µseconds, 21 µseconds, 22 µseconds, 23 µseconds, 24 µseconds, 25 µseconds, 26 µseconds, 27 µseconds, 28 µseconds, 29 µseconds, 30 µseconds, 31 µseconds, 32 µseconds, 33 µseconds, 34 µseconds, 35 µseconds, 36 µseconds, 37 µseconds, 38 µseconds, 39 µseconds, 40 µseconds, 41 µseconds, 42 µseconds, 43 µseconds, 44 µseconds, 45 µseconds, 46 µseconds, 47 µseconds, 48 µseconds, 49 µseconds, 50 µseconds, 100 µseconds, 150 µseconds, 200 µseconds, 250 µseconds, 300 µseconds, 350 µseconds, 400 µseconds, 450 µseconds, 500 µseconds, 550 µseconds, 600 µseconds, 650 µseconds, 700 µseconds, 750 µseconds, 800 µseconds, 850 µseconds, 900 µseconds, 950 µseconds, 1 msecond, 2 mseconds, 3 mseconds, 4 mseconds, 5 mseconds, 6 mseconds, 7 mseconds, 8 mseconds, 9 mseconds, 10 mseconds, 11 mseconds, 12 mseconds, 13 mseconds, 14 mseconds, 15 mseconds, 16 mseconds, 17 mseconds, 18 mseconds, 19 mseconds, 20 mseconds, 21 mseconds, 22 mseconds, 23 mseconds, 24 mseconds, 25 mseconds, 26 mseconds, 27 mseconds, 28 mseconds, 29 mseconds, 30 mseconds, 31 mseconds, 32 mseconds, 33 mseconds, 34 mseconds, 35 mseconds, 36 mseconds, 37 mseconds, 38 mseconds, 39 mseconds, 40 mseconds, 41 mseconds, 42 mseconds, 43 mseconds, 44 mseconds, 45 mseconds, 46 mseconds, 47 mseconds, 48 mseconds, 49 mseconds, or 50 mseconds.

According to one embodiment, said pulsed light has a time on (or illumination time) of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, 1 µsecond, 2 µseconds, 3 µseconds, 4 µseconds, 5 µseconds, 6 µseconds, 7 µseconds, 8 µseconds, 9 µseconds, 10 µseconds, 11 µseconds, 12 µseconds, 13 µseconds, 14 µseconds, 15 µseconds, 16 µseconds, 17 µseconds, 18 µseconds, 19 µseconds, 20 µseconds, 21 µseconds, 22 µseconds, 23 µseconds, 24 µseconds, 25 µseconds, 26 µseconds, 27 µseconds, 28 µseconds, 29 µseconds, 30 µseconds, 31 µseconds, 32 µseconds, 33 µseconds, 34 µseconds, 35 µseconds, 36 µseconds, 37 µseconds, 38 µseconds, 39 µseconds, 40 µseconds, 41 µseconds, 42 µseconds, 43 µseconds, 44 µseconds, 45 µseconds, 46 µseconds, 47 µseconds, 48 µseconds, 49 µseconds, or 50 µseconds.

According to one embodiment, said pulsed light has a frequency of at least 10 Hz, 11 Hz, 12 Hz, 13 Hz, 14 Hz, 15 Hz, 16 Hz, 17 Hz, 18 Hz, 19 Hz, 20 Hz, 21 Hz, 22 Hz, 23 Hz, 24 Hz, 25 Hz, 26 Hz, 27 Hz, 28 Hz, 29 Hz, 30 Hz, 31 Hz, 32 Hz, 33 Hz, 34 Hz, 35 Hz, 36 Hz, 37 Hz, 38 Hz, 39 Hz, 40 Hz, 41 Hz, 42 Hz, 43 Hz, 44 Hz, 45 Hz, 46 Hz, 47 Hz, 48 Hz, 49 Hz, 50 Hz, 100 Hz, 150 Hz, 200 Hz, 250 Hz, 300 Hz, 350 Hz, 400 Hz, 450 Hz, 500 Hz, 550 Hz, 600 Hz, 650 Hz, 700 Hz, 750 Hz, 800 Hz, 850 Hz, 900 Hz, 950 Hz, 1 kHz, 2 kHz, 3 kHz, 4 kHz, 5 kHz, 6 kHz, 7 kHz, 8 kHz, 9 kHz, 10 kHz, 11 kHz, 12 kHz, 13 kHz, 14 kHz, 15 kHz, 16 kHz, 17 kHz, 18 kHz, 19 kHz, 20 kHz, 21 kHz, 22 kHz, 23 kHz, 24 kHz, 25 kHz, 26 kHz, 27 kHz, 28 kHz, 29 kHz, 30 kHz, 31 kHz, 32 kHz, 33 kHz, 34 kHz, 35 kHz, 36 kHz, 37 kHz, 38 kHz, 39 kHz, 40 kHz, 41 kHz, 42 kHz, 43 kHz, 44 kHz, 45 kHz, 46 kHz, 47 kHz, 48 kHz, 49 kHz, 50 kHz, 100 kHz, 150 kHz, 200 kHz, 250 kHz, 300 kHz, 350 kHz, 400 kHz, 450 kHz, 500 kHz, 550 kHz, 600 kHz, 650 kHz, 700 kHz, 750 kHz, 800 kHz, 850 kHz, 900 kHz, 950 kHz, 1 MHz, 2 MHz, 3 MHz, 4 MHz, 5 MHz, 6 MHz, 7 MHz, 8 MHz, 9 MHz, 10 MHz, 11 MHz, 12 MHz, 13 MHz, 14 MHz, 15 MHz, 16 MHz, 17 MHz, 18 MHz, 19 MHz, 20 MHz, 21 MHz, 22 MHz, 23 MHz, 24 MHz, 25 MHz, 26 MHz, 27 MHz, 28 MHz, 29 MHz, 30 MHz, 31 MHz, 32 MHz, 33 MHz, 34 MHz, 35 MHz, 36 MHz, 37 MHz, 38 MHz, 39 MHz, 40 MHz, 41 MHz, 42 MHz, 43 MHz, 44 MHz, 45 MHz, 46 MHz, 47 MHz, 48 MHz, 49 MHz, 50 MHz, or 100 MHz.

According to one embodiment, the spot area of the light which illuminates the composite particle 1, the nanoparticles 3 and/or the light emitting material 7 is at least 10 $\mu m^2$, 20 $\mu m^2$, 30 $\mu m^2$, 40 $\mu m^2$, 50 $\mu m^2$, 60 $\mu m^2$, 70 $\mu m^2$, 80 $\mu m^2$, 90 $\mu m^2$, 100 $\mu m^2$, 200 $\mu m^2$, 300 $\mu m^2$, 400 $\mu m^2$, 500 $\mu m^2$, 600 $\mu m^2$, 700 $\mu m^2$, 800 $\mu m^2$, 900 $\mu m^2$, $10^3$ $\mu m^2$, $10^4$ $\mu m^2$, $10^5$ $\mu m^2$, 1 $mm^2$, 10 $mm^2$, 20 $mm^2$, 30 $mm^2$, 40 $mm^2$, 50 $mm^2$, 60 $mm^2$, 70 $mm^2$, 80 $mm^2$, 90 $mm^2$, 100 $mm^2$, 200 $mm^2$, 300 $mm^2$, 400 $mm^2$, 500 $mm^2$, 600 $mm^2$, 700 $mm^2$, 800 $mm^2$, 900 $mm^2$, $10^3$ $mm^2$, $10^4$ $mm^2$, $10^5$ $mm^2$, 1 $m^2$, 10 $m^2$, 20 $m^2$, 30 $m^2$, 40 $m^2$, 50 $m^2$, 60 $m^2$, 70 $m^2$, 80 $m^2$, 90 $m^2$, or 100 $m^2$.

According to one embodiment, the emission saturation of the composite particle 1, the nanoparticles 3 and/or the light emitting material 7 is reached under a pulsed light with a peak pulse power of at least 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, 100 $kW\cdot cm^{-2}$, 200 $kW\cdot cm^{-2}$, 300 $kW\cdot cm^{-2}$, 400 $kW\cdot cm^{-2}$, 500 $kW\cdot cm^{-2}$, 600 $kW\cdot cm^{-2}$, 700 $kW\cdot cm^{-2}$, 800 $kW\cdot cm^{-2}$, 900 $kW\cdot cm^{-2}$, or 1 $MW\cdot cm^{-2}$.

According to one embodiment, the emission saturation of the composite particle 1, the nanoparticles 3 and/or the light emitting material 7 is reached under a continuous illumination with a peak pulse power of at least 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, or 1 $kW\cdot cm^{-2}$.

Emission saturation of particles under illumination with a given photon flux occurs when said particles cannot emit more photons. In other words, a higher photon flux doesn't lead to a higher number of photons emitted by said particles.

According to one embodiment, the FCE (Frequency Conversion Efficiency) of illuminated composite particle 1, nanoparticles 3 and/or light emitting material 7 is of at least 1%, 2%, 3%, 4%, 5%, 6%, 7%, 8%, 9%, 10%, 15%, 16%, 17%, 18%, 18%, 19%, 20%, 21%, 22%, 23%, 24%, 25%, 30%, 35%, 40%, 45%, 50%, 55%, 60%, 65%, 70%, 75%, 80%, 85%, 90%, 95%, or 100%. In this embodiment, the FCE was measured at 480 nm.

In one embodiment, the composite particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $nW\cdot cm^{-2}$, 50 $nW\cdot cm^{-2}$, 100 $nW\cdot cm^{-2}$, 200 $nW\cdot cm^{-2}$, 300 $nW\cdot cm^{-2}$, 400 $nW\cdot cm^{-2}$, 500 $nW\cdot cm^{-2}$, 600 $nW\cdot cm^{-2}$, 700 $nW\cdot cm^{-2}$, 800 $nW\cdot cm^{-2}$, 900 $nW\cdot cm^{-2}$, 1 $\mu W\cdot cm^{-2}$, 10 $\mu W\cdot cm^{-2}$, 100 $\mu W\cdot cm^{-2}$, 500 $\mu W\cdot cm^{-2}$, 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the composite particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

According to one embodiment, the composite particle 1 has an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

In one embodiment, the composite particle 1 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$. In this embodiment, the composite particle 1 preferably comprises quantum dots, semiconductor nanoparticles, semiconductor nanocrystals, or semiconductor nanoplatelets.

In one preferred embodiment, the composite particle 1 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

In one embodiment, the composite particle 1 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$. In this embodiment, the composite particle 1 preferably comprises quantum dots, semiconductor nanoparticles, semiconductor nanocrystals, or semiconductor nanoplatelets.

In one preferred embodiment, the composite particle 1 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW\cdot cm^{-2}$, 50 $mW\cdot cm^{-2}$, 100 $mW\cdot cm^{-2}$, 500 $mW\cdot cm^{-2}$, 1 $W\cdot cm^{-2}$, 5 $W\cdot cm^{-2}$, 10 $W\cdot cm^{-2}$, 20 $W\cdot cm^{-2}$, 30 $W\cdot cm^{-2}$, 40 $W\cdot cm^{-2}$, 50 $W\cdot cm^{-2}$, 60 $W\cdot cm^{-2}$, 70 $W\cdot cm^{-2}$, 80 $W\cdot cm^{-2}$, 90 $W\cdot cm^{-2}$, 100 $W\cdot cm^{-2}$, 110 $W\cdot cm^{-2}$, 120 $W\cdot cm^{-2}$, 130 $W\cdot cm^{-2}$, 140 $W\cdot cm^{-2}$, 150 $W\cdot cm^{-2}$, 160 $W\cdot cm^{-2}$, 170 $W\cdot cm^{-2}$, 180 $W\cdot cm^{-2}$, 190 $W\cdot cm^{-2}$, 200 $W\cdot cm^{-2}$, 300 $W\cdot cm^{-2}$, 400 $W\cdot cm^{-2}$, 500 $W\cdot cm^{-2}$, 600 $W\cdot cm^{-2}$, 700 $W\cdot cm^{-2}$, 800 $W\cdot cm^{-2}$, 900 $W\cdot cm^{-2}$, 1 $kW\cdot cm^{-2}$, 50 $kW\cdot cm^{-2}$, or 100 $kW\cdot cm^{-2}$.

According to one embodiment, the composite particle 1 is surfactant-free. In this embodiment, the surface of the composite particle 1 will be easy to functionalize as said surface will not be blocked by any surfactant molecule.

According to one embodiment, the composite particle 1 is not surfactant-free.

According to one embodiment, the composite particle 1 is amorphous.

According to one embodiment, the composite particle 1 is crystalline.

According to one embodiment, the composite particle 1 is totally crystalline.

According to one embodiment, the composite particle 1 is partially crystalline.

According to one embodiment, the composite particle 1 is monocrystalline.

According to one embodiment, the composite particle 1 is polycrystalline. In this embodiment, the composite particle 1 comprises at least one grain boundary.

According to one embodiment, the composite particle 1 is a colloidal particle.

According to one embodiment, the composite particle 1 does not comprise a spherical porous bead, preferably the composite particle 1 does not comprise a central spherical porous bead.

According to one embodiment, the composite particle 1 does not comprise a spherical porous bead, wherein nanoparticles 3 are linked to the surface of said spherical porous bead.

According to one embodiment, the composite particle 1 does not comprise a bead and nanoparticles 3 having opposite electronic charges.

According to one embodiment, the composite particle 1 is porous.

According to one embodiment, the composite particle 1 is considered porous when the quantity adsorbed by the composite particles 1 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the composite particle 1 can be hexagonal, vermicular or cubic.

According to one embodiment, the organized porosity of the composite particle 1 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the composite particle 1 is not porous.

According to one embodiment, the composite particle 1 is considered non-porous when the quantity adsorbed by the said composite particle 1 determined by adsorption-desorption of nitrogen in the BrunauerEmmettTeller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the composite particle 1 does not comprise pores or cavities.

According to one embodiment, the composite particle 1 is permeable.

According to one embodiment, the permeable composite particle 1 has an intrinsic permeability to fluids higher or equal to $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the composite particle 1 is impermeable to outer molecular species, gas or liquid. In this embodiment, outer molecular species, gas or liquid refers to molecular species, gas or liquid external to said composite particle 1.

According to one embodiment, the impermeable composite particle 1 has an intrinsic permeability to fluids less or equal to $10^{-11}$ $cm^2$, $10^{-12}$ $cm^2$, $10^{-13}$ $cm^2$, $10^{-14}$ $cm^2$, or $10^{-15}$ $cm^2$.

According to one embodiment, the composite particle 1 has an oxygen transmission rate ranging from $10^{-7}$ to 10 $cm^3 \cdot m^{-2} \cdot day^{-1}$, preferably from $10^{-7}$ to 1 $cm^3 \cdot m^{-2} \cdot day^{-1}$, more preferably from $10^{-7}$ to $10^{-1}$ $cm^3 \cdot m^{-2} \cdot day^{-1}$, even more preferably from $10^{-7}$ to $10^{-4}$ $cm^3 \cdot m^{-2} \cdot day^{-1}$ at room temperature.

According to one embodiment, the composite particle 1 has a water vapor transmission rate ranging from $10^{-7}$ to 10 $g \cdot m^{-2} \cdot day^{-1}$, preferably from $10^{-7}$ to 1 $g \cdot m^{-2} \cdot day^{-1}$, more preferably from $10^{-7}$ to $10^{-1}$ $g \cdot m^{-2} \cdot day^{-1}$, even more preferably from $10^{-7}$ to $10^{-4}$ $g \cdot m^{-2} \cdot day^{-1}$ at room temperature. A water vapor transmission rate of $10^{-6}$ $g \cdot m^{-2} \cdot day^{-1}$ is particularly adequate for a use on LED.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the composite particle 1 exhibits a shelf life of at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its specific property of less than 100%, 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the specific property of the composite particle 1 comprises one or more of the following: fluorescence, phosphorescence, or chemiluminescence.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

Photoluminescence refers to fluorescence and/or phosphorescence.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $0_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300°

C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the composite particle 1 exhibits a degradation of its FCE of less than 90%, 80%, 70%, 60%, 50%, 40%, 30%, 25%, 20%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the composite particle 1 is optically transparent, i.e. the composite particle 1 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, each nanoparticle 3 is totally surrounded by or encapsulated in the inorganic material 2.

According to one embodiment, each nanoparticle 3 is partially surrounded by or encapsulated in the inorganic material 2.

According to one embodiment, the composite particle 1 comprises at least 95%, 90%, 85%, 80%, 75%, 70%, 65%, 60%, 55%, 50%, 45%, 40%, 35%, 30%, 25%, 20%, 15%, 10%, 5%, 1%, or 0% of nanoparticles 3 on its surface.

According to one embodiment, the composite particle 1 does not comprise nanoparticles 3 on its surface. In this embodiment, said nanoparticles 3 are completely surrounded by the inorganic material 2.

According to one embodiment, at least 100%, 95%, 90%, 85%, 80%, 75%, 70%, 65%, 60%, 55%, 50%, 45%, 40%, 35%, 30%, 25%, 20%, 15%, 10%, 5%, or 1% of nanoparticles 3 are comprised in the inorganic material 2. In this embodiment, each of said nanoparticles 3 is completely surrounded by the inorganic material 2.

According to one embodiment, the composite particle 1 comprises at least one nanoparticle 3 located on the surface of said composite particle 1. This embodiment is advantageous as the at least one nanoparticle 3 will be better excited by the incident light than if said nanoparticle 3 was dispersed in the inorganic material 2.

According to one embodiment, the composite particle 1 comprises nanoparticles 3 dispersed in the inorganic material 2, i.e. totally surrounded by said inorganic material 2; and at least one nanoparticle 3 located on the surface of said luminescent particle 1.

According to one embodiment, the composite particle 1 comprises nanoparticles 3 dispersed in the inorganic material 2, wherein said nanoparticles 3 emit at a wavelength in the range from 500 to 560 nm; and at least one nanoparticle 3 located on the surface of said composite particle 1, wherein said at least one nanoparticle 3 emits at a wavelength in the range from 600 to 2500 nm.

According to one embodiment, the composite particle 1 comprises nanoparticles 3 dispersed in the inorganic material 2, wherein said nanoparticles 3 emit at a wavelength in the range from 600 to 2500 nm; and at least one nanoparticle 3 located on the surface of said composite particle 1, wherein said at least one nanoparticle 3 emits at a wavelength in the range from 500 to 560 nm.

According to one embodiment, the at least one nanoparticle 3 located on the surface of said composite particle 1 may be chemically or physically adsorbed on said surface.

According to one embodiment, the at least one nanoparticle 3 located on the surface of said composite particle 1 may be adsorbed on said surface.

According to one embodiment, the at least one nanoparticle 3 located on the surface of said composite particle 1 may be adsorbed with a cement on said surface.

According to one embodiment, examples of cement include but are not limited to: polymers, silicone, oxides, or a mixture thereof.

According to one embodiment, the at least one nanoparticle 3 located on the surface of said composite particle 1 may have at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of its volume trapped in the inorganic material 2.

According to one embodiment, a plurality of nanoparticles 3 is uniformly spaced on the surface of the composite particle 1.

According to one embodiment, each nanoparticle 3 of the plurality of nanoparticles 3 is spaced from its adjacent nanoparticle 3 by an average minimal distance, said average minimal distance is as described hereabove.

According to one embodiment, the composite particle 1 is a homostructure.

According to one embodiment, the composite particle 1 is not a core/shell structure wherein the core does not comprise nanoparticles 3 and the shell comprises nanoparticles 3.

According to one embodiment, the composite particle 1 is a heterostructure, comprising a core 11 and at least one shell 12.

According to one embodiment, the shell 12 of the core/shell composite particle 1 comprises or consists of an inorganic material 2. In this embodiment, said inorganic material 2 is the same or different than the inorganic material 2 comprised in the core 11 of the core/shell composite particle 1.

According to one embodiment, the core 11 of the core/shell composite particle 1 comprises nanoparticles 3 as described herein and the shell 12 of the core/shell composite particle 1 does not comprise nanoparticles 3.

According to one embodiment, the core 11 of the core/shell composite particle 1 comprises nanoparticles 3 as described herein and the shell 12 of the core/shell composite particle 1 comprises nanoparticles 3.

According to one embodiment, the nanoparticles 3 comprised in the core 11 of the core/shell composite particle 1 are identical to the nanoparticles 3 comprised in the shell 12 of the core/shell composite particle 1.

According to one embodiment illustrated in FIG. 4, the nanoparticles 3 comprised in the core 11 of the core/shell composite particle 1 are different to the nanoparticles 3 comprised in the shell 12 of the core/shell composite particle 1. In this embodiment, the resulting core/shell composite particle 1 will exhibit different properties.

According to one embodiment, the core 11 of the core/shell composite particle 1 comprises at least one luminescent nanoparticle and the shell 12 of the core/shell composite particle 1 comprises at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 11 of the core/shell composite particle 1 and the shell 12 of the core/shell composite particle 1 comprise at least two different luminescent nanoparticles, wherein said luminescent nanoparticles have different emission wavelengths. This means that the core 11 comprises at least one luminescent nanoparticle and the shell 12 comprises at least one luminescent nanoparticle, said luminescent nanoparticles having different emission wavelengths.

In a preferred embodiment, the core 11 of the core/shell composite particle 1 and the shell 12 of the core/shell composite particle 1 comprise at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the core 11 of the core/shell composite particle 1 and the shell 12 of the core/shell composite particle 1 comprise at least one luminescent nanoparticle emitting in the green region of the visible spectrum and at least one luminescent nanoparticle emitting in the red region of the visible spectrum, thus the composite particle 1 paired with a blue LED will be a white light emitter.

In a preferred embodiment, the core 11 of the core/shell composite particle 1 and the shell 12 of the core/shell composite particle 1 comprise at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the core 11 of the core/shell composite particle 1 and the shell 12 of the core/shell composite particle 1 comprise at least one luminescent nanoparticle emitting in the blue region of the visible spectrum and at least one luminescent nanoparticle emitting in the red region of the visible spectrum, thus the composite particle 1 will be a white light emitter.

In a preferred embodiment, the core 11 of the core/shell composite particle 1 and the shell 12 of the core/shell composite particle 1 comprise comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the core 11 of the core/shell composite particle 1 and the shell 12 of the core/shell composite particle 1 comprise comprises at least one luminescent nanoparticle emitting in the blue region of the visible spectrum and at least one luminescent nanoparticle emitting in the green region of the visible spectrum.

According to one embodiment, the core 11 of the core/shell composite particle 1 comprises at least one magnetic nanoparticle and the shell 12 of the core/shell composite particle 1 comprises at least one nanoparticle 3 selected in the group of luminescent nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell composite particle 1 comprises at least one plasmonic nanoparticle and the shell 12 of the core/shell composite particle 1 comprises at least one nanoparticle 3 selected in the group of luminescent nanoparticle, magnetic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the core 11 of the core/shell composite particle 1 comprises at least one plasmonic nanoparticle and the shell 12 of the core/shell composite particle 1 comprises at least one luminescent nanoparticle emitting in the visible spectrum of light.

According to one embodiment, the core 11 of the core/shell composite particle 1 comprises at least one dielectric nanoparticle and the shell 12 of the core/shell composite particle 1 comprises at least one nanoparticle 3 selected in the group of luminescent nanoparticle, magnetic nanoparticle, plasmonic nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell composite particle 1 comprises at least one piezoelectric nanoparticle and the shell 12 of the core/shell composite particle 1 comprises at least one nanoparticle 3 selected in the group of luminescent nanoparticle, magnetic nanoparticle, dielectric nanoparticle, plasmonic nanoparticle, pyro-electric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell composite particle 1 comprises at least one pyro-electric nanoparticle and the shell 12 of the core/shell composite particle 1 comprises at least one nanoparticle 3 selected in the group of luminescent nanoparticle, magnetic nanoparticle, dielectric nanoparticle, plasmonic nanoparticle, piezoelectric nanoparticle, ferro-electric nanoparticle, light scattering nanoparticle, electrically insulating nanoparticle, thermally insulating nanoparticle, or catalytic nanoparticle.

According to one embodiment, the core 11 of the core/shell composite particle 1 comprises at least one ferro-electric nanoparticle and the shell 12 of the core/shell composite particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, light scattering nanoparticle, electrically insulating nanoparticle, thermally insulating nanoparticle, or catalytic nanoparticle.

According to one embodiment, the core 11 of the core/shell composite particle 1 comprises at least one light scattering nanoparticle and the shell 12 of the core/shell composite particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the core 11 of the core/shell composite particle 1 comprises at least one electrically insulating nanoparticle and the shell 12 of the core/shell composite particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, thermally insulating nanoparticle, or catalytic nanoparticle.

According to one embodiment, the core 11 of the core/shell composite particle 1 comprises at least one thermally insulating nanoparticle and the shell 12 of the core/shell composite particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or catalytic nanoparticle.

According to one embodiment, the core 11 of the core/shell composite particle 1 comprises at least one catalytic nanoparticle and the shell 12 of the core/shell composite particle 1 comprises at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, light scattering nanoparticle, electrically insulating nanoparticle, or thermally insulating nanoparticle.

According to one embodiment, the shell 12 of the composite particle 1 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the shell 12 of the composite particle 1 has a thickness homogeneous all along the core 11, i.e. the shell 12 of the composite particle 1 has a same thickness all along the core 11.

According to one embodiment, the shell 12 of the composite particle 1 has a thickness heterogeneous along the core 11, i.e. said thickness varies along the core 11.

According to one embodiment, the composite particle 1 is not a core/shell particle wherein the core is an aggregate of metallic particles and the shell comprises the inorganic material 2.

According to one embodiment, the composite particle 1 is a core/shell particle wherein the core is filled with solvent and the shell comprises nanoparticles 3 dispersed in an inorganic material 2, i.e. said composite particle 1 is a hollow bead with a solvent filled core.

According to one embodiment, the composite particle 1 is functionalized. In this embodiment, the dispersion of the composite particle 1 in a solid host material may be facilitated.

According to one embodiment, the composite particle 1 of the invention is functionalized with a specific-binding component, wherein said specific-binding component includes but is not limited to: antigens, steroids, vitamins, drugs, haptens, metabolites, toxins, environmental pollutants, amino acids, peptides, proteins, antibodies, polysaccharides, nucleotides, nucleosides, oligonucleotides, psoralens, hormones, nucleic acids, nucleic acid polymers, carbohydrates, lipids, phospholipids, lipoproteins, lipopolysaccharides, liposomes, lipophilic polymers, synthetic polymers, polymeric microparticles, biological cells, virus and combinations thereof. Preferred peptides include, but are not limited to: neuropeptides, cytokines, toxins, protease substrates, and protein kinase substrates. Preferred protein conjugates include enzymes, antibodies, lectins, glycoproteins, histones, albumins, lipoproteins, avidin, streptavidin, protein A, protein G, phycobiliproteins and other fluorescent proteins, hormones, toxins and growth factors. Preferred nucleic acid polymers are single- or multi-stranded, natural or synthetic DNA or RNA oligonucleotides, or DNA/RNA hybrids, or incorporating an unusual linker such as morpholine derivatized phosphides, or peptide nucleic acids such as N-(2-aminoethyl)glycine units, where the nucleic acid contains fewer than 50 nucleotides, more typically fewer than 25 nucleotides. The functionalization of the composite particle 1 can be made using techniques known in the art.

According to one embodiment, the inorganic material 2 is physically and chemically stable under various conditions. In this embodiment, the inorganic material 2 is sufficiently robust to withstand the conditions to which the composite particle 1 will be subjected.

According to one embodiment, the inorganic material 2 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the composite particle 1 will be subjected.

According to one embodiment, the inorganic material 2 is physically and chemically stable under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the composite particle 1 will be subjected.

According to one embodiment, the inorganic material 2 is physically and chemically stable under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the composite particle 1 will be subjected.

According to one embodiment, the inorganic material 2 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 10%, 20%, 30%, 40%, 50%, 55%, 60%, 65%, 70%, 75%, 80%, 85%, 90%, 95%, or 99% of humidity for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the composite particle 1 will be subjected.

According to one embodiment, the inorganic material 2 is physically and chemically stable under 0%, 10%, 20%, 30%, 40%, 50%, 55%, 60%, 65%, 70%, 75%, 80%, 85%, 90%, 95%, or 99% of humidity and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the composite particle 1 will be subjected.

According to one embodiment, the inorganic material 2 is physically and chemically stable under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C. and under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$ for at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years. In this embodiment, the inorganic material 2 is sufficiently robust to withstand the conditions to which the composite particle 1 will be subjected.

According to one embodiment, the inorganic material 2 is stable under acidic conditions, i.e. at pH inferior or equal to 7. In this embodiment, the inorganic material 2 is sufficiently robust to withstand acidic conditions, meaning that the properties of the composite particle 1 are preserved under said conditions.

According to one embodiment, the inorganic material 2 is stable under basic conditions, i.e. at pH superior to 7. In this embodiment, the inorganic material 2 is sufficiently robust to withstand basic conditions, meaning that the properties of the composite particle 1 are preserved under said conditions.

According to one embodiment, the inorganic material 2 acts as a barrier against oxidation of the nanoparticles 3.

According to one embodiment, the inorganic material 2 is thermally conductive.

According to one embodiment, the inorganic material 2 has a thermal conductivity at standard conditions ranging from 0.1 to 450 W/(m·K), preferably from 1 to 200 W/(m·K), more preferably from 10 to 150 W/(m·K).

According to one embodiment, the inorganic material 2 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1

W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the inorganic material 2 may be measured by for example by steady-state methods or transient methods.

According to one embodiment, the inorganic material 2 is not thermally conductive.

According to one embodiment, the inorganic material 2 comprises a refractory material.

According to one embodiment, the inorganic material 2 is electrically insulator. In this embodiment, the quenching of fluorescent properties for fluorescent nanoparticles encapsulated in the inorganic material 2 is prevented when it is due to electron transport. In this embodiment, the composite particle 1 may be used as an electrical insulator material exhibiting the same properties as the nanoparticles 3 encapsulated in the inorganic material 2.

According to one embodiment, the inorganic material 2 is electrically conductive. This embodiment is particularly advantageous for an application of the composite particle 1 in photovoltaics or LEDs.

According to one embodiment, the inorganic material 2 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the inorganic material 2 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-31\ 2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the inorganic material 2 may be measured for example with an impedance spectrometer.

According to one embodiment, the inorganic material 2 has a bandgap superior or equal to 3 eV.

Having a bandgap superior or equal to 3eV, the inorganic material 2 is optically transparent to UV and blue light.

According to one embodiment, the inorganic material 2 have a bandgap of at least 3.0 eV, 3.1 eV, 3.2 eV, 3.3 eV, 3.4 eV, 3.5 eV, 3.6 eV, 3.7 eV, 3.8 eV, 3.9 eV, 4.0 eV, 4.1 eV, 4.2 eV, 4.3 eV, 4.4 eV, 4.5 eV, 4.6 eV, 4.7 eV, 4.8 eV, 4.9 eV, 5.0 eV, 5.1 eV, 5.2 eV, 5.3 eV, 5.4 eV or 5.5 eV.

According to one embodiment, the inorganic material 2 has an extinction coefficient less or equal to $15\times10^{-5}$ at 460 nm.

In one embodiment, the extinction coefficient is measured by an absorbance measuring technique such as absorbance spectroscopy or any other method known in the art.

In one embodiment, the extinction coefficient is measured by an absorbance measurement divided by the length of the path light passing through the sample.

According to one embodiment, the inorganic material 2 is amorphous.

According to one embodiment, the inorganic material 2 is crystalline.

According to one embodiment, the inorganic material 2 is totally crystalline.

According to one embodiment, the inorganic material 2 is partially crystalline.

According to one embodiment, the inorganic material 2 is monocrystalline.

According to one embodiment, the inorganic material 2 is polycrystalline. In this embodiment, the inorganic material 2 comprises at least one grain boundary.

According to one embodiment, the inorganic material 2 is hydrophobic.

According to one embodiment, the inorganic material 2 is hydrophilic.

According to one embodiment, the inorganic material 2 is porous.

According to one embodiment, the inorganic material 2 is considered porous when the quantity adsorbed by the composite particles 1 determined by adsorption-desorption of nitrogen in the Brunauer-Emmett-Teller (BET) theory is more than 20 $cm^3/g$, 15 $cm^3/g$, 10 $cm^3/g$, 5 $cm^3/g$ at a nitrogen pressure of 650 mmHg, preferably 700 mmHg.

According to one embodiment, the organization of the porosity of the inorganic material 2 can be hexagonal, vermicular or cubic.

According to one embodiment, the organized porosity of the inorganic material 2 has a pore size of at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, or 50 nm.

According to one embodiment, the inorganic material 2 is not porous.

According to one embodiment, the inorganic material 2 is considered non-porous when the quantity adsorbed by the composite particles 1 determined by adsorption-desorption of nitrogen in the Brunauer-Emmett-Teller (BET) theory is less than 20 $cm^3/g$, 15 $cm^3/g$, 10 $cm^3/g$, 5 $cm^3/g$ at a nitrogen pressure of 650 mmHg, preferably 700 mmHg.

According to one embodiment, the inorganic material 2 does not comprise pores or cavities.

According to one embodiment, the inorganic material 2 is permeable. In this embodiment, permeation of outer molecular species, gas or liquid in the inorganic material 2 is possible.

According to one embodiment, the permeable inorganic material 2 has an intrinsic permeability to fluids higher or equal to $10^{-20}$ $cm^2$, $10^{-19}$ $cm^2$, $10^{-18}$ $cm^2$, $10^{-17}$ $cm^2$, $10^{-16}$ $cm^2$, $10^{-15}$ $cm^2$, $10^{-14}$ $cm^2$, $10^{-13}$ $cm^2$, $10^{-12}$ $cm^2$, $10^{-11}$ $cm^2$, $10^{-10}$ $cm^2$, $10^{-9}$ $cm^2$, $10^{-8}$ $cm^2$, $10^{-7}$ $cm^2$, $10^{-6}$ $cm^2$, $10^{-5}$ $cm^2$, $10^{-4}$ $cm^2$, or $10^{-3}$ $cm^2$.

According to one embodiment, the inorganic material 2 is impermeable to outer molecular species, gas or liquid. In this embodiment, the inorganic material 2 limits or prevents the degradation of the chemical and physical properties of the nanoparticles 3 from molecular oxygen, ozone, water and/or high temperature.

According to one embodiment, the impermeable inorganic material 2 has an intrinsic permeability to fluids less or equal to $10^{-11}$ $cm^2$, $10^{-12}$ $cm^2$, $10^{-13}$ $cm^2$, $10^{-14}$ $cm^2$, $10^{-15}$ $cm^2$, $10^{-16}$ $cm^2$, $10^{-17}$ $cm^2$, $10^{-18}$ $cm^2$, $10^{-19}$ $cm^2$, or $10^{-20}$ $cm^2$.

According to one embodiment, the inorganic material 2 limits or prevents the diffusion of outer molecular species or fluids (liquid or gas) into said inorganic material 2.

According to one embodiment, the specific property of the nanoparticles 3 is preserved after encapsulation in the composite particle 1.

According to one embodiment, the photoluminescence of the nanoparticles 3 is preserved after encapsulation in the composite particle 1.

According to one embodiment, the inorganic material 2 has a density ranging from 1 to 10, preferably the inorganic material 2 has a density ranging from 3 to 10 $g/cm^3$.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their specific property of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the specific property of the nanoparticles 3 comprises one or more of the following: fluorescence, phosphorescence, or chemiluminescence.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their photoluminescence quantum yield (PLQY) of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the nanoparticles 3 in the inorganic material 2 exhibit a degradation of their FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the inorganic material 2 is optically transparent, i.e. the inorganic material 2 is transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the inorganic material 2 does not absorb all incident light allowing the nanoparticles 3 to absorb all the incident light, and/or the inorganic material 2 does not absorb the light emitted by the nanoparticles 3 allowing to said light emitted to be transmitted through the inorganic material 2.

According to one embodiment, the inorganic material 2 is not optically transparent, i.e. the inorganic material 2 absorbs light at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the inorganic material 2 absorbs part of the incident light allowing the nanoparticles 3 to absorb only a part of the incident light, and/or the inorganic material 2 absorbs part of the light emitted by the nanoparticles 3 allowing said light emitted to be partially transmitted through the inorganic material 2.

According to one embodiment, the inorganic material 2 transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the inorganic material 2 transmits a part of the incident light and emits at least one secondary light. In this embodiment, the resulting light is a combination of the remaining transmitted incident light.

According to one embodiment, the inorganic material 2 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the inorganic material 2 absorbs the incident light with wavelength lower than 460 nm.

According to one embodiment, the inorganic material 2 has an extinction coefficient less or equal to $1\times10^{-5}$, $1.1\times10^{-5}$, $1.2\times10^{-5}$, $1.3\times10^{-5}$, $1.4\times10^{-5}$, $1.5\times10^{-5}$, $1.6\times10^{-5}$, $1.7\times10^{-5}$, $1.8\times10^{-5}$, $1.9\times10^{-5}$, $2\times10^{-5}$, $3\times10^{-5}$, $4\times10^{-5}$, $5\times10^{-5}$, $6\times10^{-5}$, $7\times10^{-5}$, $8\times10^{-5}$, $9\times10^{-5}$, $10\times10^{-5}$, $11\times10^{-5}$, $12\times10^{-5}$, $13\times10^{-5}$, $14\times10^{-5}$, $15\times10^{-5}$, $16\times10^{-5}$, $17\times10^{-5}$, $18\times10^{-5}$, $19\times10^{-5}$, $20\times10^{-5}$, $21\times10^{-5}$, $22\times10^{-5}$, $23\times10^{-5}$, $24\times10^{-5}$, or $25\times10^{-5}$ at 460 nm.

According to one embodiment, the inorganic material 2 has an attenuation coefficient less or equal to $1\times10^{-2}$ $cm^{-1}$, $1\times10^{-1}$ $cm^{-1}$, $0.5\times10^{-1}$ $cm^{-1}$, 0.1 $cm^{-1}$, 0.2 $cm^{-1}$, 0.3 $cm^{-1}$, 0.4 $cm^{-1}$, 0.5 $cm^{-1}$, 0.6 $cm^{1}$, 0.7 $cm^{-1}$, 0.8 $cm^{-1}$, 0.9 $cm^{-1}$, 1 $cm^{-1}$, 1.1 $cm^{-1}$, 1.2 $cm^{-1}$, 1.3 $cm^{-1}$, 1.4 $cm^{-1}$, 1.5 $cm^{-1}$, 1.6 $cm^{-1}$, 1.7 $cm^{-1}$, 1.8 $cm^{-1}$, 1.9 $cm^{-1}$, 2.0 $cm^{-1}$, 2.5 $cm^{-1}$, 3.0 $cm^{-1}$, 3.5 $cm^{-1}$, 4.0 $cm^{-1}$, 4.5 $cm^{-1}$, 5.0 $cm^{-1}$, 5.5 $cm^{-1}$, 6.0 $cm^{-1}$, 6.5 $cm^{-1}$, 7.0 $cm^{-1}$, 7.5 $cm^{-1}$, 8.0 $cm^{-1}$, 8.5 $cm^{-1}$, 9.0 $cm^{-1}$, 9.5 $cm^{-1}$, 10 $cm^{-1}$, 15 $cm^{-1}$, 20 $cm^{-1}$, 25 $cm^{-1}$, or 30 $cm^{-1}$ at 460 nm.

According to one embodiment, the inorganic material 2 has an attenuation coefficient less or equal to $1\times10^{-2}$ $cm^{-1}$, $1\times10^{-1}$ $cm^{-1}$, $0.5\times10^{-1}$ $cm^{-1}$, 0.1 $cm^{-1}$, 0.2 $cm^{-1}$, 0.3 $cm^{-1}$, 0.4 $cm^{-1}$, 0.5 $cm^{-1}$, 0.6 $cm^{-1}$, 0.7 $cm^{-1}$, 0.8 $cm^{-1}$, 0.9 $cm^{-1}$, 1 $cm^{-1}$, 1.1 $cm^{-1}$, 1.2 $cm^{-1}$, 1.3 $cm^{-1}$, 1.4 $cm^{-1}$, 1.5 $cm^{-1}$, 1.6 $cm^{-1}$, 1.7 $cm^{-1}$, 1.8 $cm^{-1}$, 1.9 $cm^{-1}$, 2.0 $cm^{-1}$, 2.5 $cm^{-1}$, 3.0 $cm^{-1}$, 3.5 $cm^{-1}$, 4.0 $cm^{-1}$, 4.5 $cm^{-1}$, 5.0 $cm^{-1}$, 5.5 $cm^{-1}$, 6.0 $cm^{-1}$, 6.5 $cm^{-1}$, 7.0 $cm^{-1}$, 7.5 $cm^{-1}$, 8.0 $cm^{-1}$, 8.5 $cm^{-1}$, 9.0 $cm^{-1}$, 9.5 $cm^{-1}$, 10 $cm^{-1}$, 15 $cm^{-1}$, 20 $cm^{-1}$, 25 $cm^{-1}$, or 30 $cm^{-1}$ at 450 nm.

According to one embodiment, the inorganic material 2 has an optical absorption cross section less or equal to $1.10^{-35}$ $cm^2$, $1.10^{-34}$ $cm^2$, $1.10^{-33}$ $cm^2$, $1.10^{-32}$ $cm^2$, $1.10^{-31}$ $cm^2$, $1.10^{-30}$ $cm^2$, $1.10^{-29}$ $cm^2$, $1.10^{-28}$ $cm^2$, $1.10^{-27}$ $cm^2$, $1.10^{-26}$ $cm^2$, $1.10^{-25}$ $cm^2$, $1.10^{-24}$ $cm^2$, $1.10^{-23}$ $cm^2$, $1.10^{-22}$ $cm^2$, $1.10^{-21}$ $cm^2$, $1.10^{-20}$ $cm^2$, $1.10^{-19}$ $cm^2$, $1.10^{-18}$ $cm^2$, $1.10^{-17}$ $cm^2$, $1.10^{-16}$ $cm^2$, $1.10^{-15}$ $cm^2$, $1.10^{-14}$ $cm^2$, $1.10^{-13}$ $cm^2$, $1.10^{-12}$ $cm^2$, $1.10^{-11}$ $cm^2$, $1.10^{-10}$ $cm^2$, $1.10^{-9}$ $cm^2$, $1.10^{-8}$ $cm^2$, $1.10^{-7}$ $cm^2$, $1.10^{-6}$ $cm^2$, $1.10^{-5}$ $cm^2$, $1.10^{-4}$ $cm^2$, $1.10^{-3}$ $cm^2$, $1.10^{-2}$ $cm^2$ or 1.10$^{-1}$ $cm^2$ at 460 nm.

According to one embodiment, the inorganic material 2 does not comprise organic molecules, organic groups or polymer chains.

According to one embodiment, the inorganic material 2 does not comprise polymers.

According to one embodiment, the inorganic material 2 comprises inorganic polymers.

According to one embodiment, the inorganic material 2 is composed of a material selected in the group of metals, halides, chalcogenides, phosphides, sulfides, metalloids, metallic alloys, ceramics such as for example oxides, carbides, nitrides, glasses, enamels, ceramics, stones, precious stones, pigments, cements and/or inorganic polymers. Said inorganic material 2 is prepared using protocols known to the person skilled in the art.

According to one embodiment, the inorganic material 2 is composed of a material selected in the group of metals, halides, chalcogenides, phosphides, sulfides, metalloids, metallic alloys, ceramics such as for example oxides, carbides, nitrides, enamels, ceramics, stones, precious stones, pigments, and/or cements. Said inorganic material 2 is prepared using protocols known to the person skilled in the art.

According to one embodiment, the inorganic material 2 is selected from the group consisting of oxide materials, semiconductor materials, wide-bandgap semiconductor materials or a mixture thereof.

According to one embodiment, examples of semiconductor materials include but are not limited to: IIIV semiconductors, IIVI semiconductors, or a mixture thereof.

According to one embodiment, examples of wide-bandgap semiconductor materials include but are not limited to: silicon carbide SiC, aluminium nitride AlN, gallium nitride GaN, boron nitride BN, or a mixture thereof.

According to one embodiment, the inorganic material 2 comprises or consists of a $ZrO_2/SiO_2$ mixture: $Si_xZr_{1-x}O_2$, wherein $0\leq x\leq 1$. In this embodiment, the first inorganic material 2 is able to resist to any pH in a range from 0 to 14. This allows for a better protection of the nanoparticles 3.

According to one embodiment, the inorganic material 2 comprises or consists of $Si_{0.8}Zr_{0.2}O_2$.

According to one embodiment, the inorganic material 2 comprises or consists of mixture: $Si_xZr_{1-x}O_z$, wherein $0<x\leq 1$ and $0<z\leq 3$.

According to one embodiment, the inorganic material 2 comprises or consists of a $HfO_2/SiO_2$ mixture: $Si_xHf_{1-x}O_2$, wherein $0<x\leq 1$ and $0<z\leq 3$.

According to one embodiment, the inorganic material 2 comprises or consists of $Si_{0.8}Hf_{0.2}O_2$.

According to one embodiment, a chalcogenide is a chemical compound consisting of at least one chalcogen anion selected in the group of O, S, Se, Te, Po, and at least one or more electropositive element.

According to one embodiment, the metallic inorganic material 2 is selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide inorganic material 2 include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide inorganic material 2 include but are not limited to: $SiO_2$, $Al_2O_3$, $TiO_2$, $ZrO_2$, ZnO, MgO, $SnO_2$, $Nb_2O_5$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide inorganic material 2 include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride inorganic material 2 include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide inorganic material 2 include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide inorganic material 2 include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide inorganic material 2 include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, RhS2, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2O_5$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $T1_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Th_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide inorganic material 2 include but are not limited to: InP, $Cd_3P_2$, $Zn_3P_2$, AlP, GaP, T1P, or a mixture thereof.

According to one embodiment, examples of metalloid inorganic material 2 include but are not limited to: Si, B, Ge, As, Sb, Te, or a mixture thereof.

According to one embodiment, examples of metallic alloy inorganic material 2 include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the inorganic material 2 comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the ceramic is crystalline or non-crystalline ceramics. According to one embodiment, the ceramic is selected from oxide ceramics and/or non-oxides ceramics, According to one embodiment, the ceramic is selected from pottery, bricks, tiles, cements and/glasses.

According to one embodiment, the stone is selected from agate, aquamarine, amazonite, amber, amethyst, ametrine, angelite, apatite, aragonite, silver, astrophylite, aventurine, azurite, beryk, silicified wood, bronzite, chalcedony, calcite, celestine, chakras, charoite, chiastolite, chrysocolla, chrysoprase, citrine, coral, cornalite, rock crystal, native copper, cyanite, damburite, diamond, dioptase, dolomite, dumorerite, emerald, fluorite, foliage, galene, garnet, heliotrope; hematite, hemimorphite, howlite, hypersthene, iolite, jades, jet, jasper, kunzite, labradorite, lazuli lazuli, larimar, lava, lepidolite, magnetist, magnetite, alachite, marcasite, meteorite, mokaite, moldavite, morganite, mother-of-pearl, obsidian, eye hawk, iron eye, bull's eye, tiger eye, onyx tree, black onyx, opal, gold, peridot, moonstone, star stone, sun stone, pietersite, prehnite, pyrite, blue quartz, smoky quartz, quartz, quatz hematoide, milky quartz, rose quartz, rutile quartz, rhodochrosite, rhodonite, rhyolite, ruby, sapphire, rock salt, selenite, seraphinite, serpentine, shattukite, shiva lingam, shungite, flint, smithsonite, sodalite, stealite, straumatolite sugilite, tanzanite, topaz, tourmaline watermelon, black tourmaline, turquoise, ulexite, unakite, variscite, zoizite.

According to one embodiment, the inorganic material 2 comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, CdS, ZnS, ZnSe, CdZnS, CdZnSe, Au, Na, Fe, Cu, Al, Ag, Mg, mixed oxides, mixed oxides thereof or a mixture thereof; x and y are independently a decimal number from 0 to 10, at the condition that x and y are not simultaneously equal to 0, and $x \neq 0$.

According to one embodiment, the inorganic material 2 comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, CdS, ZnS, ZnSe, CdZnS, CdZnSe, Au, Na, Fe, Cu, Al, Ag, Mg, mixed oxides, mixed oxides thereof or a mixture thereof.

According to one embodiment, the inorganic material 2 comprises or consists of a thermal conductive material wherein said thermal conductive material includes but is not limited to: aluminium oxide, silver oxide, copper oxide, iron oxide, silicon oxide, lead oxide, calcium oxide, magnesium oxide, zinc oxide, tin oxide, titanium oxide, beryllium oxide, zinc sulfide, cadmium sulfide, zinc selenium, cadmium zinc selenium, cadmium zinc sulfide, gold, sodium, iron, copper, aluminium, silver, magnesium, mixed oxides, mixed oxides thereof or a mixture thereof.

According to one embodiment, the inorganic material 2 comprises a material including but not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof, garnets such as for example $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the inorganic material 2 comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said inorganic material 2.

According to one embodiment, the inorganic material 2 does not comprise inorganic polymers.

According to one embodiment, the inorganic material 2 does not comprise $SiO_2$.

According to one embodiment, the inorganic material 2 does not consist of pure $SiO_2$, i.e. 100% $SiO_2$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $SiO_2$ precursors.

According to one embodiment, examples of precursors of $SiO_2$ include but are not limited to: tetramethyl orthosilicate, tetraethyl orthosilicate, polydiethyoxysilane, n-alkyltrimethoxylsilanes such as for example n-butyltrimethoxysilane, n-octyltrimethoxylsilane, n-dodecyltrimethoxysilane, n-octadecyltrimethoxysilane, 3-mercaptopropyltrimethoxysilane, 11-mercaptoundecyltrimethoxysilane, 3-aminopropyltrimethoxysilane, 11-aminoundecyltrimethoxysilane, 3-(2-(2-aminoethylamino)ethylamino)propyltrimethoxysilane, 3-(trimethoxysilyl)propyl methacrylate, 3-(aminopropyl)trimethoxysilane, or a mixture thereof.

According to one embodiment, the inorganic material 2 does not consist of pure $Al_2O_3$, i.e. 100% $Al_2O_3$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$.

According to one embodiment, the inorganic material 2 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the inorganic material 2 comprises less than 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% of $Al_2O_3$ precursors.

According to one embodiment, the inorganic material 2 does not comprise $TiO_2$.

According to one embodiment, the inorganic material 2 does not consist of pure $TiO_2$, i.e. 100% $TiO_2$.

According to one embodiment, the inorganic material 2 does not comprise zeolite.

According to one embodiment, the inorganic material 2 does not consist of pure zeolite, i.e. 100% zeolite.

According to one embodiment, the inorganic material 2 does not comprise glass.

According to one embodiment, the inorganic material 2 does not comprise vitrified glass.

According to one embodiment, the inorganic material 2 comprises an inorganic polymer.

According to one embodiment, the inorganic polymer is a polymer not containing carbon.

According to one embodiment, the inorganic polymer is selected from polysilanes, polysiloxanes (or silicones), polythiazyles, polyaluminosilicates, polygermanes, polystannanes, polyborazylenes, polyphosphazenes, polydichlorophosphazenes, polysulfides, polysulfur and/or nitrides. According to one embodiment, the inorganic polymer is a liquid crystal polymer.

According to one embodiment, the inorganic polymer is a natural or synthetic polymer. According to one embodiment, the inorganic polymer is synthetized by inorganic reaction, radical polymerization, polycondensation, polyaddition, or ring opening polymerization (ROP). According to one embodiment, the inorganic polymer is a homopolymer or a copolymer. According to one embodiment, the inorganic polymer is linear, branched, and/or cross-linked. According to one embodiment, the inorganic polymer is amorphous, semi-crystalline or crystalline.

According to one embodiment, the inorganic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55 000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the inorganic material 2 comprises additional heteroelements, wherein said additional heteroelements include but are not limited to: Cd, S, Se, Zn, In, Te, Hg, Sn, Cu, N, Ga, Sb, Tl, Mo, Pd, Ce, W, Co, Mn, Si, Ge, B, P, Al, As, Fe, Ti, Zr, Ni, Ca, Na, Ba, K, Mg, Pb, Ag, V, Be, Ir, Sc, Nb, Ta or a mixture thereof. In this embodiment, heteroelements can diffuse in the composite particle 1 during heating step. They may form nanoclusters inside the composite particle 1. These elements can limit the degradation of the specific property of said composite particle 1 during the heating step, and/or drain away the heat if it is a good thermal conductor, and/or evacuate electrical charges.

According to one embodiment, the inorganic material 2 comprises additional heteroelements in small amounts of 0 mole %, 1 mole %, 5 mole %, 10 mole %, 15 mole %, 20 mole %, 25 mole %, 30 mole %, 35 mole %, 40 mole %, 45 mole %, 50 mole % relative to the majority element of said inorganic material 2.

According to one embodiment, the inorganic material 2 comprises $Al_2O_3$, $SiO_2$, MgO, ZnO, $ZrO_2$, $TiO_2$, $IrO_2$, $SnO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, or $Y_2O_3$ additional nanoparticles. These additional nanoparticles can drain away the heat if it is a good thermal conductor, and/or evacuate electrical charges, and/or scatter an incident light.

According to one embodiment, the inorganic material 2 comprises additional nanoparticles in small amounts at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight compared to the composite particle 1.

According to one embodiment, the inorganic material 2 has a refractive index ranging from 1.0 to 3.0, from 1.2 to 2.6, from 1.4 to 2.0 at 450 nm.

According to one embodiment, the inorganic material 2 has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 at 450 nm.

According to one embodiment, the nanoparticles 3 absorb the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the nanoparticles 3 are luminescent nanoparticles.

According to one embodiment, the luminescent nanoparticles are fluorescent nanoparticles.

According to one embodiment, the luminescent nanoparticles are phosphorescent nanoparticles.

According to one embodiment, the luminescent nanoparticles are chemiluminescent nanoparticles.

According to one embodiment, the luminescent nanoparticles are triboluminescent nanoparticles.

According to one embodiment, the luminescent nanoparticles exhibit an emission spectrum with at least one emission peak, wherein said emission peak has a maximum emission wavelength ranging from 400 nm to 50 μm.

According to one embodiment, the luminescent nanoparticles exhibit an emission spectrum with at least one emission peak, wherein said emission peak has a maximum emission wavelength ranging from 400 nm to 500 nm. In this embodiment, the luminescent nanoparticles emit blue light.

According to one embodiment, the luminescent nanoparticles exhibit an emission spectrum with at least one emission peak, wherein said emission peak has a maximum emission wavelength ranging from 500 nm to 560 nm, more preferably ranging from 515 nm to 545 nm. In this embodiment, the luminescent nanoparticles emit green light.

According to one embodiment, the luminescent nanoparticles exhibit an emission spectrum with at least one emission peak, wherein said emission peak has a maximum emission wavelength ranging from 560 nm to 590 nm. In this embodiment, the luminescent nanoparticles emit yellow light.

According to one embodiment, the luminescent nanoparticles exhibit an emission spectrum with at least one emission peak, wherein said emission peak has a maximum emission wavelength ranging from 590 nm to 750 nm, more preferably ranging from 610 nm to 650 nm. In this embodiment, the luminescent nanoparticles emit red light.

According to one embodiment, the luminescent nanoparticles exhibit an emission spectrum with at least one emission peak, wherein said emission peak has a maximum emission wavelength ranging from 750 nm to 50 μm. In this embodiment, the luminescent nanoparticles emit near infrared, mid-infra-red, or infra-red light.

According to one embodiment, the luminescent nanoparticles exhibit emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticles exhibit emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

According to one embodiment, the luminescent nanoparticles exhibit emission spectra with at least one emission peak having a full width half maximum strictly lower than 40 nm, 30 nm, 25 nm, 20 nm, 15 nm, or 10 nm.

According to one embodiment, the luminescent nanoparticles exhibit emission spectra with at least one emission peak having a full width at quarter maximum strictly lower than 40 nm, 30 nm, 25 nm, 20 nm, 15 nm, or 10 nm.

According to one embodiment, the luminescent nanoparticles have a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the luminescent nanoparticles have an average fluorescence lifetime of at least 0.1 nanosecond, 0.2 nanosecond, 0.3 nanosecond, 0.4 nanosecond, 0.5 nanosecond, 0.6 nanosecond, 0.7 nanosecond, 0.8 nanosecond, 0.9 nanosecond, 1 nanosecond, 2 nanoseconds, 3 nanoseconds, 4 nanoseconds, 5 nanoseconds, 6 nanoseconds, 7 nanoseconds, 8 nanoseconds, 9 nanoseconds, 10 nanoseconds, 11 nanoseconds, 12 nanoseconds, 13 nanoseconds, 14 nanoseconds, 15 nanoseconds, 16 nanoseconds, 17 nanoseconds, 18 nanoseconds, 19 nanoseconds, 20 nanoseconds, 21 nanoseconds, 22 nanoseconds, 23 nanoseconds, 24 nanoseconds, 25 nanoseconds, 26 nanoseconds, 27 nanoseconds, 28 nanoseconds, 29 nanoseconds, 30 nanoseconds, 31 nanoseconds, 32 nanoseconds, 33 nanoseconds, 34 nanoseconds, 35 nanoseconds, 36 nanoseconds, 37 nanoseconds, 38 nanoseconds, 39 nanoseconds, 40 nanoseconds, 41 nanoseconds, 42 nanoseconds, 43 nanoseconds, 44 nanoseconds, 45 nanoseconds, 46 nanoseconds, 47 nanoseconds, 48 nanoseconds, 49 nanoseconds, 50 nanoseconds, 100 nanoseconds, 150 nanoseconds, 200 nanoseconds, 250 nanoseconds, 300 nanoseconds, 350 nanoseconds, 400 nanoseconds, 450 nanoseconds, 500 nanoseconds, 550 nanoseconds, 600 nanoseconds, 650 nanoseconds, 700 nanoseconds, 750 nanoseconds, 800 nanoseconds, 850 nanoseconds, 900 nanoseconds, 950 nanoseconds, or 1 μsecond.

According to one embodiment, the luminescent nanoparticles are semiconductor nanoparticles.

According to one embodiment, the luminescent nanoparticles are semiconductor nanocrystals.

According to one embodiment, the nanoparticles 3 are light scattering nanoparticles.

According to one embodiment, the nanoparticles 3 are electrically insulating.

According to one embodiment, the nanoparticles 3 are electrically conductive.

According to one embodiment, the nanoparticles 3 have an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the nanoparticles 3 have an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $\mathbf{0.5\times10^{-5}}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the nanoparticles 3 may be measured for example with an impedance spectrometer.

According to one embodiment, the nanoparticles 3 are thermally conductive.

According to one embodiment, the nanoparticles 3 have a thermal conductivity at standard conditions ranging from 0.1 to 450 W/(m·K), preferably from 1 to 200 W/(m·K), more preferably from 10 to 150 W/(m·K).

According to one embodiment, the nanoparticles 3 have a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9

W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the thermal conductivity of the nanoparticles 3 may be measured by steady-state methods or transient methods.

According to one embodiment, the nanoparticles 3 are thermally insulating.

According to one embodiment, the nanoparticles 3 are local high temperature heating systems.

According to one embodiment, the ligands attached to the surface of a nanoparticle 3 is in contact with the inorganic material 2. In this embodiment, said nanoparticle 3 is linked to the inorganic material 2 and the electrical charges from said nanoparticle 3 can be evacuated. This prevents reactions at the surface of the nanoparticles 3 that can be due to electrical charges.

According to one embodiment, the ligands at the surface of the nanoparticles 3 are C3 to C20 alkanethiol ligands such as for example propanethiol, butanethiol, pentanethiol, hexanethiol, heptanethiol, octanethiol, nonanethiol, decanethiol, undecanethiol, dodecanethiol, tridecanethiol, tetradecanethiol, pentadecanethiol, hexadecanethiol, heptadecanethiol, octadecanethiol, or a mixture thereof. In this embodiment, C3 to C20 alkanethiol ligands help control the hydrophobicity of the nanoparticles surface.

According to one embodiment, the nanoparticles 3 are hydrophobic.

According to one embodiment, the nanoparticles 3 are hydrophilic.

According to one embodiment, the nanoparticles 3 are dispersible in aqueous solvents, organic solvents and/or mixture thereof.

According to one embodiment, the nanoparticles 3 have an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 82 m, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the largest dimension of the nanoparticles 3 is at least 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the nanoparticles 3 is at least 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 ηm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the smallest dimension of the nanoparticles 3 is smaller than the largest dimension of said nanoparticle 3 by a factor (aspect ratio) of at least 1.5; at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the nanoparticles 3 are polydisperse.

According to one embodiment, the nanoparticles 3 are monodisperse.

According to one embodiment, the nanoparticles 3 have a narrow size distribution.

According to one embodiment, the size distribution for the smallest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said smallest dimension.

According to one embodiment, the size distribution for the largest dimension of a statistical set of nanoparticles 3 is inferior than 1%, 2%, 3%, 4%, 5%, 6%, 7%, 8%, 9%, 10%, 15%, 20%, 25%, 30%, 35%, or 40% of said largest dimension.

According to one embodiment, the nanoparticles 3 are hollow.

According to one embodiment, the nanoparticles 3 are not hollow.

According to one embodiment, the nanoparticles 3 are isotropic.

According to one embodiment, examples of shape of isotropic nanoparticles 3 include but are not limited to: sphere 31 (as illustrated in FIG. 2A), faceted sphere, prism, polyhedron, or cubic shape.

According to one embodiment, the nanoparticles 3 are not spherical.

According to one embodiment, the nanoparticles 3 are anisotropic.

According to one embodiment, examples of shape of anisotropic nanoparticles 3 include but are not limited to: rod, wire, needle, bar, belt, cone, or polyhedron shape.

According to one embodiment, examples of branched shape of anisotropic nanoparticles 3 include but are not limited to: monopod, bipod, tripod, tetrapod, star, or octopod shape.

According to one embodiment, examples of complex shape of anisotropic nanoparticles 3 include but are not limited to: snowflake, flower, thorn, hemisphere, cone, urchin, filamentous particle, biconcave discoid, worm, tree, dendrite, necklace, or chain.

According to one embodiment, as illustrated in FIG. 2B, the nanoparticles 3 have a 2D shape 32.

According to one embodiment, examples of shape of 2D nanoparticles 32 include but are not limited to: sheet, platelet, ribbon, wall, plate triangle, square, pentagon, hexagon, disk or ring.

According to one embodiment, a nanoplatelet is different from a nanodisk.

According to one embodiment, a nanoplatelet is different from a disk or a nanodisk.

According to one embodiment, nanosheets and nanoplatelets are not disks or nanodisks. In this embodiment, the section along the other dimensions than the thickness (width, length) of said nanosheets or nanoplatelets is square or rectangular, while it is circular or ovoidal for disks or nanodisks.

According to one embodiment, nanosheets and nanoplatelets are not disks or nanodisks. In this embodiment, none of the dimensions of said nanosheets and nanoplatelets can be defined as a diameter nor the size of a semi-major axis and a semi-minor axis contrarily to disks or nanodisks.

According to one embodiment, nanosheets and nanoplatelets are not disks or nanodisks. In this embodiment, the curvature at all points along the other dimensions than the thickness (length, width) of said nanosheets or nanoplatelets is below 10 $\mu m^{-1}$, while the curvature for disks or nanodisks is superior on at least one point.

According to one embodiment, nanosheets and nanoplatelets are not disks or nanodisks. In this embodiment, the curvature at at least one point along the other dimensions than the thickness (length, width) of said nanosheets or nanoplatelets is below 10 $\mu m^{-1}$, while the curvature for disks or nanodisks is superior than 10 $\mu m^{-1}$ at all points.

According to one embodiment, a nanoplatelet is different from a quantum dot, or a spherical nanocrystal. A quantum dot is spherical, thus is has a 3D shape and allow confinement of excitons in all three spatial dimensions, whereas the nanoplatelet has a 2D shape and allow confinement of excitons in one dimension and allow free propagation in the other two dimensions. This results in distinct electronic and optical properties, for example the typical photoluminescence decay time of semiconductor platelets is 1 order of magnitude faster than for spherical quantum dots, and the semiconductor platelets also show an exceptionally narrow optical feature with full width at half maximum (FWHM) much lower than for spherical quantum dots.

According to one embodiment, a nanoplatelet is different from a nanorod or nanowire. A nanorod (or nanowire) has a 1D shape and allow confinement of excitons two spatial dimensions, whereas the nanoplatelet has a 2D shape and allow confinement of excitons in one dimension and allow free propagation in the other two dimensions. This results in distinct electronic and optical properties.

According to one embodiment, to obtain a ROHS compliant composite particle 1, said composite particle 1 rather comprises semiconductor nanoplatelets than semiconductor quantum dots. Indeed, a same emission peak position is obtained for semiconductor quantum dots with a diameter d, and semiconductor nanoplatelets with a thickness d/2; thus for the same emission peak position, a semiconductor nanoplatelet comprises less cadmium in weight than a semiconductor quantum dot. Furthermore, if a CdS core is comprised in a core/shell quantum dot or a core/shell (or core/crown) nanoplatelet, then there are more possibilities of shell layers without cadmium in the case of core/shell (or core/crown) nanoplatelet; thus a core/shell (or core/crown) nanoplatelet with a CdS core may comprise less cadmium in weight than a core/shell quantum dot with a CdS core. The lattice difference between CdS and nonCadmium shells is too important for the quantum dot to sustain. Finally, semiconductor nanoplatelets have better absorption properties than semiconductor quantum dots, thus resulting in less cadmium in weight needed in semiconductor nanoplatelets.

According to one embodiment, the nanoparticles 3 are atomically flat. In this embodiment, the atomically flat nanoparticles 3 may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, as illustrated in FIG. 5A, the nanoparticles 3 are core nanoparticles 33 without a shell.

According to one embodiment, the nanoparticles 3 comprise at least one atomically flat core nanoparticle. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the nanoparticles 3 are core 33/shell 34 nanoparticles, wherein the core 33 is partially or totally covered with a at least one shell 34 comprising at least one layer of material.

According to one embodiment, as illustrated in FIG. 5B-C and FIG. 5F-G, the nanoparticles 3 are core 33/shell 34 nanoparticles, wherein the core 33 is covered with at least one shell (34, 35).

According to one embodiment, the at least one shell (34, 35) has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the nanoparticles 3 are core 33/shell 34 nanoparticles, wherein the core 33 and the shell 34 are composed of the same material.

According to one embodiment, the nanoparticles 3 are core 33/shell 34 nanoparticles, wherein the core 33 and the shell 34 are composed of at least two different materials.

According to one embodiment, the nanoparticles 3 are core 33/shell 34 nanoparticles, wherein the core 33 is a luminescent core covered with at least one shell 34 selected in the group of magnetic material, plasmonic material, dielectric material, piezoelectric material, pyro-electric material, ferro-electric material, light scattering material, electrically insulating material, thermally insulating material, or catalytic material.

According to one embodiment, the nanoparticles 3 are core 33/shell 34 nanoparticles, wherein the core 33 is a magnetic core covered with at least one shell 34 selected in the group of luminescent material, plasmonic material, dielectric material, piezoelectric material, pyro-electric material, ferro-electric material, light scattering material, electrically insulating material, thermally insulating material or catalytic material.

According to one embodiment, the nanoparticles 3 are core 33/shell 34 nanoparticles, wherein the core 33 is a light scattering core covered with at least one shell 34 selected in the group of magnetic material, plasmonic material, dielectric material, luminescent material, piezoelectric material, pyro-electric material, ferro-electric material, electrically insulating material, thermally insulating material, or catalytic material.

According to one embodiment, the nanoparticles 3 are core 33/shell 34 nanoparticles, wherein the core 33 is selected in the group of magnetic material, plasmonic material, dielectric material, piezoelectric material, pyro-electric material, ferro-electric material, light scattering material, electrically insulating material, thermally insulating material, or catalytic material, and is covered with at least one shell 34 comprising a luminescent material.

According to one embodiment, the nanoparticles 3 are core 33/shell 34 nanoparticles, wherein the core 33 is selected in the group of magnetic material, plasmonic material, dielectric material, piezoelectric material, pyro-electric material, ferro-electric material, light scattering material, electrically insulating material, thermally insulating material, or catalytic material, and is covered with at least one shell 34 comprising a light scattering material.

According to one embodiment, the nanoparticles 3 are core 33/shell 36 nanoparticles, wherein the core 33 is covered with an insulator shell 36. In this embodiment, the insulator shell 36 prevents the aggregation of the cores 33.

According to one embodiment, the insulator shell 36 has a thickness of at least 0.1 nm, 0.2 nm, 0.3 nm, 0.4 nm, 0.5 nm, 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, as illustrated in FIG. 5D and FIG. 5H, the nanoparticles 3 are core 33/shell (34, 35, 36) nanoparticles, wherein the core 33 is covered with at least one shell (34, 35) and an insulator shell 36.

According to one embodiment, the shells (34, 35, 36) covering the core 33 of the nanoparticles 3 may be composed of the same material.

According to one embodiment, the shells (34, 35, 36) covering the core 33 of the nanoparticles 3 may be composed of at least two different materials.

According to one embodiment, the shells (34, 35, 36) covering the core 33 of the nanoparticles 3 may have the same thickness.

According to one embodiment, the shells (34, 35, 36) covering the core 33 of the nanoparticles 3 may have different thickness.

According to one embodiment, each shell (34, 35, 36) covering the core 33 of the nanoparticles 3 has a thickness homogeneous all along the core 33, i.e. each shell (34, 35, 36) has a same thickness all along the core 33.

According to one embodiment, each shell (34, 35, 36) covering the core 33 of the nanoparticles 3 has a thickness heterogeneous along the core 33, i.e. said thickness varies along the core 33.

According to one embodiment, the nanoparticles 3 are core 33/insulator shell 36 nanoparticles, wherein examples of insulator shell 36 include but are not limited to: non-porous $SiO_2$, mesoporous $SiO_2$, non-porous MgO, mesoporous MgO, non-porous ZnO, mesoporous ZnO, non-porous $Al_2O_3$, mesoporous $Al_2O_3$, non-porous $ZrO_2$, mesoporous $ZrO_2$, non-porous $TiO_2$, mesoporous $TiO_2$, non-porous $SnO_2$, mesoporous $SnO_2$, or a mixture thereof. Said insulator shell 36 acts as a supplementary barrier against oxidation and can drain away the heat if it is a good thermal conductor.

According to one embodiment, as illustrated in FIG. 5E, the nanoparticles 3 are core 33/crown 37 nanoparticles with a 2D structure, wherein the core 33 is covered with at least one crown 37.

According to one embodiment, the nanoparticles 3 are core 33/crown 37 nanoparticles, wherein the core 33 is covered with a crown 37 comprising at least one layer of material.

According to one embodiment, the nanoparticles 3 are core 33/crown 37 nanoparticles, wherein the core 33 and the crown 37 are composed of the same material.

According to one embodiment, the nanoparticles 3 are core 33/crown 37 nanoparticles, wherein the core 33 and the crown 37 are composed of at least two different materials.

According to one embodiment, the nanoparticles 3 are core 33/crown 37 nanoparticles, wherein the core 33 is a luminescent core covered with at least one crown 37 selected in the group of magnetic material, plasmonic material, dielectric material, piezoelectric material, pyro-electric material, ferro-electric material, light scattering material, electrically insulating material, thermally insulating material, or catalytic material.

According to one embodiment, the nanoparticles 3 are core 33/crown 37 nanoparticles, wherein the core 33 is a light scattering core covered with at least one crown 37 selected in the group of magnetic material, plasmonic material, dielectric material, luminescent material, piezoelectric material, pyro-electric material, ferro-electric material, electrically insulating material, thermally insulating material, or catalytic material.

According to one embodiment, the nanoparticles 3 are core 33/crown 37 nanoparticles, wherein the core 33 is a magnetic core covered with at least one crown 37 selected in the group of luminescent material, plasmonic material, dielectric material, piezoelectric material, pyro-electric material, ferro-electric material, light scattering material, electrically insulating material, thermally insulating material, or catalytic material.

According to one embodiment, the nanoparticles 3 are core 33/crown 37 nanoparticles, wherein the core 33 is selected in the group of magnetic material, plasmonic material, dielectric material, piezoelectric material, pyro-electric material, ferro-electric material, light scattering material, electrically insulating material, thermally insulating material, or catalytic material, and is covered with at least one crown 37 comprising a luminescent material.

According to one embodiment, the nanoparticles 3 are core 33/crown 37 nanoparticles, wherein the core 33 is selected in the group of magnetic material, plasmonic material, dielectric material, piezoelectric material, pyro-electric material, ferro-electric material, light scattering material, electrically insulating material, thermally insulating material, or catalytic material, and is covered with at least one crown 37 comprising a light scattering material.

According to one embodiment, the nanoparticles 3 are core 33/crown 37 nanoparticles, wherein the core 33 is covered with an insulator crown. In this embodiment, the insulator crown prevents the aggregation of the cores 33.

According to one embodiment, as illustrated in FIG. 3, the composite particle 1 comprises a combination of at least two different nanoparticles (31, 32). In this embodiment, the resulting composite particle 1 will exhibit different properties.

According to one embodiment, the composite particle 1 comprises at least one luminescent nanoparticle and at least one nanoparticle 3 selected in the group of magnetic nanoparticle, plasmonic nanoparticle, dielectric nanoparticle, piezoelectric nanoparticle, pyro-electric nanoparticle, ferro-electric nanoparticle, light scattering nanoparticle, electrically insulating nanoparticle, thermally insulating nanoparticle, or catalytic nanoparticle.

In a preferred embodiment, the composite particle 1 comprises at least two different luminescent nanoparticles, wherein said luminescent nanoparticles have different emission wavelengths.

In a preferred embodiment, the composite particle 1 comprises at least two different luminescent nanoparticles, wherein at least one luminescent nanoparticle emits at a wavelength in the range from 500 to 560 nm, and at least one luminescent nanoparticle emits at a wavelength in the range from 600 to 2500 nm. In this embodiment, the composite particle 1 comprises at least one luminescent nanoparticle emitting in the green region of the visible spectrum and at least one luminescent nanoparticle emitting in the red region of the visible spectrum, thus the composite particle 1 paired with a blue LED will be a white light emitter.

In a preferred embodiment, the composite particle 1 comprises at least two different luminescent nanoparticles, wherein at least one luminescent nanoparticle emits at a wavelength in the range from 400 to 490 nm, and at least one luminescent nanoparticle emits at a wavelength in the range from 600 to 2500 nm. In this embodiment, the composite particle 1 comprises at least one luminescent nanoparticle emitting in the blue region of the visible spectrum and at least one luminescent nanoparticle emitting in the red region of the visible spectrum, thus the composite particle 1 will be a white light emitter.

In a preferred embodiment, the composite particle 1 comprises at least two different luminescent nanoparticles, wherein at least one luminescent nanoparticle emits at a wavelength in the range from 400 to 490 nm, and at least one luminescent nanoparticle emits at a wavelength in the range from 500 to 560 nm. In this embodiment, the composite particle 1 comprises at least one luminescent nanoparticle emitting in the blue region of the visible spectrum and at least one luminescent nanoparticle emitting in the green region of the visible spectrum.

In a preferred embodiment, the composite particle 1 comprises three different luminescent nanoparticles, wherein said luminescent nanoparticles emit different emission wavelengths or color.

In a preferred embodiment, the composite particle 1 comprises at least three different luminescent nanoparticles, wherein at least one luminescent nanoparticle emits at a wavelength in the range from 400 to 490 nm, at least one luminescent nanoparticle emits at a wavelength in the range from 500 to 560 nm and at least one luminescent nanoparticle emits at a wavelength in the range from 600 to 2500 nm. In this embodiment, the composite particle 1 comprises at least one luminescent nanoparticle emitting in the blue region of the visible spectrum, at least one luminescent nanoparticle emitting in the green region of the visible spectrum and at least one luminescent nanoparticle emitting in the red region of the visible spectrum.

According to one embodiment, the composite particle 1 comprises at least one light scattering nanoparticle and at least one nanoparticle 3 selected in the group of luminescent nanoparticle, magnetic nanoparticle, dielectric nanoparticle, plasmonic nanoparticle, piezoelectric nanoparticle, pyro-electric nanoparticle, ferro-electric nanoparticle, electrically insulating nanoparticle, thermally insulating nanoparticle, or catalytic nanoparticle.

According to one embodiment, the composite particle 1 comprises at least one nanoparticle 3 without a shell and at least one nanoparticle 3 selected in the group of core 33/shell 34 nanoparticles 3 and core 33/insulator shell 36 nanoparticles 3.

According to one embodiment, the composite particle 1 comprises at least one core 33/shell 34 nanoparticle 3 and at least one nanoparticle 3 selected in the group of nanoparticles 3 without a shell and core 33/insulator shell 36 nanoparticles 3.

According to one embodiment, the composite particle 1 comprises at least one core 33/insulator shell 36 nanoparticle 3 and at least one nanoparticle 3 selected in the group of nanoparticles 3 without a shell and core 33/shell 34 nanoparticles 3.

According to one embodiment, the composite particle 1 comprises at least two nanoparticles 3.

According to one embodiment, the composite particle 1 comprises more than ten nanoparticles 3.

According to one embodiment, the composite particle 1 comprises at least 11, at least 12, at least 13, at least 14, at least 15, at least 16, at least 17, at least 18, at least 19, at least 20, at least 21, at least 22, at least 23, at least 24, at least 25, at least 26, at least 27, at least 28, at least 29, at least 30, at least 31, at least 32, at least 33, at least 34, at least 35, at least 36, at least 37, at least 38, at least 39, at least 40, at least 41, at least 42, at least 43, at least 44, at least 45, at least 46, at least 47, at least 48, at least 49, at least 50, at least 51, at least 52, at least 53, at least 54, at least 55, at least 56, at least 57, at least 58, at least 59, at least 60, at least 61, at least 62, at least 63, at least 64, at least 65, at least 66, at least 67, at least 68, at least 69, at least 70, at least 71, at least 72, at least 73, at least 74, at least 75, at least 76, at least 77, at least 78, at least 79, at least 80, at least 81, at least 82, at least 83, at least 84, at least 85, at least 86, at least 87, at least 88, at least 89, at least 90, at least 91, at least 92, at least 93, at least 94, at least 95, at least 96, at least 97, at least 98, at least 99, at least 100, at least 200, at least 300, at least 400, at least 500, at least 600, at least 700, at least 800, at least 900, at least 1000, at least 1500, at least 2000, at least 2500, at least 3000, at least 3500, at least 4000, at least 4500, at least 5000, at least 5500, at least 6000, at least 6500, at least 7000, at least 7500, at least 8000, at least 8500, at least 9000, at least 9500, at least 10000, at least 15000, at least 20000, at least 25000, at least 30000, at least 35000, at least 40000, at least 45000, at least 50000, at least 55000, at least 60000, at least 65000, at least 70000, at least 75000, at least 80000, at least 85000, at least 90000, at least 95000, or at least 100000 nanoparticles 3.

In a preffered embodiment, the composite particle 1 comprises at least one luminescent nanoparticle and at least one plasmonic nanoparticle.

According to one embodiment, the number of nanoparticles 3 comprised in a composite particle 1 depends mainly on the molar ratio or the mass ratio between the chemical species allowing to produce the inorganic material 2 and the nanoparticles 3.

According to one embodiment, the nanoparticles 3 represent at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99% by weight of the composite particle 1.

According to one embodiment, the loading charge of nanoparticles 3 in a composite particle 1 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of nanoparticles 3 in a composite particle 1 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the nanoparticles 3 are not encapsulated in composite particle 1 via physical entrapment or electrostatic attraction.

According to one embodiment, the nanoparticles 3 and the inorganic material 2 are not bonded or linked by electrostatic attraction or a functionalized silane based coupling agent.

According to one embodiment, the nanoparticles 3 comprised in a composite particle 1 are not aggregated.

According to one embodiment, the nanoparticles 3 comprised in a composite particle 1 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the nanoparticles 3 comprised in a composite particle 1 do not touch, are not in contact.

According to one embodiment, the nanoparticles 3 comprised in a composite particle 1 are separated by inorganic material 2.

According to one embodiment, the nanoparticles 3 comprised in a composite particle 1 can be individually evidenced.

According to one embodiment, the nanoparticles 3 comprised in a composite particle 1 can be individually evidenced by transmission electron microscopy or fluorescence scanning microscopy, or any other characterization means known by the person skilled in the art.

According to one embodiment, the nanoparticles 3 comprised in a composite particle 1 are uniformly dispersed in the inorganic material 2 comprised in said composite particle 1.

According to one embodiment, the nanoparticles 3 comprised in a composite particle 1 are uniformly dispersed within the inorganic material 2 comprised in said composite particle 1.

According to one embodiment, the nanoparticles 3 comprised in a composite particle 1 are dispersed within the inorganic material 2 comprised in said composite particle 1.

According to one embodiment, the nanoparticles 3 comprised in a composite particle 1 are uniformly and evenly dispersed within the inorganic material 2 comprised in said composite particle 1.

According to one embodiment, the nanoparticles 3 comprised in a composite particle 1 are evenly dispersed within the inorganic material 2 comprised in said composite particle 1.

According to one embodiment, the nanoparticles 3 comprised in a composite particle 1 are homogeneously dispersed within the inorganic material 2 comprised in said composite particle 1.

According to one embodiment, the dispersion of nanoparticles 3 in the inorganic material 2 does not have the shape of a ring, or a monolayer.

According to one embodiment, each nanoparticle 3 of the plurality of nanoparticles 3 is spaced from its adjacent nanoparticle 3 by an average minimal distance.

According to one embodiment, the average minimal distance between two nanoparticles 3 is controlled.

According to one embodiment, the average minimal distance is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 51.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 300 µm, 400 µm, 500 µm, 600 µm, 700 µm, 800 µm, 900 µm, or 1 mm.

According to one embodiment, the average distance between two nanoparticles 3 in the same composite particle 1 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.5 µm, 5 µm, 5.5 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33 µm, 33.5 µm, 34 µm, 34.5 µm, 35 µm, 35.5 µm, 36 µm, 36.5 µm, 37 µm, 37.5 µm, 38 µm, 38.5 µm, 39 µm, 39.5 µm, 40 µm, 40.5 µm, 41 µm, 41.5 µm, 42 µm, 42.5 µm, 43 µm, 43.5 µm, 44 µm, 44.5 µm, 45 µm, 45.5 µm, 46 µm, 46.5 µm, 47 µm, 47.5 µm, 48 µm, 48.5 µm, 49 µm, 49.5 µm, 50 µm, 50.5 µm, 51 µm, 1.5 µm, 52 µm, 52.5 µm, 53 µm, 53.5 µm, 54 µm, 54.5 µm, 55 µm, 55.5 µm, 56 µm, 56.5 µm, 57 µm, 57.5 µm, 58 µm, 58.5 µm, 59 µm, 59.5 µm, 60 µm, 60.5 µm, 61 µm, 61.5 µm, 62 µm, 62.5 µm, 63 µm, 63.5 µm, 64 µm, 64.5 µm, 65 µm, 65.5 µm, 66 µm, 66.5 µm, 67 µm, 67.5 µm, 68 µm, 68.5 µm, 69 µm, 69.5 µm, 70 µm, 70.5 µm, 71 µm, 71.5 µm, 72 µm, 72.5 µm, 73 µm, 73.5 µm, 74 µm, 74.5 µm, 75 µm, 75.5 µm, 76 µm, 76.5 µm, 77 µm, 77.5 µm, 78 µm, 78.5 µm, 79 µm, 79.5 µm, 80 µm, 80.5 µm, 81 µm, 81.5 µm, 82 µm, 82.5 µm, 83 µm, 83.5 µm, 84 µm, 84.5 µm, 85 µm, 85.5 µm, 86 µm, 86.5 µm, 87 µm, 87.5 µm, 88 µm, 88.5 µm, 89 µm, 89.5 µm, 90 µm, 90.5 µm, 91 µm, 91.5 µm, 92 µm, 92.5 µm, 93 µm, 93.5 µm, 94 µm, 94.5 µm, 95 µm, 95.5 µm, 96 µm, 96.5 µm, 97 µm, 97.5 µm, 98 µm, 98.5 µm, 99 µm, 99.5 µm, 100 µm, 200 µm, 300 µm, 400 µm, 500 µm, 600 µm, 700 µm, 800 µm, 900 µm, or 1 mm.

According to one embodiment, the average distance between two nanoparticles 3 in the same composite particle 1 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the nanoparticles 3 are ROHS compliant.

According to one embodiment, the nanoparticles 3 comprise less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the nanoparticles 3 comprise less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the nanoparticles 3 comprise less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the nanoparticles 3 are colloidal nanoparticles.

According to one embodiment, the nanoparticles 3 are electrically charged nanoparticles.

According to one embodiment, the nanoparticles 3 are not electrically charged nanoparticles.

According to one embodiment, the nanoparticles 3 are not positively charged nanoparticles.

According to one embodiment, the nanoparticles 3 are not negatively charged nanoparticles.

According to one embodiment, the nanoparticles 3 are organic nanoparticles.

According to one embodiment, the organic nanoparticles are composed of a material selected in the group of carbon nanotube, graphene and its chemical derivatives, graphyne, fullerenes, nanodiamonds, boron nitride nanotubes, boron nitride nanosheets, phosphorene and $Si_2BN$.

According to one embodiment, the organic nanoparticles comprise an organic material.

In one embodiment, the organic material is selected from polyacrylates; polymethacrylate; polyacrylamide; polyester; polyether; polyolefin (or polyalkene); polysaccharide; polyamide; or a mixture thereof; preferably the organic material is an organic polymer.

According to one embodiment, the organic material refers to any element and/or material containing carbon, preferably any element and/or material containing at least one carbon-hydrogen bond.

According to one embodiment, the organic material may be natural or synthetic.

According to one embodiment, the organic material is a small organic compound or an organic polymer.

According to one embodiment, the organic polymer is selected from polyacrylates; polymethacrylates; polyacrylamides; polyamides; polyesters; polyethers; polyoelfins; polysaccharides; polyurethanes (or polycarbamates), polystyrenes; polyacrylonitrile-butadiene-styrene (ABS); polycarbonate; poly(styrene acrylonitrile); vinyl polymers such as polyvinyl chloride; polyvinyl alcohol, polyvinyl acetate, polyvinylpyrrolidone, polyvinyl pyridine, polyvinylimidazole; poly(p-phenylene oxide); polysulfone; polyethersulfone; polyethylenimine; polyphenylsulfone; poly(acrylonitrile styrene acrylate); polyepoxides, polythiophenes, polypyrroles; polyanilines; polyaryletherketones; polyfurans; polyimides; polyimidazoles; polyetherimides; polyketones; polynucleotides; polystyrene sulfonates; polyetherimines; polyamic acid; or any combinations and/or derivatives and/or copolymers thereof.

According to one embodiment, the organic polymer is a polyacrylate, preferably selected from poly(methyl acrylate), poly(ethyl acrylate), poly(propyl acrylate), poly(butyl acrylate), poly(pentyl acrylate), and poly(hexyl acrylate).

According to one embodiment, the organic polymer is a polymethacrylate, preferably selected from poly(methyl methacrylate), poly(ethyl methacrylate), poly(propyl methacrylate), poly(butyl methacrylate), poly(pentyl methacrylate), and poly(hexyl methacrylate). According to one embodiment, the organic polymer is poly(methyl methacrylate) (PMMA).

According to one embodiment, the organic polymer is a polyacrylamide, preferably selected from poly(acrylamide); poly(methyl acrylamide), poly(dimethyl acrylamide), poly (ethyl acrylamide), poly(diethyl acrylamide), poly(propyl acrylamide), poly(isopropyl acrylamide); poly(butyl acrylamide); and poly(tert-butyl acrylamide).

According to one embodiment, the organic polymer is a polyester, preferably selected from poly(glycolic acid) (PGA), poly(lactic acid) (PLA), poly(caprolactone) (PCL), polyhydroxyalcanoate (PHA), polyhydroxybutyrate (PHB), polyethylene adipate, polybutylene succinate, poly(ethylene terephthalate), polybutylene terephthalate), poly(trimethylene terephthalate), polyarylate or any combination thereof.

According to one embodiment, the organic polymer is a polyether, preferably selected from aliphatic polyethers such as poly(glycol ether) or aromatic polyethers. According to one embodiment, the polyether is selected from poly(methylene oxide); poly(ethylene glycol)/poly(ethylene oxide), poly(propylene glycol) and poly(tetrahydrofuran).

According to one embodiment, the organic polymer is a polyolefin (or polyalkene), preferably selected from poly (ethylene), poly(propylene), poly(butadiene), poly(methylpentene), poly(butane) and poly(isobutylene).

According to one embodiment, the organic polymer is a polysaccharide selected from chitosan, dextran, hyaluronic acid, amylose, amylopectin, pullulan, heparin, chitin, cellulose, dextrin, starch, pectin, alginates, carrageenans, fucan, curdlan, xylan, polyguluronic acid, xanthan, arabinan, polymannuronic acid and their derivatives.

According to one embodiment, the organic polymer is a polyamide, preferably selected from polyc aprolac tame, polyauro amide, polyundec anamide, polytetramethylene adipamide, polyhexamethylene adipamide (also called nylon), polyhexamethylene nonanediamide, polyhexamethylene sebacamide, polyhexamethylene dodecanediamide; polydecamethylene sebacamide; Polyhexamethylene isophtalamide; Polymetaxylylene adipamide; Polymetaphenylene isophtalamide; Polyparaphenylene terephtalamide; polyphtalimides.

According to one embodiment, the organic polymer is a naturel or synthetic polymer.

According to one embodiment, the organic polymer is synthetized by organic reaction, radical polymerization, polycondensation, polyaddition, or ring opening polymerization (ROP).

According to one embodiment, the organic polymer is a homopolymer or a copolymer. According to one embodiment, the organic polymer is linear, branched, and/or cross-linked. According to one embodiment, the branched organic polymer is brush polymer (or also called comb polymer) or is a dendrimer.

According to one embodiment, the organic polymer is amorphous, semi-crystalline or crystalline. According to one embodiment, the organic polymer is a thermoplastic polymer or an elastomer.

According to one embodiment, the organic polymer is not a polyelectrolyte.

According to one embodiment, the organic polymer is not a hydrophilic polymer.

According to one embodiment, the organic polymer has an average molecular weight ranging from 2 000 g/mol to $5.10^6$ g/mol, preferably from 5 000 g/mol to $4.10^6$ g/mol; from 6 000 to $4.10^6$; from 7 000 to $4.10^6$; from 8 000 to $4.10^6$; from 9 000 to $4.10^6$; from 10 000 to $4.10^6$; from 15 000 to $4.10^6$; from 20 000 to $4.10^6$; from 25 000 to $4.10^6$; from 30 000 to $4.10^6$; from 35 000 to $4.10^6$; from 40 000 to $4.10^6$; from 45 000 to $4.10^6$; from 50 000 to $4.10^6$; from 55

000 to $4.10^6$; from 60 000 to $4.10^6$; from 65 000 to $4.10^6$; from 70 000 to $4.10^6$; from 75 000 to $4.10^6$; from 80 000 to $4.10^6$; from 85 000 to $4.10^6$; from 90 000 to $4.10^6$; from 95 000 to $4.10^6$; from 100 000 to $4.10^6$; from 200 000 to $4.10^6$; from 300 000 to $4.10^6$; from 400 000 to $4.10^6$; from 500 000 to $4.10^6$; from 600 000 to $4.10^6$; from 700 000 to $4.10^6$; from 800 000 to $4.10^6$; from 900 000 to $4.10^6$; from $1.10^6$ to $4.10^6$; from $2.10^6$ to $4.10^6$; from $3.10^6$ g/mol to $4.10^6$ g/mol.

According to one embodiment, the nanoparticles 3 are inorganic nanoparticles.

According to one embodiment, the nanoparticles 3 comprises an inorganic material. Said inorganic material is the same or different from the inorganic material 2.

According to one embodiment, the composite particle 1 comprises at least one inorganic nanoparticle and at least one organic nanoparticle.

According to one embodiment, the nanoparticles 3 are not ZnO nanoparticles.

According to one embodiment, the nanoparticles 3 are not metal nanoparticles.

According to one embodiment, the composite particle 1 does not comprise only metal nanoparticles.

According to one embodiment, the composite particle 1 does not comprise only magnetic nanoparticles.

According to one embodiment, the inorganic nanoparticles are colloidal nanoparticles.

According to one embodiment, the inorganic nanoparticles are amorphous.

According to one embodiment, the inorganic nanoparticles are crystalline.

According to one embodiment, the inorganic nanoparticles are totally crystalline.

According to one embodiment, the inorganic nanoparticles are partially crystalline.

According to one embodiment, the inorganic nanoparticles are monocrystalline.

According to one embodiment, the inorganic nanoparticles are polycrystalline. In this embodiment, each inorganic nanoparticle comprises at least one grain boundary.

According to one embodiment, the inorganic nanoparticles are nanocrystals.

According to one embodiment, the inorganic nanoparticles are semiconductor nanocrystals.

According to one embodiment, the inorganic nanoparticles are composed of a material selected in the group of metals, halides, chalcogenides, phosphides, sulfides, metalloids, metallic alloys, ceramics such as for example oxides, carbides, or nitrides. Said inorganic nanoparticles are prepared using protocols known to the person skilled in the art.

According to one embodiment, the inorganic nanoparticles are selected in the group of metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof. Said nanoparticles are prepared using protocols known to the person skilled in the art.

According to one embodiment, the inorganic nanoparticles are selected from metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof, preferably is a semiconductor nanocrystal.

According to one embodiment, a chalcogenide is a chemical compound consisting of at least one chalcogen anion selected in the group of O, S, Se, Te, Po, and at least one or more electropositive element.

According to one embodiment, the metallic nanoparticles are selected in the group of gold nanoparticles, silver nanoparticles, copper nanoparticles, vanadium nanoparticles, platinum nanoparticles, palladium nanoparticles, ruthenium nanoparticles, rhenium nanoparticles, yttrium nanoparticles, mercury nanoparticles, cadmium nanoparticles, osmium nanoparticles, chromium nanoparticles, tantalum nanoparticles, manganese nanoparticles, zinc nanoparticles, zirconium nanoparticles, niobium nanoparticles, molybdenum nanoparticles, rhodium nanoparticles, tungsten nanoparticles, iridium nanoparticles, nickel nanoparticles, iron nanoparticles, or cobalt nanoparticles.

According to one embodiment, examples of carbide nanoparticles include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide nanoparticles include but are not limited to: $SiO_2$, $Al_2O_3$, $TiO_2$, $ZrO_2$, ZnO, MgO, $SnO_2$, $Nb_2O_5$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide nanoparticles include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride nanoparticles include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide nanoparticles include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $AS_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide nanoparticles include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide nanoparticles include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, RhS2, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2O_5$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, $SiO_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sna_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide nanoparticles include but are not limited to: InP, $Cd_3P_2$, $Zn_3P_2$, AlP, GaP, TlP, or a mixture thereof.

According to one embodiment, examples of metalloid nanoparticles include but are not limited to: Si, B, Ge, As, Sb, Te, or a mixture thereof.

According to one embodiment, examples of metallic alloy nanoparticles include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the nanoparticles 3 are nanoparticles comprising hygroscopic materials such as for example phosphor materials or scintillator materials.

According to one embodiment, the nanoparticles 3 are perovskite nanoparticles.

According to one embodiment, perovskites comprise a material $A_mB_nX_{3p}$, wherein A is selected from the group consisting of Ba, B, K, Pb, Cs, Ca, Ce, Na, La, Sr, Th, FA (formamidinium $CN_2H_5^+$), or a mixture thereof; B is selected from the group consisting of Fe, Nb, Ti, Pb, Sn, Ge, Bi, Zr, or a mixture thereof; X is selected from the group consisting of O, Cl, Br, I, cyanide, thiocyanate, or a mixture thereof; m, n and p are independently a decimal number from 0 to 5; m, n and p are not simultaneously equal to 0; m and n are not simultaneously equal to 0.

According to one embodiment, m, n and p are not equal to 0.

According to one embodiment, examples of perovskites include but are not limited to: $Cs_3Bi_2I_9$, $Cs_3Bi_2Cl_9$, $Cs_3Bi_2Br_9$, $BFeO_3$, $KNbO_3$, $BaTiO_3$, $CH_3NH_3PbI_3$, $CH_3NH_3PbCl_3$, $CH_3NH_3PbBr_3$, $FAPbBr_3$ (with FA formamidinium), $FAPbCl_3$, $FAPbI_3$, $CsPbCl_3$, $CsPbBr_3$, $CsPbI_3$, $CsSnI_3$, $CsSnCl_3$, $CsSnBr_3$, $CsGeCl_3$, $CsGeBr_3$, $CsGeI_3$, $FAPbCl_xBr_yI_z$ (with x, y and z independent decimal number from 0 to 5 and not simultaneously equal to 0).

According to one embodiment, the nanoparticles 3 are phosphor nanoparticles.

According to one embodiment, the inorganic nanoparticles are phosphor nanoparticles.

According to one embodiment, examples of phosphor nanoparticles include but are not limited to:

- rare earth doped garnets or garnets such as for example $Y_3Al_5O_{12}$, $Y_3Ga_5O_{12}$, $Y_3Fe_2(FeO_4)_3$, $Y_3Fe_5O_{12}$, $Y_4Al_2O_9$, $YAlO_3$, $RE_{3-n}Al_5O_{12}:Ce_n$ (RE=Y, Gd, Tb, Lu), $Gd_3Al_5O_{12}$, $Gd_3Ga_5O_{12}$, $Lu_3Al_5O_{12}$, $Fe_3Al_2(SiO_4)_3$, $(Lu_{(1-x-y)}A_xCe_y)_3B_zAl_5O_{12}C_{2z}$ with A=at least one of Sc, La, Gd, Tb or mixture thereof, B at least one of Mg, Sr, Ca, Ba or mixture thereof, C at least one of F, C, Br, I or mixture thereof, $0 \leq x \leq 0.5$, $0.001 \leq y \leq 0.2$, and $0.001 \leq z \leq 0.5$, $(Lu_{0.90}Gd_{0.07}Ce_{0.03})_3Sr_{0.34}Al_5O_{12}F_{0.68}$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, TAG, GAL, LuAG, YAG;
- doped nitridres such as europium doped $CaAlSiN_3$, $Sr(LiAl_3N_4)$:Eu, $SrMg_3SiN_4$:Eu, $La_3Si_6N_{11}$:Ce, $La_3Si_6N_{11}$:Ce, (Ca,Sr)$AlSiN_3$:Eu, $(Ca_{0.2}Sr_{0.8})AlSiN_3$, (Ca, Sr, Ba)$_2Si_5N_8$:Eu;
- sulfide-based phosphors such as for example CaS:$Eu^{2+}$, SrS:$Eu^{2+}$;
- $A_2(MF_6)$ $Mn^{4+}$ wherein A comprises Na, K, Rb, Cs, or $NH_4$ and M comprises Si, Ti, Zr, or Mn, such as for example $Mn^{4+}$ doped potassium fluorosilicate (PFS), $K_2(SiF_6)$:$Mn^{4+}$ or $K_2(TiF_6)$:$Mn^{4+}$, $Na_2SnF_6$:$Mn^{4+}$, $Cs_2SnF_6$:$Mn^{4+}$, $Na_2SiF_6$:$Mn^{4+}$, $Na_2GeF_6$:$Mn^{4+}$;
- oxinitrides such as for example europium doped (Li, Mg, Ca, Y)-α-SiAlON, $SrAl_2Si_3ON_6$:Eu, $Eu_xSi_{6-z}Al_zO_yN_{8-y}$ (y=z-2x), $Eu_{0.018}Si_{5.77}Al_{0.23}O_{0.194}N_{7.806}$, $SrSi_2O_2N_2$:$Eu^{2+}$, $Pr^{3+}$ activated β-SiAlON:Eu;
- silicates such as for example $A_2Si(OD)_4$:Eu with A=Sr, Ba, Ca, Mg, Zn or mixture thereof and D=F, Cl, S, N, Br or mixture thereof, $(SrBaCa)_2SiO_4$:Eu, $Ba_2MgSi_2O_7$:Eu, $Ba_2SiO_4$:Eu, $Sr_3SiO_5$, $(Ca,Ce)_3(Sc,Mg)_2Si_3O_{12}$;
- carbonitrides such as for example $Y_2Si_4N_6C$, $CsLnSi(CN_2)_4$:Eu with Ln=Y, La or Gd;
- oxycarbonitrides such as for example $Sr_2Si_5N_{8-[(4x/3)+z]}C_xO_{3z/2}$ wherein $0 \leq x \leq 5.0$, $0.06 < z \leq 0.1$, and $x \neq 3z/2$;
- europium aluminates such as for example $EuAl_6O_{10}$, $EuAl_2O_4$;
- barium oxides such as for example $Ba_{0.93}Eu_{0-07}Al_2O_4$;
- blue phosphors such as for example ($BaMgAl_{10}O_{17}$:Eu), $Sr_5(PO_4)_3Cl$:Eu, AlN:Eu:, $LaSi_3N_5$:Ce, $SrSi_9Al_{19}ON_{31}$:Eu, $SrSi_{6-x}Al_xO_{1+x}N_{8-x}$:Eu;
- halogenated garnets such as for example $(Lu_{1-a-b-c}Y_aTb_bA_c)_3(Al_{1-d}B_d)_5(O_{1-e}C_e)_{12}$; Ce, Eu, where A is selected from the group consisting of Mg, Sr, Ca, Ba or mixture thereof; B is selected from the group consisting of Ga, In or mixture thereof; C is selected from the group consisting of F, Cl, Br or mixture thereof; and $0 \leq a \leq 1$; $0 \leq b \leq 1$; $0 < c \leq 0.5$; $0 \leq d \leq 1$; and $0 < e \leq 0.2$;

$((Sr_{1-z}M_z)_{1-(x+w)}A_wCe_x)_3(Al_{1-y}Si_y)O_{4+y+3(x-w)}F_{1-y-3(x-w)}$, wherein $0 < x \leq 0.10$, $0 \leq y \leq 0.5$, $0 \leq z \leq 0.5$, $0 \leq w \leq x$, A comprises Li, Na, K, Rb or mixture thereof; and M comprises Ca, Ba, Mg, Zn, Sn or mixture thereof, $(Sr_{0.98}Na_{0.01}Ce_{0.01})_3(Al_{0.9}Si_{0.1})O_{4.1}F_{0.9}$, $(Sr_{0.595}Ca_{0.4}Ce_{0.005})_3(Al_{0.6}Si_{0.4})O_{4.415}F_{0.585}$;

rare earth doped nanoparticles;

doped nanoparticles;

any phosphors known by the skilled artisan;

or a mixture thereof.

According to one embodiment, examples of phosphor nanoparticles include but are not limited to:

- blue phosphors such as for example $BaMgAl_{10}O_{17}:Eu^{2+}$ or $Co^{2+}$, $Sr_5(PO_4)_3Cl:Eu^{2+}$, $AlN:Eu^{2+}$, $LaSi_3N_5:Ce^{3+}$, $SrSi_9Al_{19}ON_{31}:Eu^{2+}$, $SrSi_{6-x}Al_xO_{1+x}N_{8-x}Eu^{2+}$;
- red phosphors such as for example $Mn^{4+}$ doped potassium fluorosilicate (PFS), carbidonitrides, nitrides, sulfides (CaS), $CaAlSiN_3:Eu^{3+}$, $(Ca,Sr)AlSiN_3:Eu^{3+}$, $(Ca, Sr, Ba)_2Si_5N_8:Eu^{3+}$, $SrLiAl_3N_4:Eu^{3+}$, $SrMg_3SiN_4:Eu^{3+}$, red emitting silicates;
- orange phosphors such as for example orange emitting silicates, Li, Mg, Ca, or Y doped α-SiAlON;
- green phosphors such as for example oxynitrides, carbidonitrides, green emitting silicates, LuAG, green GAL, green YAG, green GaYAG, β-SiAlON:$Eu^{2+}$, $SrSi_2O_2N_2:Eu^{2+}$; and
- yellow phosphors such as for example yellow emitting silicates, TAG, yellow YAG, $La_3Si_6N_{11}:Ce^{3+}$ (LSN), yellow GAL.

According to one embodiment, examples of phosphor nanoparticles include but are not limited to: blue phosphors; red phosphors; orange phosphors; green phosphors; and yellow phosphors.

According to one embodiment, the phosphor nanoparticle has an average size of at least 0.5 nm, 1 nm, 2 nm, 3 nm, 4 nm, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, 20 nm, 21 nm, 22 nm, 23 nm, 24 nm, 25 nm, 26 nm, 27 nm, 28 nm, 29 nm, 30 nm, 31 nm, 32 nm, 33 nm, 34 nm, 35 nm, 36 nm, 37 nm, 38 nm, 39 nm, 40 nm, 41 nm, 42 nm, 43 nm, 44 nm, 45 nm, 46 nm, 47 nm, 48 nm, 49 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the phosphor nanoparticles have an average size ranging from 0.1 μm to 50 μm.

According to one embodiment, the composite particle 1 comprises one phosphor nanoparticle.

According to one embodiment, the nanoparticles 3 are scintillator nanoparticles.

According to one embodiment, examples of scintillator nanoparticles include but are not limited to: NaI(Tl) (thallium-doped sodium iodide), CsI(Tl), CsI(Na), CsI(pure), CsF, KI(Tl), LiI(Eu), $BaF_2$, $CaF_2$(Eu), ZnS(Ag), $CaWO_4$, $CdWO_4$, YAG(Ce) ($Y_3Al_5O_{12}$(Ce)), GSO, LSO, $LaCl_3$(Ce) (lanthanum chloride doped with cerium), $LaBr_3$(Ce) (cerium-doped lanthanum bromide), LYSO ($Lu_{1.8}Y_{0.2}SiO_5$(Ce)), or a mixture thereof.

According to one embodiment, the nanoparticles 3 are metal nanoparticles (gold, silver, aluminum, magnesium, or copper, alloys).

According to one embodiment, the nanoparticles 3 are inorganic semiconductors or insulators which can be coated with organic compounds.

According to one embodiment, the inorganic semiconductor or insulator can be, for instance, group IV semiconductors (for instance, Carbon, Silicon, Germanium), group III-V compound semiconductors (for instance, Gallium Nitride, Indium Phosphide, Gallium Arsenide), II-VI compound semiconductors (for instance, Cadmium Selenide, Zinc Selenide, Cadmium Sulfide, Mercury Telluride), inorganic oxides (for instance, Indium Tin Oxide, Aluminum Oxide, Titanium Oxide, Silicon Oxide), and other chalcogenides.

According to one embodiment, the semiconductor nanocrystals comprise a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystals comprise a core comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the semiconductor nanocrystals comprise a material of formula $M_xN_yE_zA_w$, wherein M and/or N is selected from the group consisting of Ib, IIa, IIb, IIIa, IIIb, IVa, IVb, Va, Vb, VIb, VIIb, VIII, or mixtures thereof; E and/or A is selected from the group consisting of Va, VIa, VIIa, or mixtures thereof; x, y, z and w are independently a decimal number from 0 to 5; x, y, z and w are not simultaneously equal to 0; x and y are not simultaneously equal to 0; z and w may not be simultaneously equal to 0.

According to one embodiment, w, x, y and z are independently a decimal number from 0 to 5, at the condition that when w is 0, x, y and z are not 0, when x is 0, w, y and z are not 0, when y is 0, w, x and z are not 0 and when z is 0, w, x and y are not 0.

According to one embodiment, the semiconductor nanocrystals comprise a material of formula $M_xE_y$, wherein M is selected from group consisting of Cd, Zn, Hg, Ge, Sn, Pb, Cu, Ag, Fe, In, Al, Ti, Mg, Ga, Tl, Mo, Pd, W, Cs, Pb, or a mixture thereof; x and y are independently a decimal number from 0 to 5, at the condition that x and y are not simultaneously equal to 0, and $x \neq 0$.

According to one embodiment, the semiconductor nanocrystals comprise a material of formula $M_xE_y$, wherein E is selected from group consisting of S, Se, Te, O, P, C, N, As, Sb, F, Cl, Br, I, or a mixture thereof; x and y are independently a decimal number from 0 to 5, at the condition that x and y are not simultaneously equal to 0, and $x \neq 0$.

According to one embodiment, the semiconductor nanocrystals are selected from the group consisting of a IIb-VIa, IVa-VIa, Ib-IIIa-VIa, IIb-IVa-Va, Ib-VIa, VIII-VIa, IIb-Va, IIIa-VIa, IVb-VIa, IIa-VIa, IIIa-Va, IIIa-VIa, VIb-VIa, and Va-VIa semiconductor.

According to one embodiment, the semiconductor nanocrystals comprise a material $M_xN_yE_zA_w$ selected from the group consisting of CdS, CdSe, CdTe, ZnS, ZnSe, ZnTe, HgS, HgSe, HgTe, HgO, GeS, GeSe, GeTe, SnS, SnSe, SnTe, PbS, PbSe, PbTe, $GeS_2$, $GeSe_2$, $SnS_2$, $SnSe_2$, $CuInS_2$, $CuInSe_2$, $AgInS_2$, $AgInSe_2$, CuS, $Cu_2S$, $Ag_2S$, $Ag_2Se$, $Ag_2Te$, FeS, $FeS_2$, InP, $Cd_3P_2$, $Zn_3P_2$, CdO, ZnO, FeO, $Fe_2O_3$, $Fe_3O_4$, $Al_2O_3$, $TiO_2$, MgO, MgS, MgSe, MgTe, AlN, AlP, AlAs, AlSb, GaN, GaP, GaAs, GaSb, InN, InP, InAs, InSb, TlN, TlP, TlAs, TlSb, $MoS_2$, PdS, $Pd_4S$, $WS_2$, $CsPbCl_3$, $PbBr_3$, $CsPbBr_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, the inorganic nanoparticles are semiconductor nanoplatelets, nanosheets, nanoribbons, nanowires, nanodisks, nanocubes, nanorings, magic size clusters, or spheres such as for example quantum dots.

According to one embodiment, the inorganic nanoparticles are semiconductor nanoplatelets, nanosheets, nanoribbons, nanowires, nanodisks, nanocubes, magic size clusters, or nanorings.

According to one embodiment, the inorganic nanoparticle comprises an initial nanocrystal.

According to one embodiment, the inorganic nanoparticle comprises an initial colloidal nanocrystal.

According to one embodiment, the inorganic nanoparticle comprises an initial nanoplatelet.

According to one embodiment, the inorganic nanoparticle comprises an initial colloidal nanoplatelet.

According to one embodiment, the inorganic nanoparticles are core nanoparticles, wherein each core is not partially or totally covered with at least one shell comprising at least one layer of inorganic material.

According to one embodiment, the inorganic nanoparticles are core 33 nanocrystals, wherein each core 33 is not partially or totally covered with at least one shell 34 comprising at least one layer of inorganic material.

According to one embodiment, the inorganic nanoparticles are core/shell nanoparticles, wherein the core is partially or totally covered with at least one shell comprising at least one layer of inorganic material.

According to one embodiment, the inorganic nanoparticles are core 33/shell 34 nanocrystals, wherein the core 33 is partially or totally covered with at least one shell 34 comprising at least one layer of inorganic material.

According to one embodiment, the core/shell semiconductor nanocrystals comprise at least one shell 34 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the shell 34 comprises a different material than the material of core 33.

According to one embodiment, the shell 34 comprises the same material than the material of core 33.

According to one embodiment, the core/shell semiconductor nanocrystals comprise two shells (34, 35) comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the shells (34, 35) comprise different materials.

According to one embodiment, the shells (34, 35) comprise the same material.

According to one embodiment, the core/shell semiconductor nanocrystals comprise at least one shell comprising a material of formula $M_xN_yE_zA_w$, wherein M, N, E and A are as described hereabove.

According to one embodiment, examples of core/shell semiconductor nanocrystals include but are not limited to: CdSe/CdS, CdSe/$Cd_xZn_i$,S, CdSe/CdS/ZnS, CdSe/ZnS/CdS, CdSe/ZnS, CdSe/$Cd_xZn_{1-x}S$/ZnS, CdSe/ZnS/$Cd_xZn_{1-x}S$, CdSe/CdS/$Cd_xZn_{1-x}S$, CdSe/ZnSe/ZnS, CdSe/ZnSe/$Cd_xZn_{1-x}S$, $CdSe_xS_{1-x}$/CdS, $CdSe_xS_{1-x}$/CdZnS, $CdSe_xS_{1-x}$/CdS/ZnS, $CdSe_xS_{1-x}$/ZnS/CdS, $CdSe_xS_{1-x}$/ZnS, $CdSe_xS_{1-x}$/$Cd_xZn_{1-x}S$/ZnS, $CdSe_xS_{1-x}$/ZnS/$Cd_xZn_{1-x}S$, $CdSe_xS_{1-x}$/CdS/$Cd_xZn_{1-x}S$, $CdSe_xS_{1-x}$/ZnSe/ZnS, $CdSe_xS_{1-x}$/ZnSe/$Cd_xZn_{1-x}S$, InP/CdS, InP/$Cd_xZn_{1-x}S$, InP/CdS/ZnS, InP/ZnS/CdS, InP/ZnS, InP/$Cd_xZn_{1-x}S$/ZnS, InP/ZnS/$Cd_xZn_{1-x}S$, InP/CdS/$Cd_xZn_{1-x}S$, InP/CdS/ZnSe/ZnS, InP/ZnSe, InP/ZnSe/ZnS, InP/ZnSe/$Cd_xZn_{1-x}S$, InP/$ZnSe_xS_{1-x}$, InP/GaP/ZnS, $In_xZn_{1-x}P$/ZnS, $In_xZn_{1-x}P$/ZnS, InP/GaP/ZnSe, InP/ZnS/ZnSe, InP/GaP/ZnSe/ZnS, InP/ZnS/ZnSe/ZnS, wherein x is a decimal number from 0 to 1.

According to one embodiment, the core/shell semiconductor nanocrystals are ZnS rich, i.e. the last monolayer of the shell is a ZnS monolayer.

According to one embodiment, the core/shell semiconductor nanocrystals are CdS rich, i.e. the last monolayer of the shell is a CdS monolayer.

According to one embodiment, the core/shell semiconductor nanocrystals are $Cd_xZn_{1-x}S$ rich, i.e. the last monolayer of the shell is a $Cd_xZn_{1-x}S$ monolayer, wherein x is a decimal number from 0 to 1.

According to one embodiment, the last atomic layer of the semiconductor nanocrystals is a cation-rich monolayer of cadmium, zinc or indium.

According to one embodiment, the last atomic layer of the semiconductor nanocrystals is an anion-rich monolayer of sulfur, selenium or phosphorus.

According to one embodiment, the inorganic nanoparticles are core/crown semiconductor nanocrystals.

According to one embodiment, the core/crown semiconductor nanocrystals comprise at least one crown 37 comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

According to one embodiment, the core/crown semiconductor nanocrystals comprise at least one crown comprising a material of formula $M_xN_yE_zA_w$, wherein M, N, E and A are as described hereabove.

According to one embodiment, the crown 37 comprises a different material than the material of core 33.

According to one embodiment, the crown 37 comprises the same material than the material of core 33.

According to one embodiment, the semiconductor nanocrystal is atomically flat. In this embodiment, the atomically flat semiconductor nanocrystal may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystal comprises an initial nanoplatelet.

According to one embodiment, the semiconductor nanocrystal comprises an initial colloidal nanoplatelet.

According to one embodiment, the nanoparticles 3 comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the inorganic nanoparticles comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanocrystals comprise at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the composite particle 1 comprises at least 1%, 5%, 10%, 15%, 20%, 25%, 30%, 35%, 40%, 45%, 50%, 55%, 60%, 65%, 70%, 75%, 80%, 85%, 90%, 95%, or 100% of semiconductor nanoplatelets.

According to one embodiment, the semiconductor nanocrystal comprises an atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanocrystals are semiconductor nanoplatelets.

According to one embodiment, the semiconductor nanoplatelets are atomically flat. In this embodiment, the atomically flat nanoplatelet may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence or any other characterization means known by the person skilled in the art.

According to one embodiment, the semiconductor nanoplatelet comprises an atomically flat core. In this embodiment, the atomically flat core may be evidenced by transmission electron microscopy or fluorescence scanning microscopy, energy-dispersive X-ray spectroscopy (EDS), X-Ray photoelectron spectroscopy (XPS), UV photoelectron spectroscopy (UPS), electron energy loss spectroscopy (EELS), photoluminescence, or any other characterization means known by the person skilled in the art.

According to one embodiment, the semiconductor nanoplatelets are quasi-2D.

According to one embodiment, the semiconductor nanoplatelets are 2D-shaped.

According to one embodiment, the semiconductor nanoplatelets have a thickness tuned at the atomic level.

According to one embodiment, the semiconductor nanoplatelet comprises an initial nanocrystal.

According to one embodiment, the semiconductor nanoplatelet comprises an initial colloidal nanocrystal.

According to one embodiment, the semiconductor nanoplatelet comprises an initial nanoplatelet.

According to one embodiment, the semiconductor nanoplatelet comprises an initial colloidal nanoplatelet.

According to one embodiment, the core 33 of the semiconductor nanoplatelets is an initial nanoplatelet.

According to one embodiment, the initial nanoplatelet comprises a material of formula $M_xN_yE_zA_w$, wherein M, N, E and A are as described hereabove.

According to one embodiment, the thickness of the initial nanoplatelet comprises an alternate of atomic layers of M and E.

According to one embodiment, the thickness of the initial nanoplatelet comprises an alternate of atomic layers of M, N, A and E.

According to one embodiment, a semiconductor nanoplatelet comprises an initial nanoplatelet partially or completely covered with at least one layer of additional material.

According to one embodiment, the at least one layer of additional material comprises a material of formula $M_xN_yE_zA_w$, wherein M, N, E and A are as described hereabove.

According to one embodiment, a semiconductor nanoplatelet comprises an initial nanoplatelet partially or completely covered on a least one facet by at least one layer of additional material.

In one embodiment wherein several layers cover all or part of the initial nanoplatelet, these layers can be composed of the same material or composed of different materials.

In one embodiment wherein several layers cover all or part of the initial nanoplatelet, these layers can be composed such as to form a gradient of materials.

In one embodiment, the initial nanoplatelet is an inorganic colloidal nanoplatelet.

In one embodiment, the initial nanoplatelet comprised in the semiconductor nanoplatelet has preserved its 2D structure.

In one embodiment, the material covering the initial nanoplatelet is inorganic.

In one embodiment, at least one part of the semiconductor nanoplatelet has a thickness greater than the thickness of the initial nanoplatelet.

In one embodiment, the semiconductor nanoplatelet comprises the initial nanoplatelet totally covered with at least one layer of material.

In one embodiment, the semiconductor nanoplatelet comprises the initial nanoplatelet totally covered with a first layer of material, said first layer being partially or completely covered with at least a second layer of material.

In one embodiment, the initial nanoplatelet has a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the thickness of the initial nanoplatelet is smaller than at least one of the lateral dimensions (length or width) of the initial nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100; at least 150; at least 200; at least 250; at least 300; at least 350; at least 400; at least 450; at least 500; at least 550; at least 600; at least 650; at least 700; at least 750; at least 800; at least 850; at least 900; at least 950; or at least 1000.

In one embodiment, the initial nanoplatelet has lateral dimensions of at least 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 82 m, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the semiconductor nanoplatelets have a thickness of at least 0.3 nm, 0.4 nm, 0.5 nm, 0.6 nm, 0.7 nm, 0.8 nm, 0.9 nm, 1.0 nm, 1.1 nm, 1.2 nm, 1.3 nm, 1.4 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, or 500 nm.

According to one embodiment, the semiconductor nanoplatelets have lateral dimensions of at least 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm, 105 nm, 110 nm, 115 nm, 120 nm, 125 nm, 130 nm, 135 nm, 140 nm, 145 nm, 150 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 mm.

According to one embodiment, the thickness of the semiconductor nanoplatelet is smaller than at least one of the lateral dimensions (length or width) of the semiconductor nanoplatelet by a factor (aspect ratio) of at least 1.5; of at least 2; at least 2.5; at least 3; at least 3.5; at least 4; at least 4.5; at least 5; at least 5.5; at least 6; at least 6.5; at least 7; at least 7.5; at least 8; at least 8.5; at least 9; at least 9.5; at least 10; at least 10.5; at least 11; at least 11.5; at least 12; at least 12.5; at least 13; at least 13.5; at least 14; at least 14.5; at least 15; at least 15.5; at least 16; at least 16.5; at least 17; at least 17.5; at least 18; at least 18.5; at least 19; at least 19.5; at least 20; at least 25; at least 30; at least 35; at least 40; at least 45; at least 50; at least 55; at least 60; at least 65; at least 70; at least 75; at least 80; at least 85; at least 90; at least 95; at least 100, at least 150, at least 200, at least 250, at least 300, at least 350, at least 400, at least 450, at least 500, at least 550, at least 600, at least 650, at least 700, at least 750, at least 800, at least 850, at least 900, at least 950, or at least 1000.

According to one embodiment, the semiconductor nanoplatelets are obtained by a process of growth in the thickness of at least one face of at least one initial nanoplatelet by deposition of a film or a layer of material on the surface of the at least one initial nanoplatelet; or a process lateral growth of at least one face of at least one initial nanoplatelet by deposition of a film or a layer of material on the surface of the at least one initial nanoplatelet; or any methods known by the person skilled in the art.

In one embodiment, the semiconductor nanoplatelet can comprise the initial nanoplatelet and 1, 2, 3, 4, 5 or more layers covering all or part of the initial nanoplatelet, said layers begin of same composition as the initial nanoplatelet or being of different composition than the initial nanoplatelet or being of different composition one another.

In one embodiment, the semiconductor nanoplatelet can comprise the initial nanoplatelet and at least 1, 2, 3, 4, 5 or more layers in which the first deposited layer covers all or part of the initial nanoplatelet and the at least second deposited layer covers all or part of the previously deposited layer, said layers being of same composition as the initial nanoplatelet or being of different composition than the initial nanoplatelet and possibly of different compositions one another.

According to one embodiment, the semiconductor nanoplatelets have a thickness quantified by a $M_xN_yE_zA_w$ monolayer, wherein M, N, E and A are as described hereabove.

According to one embodiment, the core 33 of the semiconductor nanoplatelets have a thickness of at least 1 $M_xN_yE_zA_w$ monolayer, at least 2 $M_xN_yE_zA_w$ monolayers, at least 3 $M_xN_yE_zA_w$ monolayers, at least 4 $M_xN_yE_zA_w$ monolayers, at least 5 $M_xN_yE_zA_w$ monolayers, wherein M, N, E and A are as described hereabove.

According to one embodiment, the shell 34 of the semiconductor nanoplatelets have a thickness quantified by a $M_xN_yE_zA_w$ monolayer, wherein M, N, E and A are as described hereabove, wherein M, N, E and A are as described hereabove.

According to one embodiment, the composite particle 1 further comprises at least one dense particle dispersed in the inorganic material 2. In this embodiment, said at least one dense particle comprises a dense material with a density superior to the density of the inorganic material 2.

According to one embodiment, the dense material has a bandgap superior or equal to 3 eV.

According to one embodiment, examples of dense material include but are not limited to: oxides such as for example tin oxide, silicon oxide, germanium oxide, aluminium oxide, gallium oxide, hafmium oxide, titanium oxide, tantalum oxide, ytterbium oxide, zirconium oxide, yttrium oxide, thorium oxide, zinc oxide, lanthanide oxides, actinide oxides, alkaline earth metal oxides, mixed oxides, mixed oxides thereof; metal sulfides; carbides; nitrides; or a mixture thereof.

According to one embodiment, the at least one dense particle has a maximal packing fraction of 70%, 60%, 50%, 40%, 30%, 20%, 10% or 1%.

According to one embodiment, the at least one dense particle has a density of at least 3, 4, 5, 6, 7, 8, 9 or 10.

According to a preferred embodiment, examples of composite particle 1 include but are not limited to: semiconductor nanoparticles encapsulated in an inorganic material, semiconductor nanocrystals encapsulated in an inorganic material, semiconductor nanoplatelets encapsulated in an inorganic material, perovskite nanoparticles encapsulated in an inorganic material, phosphor nanoparticles encapsulated in an inorganic material, semiconductor nanoplatelets coated with grease and then in an inorganic material such as for example $Al_2O_3$, or a mixture thereof. In this embodiment, grease can refer to lipids as, for example, long apolar carbon chain molecules; phosphlipid molecules that possess a charged end group; polymers such as block copolymers or copolymers, wherein one portion of polymer has a domain of long apolar carbon chains, either part of the backbone or part of the polymeric sidechain; or long hydrocarbon chains that have a terminal functional group that includes carboxylates, sulfates, phosphonates or thiols.

According to a preferred embodiment, examples of composite particle 1 include but are not limited to: CdSe/CdZnS@$SiO_2$, CdSe/CdZnS@$Si_xCd_yZn_zO_w$, CdSe/CdZnS@$Al_2O_3$, InP/ZnS@$Al_2O_3$, $CH_5N_2$—$PbBr_3$@$Al_2O_3$, CdSe/CdZnS—Au@$SiO_2$, $Fe_3O_4$@$Al_2O_3$—CdSe/CdZnS@$SiO_2$, CdS/ZnS@$Al_2O_3$, CdSeS/CdZnS@$Al_2O_3$, CdSe/CdS/ZnS@$Al_2\mathbf{0}_3$, InP/ZnSe/ZnS@$Al_2I_3$, $CuInS_2$/ZnS@$Al_2O_3$, $CuInSe_2$/ZnS@$Al_2O_3$, CdSe/CdS/ZnS@$SiO_2$, CdSeS/ZnS@$Al_2O_3$, CdSeS/CdZnS@$SiO_2$, InP/ZnS@$SiO_2$, CdSeS/CdZnS@$SiO_2$, InP/ZnSe/ZnS@$SiO_2$, $Fe_3O_4$@$Al_2O_3$, CdSe/CdZnS@ZnO, CdSe/CdZnS@ZnO, CdSe/CdZnS@$Al_2O_3$ @MgO, CdSe/CdZnS—$Fe_3O_4$@$SiO_2$, phosphor nanoparticles @$Al_2O_3$, phosphor nanoparticles@ZnO, phosphor nanoparticles@$SiO_2$, phosphor nanoparticles@$HfO_2$, CdSe/CdZnS@$HfO_2$, CdSeS/CdZnS@$HfO_2$, InP/ZnS@$HfO_2$, CdSeS/CdZnS@$HfO_2$, InP/ZnSe/ZnS@$HfO_2$, CdSe/CdZnS—$Fe_3O_4$@$HfO_2$, CdSe/CdS/ZnS@$SiO_2$, or a mixture thereof; wherein phosphor nanoparticles include but are not limited to: Yttrium aluminium garnet particles (YAG, $Y_3Al_5O_{12}$), (Ca,Y)-α-SiAlON:Eu particles, ($(Y,Gd)_3(Al,Ga)_5O_{12}$:Ce) particles, $CaAlSiN_3$:Eu particles, sulfide-based phosphor particles, PFS:$Mn^{4+}$ particles (potassium fluorosilicate).

According to one embodiment, the composite particle 1 does not comprise quantum dots encapsulated in $TiO_2$, semiconductor nanocrystals encapsulated in $TiO_2$, or semiconductor nanoplatelet encapsulated in $TiO_2$, According to one embodiment, the composite particle 1 does not comprise a spacer layer between the nanoparticles 3 and the inorganic material 2.

According to one embodiment, the composite particle 1 does not comprise one core/shell nanoparticle wherein the core is luminescent and emits red light, and the shell is a spacer layer between the nanoparticles 3 and the inorganic material 2.

According to one embodiment, the composite particle 1 does not comprise a core/shell nanoparticle and a plurality of nanoparticles 3, wherein the core is luminescent and emits red light, and the shell is a spacer layer between the nanoparticles 3 and the inorganic material 2.

According to one embodiment, the composite particle 1 does not comprise at least one luminescent core, a spacer layer, an encapsulation layer and a plurality of quantum dots, wherein the luminescent core emits red light, and the spacer layer is situated between said luminescent core and the inorganic material 2.

According to one embodiment, the composite particle 1 does not comprise a luminescent core sourrounded by a spacer layer and emitting red light.

According to one embodiment, the composite particle 1 does not comprise nanoparticles covering or surrounding a luminescent core.

According to one embodiment, the composite particle 1 does not comprise nanoparticles covering or surrounding a luminescent core emitting red light.

According to one embodiment, the composite particle 1 does not comprise a luminescent core made by a specific material selected from the group consisting of silicate phosphor, aluminate phosphor, phosphate phosphor, sulfide phosphor, nitride phosphor, nitrogen oxide phosphor, and combination of aforesaid two or more materials; wherein said luminescent core is covered by a spacer layer.

According to one embodiment, the nanoparticles 3 emit a secondary light having a different wavelength as the primary light.

FIG. 6A illustrates the light emitting material 7 comprising at least one composite particle 1 surrounded by a surrounding medium 71.

According to one embodiment, the at least one surrounding medium 71 surrounds, encapsulates and/or covers partially or totally at least one composite particle 1.

According to one embodiment, the light emitting material 7 further comprises a plurality of composite particles 1.

According to one embodiment illustrated in FIG. 7C-D, the light emitting material 7 comprises at least two surrounding media (71, 72). In this embodiment, the surrounding medium 71 is different from the surrounding medium 72.

According to one embodiment, the light emitting material 7 comprises a plurality of surrounding media (71, 72).

According to one embodiment, the plurality of composite particles 1 are uniformly dispersed in the at least one surrounding medium 71.

According to one embodiment, the loading charge of composite particles 1 in the at least one surrounding medium 71 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of composite particles 1 in the at least one surrounding medium 71 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the composite particles 1 dispersed in the at least one surrounding medium 71 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the composite particles 1 dispersed in the at least one surrounding medium 71 have a packing fraction of less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the composite particles 1 are adjoigning, are in contact.

According to one embodiment, the composite particles 1 do not touch, are not in contact.

According to one embodiment in the same surrounding medium 71, the composite particles 1 do not touch, are not in contact.

According to one embodiment, the composite particles 1 are separated by the at least one surrounding medium 71.

According to one embodiment, the composite particles 1 can be individually evidenced for example by conventional microscopy, transmission electron microscopy, scanning transmission electron microscopy, scanning electron microscopy, or fluorescence scanning microscopy.

According to one embodiment, each composite particle 1 of the plurality of composite 1 particles is spaced from its adjacent composite particle 1 by an average minimal distance.

According to one embodiment, the average minimal distance between two composite particles 1 is controlled.

According to one embodiment, the average minimal distance between two composite particles 1 in the at least one surrounding medium 71 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two composite particles 1 in the at least one surrounding medium 71 is at least 1 nm, 1.5 nm, 2 nm, 2.5 nm, 3 nm, 3.5 nm, 4 nm, 4.5 nm, 5 nm, 5.5 nm, 6 nm, 6.5 nm, 7 nm, 7.5 nm, 8 nm, 8.5 nm, 9 nm, 9.5 nm, 10 nm, 10.5 nm, 11 nm, 11.5 nm, 12 nm, 12.5 nm, 13 nm, 13.5 nm, 14 nm, 14.5 nm, 15 nm, 15.5 nm, 16 nm, 16.5 nm, 17 nm, 17.5 nm, 18 nm, 18.5 nm, 19 nm, 19.5 nm, 20 nm, 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.5 μm, 5 μm, 5.5 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 82 m, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 300 μm, 400 μm, 500 μm, 600 μm, 700 μm, 800 μm, 900 μm, or 1 mm.

According to one embodiment, the average distance between two composite particles 1 in the at least one surrounding medium 71 may have a deviation less or equal to 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 1.1%, 1.2%, 1.3%, 1.4%, 1.5%, 1.6%, 1.7%, 1.8%, 1.9%, 2%, 2.1%, 2.2%, 2.3%, 2.4%, 2.5%, 2.6%, 2.7%, 2.8%, 2.9%, 3%, 3.1%, 3.2%, 3.3%, 3.4%, 3.5%, 3.6%, 3.7%, 3.8%, 3.9%, 4%, 4.1%, 4.2%, 4.3%, 4.4%, 4.5%, 4.6%, 4.7%, 4.8%, 4.9%, 5%, 5.1%, 5.2%, 5.3%, 5.4%, 5.5%, 5.6%, 5.7%, 5.8%, 5.9%, 6%, 6.1%, 6.2%, 6.3%, 6.4%, 6.5%, 6.6%, 6.7%, 6.8%, 6.9%, 7%, 7.1%, 7.2%, 7.3%, 7.4%, 7.5%, 7.6%, 7.7%, 7.8%, 7.9%, 8%, 8.1%, 8.2%, 8.3%, 8.4%, 8.5%, 8.6%, 8.7%, 8.8%, 8.9%, 9%, 9.1%, 9.2%, 9.3%, 9.4%, 9.5%, 9.6%, 9.7%, 9.8%, 9.9%, 10%, 15%, 20%, 25%, 30%, 35%, 40%, 45%, or 50%.

According to one embodiment, the light emitting material 7 does not comprise optically transparent void regions.

According to one embodiment, the light emitting material 7 does not comprise void regions surrounding the at least one composite particle 1.

According to one embodiment, as illustrated in FIG. 6B, the light emitting material 7 further comprises at least one particle comprising an inorganic material 21; and a plurality of nanoparticles, wherein said inorganic material 21 is different from the inorganic material 2 comprised in the composite particle 1 of the invention. In this embodiment, said at least one particle comprising an inorganic material 21 is empty, i.e. does not comprise any nanoparticle.

According to one embodiment, the light emitting material 7 further comprises at least one particle comprising an inorganic material 21; and a plurality of nanoparticles, wherein said inorganic material 21 is the same as the inorganic material 2 comprised in the composite particle 1 of the invention. In this embodiment, said at least one particle comprising an inorganic material 21 is empty, i.e. does not comprise any nanoparticle.

According to one embodiment, the light emitting material 7 further comprises at least one particle comprising an inorganic material 21, wherein said inorganic material 21 is the same as the inorganic material 2 comprised in the composite particle 1 of the invention. In this embodiment, said at least one particle comprising an inorganic material 21 is empty, i.e. does not comprise any nanoparticle.

According to one embodiment, the light emitting material 7 further comprises at least one particle comprising an inorganic material 21, wherein said inorganic material 21 is different from the inorganic material 2 comprised in the composite particle 1 of the invention. In this embodiment, said at least one particle comprising an inorganic material 21 is empty, i.e. does not comprise any nanoparticle.

According to one embodiment, the light emitting material 7 further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of particle comprising an inorganic material 21.

According to one embodiment, the particle comprising an inorganic material 21 has a different size than the at least one composite particle 1.

According to one embodiment, the particle comprising an inorganic material 21 has the same size as the at least one composite particle 1.

According to one embodiment, the light emitting material 7 further comprises a plurality of nanoparticles. In this embodiment, said nanoparticles are different from the nanoparticles 3 comprised in the at least one composite particle 1.

According to one embodiment, the light emitting material 7 further comprises a plurality of nanoparticles. In this embodiment, said nanoparticles are the same as the nanoparticles 3 comprised in the at least one composite particle 1.

According to one embodiment, the light emitting material 7 further comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight of nanoparticles, wherein said nanoparticles are not comprised in the at least one composite particle 1.

According to one embodiment, the light emitting material 7 is free of oxygen.

According to one embodiment, the light emitting material 7 is free of water.

In another embodiment, the light emitting material 7 may further comprise at least one solvent.

In another embodiment, the light emitting material 7 does not comprise a solvent.

In another embodiment, the light emitting material 7 may further comprise a liquid including but not limited to: 1-methoxy-2-propanol, 2-pyrrolidinone, C4 to C8 1,2-alkanediol, aliphatic or alicycle ketone, methyl ethyl ketone, C1-C4 alkanol such as for example methanol, ethanol, methanol propanol, or isopropanol, ketones, esters, ether of ethylene glycol or propylene glycol, acetals, acrylic resin, polyvinyl acetate, polyvinyl alcohol, polyamide resin, polyurethane resin, epoxy resin, alkyd ester, nitrated cellulose, ethyl cellulose, sodium carboxymethyl cellulose, alkyds, maleics, cellulose derivatives, formaldehyde, rubber resin, phenolics, propyl acetate, glycol ether, aliphatic hydrocarbon, acetate, ester. acrylic, cellulose ester, nitrocellulose, modified resin, alkoxylated alcohol, 2-pyrrolidone, a homolog of 2-pyrrolidone, glycol, water, or a mixture thereof.

According to one embodiment, the light emitting material 7 comprises a liquid at a level of at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, or 95% in weight compared to the total weight of the light emitting material 7.

According to one embodiment, the light emitting material 7 further comprises scattering particles in the at least one surrounding medium 71. Examples of scattering particles include but are not limited to: $SiO_2$, $ZrO_2$, ZnO, MgO, $SnO_2$, $TiO_2$, Au, Ag, alumina, barium sulfate, PTFE, barium titanate and the like. Said scattering particles can help increasing light scattering in the interior of the light emitting material 7, so that there are more interactions between the photons and the scattering particles and, therefore, more light absorption by the particles.

According to one embodiment, the light emitting material 7 comprises scattering particles and does not comprise composite particles 1 in the at least one surrounding medium 71.

In one embodiment, the light emitting material 7 further comprises thermal conductor particles in the at least one surrounding medium 71. Examples of thermal conductor particles include but are not limited to: $SiO_2$, $ZrO_2$, ZnO, MgO, $SnO_2$, $TiO_2$, alumina, barium sulfate, PTFE, barium titanate and the like. In this embodiment, the thermal conductivity of the at least one surrounding medium 71 is increased.

According to one embodiment, the light emitting material 7 has a photoluminescence quantum yield (PLQY) of at least 5%, 10%, 15%, 20%, 25%, 30%, 35%, 40%, 45%, 50%, 55%, 60%, 65%, 70%, 75%, 80%, 85%, 90%, 95%, 99% or 100%.

According to one embodiment, the light emitting material 7 exhibits an emission spectrum with at least one emission peak, wherein said emission peak has a maximum emission wavelength ranging from 400 nm to 50 μm.

According to one embodiment, the light emitting material 7 exhibits an emission spectrum with at least one emission peak, wherein said emission peak has a maximum emission wavelength ranging from 400 nm to 500 nm. In this embodiment, the light emitting material 7 emits blue light.

According to one embodiment, the light emitting material 7 exhibits an emission spectrum with at least one emission peak, wherein said emission peak has a maximum emission wavelength ranging from 500 nm to 560 nm, more preferably ranging from 515 nm to 545 nm. In this embodiment, the light emitting material 7 emits green light.

According to one embodiment, the light emitting material 7 exhibits an emission spectrum with at least one emission peak, wherein said emission peak has a maximum emission wavelength ranging from 560 nm to 590 nm. In this embodiment, the light emitting material 7 emits yellow light.

According to one embodiment, the light emitting material 7 exhibits an emission spectrum with at least one emission peak, wherein said emission peak has a maximum emission wavelength ranging from 590 nm to 750 nm, more preferably ranging from 610 nm to 650 nm. In this embodiment, the light emitting material 7 emits red light.

According to one embodiment, the light emitting material 7 exhibits an emission spectrum with at least one emission peak, wherein said emission peak has a maximum emission wavelength ranging from 750 nm to 50 μm. In this embodiment, the light emitting material 7 emits near infra-red, mid-infra-red, or infra-red light.

According to one embodiment, the light emitting material 7 exhibits emission spectra with at least one emission peak having a full width half maximum lower than 90 nm, 80 nm, 70 nm, 60 nm, 50 nm, 40 nm, 30 nm, 25 nm, 20 nm, 15 nm, or 10 nm.

According to one embodiment, the light emitting material 7 exhibits emission spectra with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

In one embodiment, the light emitting material 7 exhibits photoluminescence quantum yield (PLQY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the light emitting material 7 exhibits a decrease of its resulting light intensity intensity of less than 95%, 90%, 85%, 80%, 75%, 70%, 65%, 60%, 55%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 nW·cm$^{-2}$ and 100 kW·cm$^{-2}$, more preferably between 10 mW·cm$^{-2}$ and 100 W·cm$^{-2}$, and even more preferably between 10 mW·cm$^{-2}$ and 30 W·cm$^{-2}$.

According to one embodiment, the photon flux or average peak pulse power of the illumination is at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{31\ 2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the light emitting material 7 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the light emitting material 7 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

In one embodiment, the light emitting material 7 exhibits photoluminescence quantum yield (PQLY) decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one preferred embodiment, the light emitting material 7 exhibits photoluminescence quantum yield (PQLY) decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the light emitting material 7 exhibits FCE decrease of less than 80%, 70%, 60%, 50%, 40%, 30%, 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light with an average peak pulse power of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one preferred embodiment, the light emitting material 7 exhibits FCE decrease of less than 25%, 20%, 15%, 10%, 5%, 4%, 3%, 2%, 1%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under pulsed light or continuous light with an average peak pulse power or photon flux of at least 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the light emitting material 7 exhibits a decrease of its resulting light intensity intensity of less than 95%, 90%, 85%, 80%, 75%, 70%, 65%, 60%, 55%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the light emitting material 7 comprises at least one composite particle 1 comprising at least one nanoparticle 3 that emits green light. In this embodiment, the at least one green light emitting nanoparticle 3 is excited by the primary light, so as to emit a green secondary light.

According to one embodiment, the light emitting material 7 comprises at least one composite particle 1 comprising at least one nanoparticle 3 that emits blue light. In this embodiment, the at least one blue light emitting nanoparticle 3 is excited by the primary light, so as to emit a blue secondary light.

According to one embodiment, the light emitting material 7 comprises at least one composite particle 1 comprising at least one nanoparticle 3 that emits red light. In this embodiment, the at least one red light emitting nanoparticle 3 is excited by the primary light, so as to emit a red secondary light.

According to one embodiment, the light emitting material 7 comprises at least one composite particle 1 comprising at least one nanoparticle 3 that emits orange light. In this embodiment, the at least one orange light emitting nanoparticle 3 is excited by the primary light, so as to emit an orange secondary light.

According to one embodiment, the light emitting material 7 comprises at least one composite particle 1 comprising at least one nanoparticle 3 that emits yellow light. In this embodiment, the at least one yellow light emitting nanoparticle 3 is excited by the primary light, so as to emit a yellow secondary light.

According to one embodiment, the light emitting material 7 comprises at least one composite particle 1 comprising at least one nanoparticle 3 that emits purple light. In this embodiment, the at least one purple light emitting nanoparticle 3 is excited by the primary light, so as to emit a purple secondary light.

According to one embodiment, the light emitting material 7 transmits a part of the primary light and emits at least one secondary light. In this embodiment, the resulting light is a combination of the transmitted primary light and the combination of the at least one secondary light, hence polychromatic light such as white light can be generated as resulting light.

According to one embodiment, the light emitting material 7 absorbs and/or scatters the entire primary light and emits at least one secondary light. In this embodiment, the resulting light is the combination of the at least one secondary light, hence polychromatic light such as white light can be generated as resulting light.

According to one embodiment, the at least one surrounding medium 71 is free of oxygen.

According to one embodiment, the at least one surrounding medium 71 is free of water.

According to one embodiment, the at least one surrounding medium 71 limits or prevents the degradation of the chemical and physical properties of the at least one composite particle 1 from molecular oxygen, ozone, water and/or high temperature.

According to one embodiment, the at least one surrounding medium 71 is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

According to one embodiment, the at least one surrounding medium 71 has a refractive index ranging from 1.0 to 3.0, from 1.2 to 2.6, from 1.4 to 2.0 at 450 nm.

According to one embodiment, the at least one surrounding medium 71 has a refractive index of at least 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 at 450 nm.

According to one embodiment, the at least one surrounding medium 71 has a refractive index distinct from the refractive index of the inorganic material 2 comprised in the at least one composite particle 1 or from the refractive index of the composite particle 1. This embodiment allows for a wider scattering of light compared to the case where the at least one surrounding medium 71 has the same refractive index than the refractive index of the inorganic material 2 comprised in the at least one composite particle 1 or from the refractive index of the composite particle 1. This embodiment also allows to have a difference in light scattering as a function of the wavelength, in particular to increase the scattering of the excitation light with respect to the scattering of the emitted light, as the wavelength of the excitation light is lower than the wavelength of the emitted light.

According to one embodiment, the at least one surrounding medium 71 has a difference of refractive index with the refractive index of the inorganic material 2 comprised in the at least one composite particle 1 or with the refractive index of the composite particle 1 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2.

According to one embodiment, the surrounding medium 71 has a difference of refractive index with the inorganic material 2 comprised in the at least one composite particle 1 ranging from 0.02 to 2, ranging from 0.02 to 1.5, ranging from 0.03 to 1.5, ranging from 0.04 to 1.5, ranging from 0.05 to 1.5, ranging from 0.02 to 1.2, ranging from 0.03 to 1.2, ranging from 0.04 to 1.2, ranging from 0.05 to 1.2, ranging from 0.05 to 1, ranging from 0.1 to 1, ranging from 0.2 to 1, ranging from 0.3 to 1, ranging from 0.5 to 1, ranging from 0.05 to 2, ranging from 0.1 to 2, ranging from 0.2 to 2, ranging from 0.3 to 2, or ranging from 0.5 to 2.

The difference of refractive index was measured at 450 nm.

According to one embodiment, the at least one surrounding medium 71 has a refractive index superior or equal to the refractive index of the inorganic material 2.

According to one embodiment, the at least one surrounding medium 71 has a refractive index inferior to the refractive index of the inorganic material 2.

According to one embodiment, the at least one composite particle 1 in the at least one surrounding medium 71 is configured to scatter light.

According to one embodiment, the light emitting material 7 has a haze factor ranging from 1% to 100%.

According to one embodiment, the light emitting material 7 has a haze factor of at least 1%, 2%, 3%, 4%, 5%, 10%, 15%, 20%, 25%, 30%, 35%, 40%, 45%, 50%, 55%, 60%, 65%, 70%, 75%, 80%, 85%, 90%, 95%, or 100%.

The haze factor is calculated by the ratio between the intensity of light scattered by the material beyond the viewing angle and the total intensity transmitted by the material when illuminated with a light source.

According to one embodiment, the viewing angle used to measure the haze factor ranges from 0° to 20°.

According to one embodiment, the viewing angle used to measure the haze factor is at least 0°, 1°, 2°, 3°, 4°, 5°, 6°, 7°, 8°, 9°, 10°, 11°, 12°, 13°, 14°, 15°, 16°, 17°, 18°, 19°, or 20°.

According to one embodiment, the at least one composite particle 1 in the at least one surrounding medium 71 is configured to serve as a waveguide. In this embodiment, the refractive index of the at least one composite particle 1 is higher than the refractive index of the at least one surrounding medium 71.

According to one embodiment, the composite particle 1 has a spherical shape. The spherical shape may permit to the light to circulate in the composite particle 1 without leaving said composite particle 1 such as to operate as a waveguide. The spherical shape may permit to the light to have whispering-gallery wave modes. Furthermore, a perfect spherical shape prevents fluctuations of the intensity of the scattered light.

According to one embodiment, the at least one composite particle 1 in the at least one surrounding medium 71 is configured to generate multiple reflections of light inside said composite particle 1.

According to one embodiment, the at least one surrounding medium 71 has a refractive index equal to the refractive index of the inorganic material 2 comprised in the at least one composite particle 1. In this embodiment, scattering of light is prevented.

According to one embodiment, the at least one surrounding medium 71 is a thermal insulator.

According to one embodiment, the at least one surrounding medium 71 is a thermal conductor. In this embodiment, the at least one surrounding medium 71 can drain away the heat produced by the at least one composite particle 1 or the environment.

According to one embodiment, the at least one surrounding medium 71 has a thermal conductivity at standard conditions ranging from 0.1 to 450 W/(m·K), preferably from 1 to 200 W/(m·K), more preferably from 10 to 150 W/(m·K).

According to one embodiment, the at least one surrounding medium 71 has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the at least one surrounding medium 71 is an electrical insulator.

According to one embodiment, the at least one surrounding medium 71 is electrically conductive.

According to one embodiment, the at least one surrounding medium 71 has an electrical conductivity at standard conditions ranging from $1\times10^{-20}$ to $10^7$ S/m, preferably from $1\times10^{-15}$ to 5 S/m, more preferably from $1\times10^{-7}$ to 1 S/m.

According to one embodiment, the at least one surrounding medium 71 has an electrical conductivity at standard conditions of at least $1\times10^{-20}$ S/m, $0.5\times10^{-19}$ S/m, $1\times10^{-19}$ S/m, $0.5\times10^{-18}$ S/m, $1\times10^{-18}$ S/m, $0.5\times10^{-17}$ S/m, $1\times10^{-17}$ S/m, $0.5\times10^{-16}$ S/m, $1\times10^{-16}$ S/m, $0.5\times10^{-15}$ S/m, $1\times10^{-15}$ S/m, $0.5\times10^{-14}$ S/m, $1\times10^{-14}$ S/m, $0.5\times10^{-13}$ S/m, $1\times10^{-13}$ S/m, $0.5\times10^{-12}$ S/m, $1\times10^{-12}$ S/m, $0.5\times10^{-11}$ S/m, $1\times10^{-11}$ S/m, $0.5\times10^{-10}$ S/m, $1\times10^{-10}$ S/m, $0.5\times10^{-9}$ S/m, $1\times10^{-9}$ S/m, $0.5\times10^{-8}$ S/m, $1\times10^{-8}$ S/m, $0.5\times10^{-7}$ S/m, $1\times10^{-7}$ S/m, $0.5\times10^{-6}$ S/m, $1\times10^{-6}$ S/m, $0.5\times10^{-5}$ S/m, $1\times10^{-5}$ S/m, $0.5\times10^{-4}$ S/m, $1\times10^{-4}$ S/m, $0.5\times10^{-3}$ S/m, $1\times10^{-3}$ S/m, $0.5\times10^{-2}$ S/m, $1\times10^{-2}$ S/m, $0.5\times10^{-1}$ S/m, $1\times10^{-1}$ S/m, 0.5 S/m, 1 S/m, 1.5 S/m, 2 S/m, 2.5 S/m, 3 S/m, 3.5 S/m, 4 S/m, 4.5 S/m, 5 S/m, 5.5 S/m, 6 S/m, 6.5 S/m, 7 S/m, 7.5 S/m, 8 S/m, 8.5 S/m, 9 S/m, 9.5 S/m, 10 S/m, 50 S/m, $10^2$ S/m, $5\times10^2$ S/m, $10^3$ S/m, $5\times10^3$ S/m, $10^4$ S/m, $5\times10^4$ S/m, $10^5$ S/m, $5\times10^5$ S/m, $10^6$ S/m, $5\times10^6$ S/m, or $10^7$ S/m.

According to one embodiment, the electrical conductivity of the at least one surrounding medium 71 may be measured for example with an impedance spectrometer.

According to one embodiment, the at least one surrounding medium 71 may be a fluid or a solid host material. In this embodiment, the fluid may be a liquid or a gas.

According to one embodiment, the at least one surrounding medium 71 is a fluid such as a liquid or a gas.

According to one embodiment, the at least one surrounding medium 71 is a gas such as for example air, nitrogen, argon, dihydrogen, dioxygen, helium, carbon dioxide, carbon monoxide, NO, $NO_2$, $N_2O$, $F_2$, $Cl_2$, $H_2Se$, $CH_4$, $PH_3$, $NH_3$, $SO_2$, $H_2S$ or a mixture thereof.

According to one embodiment, the at least one surrounding medium 71 is a liquid such as for example water, aqueous solvent, or organic solvent.

According to one embodiment, the at least one surrounding medium 71 comprises vapors of aqueous solvent or organic solvent.

According to one embodiment, the organic solvent includes but is not limited to: hexane, heptane, pentane, toluene, tetrahydrofuran, chloroform, acetone, acetic acid, n-methylformamide, n,n-dimethylformamide, dimethylsulfoxide, octadecene, squalene, amines such as for example tri-n-octylamine, 1,3-diaminopropane, oleylamine, hexadecylamine, octadecylamine, squalene, alcohols such as for example ethanol, methanol, isopropanol, 1-butanol, 1-hexanol, 1-decanol, propane-2-ol, ethanediol, 1,2-propanediol or a mixture thereof.

According to one embodiment, vapors of a solution or solvent are obtained by heating said solution or solvent with an external heating system.

According to one embodiment, the at least one surrounding medium 71 is a solid host material.

According to one embodiment, the solid host material can be cured into a shape of a film, thereby generating a film.

According to one embodiment, the solid host material is polymeric.

According to one embodiment, the solid host material comprises an organic material as described hereafter.

According to one embodiment, the solid host material comprises an organic polymer as described hereafter.

According to one embodiment, the solid host material can polymerize by heating it and/or by exposing it to UV light.

According to one embodiment, the polymeric solid host material includes but is not limited to: silicone based polymers, polydimethylsiloxanes (PDMS), polyethylene terephthalate, polyesters, polyacrylates, polymethacrylates, polycarbonate, poly(vinyl alcohol), polyvinylpyrrolidone, polyvinylpyridine, polysaccharides, poly(ethylene glycol), melamine resins, a phenol resin, an alkyl resin, an epoxy resin, a polyurethane resin, a maleic resin, a polyamide resin, an alkyl resin, a maleic resin, terpenes resins, an acrylic resin or acrylate based resin such as PMMA, copolymers forming the resins, co-polymers, block co-polymers, polymerizable monomers comprising an UV initiator or thermic initiator, or a mixture thereof.

According to one embodiment, the polymeric solid host material includes but is not limited to: thermosetting resin, photosensitive resin, photoresist resin, photocurable resin, or dry-curable resin. The thermosetting resin and the photocurable resin are cured using heat and light, respectively. For the use of the dry hard resin, the resin is cured by applying heat to a solvent in which the at least one composite particle 1 is dispersed.

When a thermosetting resin or a photocurable resin is used, the composition of the resulting light intensity emitting material 7 is equal to the composition of the raw material of the light emitting material 7. However, when a dry-curable resin is used, the composition of the resulting light intensity emitting material 7 may be different from the composition of the raw material of the light emitting material 7. During the dry-curing by heat, the solvent is partially evaporated. Thus, the volume ratio of composite particle 1 in the raw material of the light emitting material 7 may be lower than the volume ratio of composite particle 1 in the resulting light intensity emitting material 7.

Upon curing of the resin, a volume contraction is caused. According to one embodiment, a least 2%, 3%, 4%, 5%, 6%, 7%, 8%, 9%, 10%, 15%, or 20%, of contraction are aroused from a thermosetting resin or a photocurable resin. According to one embodiment, a dry-curable resin is contracted by at least 0.1%, 0.2%, 0.3%, 0.4%, 0.5%, 0.6%, 0.7%, 0.8%, 0.9%, 1%, 1.5%, 2%, 2.5%, 3%, 3.5%, 4%, 4.5%, 5%, 5.5%, 6%, 6.5%, 7%, 7.5%, 8%, 8.5%, 9%, 9.5%, 10%, 15%, or 20%. The contraction of the resin may cause movement of the composite particles 1, which may be lower the degree of dispersion of the composite particles 1 in the light emitting material 7. However, embodiments of the present invention can maintain high dispersibility by preventing the movement of the composite particles 1 by introducing other particles in said light emitting material 7.

In one embodiment, the solid host material may be a polymerizable formulation which can include monomers, oligomers, polymers, or mixture thereof.

In one embodiment, the polymerizable formulation may further comprise a crosslinking agent, a scattering agent, a photo initiator or a thermal initiator.

In one embodiment, the polymerizable formulation includes but is not limited to: monomers, oligomers or polymers made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, n-butyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In another embodiment, the polymerizable formulation includes but is not limited to: monomers, oligomers or polymers made from an alkyl acrylamide or alkyl methacrylamide such as acrylamide, Alkylacrylamide, N-tert-Butylacrylamide, Diacetone acrylamide, N,N-Diethylacrylamide, N-(Isobutoxymethyl)acrylamide, N-(3-Methoxypropyl)acrylamide, N-Diphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris(hydroxymethyl)methyl]acrylamide, N,N-Diethylmethacrylamide, N,NDimethyl acryl amide, N-[3-(Dimethylamino)propyl]methacrylamide, N-(Hydroxymethyl)acrylamide, 2-Hydroxypropyl methacrylamide, N-Isopropylmethacrylamide, Methacrylamide, N-(Triphenylmethyl)methacrylamide, poly (3,4-ethylenedioxythiopene), poly(ethylene dioxythiophene)/poly(styrene sulfonic acid) (PEDOT/PSS), an aqueous solution of polyaniline/camphor sulfonic acid (PANI/CSA), PTPDES, Et-PIT-DEK, PPBA, and similar derivatives.

In one embodiment, the polymerizable formulation includes but is not limited to: monomers, oligomers or polymers made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifiuoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, examples of crosslinking agent include but are not limited to: di-acrylate, tri-acrylate, tetra-acrylate, di-methacrylate, tri-methacrylate and tetra-methacrylate monomers derivatives and the like. Another example of crosslinking agent includes but is not limited to: monomers, oligomers or polymers made from di- or trifunctional monomers such as allyl methacrylate, diallyl maleate, 1,3-butanediol dimethacrylate, 1,4-butanediol dimethacrylate, 1,6-hexanediol dimethacrylate, pentaerythritol triacrylate, trimethylolpropane triacrylate, Ethylene glycol dimethacrylate, Triethylene glycol dimethacrylate, N,N-methylenebis(acrylamide), N,N'-Hexamethylenebis (methacrylamide), and divinyl benzene.

In one embodiment, the polymerizable formulation may further comprise scattering particles. Examples of scattering particles include but are not limited to: $SiO_2$, $ZrO_2$, ZnO, MgO, $SnO_2$, $TiO_2$, Au, Ag, alumina, barium sulfate, PTFE, barium titanate and the like.

In one embodiment, the polymerizable formulation may further comprise a thermal conductor. Examples of thermal conductor include but are not limited to: $SiO_2$, $ZrO_2$, ZnO, MgO, $SnO_2$, $TiO_2$, CaO, alumina, barium sulfate, PTFE, barium titanate and the like. In this embodiment, the thermal conductivity of the solid host material is increased.

In one embodiment, the polymerizable formulation may further comprise a photo initiator. Examples of photo initiator include but are not limited to: α-hydroxyketone, phenylglyoxylate, benzyldimethyl-ketal, α-aminoketone, monoacylphosphine oxides, bisacylphosphine oxides, phosphine oxide, benzophenone and derivatives, polyvinyl cinnamate, metallocene or iodonium salt derivatives and the like. Another example of photo initiator includes Irgacure® photoinitiator and Esacure® photoinitiator and the like.

In one embodiment, the polymerizable formulation may further comprise a thermal initiator. Examples of thermal initiator include but are limited to: peroxide compounds, azo compounds such as azobisisobutyronitrile (AIBN) and 4,4-Azobis(4-cyanovaleric acid), potassium and ammonium persulfate, tert-Butyl peroxide, benzoyl peroxide and the like.

In one embodiment, the polymeric solid host material may be a polymerized solid made from an alkyl methacrylates or an alkyl acrylates such as acrylic acid, methacrylic acid, crotonic acid, acrylonitrile, acrylic esters substituted with methoxy, ethoxy, propoxy, butoxy, and similar derivatives for example, methyl acrylate, ethyle acrylate, propyl acrylate, butyl acrylate, isobutyl acrylate, lauryl acrylate, norbornyl acrylate, 2-ethyl hexyl acrylate, 2-hydroxyethyl acrylate, 4-hydroxybutyl acrylate, benzyl acrylate, phenyl acrylate, isobornyle acrylate, hydroxypropyl acrylate, fluorinated acrylic monomers, chlorinated acrylic monomers, methacrylic acid, methyl methacrylate, nbutyl methacrylate, isobutyl methacrylate, 2-ethyl hexyl methacrylate, 2-hydroxyethyl methacrylate, 4-hydroxybutyl methacrylate, benzyl methacrylate, phenyl methacrylate, lauryl methacrylate, norbornyl methacrylate, isobornyle methacrylate, hydroxypropyl methacrylate, fluorinated methacrylic monomers, chlorinated methacrylic monomers, alkyl crotonates, allyl crotonates, glycidyl methacrylate and related esters.

In one embodiment, the polymeric solid host material may be a polymerized solid made from an alkyl acrylamide or alkyl methacrylamide such as acrylamide, Alkylacrylamide, Ntert-Butylacrylamide, Diacetone acrylamide, N,N-Diethylacrylamide, N-Isobutoxymethyl)acrylamide, N-(3-Methoxypropyl)acrylamide, NDiphenylmethylacrylamide, N-Ethylacrylamide, N-Hydroxyethyl acrylamide, N-(Isobutoxymethyl)acrylamide, N-Isopropylacrylamide, N-(3-Methoxypropyl)acrylamide, N-Phenylacrylamide, N-[Tris (hydroxymethyl)methyl]acrylamide, N,N-Diethylmethacrylamide, N,NDimethylacrylamide, N-[3-(Dimethylamino)propyl]methacrylamide, N-(Hydroxymethyl)acrylamide, 2-Hydroxypropyl methacrylamide, NIsopropylmethacrylamide, Methacrylamide, N-(Triphenylmethyl)methacrylamide, poly (3,4-ethylenedioxythiopene), poly(ethylene dioxythiophene)/poly(styrene sulfonic acid) (PEDOT/PSS), an aqueous solution of polyaniline/camphor sulfonic acid (PANI/CSA), PTPDES, Et-PIT-DEK, PPBA, and similar derivatives.

In one embodiment, the polymeric solid host material may be a polymerized solid made from alpha-olefins, dienes such as butadiene and chloroprene; styrene, alpha-methyl styrene, and the like; heteroatom substituted alpha-olefins, for example, vinyl acetate, vinyl alkyl ethers for example, ethyl vinyl ether, vinyltrimethylsilane, vinyl chloride, tetrafluoroethylene, chlorotrifluoroethylene, cyclic and polycyclic olefin compounds for example, cyclopentene, cyclohexene, cycloheptene, cyclooctene, and cyclic derivatives up to C20; polycyclic derivates for example, norbornene, and similar derivatives up to C20; cyclic vinyl ethers for example, 2, 3-dihydrofuran, 3,4-dihydropyran, and similar derivatives; allylic alcohol derivatives for example, vinylethylene carbonate, disubstituted olefins such as maleic and fumaric compounds for example, maleic anhydride, diethylfumarate, and the like, and mixtures thereof.

In one embodiment, the polymeric solid host material may be PMMA, Poly(lauryl methacrylate), glycolized poly (ethylene terephthalate), Poly(maleic anhydride altoctadecene), or mixtures thereof.

In another embodiment, the light emitting material 7 may further comprise at least one solvent. According to this embodiment, the solvent is one that allows the solubilization of the composite particles 1 of the invention and polymeric solid host material such as for example, pentane, hexane, heptane, 1,2-hexanediol, 1,5-pentanediol, cyclohexane, petroleum ether, toluene, benzene, xylene, chlorobenzene, carbon tetrachloride, chloroform, dichloromethane, 1,2-dichloroethane, THF (tetrahydrofuran), acetonitrile, acetone, ethanol, methanol, ethyl acetate, ethylene glycol, diglyme (diethylene glycol dimethyl ether), diethyl ether, DME (1,2-dimethoxy-ethane, glyme), DMF (dimethylformamide), NMF (N-methylformamide), FA (Formamide), DMSO (dimethyl sulfoxide), 1,4-Dioxane, triethyl amine, alkoxy alcohol, alkyl alcohol, alkyl benzene, alkyl benzoate, alkyl naphthalene, amyl octanoate, anisole, aryl alcohol, benzyl alcohol, butyl benzene, butyrophenon, cis-decalin, dipropylene glycol methyl ether, dodecyl benzene, propylene glycol methyl ether acetate (PGMEA), mesitylene, methoxy propanol, methylbenzoate, methyl naphthalene, methyl pyrrolidinone, phenoxy ethanol, 1,3-propanediol, pyrrolidinone, trans-decalin, valerophenone, or mixture thereof.

According to one embodiment, the light emitting material 7 comprises at least two solvents as described hereabove. In this embodiment, the solvents are miscible together.

According to one embodiment, the light emitting material 7 comprises a blend of solvents as described hereabove. In this embodiment, the solvents are miscible together.

According to one embodiment, the light emitting material 7 comprises a plurality of solvents as described hereabove. In this embodiment, the solvents are miscible together.

According to one embodiment, the solvent comprised in the light emitting material 7 is miscible with water.

In another embodiment, the light emitting material 7 comprises a blend of solvents such as for example: a blend of benzyl alcohol and butyl benzene, a blend of benzyl alcohol and anisole, a blend of benzyl alcohol and mesitylene, a blend of butyl benzene and anisole, a blend of butyl benzene and mesitylene, a blend of anisole and mesitylene, a blend of dodecyl benzene and cis-decalin, a blend of dodecyl benzene and benzyl alcohol, a blend of dodecyl benzene and butyl benzene, a blend of dodecyl benzene and anisole, a blend of dodecyl benzene and mesitylene, a blend of cis-decalin and benzyl alcohol, a blend of cis-decalin and butyl benzene, a blend of cis-decalin and anisole, a blend of cis-decalin and mesitylene, a blend of trans-decalin and benzyl alcohol, a blend of trans-decalin and butyl benzene, a blend of trans-decalin and anisole, a blend of trans-decalin and mesitylene, a blend of methyl pyrrolidinone and anisole, a blend of methylbenzoate and anisole, a blend of methyl pyrrolidinone and methyl naphthalene, a blend of methyl pyrrolidinone and methoxy propanol, a blend of methyl pyrrolidinone and phenoxy ethanol, a blend of methyl pyrrolidinone and amyl octanoate, a blend of methyl pyrrolidinone and trans-decalin, a blend of methyl pyrrolidinone and mesitylene, a blend of methyl pyrrolidinone and butyl benzene, a blend of methyl pyrrolidinone and dodecyl benzene, a blend of methyl pyrrolidinone and benzyl alcohol, a blend of anisole and methyl naphthalene, a blend of anisole and methoxy propanol, a blend of anisole and phenoxy ethanol, a blend of anisole and amyl octanoate, a blend of methylbenzoate and methyl naphthalene, a blend of methylbenzoate and methoxy propanol, a blend of methylbenzoate and phenoxy ethanol, a blend of methylbenzoate and amyl octanoate, a blend of methylbenzoate and cis-decalin, a blend of methylbenzoate and trans-decalin, a blend of methylbenzoate and mesitylene, a blend of methylbenzoate and butyl benzene, a blend of methylbenzoate and dodecyl benzene, a blend of methylbenzoate and benzyl alcohol, a blend of methyl naphthalene and methoxy propanol, a blend of methyl naphthalene and phenoxy ethanol, a blend of methyl naphthalene and amyl octanoate, a blend of methyl naphthalene and cis-decalin, a blend of methyl naphthalene and trans-decalin, a blend of methyl naphthalene and mesitylene, a blend of methyl naphthalene and butyl benzene, a blend of methyl naphthalene and dodecyl benzene, a blend of methyl naphthalene and benzyl alcohol, a blend of methoxy propanol and phenoxy ethanol, a blend of methoxy propanol and amyl octanoate, a blend of methoxy propanol and cis-decalin, a blend of methoxy propanol and trans-decalin, a blend of methoxy propanol and mesitylene, a blend of methoxy propanol and butyl benzene, a blend of methoxy propanol and dodecyl benzene, a blend of methoxy propanol and benzyl alcohol, a blend of phenoxy ethanol and amyl octanoate, a blend of phenoxy propanol and mesitylene, a blend of phenoxy propanol and butyl benzene, a blend of phenoxy propanol and dodecyl benzene, a blend of phenoxy propanol and benzyl alcohol, a blend of amyl octanoate and cis-decalin, a blend of amyl octanoate and trans-decalin, a blend of amyl octanoate and mesitylene, a blend of amyl octanoate and butyl benzene, a blend of amyl octanoate and dodecyl benzene, a blend of amyl octanoate and benzyl alcohol, or a combination thereof.

According to one embodiment, the light emitting material 7 comprises a blend of valerophenon and dipropyleneglycol methyl ether, a blend of valerophenon and butyrophenon, a blend of dipropyleneglycol methyl ether and butyrophenon, a blend of dipropyleneglycol methyl ether and 1,3-propanediol, a blend of butyrophenon and 1,3-propanediol, a blend of dipropyleneglycol methyl ether, 1,3-propanediol, and water, or a combination thereof.

According to one embodiment, the light emitting material 7 comprises a blend of three, four, five, or more solvents can be used for the vehicle. For example, the vehicle can comprise a blend of three, four, five, or more solvents selected from pyrrolidinone, methyl pyrrolidinone, anisole, alkyl benzoate, methylbenzoate, alkyl naphthalene, methyl naphthalene, alkoxy alcohol, methoxy propanol, phenoxy ethanol, amyl octanoate, cis-decalin, trans-decalin, mesitylene, alkyl benzene, butyl benzene, dodecyl benzene, alkyl alcohol, aryl alcohol, benzyl alcohol, butyrophenon, dipropylene glycol methyl ether, valerophenon, and 1,3-propanediol. According to one embodiment, the light emitting material 7 comprises three or more solvents selected from cis-decalin, trans-decalin, benzyl alcohol, butyl benzene, anisole, mesitylene, and dodecyl benzene.

In some embodiments, each of the solvents in each of the blends listed above is present in an amount of at least 5% by weight based on the total weight of the surrounding medium 71, for example, at least 10% by weight, at least 15% by weight, at least 20% by weight, at least 25% by weight, at least 30% by weight, at least 35% by weight, or at least 40% by weight. In some embodiments, each of the solvents in each of the blends listed can comprise 50% by weight of the light emitting material 7 based on the total weight of the light emitting material 7.

According to one embodiment, the surrounding medium 71 comprises a film-forming material. In this embodiment, the film-forming material is a polymer or an inorganic material as described hereabove.

According to one embodiment, the surrounding medium 71 comprises at least 1%, 2%, 3%, 4%, 5%, 6%, 7%, 8%, 9%, 10%, 15%, 20%, 25%, 30%, 35%, 40%, 45%, 50%, 55%, 60%, 65%, 70%, 75%, 80%, 85%, 90%, 95%, or 100% by weight of a film-forming material.

According to one embodiment, the film-forming material is polymeric, i.e. comprises or consists of polymers and/or monomers as described hereabove.

According to one embodiment, the film-forming material is inorganic, i.e. it comprises or consists of an inorganic material as described hereafter.

In another embodiment, the light emitting material 7 comprises the composite particles 1 of the invention and a polymeric solid host material, and does not comprise a solvent. In this embodiment, the composite particles 1 and solid host material can be mixed by extrusion.

According to another embodiment, the solid host material is inorganic.

According to one embodiment, the solid host material does not comprise glass.

According to one embodiment, the solid host material does not comprise vitrified glass.

According to one embodiment, examples of inorganic solid host material include but are not limited to: materials obtainable by sol-gel process, metal oxides such as for example $SiO_2$, $Al_2O_3$, $TiO_2$, $ZrO_2$, ZnO, MgO, $SnO_2$, $IrO_2$, or a mixture thereof. Said solid host material acts as a supplementary barrier against oxidation and can drain away the heat if it is a good thermal conductor and/or evacuate electrical charges.

According to one embodiment, the solid host material is composed of a material selected in the group of metals, halides, chalcogenides, phosphides, sulfides, metalloids, metallic alloys, ceramics such as for example oxides, carbides, or nitrides. Said solid host material is prepared using protocols known to the person skilled in the art.

According to one embodiment, a chalcogenide is a chemical compound consisting of at least one chalcogen anion selected in the group of O, S, Se, Te, Po, and at least one or more electropositive element.

According to one embodiment, the metallic solid host material is selected in the group of gold, silver, copper, vanadium, platinum, palladium, ruthenium, rhenium, yttrium, mercury, cadmium, osmium, chromium, tantalum, manganese, zinc, zirconium, niobium, molybdenum, rhodium, tungsten, iridium, nickel, iron, or cobalt.

According to one embodiment, examples of carbide solid host material include but are not limited to: SiC, WC, BC, MoC, TiC, $Al_4C_3$, $LaC_2$, FeC, CoC, HfC, $Si_xC_y$, $W_xC_y$, $B_xC_y$, $Mo_xC_y$, $Ti_xC_y$, $Al_xC_y$, $La_xC_y$, $Fe_xC_y$, $Co_xC_y$, $Hf_xC_y$, or a mixture thereof; x and y are independently a decimal number from 0 to 5, at the condition that x and y are not simultaneously equal to 0, and $x \neq 0$.

According to one embodiment, examples of oxide solid host material include but are not limited to: $SiO_2$, $Al_2O_3$, $TiO_2$, $ZrO_2$, ZnO, MgO, $SnO_2$, $Nb_2O_5$, $CeO_2$, BeO, $IrO_2$, CaO, $Sc_2O_3$, NiO, $Na_2O$, BaO, $K_2O$, PbO, $Ag_2O$, $V_2O_5$, $TeO_2$, MnO, $B_2O_3$, $P_2O_5$, $P_2O_3$, $P_4O_7$, $P_4O_8$, $P_4O_9$, $P_2O_6$, PO, $GeO_2$, $As_2O_3$, $Fe_2O_3$, $Fe_3O_4$, $Ta_2O_5$, $Li_2O$, SrO, $Y_2O_3$, $HfO_2$, $WO_2$, $MoO_2$, $Cr_2O_3$, $Tc_2O_7$, $ReO_2$, $RuO_2$, $Co_3O_4$, OsO, $RhO_2$, $Rh_2O_3$, PtO, PdO, CuO, $Cu_2O$, CdO, HgO, $Tl_2O$, $Ga_2O_3$, $In_2O_3$, $Bi_2O_3$, $Sb_2O_3$, $PoO_2$, $SeO_2$, $Cs_2O$, $La_2O_3$, $Pr_6O_{11}$, $Nd_2O_3$, $La_2O_3$, $Sm_2O_3$, $Eu_2O_3$, $Tb_4O_7$, $Dy_2O_3$, $Ho_2O_3$, $Er_2O_3$, $Tm_2O_3$, $Yb_2O_3$, $Lu_2O_3$, $Gd_2O_3$, or a mixture thereof.

According to one embodiment, examples of oxide solid host material include but are not limited to: silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

According to one embodiment, examples of nitride solid host material include but are not limited to: TiN, $Si_3N_4$, MoN, VN, TaN, $Zr_3N_4$, HfN, FeN, NbN, GaN, CrN, AlN, InN, $Ti_xN_y$, $Si_xN_y$, $Mo_xN_y$, $V_xN_y$, $Ta_xN_y$, $Zr_xN_y$, $Hf_xN_y$, $Fe_xN_y$, $Nb_xN_y$, $Ga_xN_y$, $Cr_xN_y$, $Al_xN_y$, $In_xN_y$, or a mixture thereof; x and y are independently a decimal number from 0 to 5, at the condition that x and y are not simultaneously equal to 0, and $x \neq 0$.

According to one embodiment, examples of sulfide solid host material include but are not limited to: $Si_yS_x$, $Al_yS_x$, $Ti_yS_x$, $Zr_yS_x$, $Zn_yS_x$, $Mg_yS_x$, $Sn_yS_x$, $Nb_yS_x$, $Ce_yS_x$, $Be_yS_x$, $Ir_yS_x$, $Ca_yS_x$, $Sc_yS_x$, $Ni_yS_x$, $Na_yS_x$, $Ba_yS_x$, $K_yS_x$, $Pb_yS_x$, $Ag_yS_x$, $V_yS_x$, $Te_yS_x$, $Mn_yS_x$, $B_yS_x$, $P_yS_x$, $Ge_yS_x$, $As_yS_x$, $Fe_yS_x$, $Ta_yS_x$, $Li_yS_x$, $Sr_yS_x$, $Y_yS_x$, $Hf_yS_x$, $W_yS_x$, $Mo_yS_x$, $Cr_yS_x$, $Tc_yS_x$, $Re_yS_x$, $Ru_yS_x$, $Co_yS_x$, $Os_yS_x$, $Rh_yS_x$, $Pt_yS_x$, $Pd_yS_x$, $Cu_yS_x$, $Au_yS_x$, $Cd_yS_x$, $Hg_yS_x$, $Tl_yS_x$, $Ga_yS_x$, $In_yS_x$, $Bi_yS_x$, $Sb_yS_x$, $Po_yS_x$, $Se_yS_x$, $Cs_yS_x$, mixed sulfides, mixed sulfides thereof or a mixture thereof; x and y are independently a decimal number from 0 to 10, at the condition that x and y are not simultaneously equal to 0, and $x \neq 0$.

According to one embodiment, examples of halide solid host material include but are not limited to: $BaF_2$, $LaF_3$, $CeF_3$, $YF_3$, $CaF_2$, $MgF_2$, $PrF_3$, AgCl, $MnCl_2$, $NiCl_2$, $Hg_2Cl_2$, $CaCl_2$, $CsPbCl_3$, AgBr, $PbBr_3$, $CsPbBr_3$, AgI, CuI, PbI, $HgI_2$, $BiI_3$, $CH_3NH_3PbI_3$, $CH_3NH_3PbCl_3$, $CH_3NH_3PbBr_3$, $CsPbI_3$, $FAPbBr_3$ (with FA formamidinium), or a mixture thereof.

According to one embodiment, examples of chalcogenide solid host material include but are not limited to: CdO, CdS, CdSe, CdTe, ZnO, ZnS, ZnSe, ZnTe, HgO, HgS, HgSe, HgTe, CuO, $Cu_2O$, CuS, $Cu_2S$, CuSe, CuTe, $Ag_2O$, $Ag_2S$, $Ag_2Se$, $Ag_2Te$, $Au_2S$, PdO, PdS, $Pd_4S$, PdSe, PdTe, PtO, PtS, $PtS_2$, PtSe, PtTe, $RhO_2$, $Rh_2O_3$, RhS2, $Rh_2S_3$, $RhSe_2$, $Rh_2Se_3$, $RhTe_2$, $IrO_2$, $IrS_2$, $Ir_2S_3$, $IrSe_2$, $IrTe_2$, $RuO_2$, $RuS_2$, OsO, OsS, OsSe, OsTe, MnO, MnS, MnSe, MnTe, $ReO_2$, $ReS_2$, $Cr_2O_3$, $Cr_2S_3$, $MoO_2$, $MoS_2$, $MoSe_2$, $MoTe_2$, $WO_2$, $WS_2$, $WSe_2$, $V_2O_5$, $V_2S_3$, $Nb_2O_5$, $NbS_2$, $NbSe_2$, $HfO_2$, $HfS_2$, $TiO_2$, $ZrO_2$, $ZrS_2$, $ZrSe_2$, $ZrTe_2$, $Sc_2O_3$, $Y_2O_3$, $Y_2S_3$, S10$_2$, $GeO_2$, GeS, $GeS_2$, GeSe, $GeSe_2$, GeTe, $SnO_2$, SnS, $SnS_2$, SnSe, $SnSe_2$, SnTe, PbO, PbS, PbSe, PbTe, MgO, MgS, MgSe, MgTe, CaO, CaS, SrO, $Al_2O_3$, $Ga_2O_3$, $Ga_2S_3$, $Ga_2Se_3$, $In_2O_3$, $In_2S_3$, $In_2Se_3$, $In_2Te_3$, $La_2O_3$, $La_2S_3$, $CeO_2$, $CeS_2$, $Pr_6O_{11}$, $Nd_2O_3$, $NdS_2$, $La_2O_3$, $Tl_2O$, $Sm_2O_3$, $SmS_2$, $Eu_2O_3$, $EuS_2$, $Bi_2O_3$, $Sb_2O_3$, $PoO_2$, $SeO_2$, $Cs_2O$, $Tb_4O_7$, $TbS_2$, $Dy_2O_3$, $Ho_2O_3$, $Er_2O_3$, $ErS_2$, $Tm_2O_3$, $Yb_2O_3$, $Lu_2O_3$, $CuInS_2$, $CuInSe_2$, $AgInS_2$, $AgInSe_2$, $Fe_2O_3$, $Fe_3O_4$, FeS, $FeS_2$, $Co_3S_4$, CoSe, $Co_3O_4$, NiO, $NiSe_2$, NiSe, $Ni_3Se_4$, $Gd_2O_3$, BeO, $TeO_2$, $Na_2O$, BaO, $K_2O$, $Ta_2O_5$, $Li_2O$, $Tc_2O_7$, $As_2O_3$, $B_2O_3$, $P_2O_5$, $P_2O_3$, $P_4O_7$, $P_4O_8$, $P_4O_9$, $P_2O_6$, PO, or a mixture thereof.

According to one embodiment, examples of phosphide solid host material include but are not limited to: InP, $Cd_3P_2$, $Zn_3P_2$, AlP, GaP, TlP, or a mixture thereof.

According to one embodiment, examples of metalloid solid host material include but are not limited to: Si, B, Ge, As, Sb, Te, or a mixture thereof.

According to one embodiment, examples of metallic alloy solid host material include but are not limited to: Au—Pd, Au—Ag, Au—Cu, Pt—Pd, Pt—Ni, Cu—Ag, Cu—Sn, Ru—Pt, Rh—Pt, Cu—Pt, Ni—Au, Pt—Sn, Pd—V, Ir—Pt, Au—Pt, Pd—Ag, Cu—Zn, Cr—Ni, Fe—Co, Co—Ni, Fe—Ni or a mixture thereof.

According to one embodiment, the solid host material comprises garnets.

According to one embodiment, examples of garnets include but are not limited to: $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$, GAL, GaYAG, or a mixture thereof.

According to one embodiment, the solid host material comprises or consists of a thermal conductive material wherein said thermal conductive material includes but is not limited to: $Al_yO_x$, $Ag_yO_x$, $Cu_yO_x$, $Fe_yO_x$, $Si_yO_x$, $Pb_yO_x$, $Ca_yO_x$, $Mg_yO_x$, $Zn_yO_x$, $Sn_yO_x$, $Ti_yO_x$, $Be_yO_x$, CdS, ZnS, ZnSe, CdZnS, CdZnSe, Au, Na, Fe, Cu, Al, Ag, Mg, mixed oxides, mixed oxides thereof or a mixture thereof; x and y are independently a decimal number from 0 to 10, at the condition that x and y are not simultaneously equal to 0, and $x \neq 0$.

According to one embodiment, the solid host material comprises or consists of a thermal conductive material wherein said thermal conductive material includes but is not limited to: $Al_2O_3$, $Ag_2O$, $Cu_2O$, CuO, $Fe_3O_4$, FeO, $SiO_2$, PbO, CaO, MgO, ZnO, $SnO_2$, $TiO_2$, BeO, CdS, ZnS, ZnSe, CdZnS, CdZnSe, Au, Na, Fe, Cu, Al, Ag, Mg, mixed oxides, mixed oxides thereof or a mixture thereof.

According to one embodiment, the solid host material comprises or consists of a thermal conductive material wherein said thermal conductive material includes but is not limited to:

aluminium oxide, silver oxide, copper oxide, iron oxide, silicon oxide, lead oxide, calcium oxide, magnesium oxide, zinc oxide, tin oxide, titanium oxide, beryllium oxide, zinc sulfide, cadmium sulfide, zinc selenium, cadmium zinc selenium, cadmium zinc sulfide, gold, sodium, iron, copper, aluminium, silver, magnesium, mixed oxides, mixed oxides thereof or a mixture thereof.

According to one embodiment, the solid host material comprises organic molecules in small amounts of 0 mole %, 1 mole %, 5 mole %, 10 mole %, 15 mole %, 20 mole %, 25 mole %, 30 mole %, 35 mole %, 40 mole %, 45 mole %, 50 mole %, 55 mole %, 60 mole %, 65 mole %, 70 mole %, 75 mole %, 80 mole % relative to the majority element of said solid host material.

According to one embodiment, the solid host material is a composite material comprising at least one inorganic material and at least one polymeric material, each being as described hereabove.

According to another embodiment, the solid host material is a mixture of at least one inorganic material and at least one polymeric material, each being as described hereabove.

According to one embodiment, the surrounding medium 71 comprises a polymeric solid host marterial as described hereabove, an inorganic solid host marterial as described hereabove, or a mixture thereof.

In one embodiment, each of the at least two different surrounding media (71, 72) has a difference of refractive index with the refractive index of the inorganic material 2 comprised in the at least one composite particle 1 or with the refractive index of the composite particle 1 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2 at 450 nm.

In one embodiment, at least one of the at least two different surrounding media (71, 72) has a difference of refractive index with the refractive index of the inorganic material 2 comprised in the at least one composite particle 1 or with the refractive index of the composite particle 1 of at least 0.02, 0.025, 0.03, 0.035, 0.04, 0.045, 0.05, 0.055, 0.06, 0.065, 0.07, 0.075, 0.08, 0.085, 0.09, 0.095, 0.1, 0.11, 0.115, 0.12, 0.125, 0.13, 0.135, 0.14, 0.145, 0.15, 0.155, 0.16, 0.165, 0.17, 0.175, 0.18, 0.185, 0.19, 0.195, 0.2, 0.25, 0.3, 0.35, 0.4, 0.45, 0.5, 0.55, 0.6, 0.65, 0.7, 0.75, 0.8, 0.85, 0.9, 0.95, 1, 1.1, 1.15, 1.2, 1.25, 1.3, 1.35, 1.4, 1.45, 1.5, 1.55, 1.6, 1.65, 1.7, 1.75, 1.8, 1.85, 1.9, 1.95, or 2 at 450 nm.

In one embodiment, the light emitting material 7 of the invention comprises at least one population of composite particles 1.

In one embodiment, the light emitting material 7 comprises two populations of composite particles 1 emitting different colors or wavelengths.

In one embodiment, the concentration of the at least two populations of composite particles 1 comprised in the light emitting material 7 and emitting different colors or wavelengths, is controlled to predetermine the light intensity of each secondary light emitted by each of the least two populations of composite particles 1, after excitation by a primary light.

In one embodiment, the light emitting material 7 comprises composite particles 1 which emit green light and red light upon downconversion of a blue light source. In this embodiment, the light emitting material 7 is configured to transmit a predetermined intensity of the primary blue light and to emit a predetermined intensity of secondary green and red lights, allowing to emit a resulting tri-chromatic white light.

In one embodiment, the light emitting material 7 comprises two populations of composite particles 1, a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, the light emitting material 7 comprises three populations of composite particles 1, a first population of composite particles 1 with a maximum emission wavelength between 440 and 499 nm, more preferably between 450 and 495 nm, a second population of composite particles 1 with a maximum emission wavelength between 500 nm and 560 nm, more preferably between 515 nm and 545 nm and a third population of composite particles 1 with a maximum emission wavelength between 600 nm and 2500 nm, more preferably between 610 nm and 650 nm.

In one embodiment, the light emitting material 7 is splitted in several areas, each of them comprises a different population having different color of composite particles 1.

In one embodiment, the light emitting material 7 has a shape of a film.

In one embodiment, the light emitting material 7 is a film.

In one embodiment, the light emitting material 7 is processed by extrusion.

In one embodiment, the light emitting material 7 is an optical pattern. In this embodiment, said pattern may be formed on a support as described herein.

In one embodiment, the light emitting material 7 is a light collection pattern. In this embodiment, said pattern may be formed on a support as described herein.

In one embodiment, the light emitting material 7 is a light diffusion pattern. In this embodiment, said pattern may be formed on a support as described herein.

In one embodiment, the support as described herein can be heated or cooled down by an external system.

In one embodiment, the light emitting material 7 is made of a stack of two films, each of them comprises a different population of composite particles 1 having a different color.

In one embodiment, the light emitting material 7 is made of a stack of a plurality of films, each of them comprises a different population of composite particles 1 emitting different colors or wavelengths.

According to one embodiment, the light emitting material 7 has a thickness between 30 nm and 10 cm, more preferably between 100 nm and 1 cm, even more preferably between 100 nm and 1 mm.

According to one embodiment, the light emitting material 7 has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.1 μm, 4.2 μm, 4.3 μm, 4.4 μm, 4.5 μm, 4.6 μm, 4.7 μm, 4.8 μm, 4.9 μm, 5 μm, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5

μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 5 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the light emitting material 7 absorbs at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 absorbs the incident light with wavelength lower than 50 μm, 40 μm, 30 μm, 20 μm, 10 μm, 1 μm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, or lower than 200 nm.

According to one embodiment, the light emitting material 7 scatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 backscatters at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 transmits at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the light emitting material 7 transmits a part of the primary light and emits at least one secondary light. In this embodiment, the resulting light is a combination of the remaining transmitted primary light.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm, 350 nm, 400 nm, 450 nm, 455 nm, 460 nm, 470 nm, 480 nm, 490 nm, 500 nm, 510 nm, 520 nm, 530 nm, 540 nm, 550 nm, 560 nm, 570 nm, 580 nm, 590 nm, or 600 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 300 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 350 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 400 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 450 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 455 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 460 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 470 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 480 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 490 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 500 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 510 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 520 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 530 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 540 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 550 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 560 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 570 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 580 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 590 nm.

According to one embodiment, the light emitting material 7 has an absorbance value of at least 0.1, 0.2, 0.3, 0.4, 0.5, 0.6, 0.7, 0.8, 0.9, 1.0, 1.2, 1.4, 1.6, 1.8, 2.0, 2.5, 3.0, 4.0, 5.0 at 600 nm.

According to one embodiment, the increase in absorption efficiency of primary light by the light emitting material 7 is at least of 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3.

Bare nanoparticles 3 refers here to nanoparticles 3 that are not encapsulated in an inorganic material 2.

According to one embodiment, the increase in emission efficiency of secondary light by the light emitting material 7 is less than 1%, 2%, 3%, 4%, 5%, 6%, 7%, 8%, 9%, 10%, 20%, 30%, 40%, 50%, 55%, 60%, 65%, 70%, 75%, 80%, 85%, 90%, 95%, or 100% compared to bare nanoparticles 3.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400

W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 nW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700

W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the light emitting material 7 exhibits a degradation of its FCE of less than 90%, 80%, 70%, 60%, 50%, 40%, 30%, 25%, 20%, 15%, 10%, 5%, 4%, 3%, 2%, 1%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

In another embodiment, the light emitting material 7 comprising at least one population of composite particles 1, may further comprise at least one population of converters having phosphor properties. Examples of converter having phosphor properties include, but are not limited to: garnets (LuAG, GAL, YAG, GaYAG, $Y_3Al_5O_{12}$, $Y_3Fe_2(FeO_4)_3$, $Y_3Fe_5O_{12}$, $Y_4Al_2O_9$, $YAlO_3$, $Fe_3Al_2(SiO_4)_3$, $Mg_3Al_2(SiO_4)_3$, $Mn_3Al_2(SiO_4)_3$, $Ca_3Fe_2(SiO_4)_3$, $Ca_3Al_2(SiO_4)_3$, $Ca_3Cr_2(SiO_4)_3$, $Al_5Lu_3O_{12}$), silicates, oxynitrides/oxycarbidonitrides, nintrides/carbidonitrides, $Mn^{4+}$ red phosphors (PFS/KFS), quantum dots.

According to one embodiment, composite particles 1 of the invention are incorporated in the solid host material at a level ranging from 100 ppm to 500 000 ppm in weight.

According to one embodiment, composite particles 1 of the invention are incorporated in the solid host material at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight.

According to one embodiment, the light emitting material 7 comprises less than 95%, 90%, 80%, 70%, 60%, 50%, 40%, 30%, 20%, 10%, 5%, 4%, 3%, 2%, 1%, 0.9%, 0.8%, 0.7%, 0.6%, 0.5%, 0.4%, 0.3%, 0.2%, or 0.1% in weight of composite particles 1 of the invention.

According to one embodiment, the loading charge of composite particles 1 in the light emitting material 7 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of composite particles 1 in the light emitting material 7 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the composite particles 1 dispersed in the light emitting material 7 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the composite particles 1 dispersed in the light emitting material 7 have a packing fraction of less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the light emitting material 7 comprises at least 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, 0.2 wt %, 0.3 wt %, 0.4 wt %, 0.5 wt %, 0.6 wt %, 0.7 wt %, 0.8 wt %, 0.9 wt %, 1 wt %, 2 wt %, 3 wt %, 4 wt %, 5 wt %, 6 wt %, 7 wt %, 8 wt %, 9 wt %, 10 wt %, 15 wt %, 20 wt %, 25 wt %, 30 wt %, 35 wt %, 40 wt %, 45 wt %, 50 wt %, 55 wt %, 60 wt %, 65 wt %, 70 wt %, 75 wt %, 80 wt %, 85 wt %, 90 wt %, 95 wt %, or 99 wt % of composite particle 1.

According to one embodiment, in the light emitting material 7, the weight ratio between the surrounding medium 71 and the composite particle 1 of the invention is at least 0.01%, 0.02%, 0.03%, 0.04%, 0.05%, 0.06%, 0.07%, 0.08%, 0.09%, 0.1%, 0.2%, 0.3%, 0.4%, 0.5%, 0.6%, 0.7%, 0.8%, 0.9%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, or 50%.

According to one embodiment, the light emitting material 7 is ROHS compliant.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the light emitting material 7 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the light emitting material 7 comprise heavier chemical elements or materials based on heavier chemical elements than the main chemical element present in the surrounding medium 71 and/or the inorganic material 2. In this embodiment, said heavy chemical elements in the light emitting material 7 will lower the mass concentration of chemical elements subject to ROHS standards, allowing said light emitting material 7 to be ROHS compliant.

According to one embodiment, examples of heavy elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the light emitting material 7 comprises one or more materials useful in forming at least one of a hole transport layer, a hole injection layer, an electron transport layer, an electron injection layer, and an emissive layer, of a light-emitting device.

According to one embodiment, the light emitting material 7 comprises a material that is cured or otherwise processed to form a layer on a support.

According to a preferred embodiment, examples of light emitting material 7 include but are not limited to: composite particle 1 dispersed in sol gel materials, silicone, polymers such as for example PMMA, PS, or a mixture thereof.

According to one embodiment, the at least one composite particle 1 in the at least one surrounding medium 71 is configured to serve as a waveguide. In this embodiment, the portion of transmitted light from the light source stays in the composite particle 1 until it meets a nanoparticle 3 which emits light in response.

According to one embodiment, the color conversion layer 4 absorbs at least 70% of incident light on a thickness less or equal to 5 µm, when the incident light has a wavelength ranging from 370 to 470 nm.

According to one embodiment, the color conversion layer 4 scatters at least 70% of incident light on a thickness less or equal to 5 µm, when the incident light has a wavelength ranging from 370 to 470 nm.

According to one embodiment, the color conversion layer 4 is able to absorb at least 95%, 90%, 85%, 80%, 75%, 70%, 65%, 60%, 55%, 50%, 45%, 40%, 35%, 30%, 25%, 20%, 15%, 10%, or 5% of incident light on a thickness less or equal to 1 cm, 900 mm 800 mm, 700 mm, 600 mm, 500 mm, 400 mm, 300 mm, 200 mm, 100 mm, 50 mm, 1 mm, 950 µm, 900 µm, 850 µm, 800 µm, 750 µm, 700 µm, 650 µm, 600 µm, 550 µm, 500 µm, 450 µm, 400 µm, 350 µm, 300 µm, 250 µm, 200 µm, 100 µm, 90 µm, 80 µm, 70 µm, 60 µm, 50 µm, 40 µm, 30 µm, 20 µm, 10 µm, 5 µm, 4 µm, 3 µm, 2 µm, 1 µm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, 200 nm, 150 nm, 100 nm, 50 nm, 40 nm, 30 nm, 20 nm, 10 nm, or 5 nm, when the incident light has a wavelength ranging from 200 nm and 2500 nm, from 200 nm and 2000 nm, from 200 nm and 1500 nm, from 200 nm and 1000 nm, from 200 nm and 800 nm, from 400 nm and 470 nm, from 400 nm and 600 nm, from 400 nm and 700 nm.

According to one embodiment, the color conversion layer 4 is able to scatter at least 95%, 90%, 85%, 80%, 75%, 70%, 65%, 60%, 55%, 50%, 45%, 40%, 35%, 30%, 25%, 20%, 15%, 10%, or 5% of incident light on a thickness less or equal to 1 cm, 900 mm 800 mm, 700 mm, 600 mm, 500 mm, 400 mm, 300 mm, 200 mm, 100 mm, 50 mm, 1 mm, 950 µm, 900 µm, 850 µm, 800 µm, 750 µm, 700 µm, 650 µm, 600 µm, 550 µm, 500 µm, 450 µm, 400 µm, 350 µm, 300 µm, 250 µm, 200 µm, 100 µm, 90 µm, 80 µm, 70 µm, 60 µm, 50 µm, 40 µm, 30 µm, 20 µm, 10 µm, 5 µm, 4 µm, 3 µm, 2 µm, 1 µm, 950 nm, 900 nm, 850 nm, 800 nm, 750 nm, 700 nm, 650 nm, 600 nm, 550 nm, 500 nm, 450 nm, 400 nm, 350 nm, 300 nm, 250 nm, 200 nm, 150 nm, 100 nm, 50 nm, 40 nm, 30 nm, 20 nm, 10 nm, or 5 nm, when the incident light has a wavelength ranging from 200 nm and 2500 nm, from 200 nm and 2000 nm, from 200 nm and 1500 nm, from 200 nm and 1000 nm, from 200 nm and 800 nm, from 400 nm and 470 nm, from 400 nm and 600 nm, from 400 nm and 700 nm.

According to one embodiment, the color conversion layer 4 is able to transmit at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the color conversion layer 4 is able to absorb at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the the color conversion layer 4 is able to scatter at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the the color conversion layer 4 is able to backscatter at least 5%, 10%, 15%, 20%, 25%, 30%, 35%, 40%, 45%, 50%, 55%, 60%, 65%, 70%, 75%, 80%, 85%, 90%, 95%, or 100% of the incident light.

According to one embodiment, the color conversion layer 4 is free of oxygen.

According to one embodiment, the color conversion layer 4 is free of water.

According to one embodiment, the color conversion layer 4 has a thickness between 0 nm and 10 cm, more preferably between 100 nm and 1 cm, even more preferably between 100 nm and 1 mm.

According to one embodiment, the color conversion layer 4 has a thickness of at least 0 nm, 5 nm, 10 nm, 15 nm, 20 nm, 25 nm, 30 nm, 35 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 µm, 1.5 µm, 2.5 µm, 3 µm, 3.5 µm, 4 µm, 4.1 µm, 4.2 µm, 4.3 µm, 4.4 µm, 4.5 µm, 4.6 µm, 4.7 µm, 4.8 µm, 4.9 µm, 5 µm, 5.1 µm, 5.2 µm, 5.3 µm, 5.4 µm, 5.5 µm, 5.5 µm, 5.6 µm, 5.7 µm, 5.8 µm, 5.9 µm, 6 µm, 6.5 µm, 7 µm, 7.5 µm, 8 µm, 8.5 µm, 9 µm, 9.5 µm, 10 µm, 10.5 µm, 11 µm, 11.5 µm, 12 µm, 12.5 µm, 13 µm, 13.5 µm, 14 µm, 14.5 µm, 15 µm, 15.5 µm, 16 µm, 16.5 µm, 17 µm, 17.5 µm, 18 µm, 18.5 µm, 19 µm, 19.5 µm, 20 µm, 20.5 µm, 21 µm, 21.5 µm, 22 µm, 22.5 µm, 23 µm, 23.5 µm, 24 µm, 24.5 µm, 25 µm, 25.5 µm, 26 µm, 26.5 µm, 27 µm, 27.5 µm, 28 µm, 28.5 µm, 29 µm, 29.5 µm, 30 µm, 30.5 µm, 31 µm, 31.5 µm, 32 µm, 32.5 µm, 33

μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 5 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the color conversion layer 4 has a homogeneous thickness. In this embodiment, the thickness of the color conversion layer 4 does not vary and is the same all along said color conversion layer 4.

According to one embodiment, the color conversion layer 4 has a heterogeneous thickness. In this embodiment, the thickness of the color conversion layer 4 may vary and may be different in different zones of said color conversion layer 4.

According to one embodiment, the color conversion layer 4 is able to emit a secondary light when is submitted to a primary light from a light source.

According to one embodiment, the color conversion layer 4 is configured to emit at least one secondary light.

According to one embodiment, the at least one secondary light emitted by the color conversion layer 4 is a combination of blue, green and red.

According to one embodiment, the at least one secondary light emitted by the color conversion layer 4 is a combination of green and red.

According to one embodiment, the at least one secondary light emitted by the color conversion layer 4 is blue.

According to one embodiment, the at least one secondary light emitted by the color conversion layer 4 is green.

According to one embodiment, the at least one secondary light emitted by the color conversion layer 4 is red.

According to one embodiment, the at least one secondary light emitted by the color conversion layer 4 has a wavelength ranging from 200 nm to 2500 nm.

According to one embodiment, the at least one secondary light emitted by the color conversion layer 4 has a wavelength ranging from 200 nm to 800 nm, from 400 nm to 800 nm, from 800 nm to 1200 nm, from 1200 nm to 1500 nm, from 1500 nm to 1800 nm, from 1800 nm to 2200 nm or from 2200 nm to 2500 nm, from 400 nm to 470 nm, from 400 nm to 500 nm, from 400 nm to 600 nm, or from 400 nm to 700 nm.

According to one embodiment, the at least one secondary light emitted by the color conversion layer 4 is green light with a maximum emission wavelength between 500 nm and 560 nm, more preferably between 515 nm and 545 nm.

According to one embodiment, the at least one secondary light emitted by the color conversion layer 4 is red light with a maximum emission wavelength between 600 nm and 2500 nm, more preferably between 610 nm and 650 nm.

According to one embodiment, the at least one secondary light emitted by the color conversion layer 4 is blue light with a maximum emission wavelength between 400 nm to 470 nm.

In one embodiment, the color conversion layer 4 comprises only one light emitting material 7.

In one embodiment, the color conversion layer 4 comprises at leat 1, 2, 3, 4, 5, 6, 7, 8, 9, 10, 15, 20, 25, 30, 35, 40, 45, 50, 55, 60, 65, 70, 75, 80, 85, 90, 95, 100, 150, 200, 250, 300, 350, 400, 450, 500, 550, 600, 650, 700, 750, 800, 850, 900, 950 or 1000 light emitting materials 7. In this embodiment, the light emitting materials 7 may form an array of light emitting materials 7. In this embodiment, the light emitting materials 7 are spaced from one another, i.e. they do not touch.

In one embodiment, the light emitting materials 7 may be separated by at least one surrounding medium 72.

According to one embodiment, the color conversion layer 4 may comprises at least one zone comprising at least one light emitting material 7 and/or at least one zone free of light emitting material 7 and/or at least one empty zone and/or at least one optically transparent zone.

According to one embodiment, there may be discontinuities or irregularities along the color conversion layer 4.

In one embodiment, the color conversion layer 4 comprises two light emitting materials 7 emitting different colors or wavelengths.

In one embodiment, the color conversion layer 4 comprises two light emitting materials 7, a first light emitting material 7 with a maximum emission wavelength between 500 nm and 560 nm, more preferably between 515 nm and 545 nm and a second light emitting material 7 with a maximum emission wavelength between 600 nm and 2500 nm, more preferably between 610 nm and 650 nm.

In one embodiment, the color conversion layer 4 comprises three light emitting materials 7 emitting different colors or wavelengths.

In one embodiment, the color conversion layer 4 comprises three light emitting materials 7, a first light emitting material 7 with a maximum emission wavelength between 440 and 499 nm, more preferably between 450 and 495 nm, a second light emitting material 7 with a maximum emission wavelength between 500 nm and 560 nm, more preferably between 515 nm and 545 nm and a third light emitting material 7 with a maximum emission wavelength between 600 nm and 2500 nm, more preferably between 610 nm and 650 nm.

In one embodiment, the color conversion layer 4 comprises a plurality of light emitting materials 7. In this embodiment, the light emitting materials 7 may emit secondary lights of the same color or wavelength.

In one embodiment, the color conversion layer 4 comprises a plurality of light emitting material 7. In this embodiment, the light emitting materials 7 may emit secondary lights of different colors or wavelengths.

In one embodiment, the color conversion layer 4 comprises at least one light emitting material 7 comprising only one population of composite particles 1.

In one embodiment, the color conversion layer 4 comprises at least one light emitting material 7, each comprising only one population of composite particles 1, the populations comprised in each light emitting material 7 emitting different colors or wavelengths.

In one embodiment, the color conversion layer 4 comprises at least one light emitting material 7, each comprising two populations of composite particles 1 emitting different colors or wavelengths.

In one embodiment, the color conversion layer 4 comprises at least one light emitting material 7 comprising three populations of composite particles 1 emitting different colors or wavelengths.

In one embodiment, the color conversion layer 4 comprises a plurality of light emitting materials 7 each comprising only one population of composite particles 1, the populations comprised in each light emitting material 7 emitting different colors or wavelengths.

In one embodiment, the concentration of the plurality of light emitting material 7 comprised in the color conversion layer 4 and emitting different colors or wavelengths, is controlled to predetermine the light intensity of each secondary light emitted by said plurality of light emitting material 7, after excitation of the composite particles 1 by a primary light.

In one embodiment, the color conversion layer 4 comprises at least one light emitting material 7 comprising composite particles 1 which emit green light and red light upon downconversion of a blue light source. In this embodiment, the color conversion layer 4 is configured to transmit a predetermined intensity of the primary blue light and to emit a predetermined intensity of secondary green and red lights, allowing to emit a resulting tri-chromatic white light.

In one embodiment, the color conversion layer 4 comprises at least one light emitting material 7 comprising at least one composite particle 1 which emits green light, and at least one light emitting material 7 comprising at least one composite particle 1 which emits red light upon downconversion of a blue light source. In this embodiment, the color conversion layer 4 is configured to transmit a predetermined intensity of the primary blue light and to emit a predetermined intensity of secondary green and red lights, allowing to emit a resulting tri-chromatic white light.

In one embodiment, the color conversion layer 4 comprises at least one light emitting material 7 comprising at least one composite particle 1 which emits green light, at least one light emitting material 7 comprising at least one composite particle 1 which emits red light, and at least one light emitting material 7 comprising at least one composite particle 1 which emits blue light upon downconversion of a UV light source. In this embodiment, the color conversion layer 4 is configured to transmit a predetermined intensity of the primary UV light and to emit a predetermined intensity of secondary green, red and blue lights, allowing to emit a resulting tri-chromatic white light.

In one embodiment, the color conversion layer 4 exhibits photoluminescence quantum yield (PLQY) decrease of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

In one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination.

According to one embodiment, the light illumination is provided by blue, green, red, or UV light source such as laser, diode, fluorescent lamp or Xenon Arc Lamp. According to one embodiment, the photon flux or average peak pulse power of the illumination is comprised between 1 $nW \cdot cm^{-2}$ and 100 $kW \cdot cm^{-2}$, more preferably between 10 $mW \cdot cm^{-2}$ and 100 $W \cdot cm^{-2}$, and even more preferably between 10 $mW \cdot cm^{-2}$ and 30 $W \cdot cm^{-2}$.

According to one embodiment, the photon flux or average peak pulse power of the illumination is at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the color conversion layer 4 exhibits photoluminescence quantum yield (PQLY) decrease of less than 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 300, 400, 500, 600, 700, 800, 900, 1000, 2000, 3000, 4000, 5000, 6000, 7000, 8000, 9000, 10000, 11000, 12000, 13000, 14000, 15000, 16000, 17000, 18000, 19000, 20000, 21000, 22000, 23000, 24000, 25000, 26000, 27000, 28000, 29000, 30000, 31000, 32000, 33000, 34000, 35000, 36000, 37000, 38000, 39000, 40000, 41000, 42000, 43000, 44000, 45000, 46000, 47000, 48000, 49000, or 50000 hours under light illumination with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{--2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 nW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 μW·cm$^{-2}$, 10 μW·cm$^{-2}$, 100 μW·cm$^{-2}$, 500 μW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5

$W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its photoluminescence quantum yield (PLQY) of less than 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a decrease of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40

W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$ or 100 kW·cm$^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 00 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, with a photon flux or average peak pulse power of at least 1 nW·cm$^{-2}$, 50 nW·cm$^{-2}$, 100 nW·cm$^{-2}$, 200 nW·cm$^{-2}$, 300 nW·cm$^{-2}$, 400 nW·cm$^{-2}$, 500 nW·cm$^{-2}$, 600 nW·cm$^{-2}$, 700 nW·cm$^{-2}$, 800 nW·cm$^{-2}$, 900 nW·cm$^{-2}$, 1 µW·cm$^{-2}$, 10 µW·cm$^{-2}$, 100 µW·cm$^{-2}$, 500 µW·cm$^{-2}$, 1 mW·cm$^{-2}$, 50 mW·cm$^{-2}$, 100 mW·cm$^{-2}$, 500 mW·cm$^{-2}$, 1 W·cm$^{-2}$, 5 W·cm$^{-2}$, 10 W·cm$^{-2}$, 20 W·cm$^{-2}$, 30 W·cm$^{-2}$, 40 W·cm$^{-2}$, 50 W·cm$^{-2}$, 60 W·cm$^{-2}$, 70 W·cm$^{-2}$, 80 W·cm$^{-2}$, 90 W·cm$^{-2}$, 100 W·cm$^{-2}$, 110 W·cm$^{-2}$, 120 W·cm$^{-2}$, 130 W·cm$^{-2}$, 140 W·cm$^{-2}$, 150 W·cm$^{-2}$, 160 W·cm$^{-2}$, 170 W·cm$^{-2}$, 180 W·cm$^{-2}$, 190 W·cm$^{-2}$, 200 W·cm$^{-2}$, 300 W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $\mathbf{0}_2$, under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 exhibits a degradation of its resulting light intensity of less than 95%, 90%, 80%, 70%, 60%, 50%, 40%, 30%, 25%, 20%, 15%, 10%, 5%, or 0% after at least 1 day, 5 days, 10 days, 15 days, 20 days, 25 days, 1 month, 2 months, 3 months, 4 months, 5 months, 6 months, 7 months, 8 months, 9 months, 10 months, 11 months, 12 months, 18 months, 2 years, 2.5 years, 3 years, 3.5 years, 4 years, 4.5 years, 5 years, 5.5 years, 6 years, 6.5 years, 7 years, 7.5 years, 8 years, 8.5 years, 9 years, 9.5 years, or 10 years under 0%, 5%, 10%, 15%, 20%, 25%, 30%, 35%, 40%, 45%, 50%, 55%, 60%, 65%, 70%, 75%, 80%, 85%, 90%, 95%, or 100% of molecular $O_2$, under 0° C., 10° C., 20° C., 30° C., 40° C., 50° C., 60° C., 70° C., 80° C., 90° C., 100° C., 125° C., 150° C., 175° C., 200° C., 225° C., 250° C., 275° C., or 300° C., and under 0%, 10%, 20%, 30%, 40%, 50%, 55%, 60%, 65%, 70%, 75%, 80%, 85%, 90%, 95%, or 99% of humidity, with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

According to one embodiment, the color conversion layer 4 comprises composite particles 1 at a level ranging from 100 ppm to 500 000 ppm in weight or from 5000 ppm to 10 000 ppm in weight.

According to one embodiment, the color conversion layer 4 comprises composite particles 1 at a level of at least 100 ppm, 200 ppm, 300 ppm, 400 ppm, 500 ppm, 600 ppm, 700 ppm, 800 ppm, 900 ppm, 1000 ppm, 1100 ppm, 1200 ppm, 1300 ppm, 1400 ppm, 1500 ppm, 1600 ppm, 1700 ppm, 1800 ppm, 1900 ppm, 2000 ppm, 2100 ppm, 2200 ppm, 2300 ppm, 2400 ppm, 2500 ppm, 2600 ppm, 2700 ppm, 2800 ppm, 2900 ppm, 3000 ppm, 3100 ppm, 3200 ppm, 3300 ppm, 3400 ppm, 3500 ppm, 3600 ppm, 3700 ppm, 3800 ppm, 3900 ppm, 4000 ppm, 4100 ppm, 4200 ppm, 4300 ppm, 4400 ppm, 4500 ppm, 4600 ppm, 4700 ppm, 4800 ppm, 4900 ppm, 5000 ppm, 5100 ppm, 5200 ppm, 5300 ppm, 5400 ppm, 5500 ppm, 5600 ppm, 5700 ppm, 5800 ppm, 5900 ppm, 6000 ppm, 6100 ppm, 6200 ppm, 6300 ppm, 6400 ppm, 6500 ppm, 6600 ppm, 6700 ppm, 6800 ppm, 6900 ppm, 7000 ppm, 7100 ppm, 7200 ppm, 7300 ppm, 7400 ppm, 7500 ppm, 7600 ppm, 7700 ppm, 7800 ppm, 7900 ppm, 8000 ppm, 8100 ppm, 8200 ppm, 8300 ppm, 8400 ppm, 8500 ppm, 8600 ppm, 8700 ppm, 8800 ppm, 8900 ppm, 9000 ppm, 9100 ppm, 9200 ppm, 9300 ppm, 9400 ppm, 9500 ppm, 9600 ppm, 9700 ppm, 9800 ppm, 9900 ppm, 10000 ppm, 10500 ppm, 11000 ppm, 11500 ppm, 12000 ppm, 12500 ppm, 13000 ppm, 13500 ppm, 14000 ppm, 14500 ppm, 15000 ppm, 15500 ppm, 16000 ppm, 16500 ppm, 17000 ppm, 17500 ppm, 18000 ppm, 18500 ppm, 19000 ppm, 19500 ppm, 20000 ppm, 30000 ppm, 40000 ppm, 50000 ppm, 60000 ppm, 70000 ppm, 80000 ppm, 90000 ppm, 100000 ppm, 110000 ppm, 120000 ppm, 130000 ppm, 140000 ppm, 150000 ppm, 160000 ppm, 170000 ppm, 180000 ppm, 190000 ppm, 200000 ppm, 210000 ppm, 220000 ppm, 230000 ppm, 240000 ppm, 250000 ppm, 260000 ppm, 270000 ppm, 280000 ppm, 290000 ppm, 300000 ppm, 310000 ppm, 320000 ppm, 330000 ppm, 340000 ppm, 350000 ppm, 360000 ppm, 370000 ppm, 380000 ppm, 390000 ppm, 400000 ppm, 410000 ppm, 420000 ppm, 430000 ppm, 440000 ppm, 450000 ppm, 460000 ppm, 470000 ppm, 480000 ppm, 490000 ppm, or 500 000 ppm in weight.

According to one embodiment, the color conversion layer 4 comprises less than 95%, 90%, 80%, 70%, 60%, 50%, 40%, 30%, 20%, 10%, 8%, 6%, 4%, 2%, 1%, 0.5% or less than 0.1% in weight of composite particles 1.

According to one embodiment, the loading charge of composite particles 1 in the color conversion layer 4 is at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the loading charge of composite particles 1 in the color conversion layer 4 is less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, 91%, 92%, 93%, 94%, 95%, 96%, 97%, 98%, or 99%.

According to one embodiment, the composite particles 1 dispersed in the color conversion layer 4 have a packing fraction of at least 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the composite particles 1 dispersed in the color conversion layer 4 have a packing fraction of less than 0.01%, 0.05%, 0.1%, 0.15%, 0.2%, 0.25%, 0.3%, 0.35%, 0.4%, 0.45%, 0.5%, 0.55%, 0.6%, 0.65%, 0.7%, 0.75%, 0.8%, 0.85%, 0.9%, 0.95%, 1%, 2%, 3%, 4%, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44%, 45%, 46%, 47%, 48%, 49%, 50%, 51%, 52%, 53%, 54%, 55%, 56%, 57%, 58%, 59%, 60%, 61%, 62%, 63%, 64%, 65%, 66%, 67%, 68%, 69%, 70%, 71%, 72%, 73%, 74%, 75%, 76%, 77%, 78%, 79%, 80%, 81%, 82%, 83%, 84%, 85%, 86%, 87%, 88%, 89%, 90%, or 95%.

According to one embodiment, the color conversion layer 4 may comprise at least one volume free of light emitting material 7 in order to transmit primary light of the light source without any emission of secondary light through said at least one volume.

According to one embodiment, the at least one volume free of light emitting material has a section of 50 $nm^2$, 100 $nm^2$, 150 $nm^2$, 200 $nm^2$, 250 $nm^2$, 300 $nm^2$, 350 $nm^2$, 400 $nm^2$, 450 $nm^2$, 500 $nm^2$, 550 $nm^2$, 600 $nm^2$, 650 $nm^2$, 700 $nm^2$, 750 $nm^2$, 800 $nm^2$, 850 $nm^2$, 900 $nm^2$, 950 $nm^2$, 1 $\mu m^2$, 50 $\mu m^2$, 100 $\mu m^2$, 150 $\mu m^2$, 200 $\mu m^2$, 250 $\mu m^2$, 300 $\mu m^2$, 350 $\mu m^2$, 400 $\mu m^2$, 450 $\mu m^2$, 500 $\mu m^2$, 550 $\mu m^2$, 600 $\mu m^2$, 650 $\mu m^2$, 700 $\mu m^2$, 750 $\mu m^2$, 800 $\mu m^2$, 850 $\mu m^2$, 900 $\mu m^2$, 950 $\mu m^2$, 1 $cm^2$, 1.5 $cm^2$, 2 $cm^2$, 2.5 $cm^2$, 3 $cm^2$, 3.5 $cm^2$, 4 $cm^2$, 4.5 $cm^2$, 5 $cm^2$, 5.5 $cm^2$, 6 $cm^2$, 6.5 $cm^2$, 7 $cm^2$, 7.5 $cm^2$, 8 $cm^2$, 8.5 $cm^2$, 9 $cm^2$, 9.5 $cm^2$, or 10 $cm^2$.

According to one embodiment, the color conversion layer 4 comprises a plurality of layers of light emitting material 7. In this embodiment, the color conversion layer 4 may to emit polychromatic light as secondary light.

According to one embodiment, a layer of light emitting material 7 is deposited on another layer of a second light emitting material 7 emitting a secondary light with a lower wavelength compared to the secondary light emitted by the superior layer of light emitting material 7.

According to one embodiment, a layer of light emitting material 7 is deposited on another layer of a second light emitting material 7 emitting a secondary light with a higher wavelength compared to the secondary light emitted by the superior layer of light emitting material 7.

According to one embodiment, the color conversion layer 4 comprises a stacking of light emitting materials 7. In this embodiment, the light emitting materials 7 may emit a secondary light with the same wavelength or with different wavelengths. In one embodiment, the color conversion layer 4 is splitted in several areas, each of them comprises a different light emitting material 7 emitting different colors or wavelengths.

In one embodiment, the color conversion layer 4 has a shape of a film.

In one embodiment, the color conversion layer 4 has a shape of a tube.

In one embodiment, the color conversion layer 4 is a film.

In one embodiment, the color conversion layer 4 is a tube.

In one embodiment, the color conversion layer 4 is processed by extrusion.

In one embodiment, the color conversion layer 4 is an optical pattern. In this embodiment, said pattern may be formed on a support as described herein.

In one embodiment, the color conversion layer 4 is a light collection pattern. In this embodiment, said pattern may be formed on a support as described herein.

In one embodiment, the color conversion layer 4 is a light diffusion pattern. In this embodiment, said pattern may be formed on a support as described herein.

In one embodiment, the color conversion layer 4 is made of a stack of two films, each of them comprises a different light emitting material 7 emitting different colors or wavelengths.

In one embodiment, the color conversion layer 4 is made of a stack of a plurality of films, each of them comprises a different light emitting material 7 emitting different colors or wavelengths.

In one embodiment, the color conversion layer 4 comprises an array of light emitting materials 7. In this embodiment, the light emitting materials 7 may emit secondary lights of the same color or wavelength.

In one embodiment, the color conversion layer 4 comprises an array of light emitting materials 7. In this embodiment, the light emitting materials 7 may emit secondary lights of different colors or wavelengths.

In one embodiment illustrated in FIG. 19A-B, the color conversion layer 4 comprises an array of light emitting materials 7 partially or totally surrounded and/or covered by a surrounding medium 72.

According to one embodiment, the conversion layer 4 does not comprise pixels.

According to one embodiment, the conversion layer 4 does not comprise sub-pixels.

According to one embodiment, the color conversion layer 4 comprises an array of pixels (FIG. 19).

According to one embodiment, pixels of the array of pixels comprised in the color conversion layer 4 are separated by a pixel pitch D.

According to one embodiment, the pixel pitch D is at least 0.1 μm, 0.2 μm, 0.3 μm, 0.4 μm, 0.5 μm, 0.6 μm, 0.7 μm, 0.8 μm, 0.9 μm, 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 50 mm, 100 mm, 200 mm, 300 mm, 400 mm, 500 mm, 600 mm, 700 mm, 800 mm, 900 mm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5 2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7 4 mm, 7 5 mm, 7.6 mm, 7.7 mm, 7.8 mm, 7.9 mm, 8 mm, 8.1 mm, 8 2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the pixel size is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8 6 mm, 8.7 mm, 8.8 mm, 8.9 mm, 9 mm, 9.1 mm, 9 2 mm, 9 3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, pixels do not touch each others.

According to one embodiment, pixels do not overlap each others.

According to one embodiment, the color conversion layer 4 comprises an array of pixels and each pixel comprises at least one light emitting material 7.

According to one embodiment, the color conversion layer 4 comprises an array of pixels and each pixel comprises an array of light emitting materials 7.

According to one embodiment, the color conversion layer 4 comprises an array of pixels and each pixel comprises at least one sub-pixel.

According to one embodiment, the at least one sub-pixel comprises at least one light emitting material 7.

According to one embodiment, the at least one sub-pixel is free of light emitting material 7.

According to one embodiment, the at least one sub-pixel is free of light emitting material 7. In this embodiment, the at least one sub-pixel can comprise scattering particles.

According to one embodiment, the at least one sub-pixel comprises scattering particles.

According to one embodiment, at least one sub-pixel comprises a light emitting material 7, wherein said light emitting material 7 comprises scattering particles and does not comprise composite particles 1; and/or at least one sub-pixel comprises a light emitting material 7, wherein said light emitting material 7 comprises scattering particles and composite particles 1.

According to one embodiment, sub-pixels are separated by a sub-pixel pitch d.

According to one embodiment, the sub-pixel pitch d is at least 0.1 μm, 0.2 μm, 0.3 μm, 0.4 μm, 0.5 μm, 0.6 μm, 0.7 μm, 0.8 μm, 0.9 μm, 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87

μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 5 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the sub-pixel size is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8 mm, 1.9 mm, 2 mm, 2.1 mm, 2.2 mm, 2.3 mm, 2.4 mm, 2.5 mm, 2.6 mm, 2 7 mm, 2 8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9 2 mm, 9 3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, sub-pixels do not touch each others.

According to one embodiment, sub-pixels do not overlap each others.

According to one embodiment the color conversion layer 4 further comprises a grid with a net of openings wherein each opening corresponds to a pixel or a sub-pixel in order to overcome the overlaying of two pixels or sub-pixels each other.

According to one embodiment, the at least one sub-pixel is free of light emitting material 7. In this embodiment, the at least one sub-pixel is able to transmit primary light of the light source without any emission of secondary light through said at least one sub-pixel.

According to one embodiment, the color conversion layer 4 comprises an array of pixel and each pixel comprises 3 sub-pixels of each primary color (red, blue and green). In this embodiment, each of the 3 sub-pixels comprises a different light emitting material 7.

According to one embodiment, the color conversion layer 4 comprises an array of pixel and each pixel comprises 3 or more sub-pixels of each primary color (red, blue and green). In this embodiment, each of the sub-pixels comprises a different light emitting material According to one embodiment, the first sub-pixel comprises a light emitting material 7 emitting a red secondary light, the second sub-pixel comprises a light emitting material 7 emitting a blue secondary light, the third sub-pixel comprises a light emitting material 7 emitting a green secondary light.

According to one embodiment, the first sub-pixel comprises a light emitting material 7 emitting a red secondary light, the second sub-pixel comprises a light emitting material 7 emitting a blue secondary light, the third sub-pixel is free of light emitting material 7.

According to one embodiment, the first sub-pixel comprises a light emitting material 7 emitting a red secondary light, the second sub-pixel comprises a light emitting material 7 emitting a green secondary light, the third sub-pixel is free of light emitting material 7.

According to one embodiment, the first sub-pixel comprises a light emitting material 7 emitting a green secondary light, the second sub-pixel comprises a light emitting material 7 emitting a blue secondary light, the third sub-pixel is free of light emitting material 7.

According to one embodiment, the first sub-pixel comprises a light emitting material 7 emitting a green secondary light, the second sub-pixel and the third sub-pixel are free of light emitting material 7.

According to one embodiment, the first sub-pixel comprises a light emitting material 7 emitting a red secondary light, the second sub-pixel and the third sub-pixel are free of light emitting material 7.

According to one embodiment, the first sub-pixel comprises a light emitting material 7 emitting a blue secondary light, the second sub-pixel and the third sub-pixel are free of light emitting material 7.

According to one embodiment, the color conversion layer 4 comprises an array of pixel and each pixel comprises 3 sub-pixels of each primary color (red, blue and green). In this embodiment, each of the 3 sub-pixels comprises a different light emitting material 7 or inorganic phosphor.

According to one embodiment, the first sub-pixel comprises an inorganic phosphor emitting a red secondary light, the second sub-pixel comprises a light emitting material 7 emitting a blue secondary light, the third sub-pixel comprises a light emitting material 7 emitting a green secondary light.

According to one embodiment, the first sub-pixel comprises a light emitting material 7 emitting a red secondary light, the second sub-pixel comprises an inorganic phosphor emitting a blue secondary light, the third sub-pixel comprises a light emitting material 7 emitting a green secondary light.

According to one embodiment, the first sub-pixel comprises a light emitting material 7 emitting a red secondary light, the second sub-pixel comprises a light emitting material 7 emitting a blue secondary light, the third sub-pixel comprises an inorganic phosphor emitting a green secondary light.

According to one embodiment, the first sub-pixel comprises an inorganic phosphor emitting a red secondary light, the second sub-pixel comprises an inorganic phosphor emitting a blue secondary light, the third sub-pixel comprises a light emitting material 7 emitting a green secondary light.

According to one embodiment, the first sub-pixel comprises an inorganic phosphor emitting a red secondary light, the second sub-pixel comprises a light emitting material 7 emitting a blue secondary light, the third sub-pixel comprises an inorganic phosphor emitting a green secondary light.

According to one embodiment, the first sub-pixel comprises a light emitting material 7 emitting a red secondary light, the second sub-pixel comprises an inorganic phosphor emitting a blue secondary light, the third sub-pixel comprises an inorganic phosphor emitting a green secondary light.

According to one embodiment, the first sub-pixel emits a green secondary light, the second sub-pixel emits a blue secondary light, the third sub-pixel is free of light emitting material 7 or inorganic phosphor.

According to one embodiment, the first sub-pixel emits a green secondary light, the second sub-pixel emits a red secondary light, the third sub-pixel is free of light emitting material 7 or inorganic phosphor.

According to one embodiment, the first sub-pixel emits a red secondary light, the second sub-pixel emits a blue secondary light, the third sub-pixel is free of light emitting material 7 or inorganic phosphor.

According to one embodiment, the first sub-pixel emits a red secondary light, the second sub-pixel and the third sub-pixel are free of light emitting material 7 or inorganic phosphor.

According to one embodiment, the first sub-pixel emits a blue secondary light, the second sub-pixel and the third sub-pixel are free of light emitting material 7 or inorganic phosphor.

According to one embodiment, the first sub-pixel emits a green secondary light, the second sub-pixel and the third sub-pixel are free of light emitting material 7 or inorganic phosphor.

According to one embodiment, the color conversion layer 4 may be used as a color filter.

According to one embodiment, the color conversion layer 4 may be used in a color filter.

According to one embodiment, the color conversion layer 4 may be used in addition to a color filter.

According to one embodiment, the color conversion layer 4 may be used with a color filter.

According to one embodiment, the color conversion layer 4 may be covered with a color filter. In this emdodiment, covering the color conversion layer 4 with a color filter permit to block any primary light that would not be converted by the color conversion layer 4 as the color filter will convert it to the desired wavelength or color.

According to one embodiment, the color conversion layer 4 is a color filter.

According to one embodiment, the color conversion layer 4, the light emitting material 7 and/or the composite particle 1 is compliant with the Directive on the restriction of the use of certain hazardous substances in electrical and electronic equipment 2002/95/EC also called RoHS 1.

According to one embodiment, the color conversion layer 4, the light emitting material 7 and/or the composite particle 1 does not comprise more than 1000 ppm in weight of polybrominated biphenyl, does not comprise more than 1000 ppm in weight of polybrominated diphenyl ethers, does not comprise more than 1000 ppm in weight of Cr(VI), does not comprise more than 1000 ppm in weight of Hg, does not comprise more than 1000 ppm in weight of Pb and does not comprise more than 100 ppm in weight of Cd.

According to one embodiment, the color conversion layer 4, the light emitting material 7 and/or the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm in weight of cadmium.

According to one embodiment, the color conversion layer 4, the light emitting material 7 and/or the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of lead.

According to one embodiment, the color conversion layer 4, the light emitting material 7 and/or the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of mercury.

According to one embodiment, the color conversion layer 4, the light emitting material 7 and/or the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of hexavalent chromium.

According to one embodiment, the color conversion layer 4, the light emitting material 7 and/or the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of polybrominated biphenyl.

According to one embodiment, the color conversion layer 4, the light emitting material 7 and/or the composite particle 1 comprises less than 10 ppm, less than 20 ppm, less than 30 ppm, less than 40 ppm, less than 50 ppm, less than 100 ppm, less than 150 ppm, less than 200 ppm, less than 250 ppm, less than 300 ppm, less than 350 ppm, less than 400 ppm, less than 450 ppm, less than 500 ppm, less than 550 ppm, less than 600 ppm, less than 650 ppm, less than 700 ppm, less than 750 ppm, less than 800 ppm, less than 850 ppm, less than 900 ppm, less than 950 ppm, less than 1000 ppm, less than 2000 ppm, less than 3000 ppm, less than 4000 ppm, less than 5000 ppm, less than 6000 ppm, less than 7000 ppm, less than 8000 ppm, less than 9000 ppm, less than 10000 ppm in weight of polybrominated diphenyl ethers.

According to one embodiment, the color conversion layer 4 and/or the light emitting material 7 comprise heavier chemical elements or materials based on heavier chemical elements than the main chemical element present in the at least one surrounding medium 71 and/or the inorganic material 2. In this embodiment, said heavy chemical elements in the color conversion layer 4 and/or the light emitting material 7 will lower the mass concentration of chemical elements subject to ROHS standards, allowing said color conversion layer 4 and/or light emitting material 7 to be ROHS compliant.

According to one embodiment, examples of heavy elements include but are not limited to B, C, N, F, Na, Mg, Al, Si, P, S, Cl, K, Ca, Sc, Ti, V, Cr, Mn, Fe, Co, Ni, Cu, Zn, Ga, Ge, As, Se, Br, Rb, Sr, Y, Zr, Nb, Mo, Tc, Ru, Rh, Pd, Ag, Cd, In, Sn, Sb, Te, I, Cs, Ba, La, Hf, Ta, W, Re, Os, Ir, Pt, Au, Hg, Tl, Pb, Bi, Po, At, Ce, Pr, Nd, Pm, Sm, Eu, Gd, Tb, Dy, Ho, Er, Tm, Yb, Lu or a mixture of thereof.

According to one embodiment, the color conversion layer 4 comprises one or more materials useful in forming at least one of a hole transport layer, a hole injection layer, an electron transport layer, an electron injection layer, and an emissive layer, of a light-emitting device.

According to one embodiment, the color conversion layer 4 comprises a material that is cured or otherwise processed to form a layer on a support. According to a preferred embodiment, examples of color conversion layer 4 include but are not limited to: composite particle 1 dispersed in sol gel materials, silicone, polymers such as for example PMMA, PS, or a mixture thereof.

To scatter light, there should be a difference of refractive index between the at least one composite particle 1 and the at least one surrounding medium 71, or between the inorganic material 2 and the at least one surrounding medium 71. The difference of refractive index is as described hereabove and has to be at least 0.02 at 450 nm. When the difference of refractive index is less than 0.02, it makes it difficult to scatter the primary light or the secondary light due to the extremely slight difference of the refractive index.

According to one embodiment, as known from the skilled artisan, the light scattering induced by the presence of the at least one composite particle 1 in the at least one surrounding medium 71 may include Mie scattering and/or Rayleigh scattering depending on said composite particle 1.

According to one embodiment, the light scattering induced by the presence of the at least one composite particle 1 in the at least one surrounding medium 71 may be controlled by adjusting the Mie and/or Rayleigh scattering.

According to one embodiment, Mie scattering may be controlled by adjusting the density, size and shape of composite particles 1.

According to one embodiment, Rayleigh scattering may be used to have a difference in light scattering as a function of the wavelength, in particular to increase the scattering of primary light with respect to secondary light.

According to one embodiment, the light emitting material 7 comprises at least one Mie composite particle 1, i.e. at least one composite particle 1 which produces a Mie scattering, surrounded by the at least one surrounding medium 71.

According to one embodiment, the light emitting material 7 comprises at least one Rayleigh composite particle 1 i.e. at least one composite particle 1 which produces a Rayleigh scattering, surrounded by the at least one surrounding medium 71.

According to one embodiment, the light emitting material 7 comprises at least one Mie composite particle 1 and at least one Rayleigh composite particle 1 surrounded by the at least one surrounding medium 71. In this embodiment, the efficiency of the light emitting material 7 may be improved compared to merely using Mie composite particles.

In a second aspect, the invention relates to a support supporting at least one light emitting material 7 and/or at least one color conversion layer 4 as described here above.

In one embodiment, the support can be a substrate, a LED, a LED array, a vessel, a tube, a solar panel, a panel, or a container. Preferably the support is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

LED used herein includes LED, LED chip 5 and microsized LED 6.

In one embodiment, the support is reflective.

In one embodiment, the support comprises a material allowing to reflect the light such as for example a metal like aluminium, silver, a glass, a polymer or a plastic.

In one embodiment, the support is thermally conductive.

According to one embodiment, the support has a thermal conductivity at standard conditions ranging from 0.5 to 450 W/(m·K), preferably from 1 to 200 W/(m·K), more preferably from 10 to 150 W/(m·K).

According to one embodiment, the support has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6

W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the support comprises GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride.

According to one embodiment, the support comprises Au, Ag, Pt, Ru, Ni, Co, Cr, Cu, Sn, Rh Pd, Mn, Ti or a mixture thereof.

According to one embodiment, the support comprises silicon oxide, aluminium oxide, titanium oxide, copper oxide, iron oxide, silver oxide, lead oxide, calcium oxide, magnesium oxide, zinc oxide, tin oxide, beryllium oxide, zirconium oxide, niobium oxide, cerium oxide, iridium oxide, scandium oxide, nickel oxide, sodium oxide, barium oxide, potassium oxide, vanadium oxide, tellurium oxide, manganese oxide, boron oxide, phosphorus oxide, germanium oxide, osmium oxide, rhenium oxide, platinum oxide, arsenic oxide, tantalum oxide, lithium oxide, strontium oxide, yttrium oxide, hafnium oxide, tungsten oxide, molybdenum oxide, chromium oxide, technetium oxide, rhodium oxide, ruthenium oxide, cobalt oxide, palladium oxide, cadmium oxide, mercury oxide, thallium oxide, gallium oxide, indium oxide, bismuth oxide, antimony oxide, polonium oxide, selenium oxide, cesium oxide, lanthanum oxide, praseodymium oxide, neodymium oxide, samarium oxide, europium oxide, terbium oxide, dysprosium oxide, erbium oxide, holmium oxide, thulium oxide, ytterbium oxide, lutetium oxide, gadolinium oxide, mixed oxides, mixed oxides thereof or a mixture thereof.

In one embodiment, the at least one light emitting material 7 or the at least one color conversion layer 4 are deposited on the support by drop-casting, spin coating, dip coating, inkjet printing, lithography, spray, plating, electroplating, or any other means known by the person skilled in the art.

In one embodiment, the support supports at least one light emitting material 7 and/or at least one color conversion layer 4 comprising at least one population of composite particles 1. In the present application, a population of composite particles 1 is defined by the maximum emission wavelength.

In one embodiment, the support supports at least one light emitting material 7 and/or at least one color conversion layer 4 comprising two populations of composite particles 1 emitting different colors or wavelengths. In one embodiment, the support supports two light emitting materials 7 and/or two color conversion layers 4 each comprising one population of composite particles 1, the populations comprised in each light emitting material 7 and/or in each color conversion layer 4 emitting different colors.

In one embodiment, the support supports at least one light emitting material 7 and/or at least one color conversion layer 4 comprising composite particles 1 which emit green light and red light upon downconversion of a blue light source. In this embodiment, the at least one light emitting material 7 and/or the at least one color conversion layer 4 is configured to transmit a predetermined intensity of the primary blue light and to emit a predetermined intensity of secondary green and red lights, allowing to emit a resulting tri-chromatic white light.

In one embodiment, the support supports at least one light emitting material 7 and/or at least one color conversion layer 4 comprising at least one composite particle 1 which emits green light, and at least one light emitting material 7 and/or at least one color conversion layer 4 comprising at least one composite particle 1 which emits red light upon downconversion of a blue light source. In this embodiment, the at least one light emitting material 7 and/or the at least one color conversion layer 4 are configured to transmit a predetermined intensity of the primary blue light and to emit a predetermined intensity of secondary green and red lights, allowing to emit a resulting tri-chromatic white light.

In one embodiment, the support supports at least one light emitting material 7 and/or at least one color conversion layer 4 comprising two populations of composite particles 1, a first population with a maximum emission wavelength between 500 nm and 560 nm, more preferably between 515 nm and 545 nm and a second population with a maximum emission wavelength between 600 nm and 2500 nm, more preferably between 610 nm and 650 nm.

In one embodiment, the support supports two light emitting materials 7 and/or two color conversion layers 4 each comprising at least one population of composite particles 1, a first light emitting material 7 and/or color conversion layer 4 comprising a first population with a maximum emission wavelength between 500 nm and 560 nm, more preferably between 515 nm and 545 nm and a second light emitting material 7 and/or color conversion layer 4 comprising a second population with a maximum emission wavelength between 600 nm and 2500 nm, more preferably between 610 nm and 650 nm.

In one embodiment, the support supports at least one light emitting material 7 and/or at least one color conversion layer 4 comprising two populations of composite particles 1, a first population with at least one emission peak having a full width half maximum lower than 90 nm, 80 nm, 70 nm, 60 nm, 50 nm, 40 nm, 30 nm, 25 nm, 20 nm, 15 nm, or 10 nm and a second population with at least one emission peak having a full width half maximum lower than 90 nm, 80 nm, 70 nm, 60 nm, 50 nm, 40 nm, 30 nm, 25 nm, 20 nm, 15 nm, or 10 nm.

In one embodiment, the support supports two light emitting materials 7 and/or two color conversion layers 4 each comprising at least one population of composite particles 1, a first light emitting material 7 and/or at least one color conversion layer 4 comprising a first population with at least one emission peak having a full width half maximum lower than 90 nm, 80 nm, 70 nm, 60 nm, 50 nm, 40 nm, 30 nm, 25 nm, 20 nm, 15 nm, or 10 nm and a second light emitting material 7 and/or at least one color conversion layer 4 comprising a second population with at least one emission peak having a full width half maximum lower than 90 nm, 80 nm, 70 nm, 60 nm, 50 nm, 40 nm, 30 nm, 25 nm, 20 nm, 15 nm, or 10 nm.

In one embodiment, the support supports at least one light emitting material 7 and/or at least one color conversion layer 4 comprising two populations of composite particles 1, a first population with at least one emission peak having a full width at quarter maximum lower than 90 nm, 80 nm, 70 nm, 60 nm, 50 nm, 40 nm, 30 nm, 25 nm, 20 nm, 15 nm, or 10 nm and a second population with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

In one embodiment, the support supports two light emitting materials 7 and/or two color conversion layers 4 each comprising at least one population of composite particles 1, a first light emitting material 7 and/or at least one color conversion layer 4 comprising a first population with at least one emission peak having a full width at quarter maximum lower than 90 nm, 80 nm, 70 nm, 60 nm, 50 nm, 40 nm, 30 nm, 25 nm, 20 nm, 15 nm, or 10 nm and a second light emitting material 7 and/or at least one color conversion layer 4 comprising a second population with at least one emission peak having a full width at quarter maximum lower than 90 nm, 80 nm, 70 nm, 60 nm, 50 nm, 40 nm, 30 nm, 25 nm, 20 nm, 15 nm, or 10 nm.

In one embodiment, the at least one light emitting material 7 and/or at least one color conversion layer 4 on a support is encapsulated into a multilayered system. In one embodiment, the multilayer system comprises at least two, at least three layers.

In one embodiment, the multilayered system may further comprise at least one auxiliary layer.

According to one embodiment, the auxiliary layer is optically transparent at wavelengths between 200 nm and 50 μm, between 200 nm and 10 μm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm. In this embodiment, the auxiliary layer does not absorb any light allowing the composite particle 1 and/or the light emitting material 7 to absorb all the incident light.

According to one embodiment, the auxiliary layer limits or prevents the degradation of the chemical and physical properties of the at least one light emitting material 7 and/or at least one color conversion layer 4 from molecular oxygen, ozone, water and/or high temperature.

According to one embodiment, the auxiliary layer is thermally conductive.

According to one embodiment, the auxiliary layer has a thermal conductivity at standard conditions ranging from 0.1 to 450 W/(m·K), preferably from 1 to 200 W/(m·K), more preferably from 10 to 150 W/(m·K).

According to one embodiment, the auxiliary layer has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9

W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the auxiliary layer is a polymeric auxiliary layer.

According to one embodiment, the one or more components of the auxiliary layer can include a polymerizable component, a crosslinking agent, a scattering agent, a rheology modifier, a filler, a photoinitiator, or a thermal initiator as described here after or above.

According to one embodiment, the auxiliary layer comprises scattering particles. Examples of scattering particles include but are not limited to: $SiO_2$, $ZrO_2$, ZnO, MgO, $SnO_2$, $TiO_2$, Au, Ag, alumina, barium sulfate, PTFE, barium titanate and the like.

In one embodiment, the auxiliary layer further comprises thermal conductor particles. Examples of thermal conductor particles include but are not limited to: $SiO_2$, $ZrO_2$, ZnO, MgO, $SnO_2$, $TiO_2$, alumina, barium sulfate, PTFE, barium titanate and the like. In this embodiment, the thermal conductivity of the auxiliary layer is increased.

According to one embodiment, the auxiliary layer comprises a solid host material as described here above.

In one embodiment, the auxiliary layer has a thickness between 30 nm and 1 cm, between 100 nm and 1 mm, preferably between 100 nm and 500 μm.

According to one embodiment, the auxiliary layer has a thickness of at least 30 nm, 40 nm, 50 nm, 60 nm, 70 nm, 80 nm, 100 nm, 110 nm, 120 nm, 130 nm, 140 nm, 150 nm, 160 nm, 170 nm, 180 nm, 190 nm, 200 nm, 210 nm, 220 nm, 230 nm, 240 nm, 250 nm, 260 nm, 270 nm, 280 nm, 290 nm, 300 nm, 350 nm, 400 nm, 450 nm, 500 nm, 550 nm, 600 nm, 650 nm, 700 nm, 750 nm, 800 nm, 850 nm, 900 nm, 950 nm, 1 μm, 1.5 μm, 2.5 μm, 3 μm, 3.5 μm, 4 μm, 4.1 μm, 4.2 μm, 4.3 μm, 4.4 μm, 4.5 μm, 4.6 μm, 4.7 μm, 4.8 μm, 4.9 μm, 5 μm, 5.1 μm, 5.2 μm, 5.3 μm, 5.4 μm, 5.5 μm, 5.5 μm, 5.6 μm, 5.7 μm, 5.8 μm, 5.9 μm, 6 μm, 6.5 μm, 7 μm, 7.5 μm, 8 μm, 8.5 μm, 9 μm, 9.5 μm, 10 μm, 10.5 μm, 11 μm, 11.5 μm, 12 μm, 12.5 μm, 13 μm, 13.5 μm, 14 μm, 14.5 μm, 15 μm, 15.5 μm, 16 μm, 16.5 μm, 17 μm, 17.5 μm, 18 μm, 18.5 μm, 19 μm, 19.5 μm, 20 μm, 20.5 μm, 21 μm, 21.5 μm, 22 μm, 22.5 μm, 23 μm, 23.5 μm, 24 μm, 24.5 μm, 25 μm, 25.5 μm, 26 μm, 26.5 μm, 27 μm, 27.5 μm, 28 μm, 28.5 μm, 29 μm, 29.5 μm, 30 μm, 30.5 μm, 31 μm, 31.5 μm, 32 μm, 32.5 μm, 33 μm, 33.5 μm, 34 μm, 34.5 μm, 35 μm, 35.5 μm, 36 μm, 36.5 μm, 37 μm, 37.5 μm, 38 μm, 38.5 μm, 39 μm, 39.5 μm, 40 μm, 40.5 μm, 41 μm, 41.5 μm, 42 μm, 42.5 μm, 43 μm, 43.5 μm, 44 μm, 44.5 μm, 45 μm, 45.5 μm, 46 μm, 46.5 μm, 47 μm, 47.5 μm, 48 μm, 48.5 μm, 49 μm, 49.5 μm, 50 μm, 50.5 μm, 51 μm, 51.5 μm, 52 μm, 52.5 μm, 53 μm, 53.5 μm, 54 μm, 54.5 μm, 55 μm, 55.5 μm, 56 μm, 56.5 μm, 57 μm, 57.5 μm, 58 μm, 58.5 μm, 59 μm, 59.5 μm, 60 μm, 60.5 μm, 61 μm, 61.5 μm, 62 μm, 62.5 μm, 63 μm, 63.5 μm, 64 μm, 64.5 μm, 65 μm, 65.5 μm, 66 μm, 66.5 μm, 67 μm, 67.5 μm, 68 μm, 68.5 μm, 69 μm, 69.5 μm, 70 μm, 70.5 μm, 71 μm, 71.5 μm, 72 μm, 72.5 μm, 73 μm, 73.5 μm, 74 μm, 74.5 μm, 75 μm, 75.5 μm, 76 μm, 76.5 μm, 77 μm, 77.5 μm, 78 μm, 78.5 μm, 79 μm, 79.5 μm, 80 μm, 80.5 μm, 81 μm, 81.5 μm, 82 μm, 82.5 μm, 83 μm, 83.5 μm, 84 μm, 84.5 μm, 85 μm, 85.5 μm, 86 μm, 86.5 μm, 87 μm, 87.5 μm, 88 μm, 88.5 μm, 89 μm, 89.5 μm, 90 μm, 90.5 μm, 91 μm, 91.5 μm, 92 μm, 92.5 μm, 93 μm, 93.5 μm, 94 μm, 94.5 μm, 95 μm, 95.5 μm, 96 μm, 96.5 μm, 97 μm, 97.5 μm, 98 μm, 98.5 μm, 99 μm, 99.5 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, or 1 cm.

According to one embodiment, the at least one light emitting material 7 and/or at least one color conversion layer 4 or the multilayered system is covered by at least one protective layer.

In one embodiment, the at least one light emitting material 7 and/or at least one color conversion layer 4 or the multilayered system is surrounded by at least one protective layer.

In one embodiment, the at least one light emitting material 7 and/or at least one color conversion layer 4 or the multilayered system is covered by at least one auxiliary layer, both being then surrounded by at least one protective layer.

In one embodiment, the at least one light emitting material 7 and/or at least one color conversion layer 4 or the multilayered system is covered at least one auxiliary layer and/or at least one protective layer.

In one embodiment, the protective layer is a planarization layer.

In one embodiment, the protective layer is an oxygen, ozone and/or water impermeable layer. In this embodiment, the protective layer is a barrier against oxidation, and limits or prevents the degradation of the chemical and physical properties of the at least one composite particles 1 and/or the at least one emitting material from molecular oxygen, ozone, water and/or high temperature.

In one embodiment, the protective layer is an oxygen, ozone and/or water non-permeable layer. In this embodiment, the protective layer is a barrier against oxidation, and limits or prevents the degradation of the chemical and physical properties of the at least one light emitting material 7 and/or at least one color conversion layer 4 from molecular oxygen, ozone, water and/or high temperature.

According to one embodiment, the protective layer is thermally conductive.

According to one embodiment, the protective layer has a thermal conductivity at standard conditions ranging from 0.1 to 450 W/(m·K), preferably from 1 to 200 W/(m·K), more preferably from 10 to 150 W/(m·K).

According to one embodiment, the protective layer has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3

W/(m·K), 1.4 W/(m·K), 1.5 W/(m·K), 1.6 W/(m·K), 1.7 W/(m·K), 1.8 W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

In one embodiment, the protective layer can be made of glass, PET (Polyethylene terephthalate), PDMS (Polydimethylsiloxane), PES (Polyethersulfone), PEN (Polyethylene naphthalate), PC (Polycarbonate), PI (Polyimide), PNB (Polynorbornene), PAR (Polyarylate), PEEK (Polyetheretherketone), PCO (Polycyclic olefins), PVDC (Polyvinylidene chloride), Nylon, ITO (Indium tin oxide), FTO (Fluorine doped tin oxide), cellulose, $Al_2O_3$, $AlO_xN_y$, $SiO_xC_y$, $SiO_2$, $SiO_x$, $SiN_X$, SiC, $ZrO_2$, $TiO_2$, MgO, ZnO, $SnO_2$, ceramic, organic modified ceramic, or mixture thereof.

In one embodiment, the protective layer can be deposited by PECVD (Plasma Enhanced Chemical Vapor Deposition), ALD (Atomic Layer Deposition), CVD (Chemical Vapor Deposition), iCVD (Initiator Chemical Vapor Deposition), Cat-CVD (Catalytic Chemical Vapor Deposition).

According to one embodiment, the protective layer may comprise scattering agents. Examples of scattering agents include but are not limited to: $SiO_2$, $ZrO_2$, ZnO, MgO, $SnO_2$, $TiO_2$, alumina, barium sulfate, PTFE, barium titanate and the like.

In one embodiment, the protective layer further comprises thermal conductor particles. Examples of thermal conductor particles include but are not limited to: $SiO_2$, $ZrO_2$, ZnO, MgO, $SnO_2$, $TiO_2$, alumina, barium sulfate, PTFE, barium titanate and the like. In this embodiment, the thermal conductivity of the protective layer is increased.

In one embodiment, the support can be a substrate, a LED, a LED array, a vessel, a tube, a solar panel, a panel, or a container. Preferably the support is optically transparent at wavelengths between 200 nm and 50 nm, between 200 nm and 10 nm, between 200 nm and 2500 nm, between 200 nm and 2000 nm, between 200 nm and 1500 nm, between 200 nm and 1000 nm, between 200 nm and 800 nm, between 400 nm and 700 nm, between 400 nm and 600 nm, or between 400 nm and 470 nm.

LED used herein includes LED, LED chip and microsized LED.

In one embodiment, the support can be a fabric, a piece of clothes, wood, plastic, ceramic, glass, steel, metal, or any active surfaces.

In one embodiment, active surfaces are interactive surfaces.

In one embodiment, active surfaces are surfaces destined to be included in an optoelectronic device, or a display device.

According to one embodiment, the optoelectronic device may be a display device, a diode, a light emitting diode (LED), a laser, a photodetector, a transistor, a supercapacitor, a barcode, a LED, a microLED, an array of LED, an array of microLED, or an IR camera.

In one embodiment, the support is reflective.

In one embodiment, the support is thermally conductive.

According to one embodiment, the support has a thermal conductivity at standard conditions ranging from 0.5 to 450 W/(m·K), preferably from 1 to 200 W/(m·K), more preferably from 10 to 150 W/(m·K).

According to one embodiment, the support has a thermal conductivity at standard conditions of at least 0.1 W/(m·K), 0.2 W/(m·K), 0.3 W/(m·K), 0.4 W/(m·K), 0.5 W/(m·K), 0.6 W/(m·K), 0.7 W/(m·K), 0.8 W/(m·K), 0.9 W/(m·K), 1 W/(m·K), 1.1 W/(m·K), 1.2 W/(m·K), 1.3 W/(m·K), 1.4 W/(m·K), 1.5 W/(m·K), 1.6 W/(m·K), 1.7 W/(m·K), 1.8

W/(m·K), 1.9 W/(m·K), 2 W/(m·K), 2.1 W/(m·K), 2.2 W/(m·K), 2.3 W/(m·K), 2.4 W/(m·K), 2.5 W/(m·K), 2.6 W/(m·K), 2.7 W/(m·K), 2.8 W/(m·K), 2.9 W/(m·K), 3 W/(m·K), 3.1 W/(m·K), 3.2 W/(m·K), 3.3 W/(m·K), 3.4 W/(m·K), 3.5 W/(m·K), 3.6 W/(m·K), 3.7 W/(m·K), 3.8 W/(m·K), 3.9 W/(m·K), 4 W/(m·K), 4.1 W/(m·K), 4.2 W/(m·K), 4.3 W/(m·K), 4.4 W/(m·K), 4.5 W/(m·K), 4.6 W/(m·K), 4.7 W/(m·K), 4.8 W/(m·K), 4.9 W/(m·K), 5 W/(m·K), 5.1 W/(m·K), 5.2 W/(m·K), 5.3 W/(m·K), 5.4 W/(m·K), 5.5 W/(m·K), 5.6 W/(m·K), 5.7 W/(m·K), 5.8 W/(m·K), 5.9 W/(m·K), 6 W/(m·K), 6.1 W/(m·K), 6.2 W/(m·K), 6.3 W/(m·K), 6.4 W/(m·K), 6.5 W/(m·K), 6.6 W/(m·K), 6.7 W/(m·K), 6.8 W/(m·K), 6.9 W/(m·K), 7 W/(m·K), 7.1 W/(m·K), 7.2 W/(m·K), 7.3 W/(m·K), 7.4 W/(m·K), 7.5 W/(m·K), 7.6 W/(m·K), 7.7 W/(m·K), 7.8 W/(m·K), 7.9 W/(m·K), 8 W/(m·K), 8.1 W/(m·K), 8.2 W/(m·K), 8.3 W/(m·K), 8.4 W/(m·K), 8.5 W/(m·K), 8.6 W/(m·K), 8.7 W/(m·K), 8.8 W/(m·K), 8.9 W/(m·K), 9 W/(m·K), 9.1 W/(m·K), 9.2 W/(m·K), 9.3 W/(m·K), 9.4 W/(m·K), 9.5 W/(m·K), 9.6 W/(m·K), 9.7 W/(m·K), 9.8 W/(m·K), 9.9 W/(m·K), 10 W/(m·K), 10.1 W/(m·K), 10.2 W/(m·K), 10.3 W/(m·K), 10.4 W/(m·K), 10.5 W/(m·K), 10.6 W/(m·K), 10.7 W/(m·K), 10.8 W/(m·K), 10.9 W/(m·K), 11 W/(m·K), 11.1 W/(m·K), 11.2 W/(m·K), 11.3 W/(m·K), 11.4 W/(m·K), 11.5 W/(m·K), 11.6 W/(m·K), 11.7 W/(m·K), 11.8 W/(m·K), 11.9 W/(m·K), 12 W/(m·K), 12.1 W/(m·K), 12.2 W/(m·K), 12.3 W/(m·K), 12.4 W/(m·K), 12.5 W/(m·K), 12.6 W/(m·K), 12.7 W/(m·K), 12.8 W/(m·K), 12.9 W/(m·K), 13 W/(m·K), 13.1 W/(m·K), 13.2 W/(m·K), 13.3 W/(m·K), 13.4 W/(m·K), 13.5 W/(m·K), 13.6 W/(m·K), 13.7 W/(m·K), 13.8 W/(m·K), 13.9 W/(m·K), 14 W/(m·K), 14.1 W/(m·K), 14.2 W/(m·K), 14.3 W/(m·K), 14.4 W/(m·K), 14.5 W/(m·K), 14.6 W/(m·K), 14.7 W/(m·K), 14.8 W/(m·K), 14.9 W/(m·K), 15 W/(m·K), 15.1 W/(m·K), 15.2 W/(m·K), 15.3 W/(m·K), 15.4 W/(m·K), 15.5 W/(m·K), 15.6 W/(m·K), 15.7 W/(m·K), 15.8 W/(m·K), 15.9 W/(m·K), 16 W/(m·K), 16.1 W/(m·K), 16.2 W/(m·K), 16.3 W/(m·K), 16.4 W/(m·K), 16.5 W/(m·K), 16.6 W/(m·K), 16.7 W/(m·K), 16.8 W/(m·K), 16.9 W/(m·K), 17 W/(m·K), 17.1 W/(m·K), 17.2 W/(m·K), 17.3 W/(m·K), 17.4 W/(m·K), 17.5 W/(m·K), 17.6 W/(m·K), 17.7 W/(m·K), 17.8 W/(m·K), 17.9 W/(m·K), 18 W/(m·K), 18.1 W/(m·K), 18.2 W/(m·K), 18.3 W/(m·K), 18.4 W/(m·K), 18.5 W/(m·K), 18.6 W/(m·K), 18.7 W/(m·K), 18.8 W/(m·K), 18.9 W/(m·K), 19 W/(m·K), 19.1 W/(m·K), 19.2 W/(m·K), 19.3 W/(m·K), 19.4 W/(m·K), 19.5 W/(m·K), 19.6 W/(m·K), 19.7 W/(m·K), 19.8 W/(m·K), 19.9 W/(m·K), 20 W/(m·K), 20.1 W/(m·K), 20.2 W/(m·K), 20.3 W/(m·K), 20.4 W/(m·K), 20.5 W/(m·K), 20.6 W/(m·K), 20.7 W/(m·K), 20.8 W/(m·K), 20.9 W/(m·K), 21 W/(m·K), 21.1 W/(m·K), 21.2 W/(m·K), 21.3 W/(m·K), 21.4 W/(m·K), 21.5 W/(m·K), 21.6 W/(m·K), 21.7 W/(m·K), 21.8 W/(m·K), 21.9 W/(m·K), 22 W/(m·K), 22.1 W/(m·K), 22.2 W/(m·K), 22.3 W/(m·K), 22.4 W/(m·K), 22.5 W/(m·K), 22.6 W/(m·K), 22.7 W/(m·K), 22.8 W/(m·K), 22.9 W/(m·K), 23 W/(m·K), 23.1 W/(m·K), 23.2 W/(m·K), 23.3 W/(m·K), 23.4 W/(m·K), 23.5 W/(m·K), 23.6 W/(m·K), 23.7 W/(m·K), 23.8 W/(m·K), 23.9 W/(m·K), 24 W/(m·K), 24.1 W/(m·K), 24.2 W/(m·K), 24.3 W/(m·K), 24.4 W/(m·K), 24.5 W/(m·K), 24.6 W/(m·K), 24.7 W/(m·K), 24.8 W/(m·K), 24.9 W/(m·K), 25 W/(m·K), 30 W/(m·K), 40 W/(m·K), 50 W/(m·K), 60 W/(m·K), 70 W/(m·K), 80 W/(m·K), 90 W/(m·K), 100 W/(m·K), 110 W/(m·K), 120 W/(m·K), 130 W/(m·K), 140 W/(m·K), 150 W/(m·K), 160 W/(m·K), 170 W/(m·K), 180 W/(m·K), 190 W/(m·K), 200 W/(m·K), 210 W/(m·K), 220 W/(m·K), 230 W/(m·K), 240 W/(m·K), 250 W/(m·K), 260 W/(m·K), 270 W/(m·K), 280 W/(m·K), 290 W/(m·K), 300 W/(m·K), 310 W/(m·K), 320 W/(m·K), 330 W/(m·K), 340 W/(m·K), 350 W/(m·K), 360 W/(m·K), 370 W/(m·K), 380 W/(m·K), 390 W/(m·K), 400 W/(m·K), 410 W/(m·K), 420 W/(m·K), 430 W/(m·K), 440 W/(m·K), or 450 W/(m·K).

According to one embodiment, the substrate comprises GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride.

In a third aspect, the invention relates to an illumination source 15 comprising at least one light source 5 and at least one color conversion layer 4 of the invention.

The illumination source may permit to emit a light in the direction of at least one color filter of a display apparatus.

According to one embodiment, the nanoparticles 3 are excited by the at least one primary light supplied from the light source 5 so as to emit a secondary light with a different wavelength respect to the primary light. For example, the nanoparticles 3 are excited by a blue primary light or an UV primary light supplied from the light source 5 so as to emit a blue, green or red secondary light.

According to one embodiment, the light source 5 is configured to supply at least one primary light.

According to one embodiment, the at least one primary light is monochromatic.

According to one embodiment, the at least one primary light is polychromatic.

According to one embodiment, the at least one primary light emitted by the light source 5 has a wavelength ranging from 200 nm to 50 μm, from 200 nm to 800 nm, from 400 nm to 470 nm, from 400 nm to 500 nm, from 400 nm to 600 nm, from 400 nm to 700 nm, from 400 nm to 800 nm, from 800 nm to 1200 nm, from 1200 nm to 1500 nm, from 1500 nm to 1800 nm, from 1800 nm to 2200 nm, from 2200 nm to 2500 nm, or from 2500 nm to 50 μm.

According to one embodiment, the light source 5 comprises at least one light-emitting diode (LED).

According to one embodiment, the light source 5 is a light-emitting diode (LED), a LED chip or a LED package including at least one LED chip.

According to one embodiment, the light source 5 comprises an array of light source pixels or an array of light source sub-pixels.

According to one embodiment, each light source pixel comprises at least one light source sub-pixel which may comprise a light emitting material 7 emitting a secondary light with a wavelength ranging from 200 nm to 50 μm, from 200 nm to 800 nm, from 400 nm to 470 nm, from 400 nm to 500 nm, from 400 nm to 600 nm, from 400 nm to 700 nm, from 400 nm to 800 nm, from 800 nm to 1200 nm, from 1200 nm to 1500 nm, from 1500 nm to 1800 nm, from 1800 nm to 2200 nm, from 2200 nm to 2500 nm, or from 2500 nm to 50 μm.

According to one embodiment, the light source pixel pitch is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9 3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the light source pixel size is at least 1 μm, 2 μm, 3 μm, 4 μm, 5 μm, 6 μm, 7 μm, 8 μm, 9 μm, 10 μm, 11 μm, 12 μm, 13 μm, 14 μm, 15 μm, 16 μm, 17 μm, 18 μm, 19 μm, 20 μm, 21 μm, 22 μm, 23 μm, 24 μm, 25 μm, 26 μm, 27 μm, 28 μm, 29 μm, 30 μm, 31 μm, 32 μm, 33 μm, 34 μm, 35 μm, 36 μm, 37 μm, 38 μm, 39 μm, 40 μm, 41 μm, 42 μm, 43 μm, 44 μm, 45 μm, 46 μm, 47 μm, 48 μm, 49 μm, 50 μm, 51 μm, 52 μm, 53 μm, 54 μm, 55 μm, 56 μm, 57 μm, 58 μm, 59 μm, 60 μm, 61 μm, 62 μm, 63 μm, 64 μm, 65 μm, 66 μm, 67 μm, 68 μm, 69 μm, 70 μm, 71 μm, 72 μm, 73 μm, 74 μm, 75 μm, 76 μm, 77 μm, 78 μm, 79 μm, 80 μm, 81 μm, 82 μm, 83 μm, 84 μm, 85 μm, 86 μm, 87 μm, 88 μm, 89 μm, 90 μm, 91 μm, 92 μm, 93 μm, 94 μm, 95 μm, 96 μm, 97 μm, 98 μm, 99 μm, 100 μm, 200 μm, 250 μm, 300 μm, 350 μm, 400 μm, 450 μm, 500 μm, 550 μm, 600 μm, 650 μm, 700 μm, 750 μm, 800 μm, 850 μm, 900 μm, 950 μm, 1 mm, 1.1 mm, 1.2 mm, 1.3 mm, 1.4 mm, 1.5 mm, 1.6 mm, 1.7 mm, 1.8mm, 1.9 mm, 2 mm, 2.1 mm, 2.2 mm, 2.3 mm, 2.4 mm, 2.5 mm, 2.6 mm, 2.7 mm, 2.8 mm, 2.9 mm, 3 mm, 3.1 mm, 3.2 mm, 3.3 mm, 3.4 mm, 3.5 mm, 3.6 mm, 3.7 mm, 3.8 mm, 3.9 mm, 4 mm, 4.1 mm, 4.2 mm, 4.3 mm, 4.4 mm, 4.5 mm, 4.6 mm, 4.7 mm, 4.8 mm, 4.9 mm, 5 mm, 5.1 mm, 5.2 mm, 5.3 mm, 5.4 mm, 5.5 mm, 5.6 mm, 5.7 mm, 5.8 mm, 5.9 mm, 6 mm, 6.1 mm, 6.2 mm, 6.3 mm, 6.4 mm, 6.5 mm, 6.6 mm, 6.7 mm, 6.8 mm, 6.9 mm, 7 mm, 7.1 mm, 7.2 mm, 7.3 mm, 7.4 mm, 7.5 mm, 7.6 mm, 7.7 mm, 7.8 mm, 7.9 mm, 8 mm, 8.1 mm, 8.2 mm, 8.3 mm, 8.4 mm, 8.5 mm, 8.6 mm, 8.7 mm, 8.8 mm, 8.9 mm, 9 mm, 9.1 mm, 9.2 mm, 9.3 mm, 9.4 mm, 9.5 mm, 9.6 mm, 9.7 mm, 9.8 mm, 9.9 mm, 1 cm, 1.1 cm, 1.2 cm, 1.3 cm, 1.4 cm, 1.5 cm, 1.6 cm, 1.7 cm, 1.8 cm, 1.9 cm, 2 cm, 2.1 cm, 2.2 cm, 2.3 cm, 2.4 cm, 2.5 cm, 2.6 cm, 2.7 cm, 2.8 cm, 2.9 cm, 3 cm, 3.1 cm, 3.2 cm, 3.3 cm, 3.4 cm, 3.5 cm, 3.6 cm, 3.7 cm, 3.8 cm, 3.9 cm, 4 cm, 4.1 cm, 4.2 cm, 4.3 cm, 4.4 cm, 4.5 cm, 4.6 cm, 4.7 cm, 4.8 cm, 4.9 cm, 5 cm, 5.1 cm, 5.2 cm, 5.3 cm, 5.4 cm, 5.5 cm, 5.6 cm, 5.7 cm, 5.8 cm, 5.9 cm, 6 cm, 6.1 cm, 6.2 cm, 6.3 cm, 6.4 cm, 6.5 cm, 6.6 cm, 6.7 cm, 6.8 cm, 6.9 cm, 7 cm, 7.1 cm, 7.2 cm, 7.3 cm, 7.4 cm, 7.5 cm, 7.6 cm, 7.7 cm, 7.8 cm, 7.9 cm, 8 cm, 8.1 cm, 8.2 cm, 8.3 cm, 8.4 cm, 8.5 cm, 8.6 cm, 8.7 cm, 8.8 cm, 8.9 cm, 9 cm, 9.1 cm, 9.2 cm, 9.3 cm, 9.4 cm, 9.5 cm, 9.6 cm, 9.7 cm, 9.8 cm, 9.9 cm, or 10 cm.

According to one embodiment, the light source 5 may further comprise inorganic phosphors.

According to one embodiment, the light source 5 comprises at least one LED and light-emitting inorganic phosphors, all well known by the skilled artisan. Therefore, the light source 5 can emit a combination of lights with different wavelengths, i.e. a polychromatic light, as primary light.

LED used herein includes LED, LED chip and microsized LED.

According to one embodiment, the primary light is a blue light with an emission wavelength ranging from 400 nm to 470 nm, preferably at about 450 nm.

According to one embodiment, the primary light is a UV light with an emission wavelength ranging from 200 nm to 400 nm, preferably at about 390 nm.

In one embodiment, the light source 5 is a blue LED with a wavelength ranging from 400 nm to 470 nm such as for instance a gallium nitride based diode.

In one embodiment, the light source 5 is a blue LED with a wavelength ranging from 400 nm to 470 nm. In one embodiment, the light source 5 has an emission peak at about 405 nm. In one embodiment, the light source 5 has an emission peak at about 447 nm. In one embodiment, the light source 5 has an emission peak at about 455 nm.

In one embodiment, the light source 5 is a UV LED with a wavelength ranging from 200 nm to 400 nm. In one embodiment, the light source 5 has an emission peak at about 253 nm. In one embodiment, the light source 5 has an emission peak at about 365 nm. In one embodiment, the light source 5 has an emission peak at about 395 nm.

In one embodiment, the light source 5 is a green LED with a wavelength ranging from 500 nm to 560 nm. In one embodiment, the light source 5 has an emission peak at about 515 nm. In one embodiment, the light source 5 has an emission peak at about 525 nm. In one embodiment, the light source 5 has an emission peak at about 540 nm.

In one embodiment, the light source 5 is a red LED with a wavelength ranging from 750 to 850 nm. In one embodiment, the light source 5 has an emission peak at about 755 nm. In one embodiment, the light source 5 has an emission peak at about 800 nm. In one embodiment, the light source 5 has an emission peak at about 850 nm.

In one embodiment, the light source 5 has a photon flux or average peak pulse power between 1 $nW \cdot cm^{-2}$ and 100 $kW \cdot cm^{-2}$ and more preferably between 1 $mW \cdot cm^{-2}$ and 100 $W \cdot cm^{-2}$, and even more preferably between 1 $mW \cdot cm^{-2}$ and 30 $W \cdot cm^{-2}$.

In one embodiment, the light source 5 has a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the incident light exciting the light emitting material 7 has a photon flux of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10

$W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300 $W \cdot cm^{-2}$, 400 $W \cdot cm^{-2}$, 500 $W \cdot cm^{-2}$, 600 $W \cdot cm^{-2}$, 700 $W \cdot cm^{-2}$, 800 $W \cdot cm^{-2}$, 900 $W \cdot cm^{-2}$, 1 $kW \cdot cm^{-2}$, 50 $kW \cdot cm^{-2}$, or 100 $kW \cdot cm^{-2}$.

In one embodiment, the light source 5 is a GaN, GaSb, GaAs, GaAsP, GaP, InP, SiGe, InGaN, GaAlN, GaAlPN, AlN, AlGaAs, AlGaP, AlGaInP, AlGaN, AlGaInN, ZnSe, Si, SiC, diamond, boron nitride diode.

In one embodiment, the LED may be located on one surface of a printed circuit board. A reflector may be disposed on one surface of the printed circuit board, and the LED may be located on the reflector. The reflector reflects light which has failed to go toward the light emitting material 7, back to the light emitting material 7.

According to one embodiment, the reflector guides the wasted light from the light source 5 back toward the light emitting material 7. Wasted light refers to the light emitted from the light source 5 that is not directed to the light emitting material 7.

According to one embodiment, the at least one color conversion layer 4 is an array of color conversion layers 4.

According to one embodiment, the at least one color conversion layer 4 is a superposition of color conversion layers 4.

According to one embodiment, the light guide distributes the primary light towards the at least one color conversion layer 4.

According to one embodiment, the nanoparticles 3 comprised in the composite particle 1 are excited by the at least one primary light supplied from the light source 5 so as to emit a secondary light with a different wavelength with respect to the primary light. For example, the nanoparticles 3 are excited by blue primary light or UV primary light supplied from the at least one light source 5 so as to emit blue, green or red secondary lights.

According to one embodiment, the color conversion layer 4 comprises an array of pixels.

According to one embodiment, the pixels are as described hereabove.

According to one embodiment, the color conversion layer 4 comprises an array of pixels and each pixel comprises at least one light emitting material 7.

According to one embodiment, the color conversion layer 4 comprises an array of pixels and each pixel comprises an array of light emitting material 7.

According to one embodiment, the pixel pitch D is as described hereabove.

According to one embodiment, the pixel size is as described hereabove.

According to one embodiment, the color conversion layer 4 comprises an array of pixels and each pixel comprises at least one sub-pixel.

According to one embodiment, the at least one sub-pixel comprises at least one light emitting material 7.

According to one embodiment, the at least one sub-pixel is free of light emitting material 7.

According to one embodiment, the sub-pixel pitch d is as described hereabove.

According to one embodiment, the sub-pixel size is as described hereabove.

According to one embodiment, the conversion layer 4 does not comprise pixels.

According to one embodiment, the conversion layer 4 does not comprise sub-pixels.

According to one embodiment, the pixels are configured to emit a resulting monochromatic light or a polychromatic light. For example, the pixels may emit a mixture of a blue, green and/or red lights.

According to one embodiment, the sub-pixels are configured to emit a resulting monochromatic light or a polychromatic light. For example, the sub-pixels may emit a blue light, a green light and/or a red light.

According to one embodiment, the color conversion layer 4 comprises an array of pixels, wherein at least one sub-pixel comprises a light emitting material 7 having an emission peak ranging from 400 nm to 470 nm, preferably at about 450 nm; at least one sub-pixel comprises a light emitting material 7 having an emission peak ranging from 500 nm to 560 nm, preferably at about 540 nm; and at least one sub-pixel comprises a light emitting material 7 having an emission peak ranging from 750 to 850 nm, preferably at about 750 nm. In this embodiment, the color conversion layer 4 can be excited with a primary light centered at 390 nm.

According to one embodiment, the color conversion layer 4 comprises an array of pixels, wherein at least one sub-pixel comprises a light emitting material 7 having an emission peak ranging from 400 nm to 470 nm, preferably at about 450 nm; at least one sub-pixel comprises a light emitting material 7 having an emission peak ranging from 500 nm to 560 nm, preferably at about 540 nm; and at least one sub-pixel comprises a light emitting material 7 having an emission peak ranging from 750 to 850 nm, preferably at about 750 nm. In this embodiment, the color conversion layer 4 can be excited with a primary light centered at 390 nm and/or at 450 nm.

According to one embodiment illustrated in FIG. 7E, the first sub-pixel emits a green secondary light, the second sub-pixel emits a red secondary light, the third sub-pixel is free of light emitting material 7 or inorganic phosphor.

In one embodiment, the color conversion layer 4 comprises an array of pixels, each pixel comprising 3 sub-pixels. The 3 sub-pixels are: i) free of light emitting material 7, red sub-pixel and green sub-pixel both comprising at least one light emitting material 7, when the laser source emits blue light.; or ii) blue sub-pixel, red sub-pixel and green sub-pixel all comprising at least one light emitting material, when the laser source emits UV light.

According to one embodiment, the light emitted by the illumination source 15 is monochromatic.

According to one embodiment, the illumination source 15 may comprise a plurality of color conversion layers 4 in order to emit several lights or a polychromatic light. In this embodiment, the color conversion layers 4 may be stacked, i.e. each conversion layer 4 may be on top of another color conversion layer 4. One color conversion layer 4 can be identical or different from the next color conversion layer 4.

In one embodiment, the illumination source 15 produces a light with a photon flux or average peak pulse power of at least 1 $nW \cdot cm^{-2}$, 50 $nW \cdot cm^{-2}$, 100 $nW \cdot cm^{-2}$, 200 $nW \cdot cm^{-2}$, 300 $nW \cdot cm^{-2}$, 400 $nW \cdot cm^{-2}$, 500 $nW \cdot cm^{-2}$, 600 $nW \cdot cm^{-2}$, 700 $nW \cdot cm^{-2}$, 800 $nW \cdot cm^{-2}$, 900 $nW \cdot cm^{-2}$, 1 $\mu W \cdot cm^{-2}$, 10 $\mu W \cdot cm^{-2}$, 100 $\mu W \cdot cm^{-2}$, 500 $\mu W \cdot cm^{-2}$, 1 $mW \cdot cm^{-2}$, 50 $mW \cdot cm^{-2}$, 100 $mW \cdot cm^{-2}$, 500 $mW \cdot cm^{-2}$, 1 $W \cdot cm^{-2}$, 5 $W \cdot cm^{-2}$, 10 $W \cdot cm^{-2}$, 20 $W \cdot cm^{-2}$, 30 $W \cdot cm^{-2}$, 40 $W \cdot cm^{-2}$, 50 $W \cdot cm^{-2}$, 60 $W \cdot cm^{-2}$, 70 $W \cdot cm^{-2}$, 80 $W \cdot cm^{-2}$, 90 $W \cdot cm^{-2}$, 100 $W \cdot cm^{-2}$, 110 $W \cdot cm^{-2}$, 120 $W \cdot cm^{-2}$, 130 $W \cdot cm^{-2}$, 140 $W \cdot cm^{-2}$, 150 $W \cdot cm^{-2}$, 160 $W \cdot cm^{-2}$, 170 $W \cdot cm^{-2}$, 180 $W \cdot cm^{-2}$, 190 $W \cdot cm^{-2}$, 200 $W \cdot cm^{-2}$, 300

W·cm$^{-2}$, 400 W·cm$^{-2}$, 500 W·cm$^{-2}$, 600 W·cm$^{-2}$, 700 W·cm$^{-2}$, 800 W·cm$^{-2}$, 900 W·cm$^{-2}$, 1 kW·cm$^{-2}$, 50 kW·cm$^{-2}$, or 100 kW·cm$^{-2}$.

According to one embodiment illustrated FIG. 8, the illumination source 15 comprises a color conversion layer 4 and a light source 5, and the color conversion layer 4 having a shape of a film is in contact with the light source 5. The light source 5 excites the color conversion layer 4 which emits a light at one specific wavelength or at different wavelengths.

According to one embodiment, the at least one color conversion layer 4 may be a film deposited on the light source 5.

In one embodiment, the color conversion layer 4 is deposited onto the light source 5 by drop-casting, spin coating, dip coating, inkjet printing, lithography, spray, plating, electroplating, or any other means known by the person skilled in the art.

According to one embodiment, the at least one color conversion layer 4 is deposited on the light source 5, and the at least one color conversion layer 4 is in contact with said light source 5.

According to one embodiment, the at least one color conversion layer 4 is deposited on the light source 5, and the at least one color conversion layer 4 is not in contact with said light source 5.

According to one embodiment, the illumination source 15 comprises a light guide 11.

According to one embodiment, the at least one color conversion layer 4 is located between the light source 5 and said light guide 11.

According to one embodiment, the at least one color conversion layer 4 is deposited on the light guide 11, and the at least one color conversion layer 4 is in contact with said light guide 11.

According to one embodiment, the at least one color conversion layer 4 is deposited on the light guide 11, and the at least one color conversion layer 4 is not in contact with said light guide 11.

According to one embodiment, the light guide 11 distributes the light towards the color conversion layer 4.

According to one embodiment illustrated on FIG. 9, the color conversion layer 4 comprises an array of pixels, the light source 5 comprises an array of light source pixels, and each pixel is illuminated and/or excited by at least one light source pixel of the light source 5.

In one embodiment, each light source 5 of the array of light sources 5 is configured to illuminate or excite only one pixel of the array of pixels. In this embodiment, each light source 5 of the array of light sources 5 is associated with only one pixel of the array of pixels.

In one embodiment, each pixel of the array of pixels is configured to be illuminated and/or excited by only one light source 5 of the array of light sources 5. In this embodiment, each pixel is associated with only one light source 5 of the array of light sources 5.

In one embodiment, the light source 5 of the array of light sources 5 is configured to illuminate and/or excite only one pixel of the array of pixels. In this embodiment, each light source 5 of the array of light sources 5 is associated with only one pixel of the array of pixels.

In one embodiment, each light source 5 of the array of light sources 5 is configured to illuminate and/or excite at least one sub-pixel.

In one embodiment, each light source 5 of the array of light sources 5 is configured to illuminate and/or excite only one sub-pixel. In this embodiment, each light source 5 of the array of light sources 5 is associated with one sub-pixel of the array of pixels.

In one embodiment, each sub-pixel is configured to be illuminated and/or excited by only one light source 5 of the array of light sources 5. In this embodiment, each sub-pixel is associated with only one light source 5 of the array of light sources 5.

In one embodiment, the array of light sources 5 is an array of microsized LED.

According to one embodiment, the color conversion layer 4 comprises an array of pixels, each pixel comprising 3 sub-pixels. The 3 sub-pixels are: i) free of light emitting material 7, red sub-pixel and green sub-pixel both comprising at least one light emitting material 7, when the light source 5 emits blue light.; or ii) blue sub-pixel, red sub-pixel and green sub-pixel all comprising at least one light emitting material, when the light source 5 emits UV light.

According to one embodiment illustrated on FIG. 10, each pixel of the color conversion layer 4 is illuminated and/or excited by at least two light source pixels of the light source 5, or by at least 3, 4, 5, 6, 7, 8, 9, 10, 11, 12, 13, 14, 15, 16, 17, 18, 19, 20, 21, 22, 23, 24, 25, 26, 27, 28, 29, 30, 40, 50, 60, 70, 80, 90, 100, 200, 300, 400, 500, 600, 700, 800, 900, 1000, 1500, 2000, 3500, 4000, 4500, 5000, 5500, 6000, 6500, 7000, 7500, 8000, 8500, 9000, 9500 or by at least 10000 light source pixels of the light source 5.

According to one embodiment illustrated on FIG. 11, each light source pixel of the light source 5 is able to illuminate and/or excite several pixels of the color conversion layer 4.

According to one embodiment, each light source pixel of the light source 5 is able to illuminate and/or excite at least 2, 3, 4, 5, 6, 7, 8, 9, 10, 11, 12, 13, 14, 15, 16, 17, 18, 19, 20, 21, 22, 23, 24, 25, 26, 27, 28, 29, 30, 40, 50, 60, 70, 80, 90, 100, 200, 300, 400, 500, 600, 700, 800, 900, 1000, 1500, 2000, 3500, 4000, 4500, 5000, 5500, 6000, 6500, 7000, 7500, 8000, 8500, 9000, 9500 or by at least 10000 pixels of the color conversion layer 4.

As illustrated FIG. 12, FIG. 13 or FIG. 14, the illumination source 15 may be a backlight unit. In FIG. 12 and FIG. 13, the illumination source 15 comprises a space 13 between the light source 5 and the light guide 11 that may be partially or completely void, an optically transparent substrate, or filled with gas such as for example air.

According to one embodiment, the illumination source 15 comprises a reflector 16.

According to one embodiment illustrated on FIG. 12, the light source 5 illuminates a reflector 16 which redirects the light to the surface of the color conversion layer 4.

According to one embodiment, a light guide 11 may be added between the light source 5 and the reflector 16 and/or between the reflector 16 and the color conversion layer 4 in order to improve the wave propagation by multiple reflections.

According to one embodiment illustrated on FIG. 13 and FIG. 14, the color conversion layer 4 is placed between the light source 5 and the reflector 16. In said embodiment, the reflector 16 changes the direction of the light emitted by the color conversion layer 4, for example to a color display of an associated display apparatus.

According to one embodiment, the color conversion layer 4 is placed between the light source 5 and the light guide 11.

According to one embodiment illustrated on FIG. 14, the color conversion layer 4 is deposited on the light source 5.

In one embodiment, the color conversion layer 4 comprises a material configured to scatter the resulting light from said color conversion layer 4.

In one embodiment, examples of material configured to scatter the resulting light include but are not limited to: $Al_2O_3$, $SiO_2$, MgO, ZnO, $ZrO_2$, $IrO_2$, $SnO_2$, $TiO_2$, BaO, $BaSO_4$, BeO, CaO, $CeO_2$, CuO, $Cu_2O$, $DyO_3$, $Fe_2O_3$, $Fe_3O_4$, $GeO_2$, $HfO_2$, $Lu_2O_3$, $Nb_2O_5$, $Sc_2O_3$, $TaO_5$, $TeO_2$, $Y_2O_3$ particles, or a mixture thereof. The present invention further relates to a display apparatus comprising an illumination source 15 as described hereabove.

FIG. 15 illustrates a display apparatus 8 comprising an illumination source 15 as described hereabove comprising a light source 5 and at least one color conversion layer 4.

According to one embodiment, the display apparatus 8 comprises at least one cut-on filter layer. In this embodiment, said layer is a global cut-on filter, a local cut-on filter, or a mixture thereof. This embodiment is particularly advantageous as said cut-on filter layer prevents the excitation of the particles of the invention comprised in the ink by ambient light. A local cut-on filter blocks only a particular part of the optical spectrum. A local cut-on filter which blocks only this particular part of the optical spectrum can, in conjunction with a global cut-on filter, eliminate (or significantly reduce) the excitation of the particles of the invention by ambient light.

According to one embodiment, the cut-on filter layer is a resin that can filter blue light.

According to one embodiment, the cut-on filter layer comprises at least one organic material, such as at least one organic polymer as described herein, preferably said cut-on filter layer is configured to filter blue light.

According to one embodiment, the display apparatus 8 further comprises at least one color filter 18 on a substrate 17.

According to one embodiment, the display apparatus 8 further comprises a color filter layer 18 on a substrate 17.

According to one embodiment, the display apparatus 8 comprises at least one layer of activation between the illumination source 15 and the at least one color filter 18.

According to one embodiment, the at least one layer of activation comprises a layer of liquid crystal material 9 and/or an active matrix 12, preferably an active thin-film-transistor matrix.

According to one embodiment, the display apparatus 8 may comprise a layer of active matrix 12 such as a layer of liquid crystal material 9 and at least one color filter 18.

According to one embodiment, the at least one color filter 18 is preferably fixed to a substrate 17.

According to one embodiment, the illumination source 15 is configured to provide light and an excitation to the at least one color filter 18.

In one embodiment, the at least one color filter 18 is a conventional color filter which is well-known by the skilled person.

In one embodiment, the at least one color filter 18 comprises at least one color conversion layer 4 of the invention.

In one embodiment, the at least one color filter 18 comprises at least one light emitting material 7 of the invention.

According to one embodiment, the display apparatus 8 comprises a plurality of color filters 18.

According to one embodiment, the plurality of color filters 18 are comprised in a plurality of pixels or a plurality of sub-pixels.

According to one embodiment, the display apparatus 8 may also comprise at least one polarizer 10 and an additional light guide 11 between the illumination source 15 and the at least one layer of activation.

FIG. 16A and FIG. 16B illustrate another display apparatus 8 according to one embodiment of the present invention wherein the illumination source 15 comprises a light source 5, at least one color conversion layer 4, a light guide 11 and a reflector 16. In FIG. 16A, the illumination source 15 comprises a space 13 between the light source 5 and the color conversion layer 4. In FIG. 16B, the illumination source 15 comprises the light source 5 coated by the color conversion layer 4.

FIG. 17 illustrates another display apparatus 8 according to one embodiment of the present invention wherein the illumination source 15 comprises a light source 5, a color conversion layer 4, a light guide 11 and a reflector 16 reflecting the light from the light source 5 to the color conversion layer 4. In FIG. 17, the light guide 11 is between the light source 5 and the color conversion layer 4.

FIG. 18 illustrates a display apparatus 8 using such a conversion layer 4. Said display apparatus 8 comprises a glass substrate 6, a color conversion layer 4 comprising an array of pixels, wherein each pixel comprises at least one sub-pixels, wherein each sub-pixel comprises at least one light emitting material 7 or is free of light emitting material. Said display apparatus 8 comprises an array of light sources 5 for which each light source 5 and each sub-pixel are associated two by two and, when activated, each light source 5 is configured to illuminate and/or excite said one sub-pixel. At least one secondary light is emitted through a sub-pixel when the primary light from the associated light source 5 illuminates and/or excites the at least one light emitting material 7 comprised in said sub-pixel, while the primary light is transmitted through a sub-pixel without emission of a secondary light when said sub-pixel is free of light emitting material 7 and is illuminated by said primary light from the associated light source 5. In this embodiment, the display apparatus 8 comprises an active matrix 12 (preferably an active TFT matrix) in order to activate each light source sub-pixel. The active matrix 12 may comprise at least one transistor and at least one capacitor per sub-pixel.

According to one embodiment, the light sources 5 may be activated collectively.

According to one embodiment, the light sources 5 may be activated independently from each other.

According to one embodiment, the light sources 5 intensity may be controlled collectively.

According to one embodiment, the light sources 5 intensity may be controlled independently from each other.

In one embodiment, the array of light sources 5 is an array of LED.

In one embodiment, the array of light sources 5 is an array of microsized LED.

In one embodiment, the array of light sources 5 is a LED array or a microsized LED array comprising an array of GaN diodes, GaSb diodes, GaAs diodes, GaAsP diodes, GaP diodes, InP diodes, SiGe diodes, InGaN diodes, GaAlN diodes, GaAlPN diodes, MN diodes, AlGaAs diodes, AlGaP diodes, AlGaInP diodes, AlGaN diodes, AlGaInN diodes, ZnSe diodes, Si diodes, SiC diodes, diamond diodes, boron nitride diodes, organic light emitting diodes (OLED), quantum dot light emitting diodes (QLED), or a mixture thereof.

According to one embodiment, the color conversion layer 4 comprises an array of pixels. Said embodiment avoids the illumination of the entire surface of the color conversion layer 4 saving energy.

While various embodiments have been described and illustrated, the detailed description is not to be construed as being limited hereto. Various modifications can be made to the embodiments by those skilled in the art without departing from the true spirit and scope of the disclosure as defined by the claims.

EXAMPLES

Example 1: Inorganic Nanoparticles Preparation

Nanoparticles used in the examples herein were prepared according to methods of the art (Lhuillier E. et al., Acc. Chem. Res., 2015, 48 (1), pp 22-30; Pedetti S. et al., J. Am. Chem. Soc., 2014, 136 (46), pp 16430-16438; Ithurria S. et al., J. Am. Chem. Soc., 2008, 130, 16504-16505; Nasilowski M. et al., Chem. Rev. 2016, 116, 10934-10982).

Nanoparticles used in the examples herein were selected in the group comprising CdSe/CdZnS, CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/

GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots.

Example 2: Exchange Ligands for Phase Transfer in Basic Aqueous Solution

100 μL of CdSe/CdZnS nanoplatelets suspended in heptane were mixed with 3-mercaptopropionic acid and heated at 60° C. for several hours. The nanoparticles were then precipitated by centrifugation and redispersed in dimethylformamide Potassium tert-butoxide were added to the solution before adding ethanol and centrifugate. The final colloidal nanoparticles were redispersed in water.

Example 3: Exchange Ligands for Phase Transfer in Acidic Aqueous Solution

100 μL of CdSe/CdZnS nanoplatelets suspended in a basic aqueous solution were mixed with ethanol and centrifugated. A PEG-based polymer was solubilized in water and added to the precipitated nanoplatelets. Acetic acid was dissolved in the colloidal suspension to control the acidic pH.

Example 4: Composite Particles Preparation from a Basic Aqueous Solution —CdSe/CdZnS@$SiO_2$ 100 μL of CdSe/CdZnS nanoplatelets suspended in a basic aqueous solution were mixed with a basic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

Figure 1:
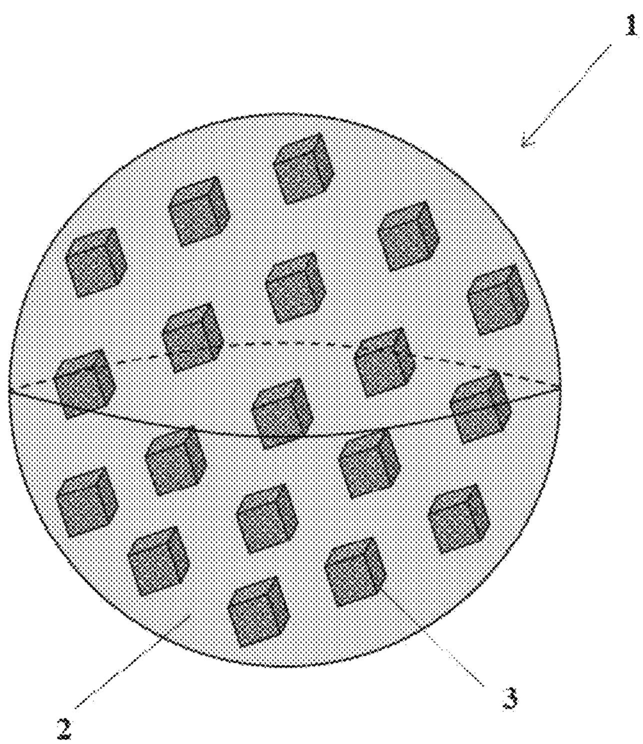
FIG. 1 illustrates a composite particle comprising a plurality of nanoparticles encapsulated in an inorganic material.
Figure 2A:
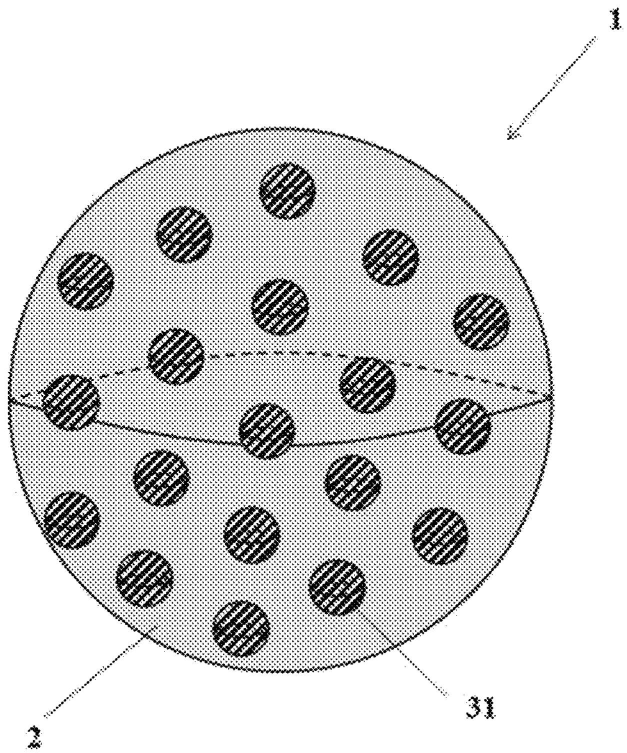
FIG. 2A illustrates a composite particle comprising a plurality of spherical nanoparticles encapsulated in an inorganic material.
Figure 2B:
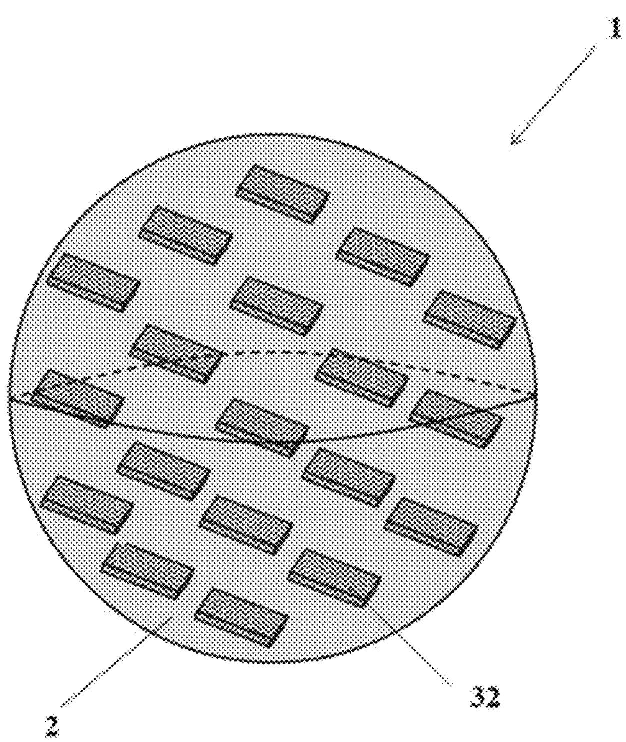
FIG. 2B illustrates a composite particle comprising a plurality of 2D nanoparticles encapsulated in an inorganic material.
Figure 3:
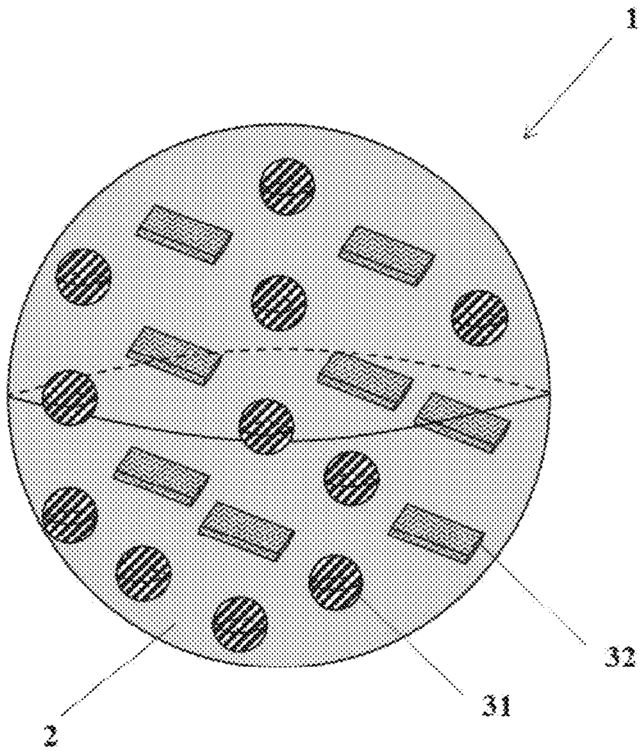
FIG. 3 illustrates a composite particle comprising a plurality of spherical nanoparticles and a plurality of 2D nanoparticles encapsulated in an inorganic material.
Figure 4:
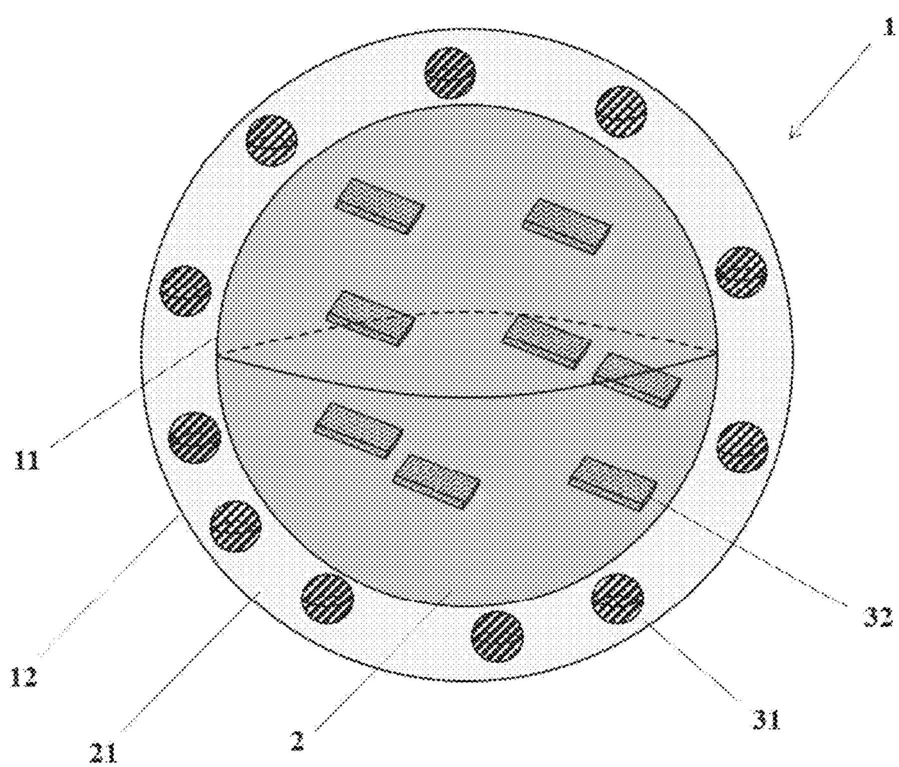
FIG. 4 illustrates a composite particle comprising a core comprising a plurality of 2D nanoparticles encapsulated in an inorganic material, and a shell comprising a plurality of spherical nanoparticles encapsulated in an inorganic material.
Figure 5A:
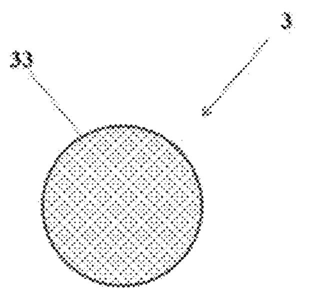
FIG. 5A illustrates a core nanoparticle 33 without a shell.
Figure 5B:
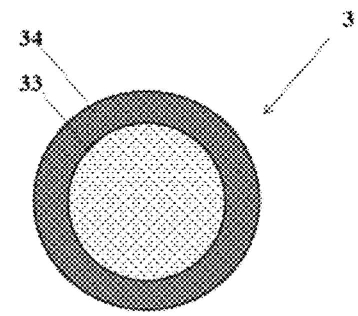
FIG. 5B illustrates a core 33/shell 34 nanoparticle 3 with one shell 34.
Figure 5C:
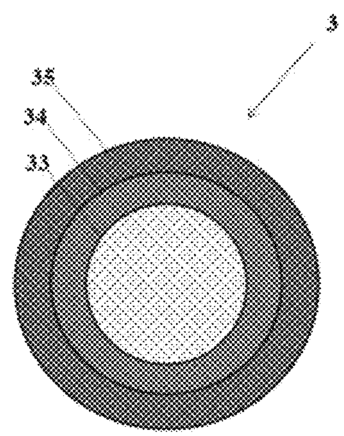
FIG. 5C illustrates a core 33/shell (34, 35) nanoparticle 3 with two different shells (34, 35).
Figure 5D:
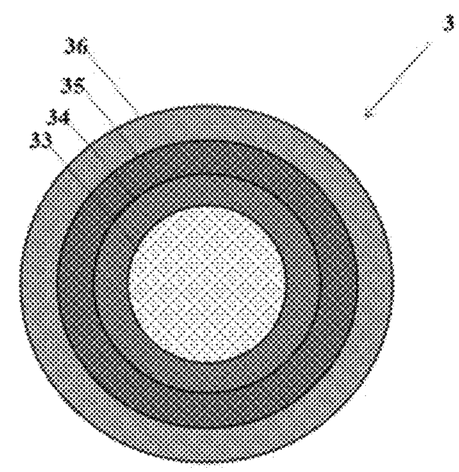
FIG. 5D illustrates a core 33/shell (34, 35, 36) nanoparticle 3 with two different shells (34, 35) surrounded by an oxide insulator shell 36.
Figure 5E:
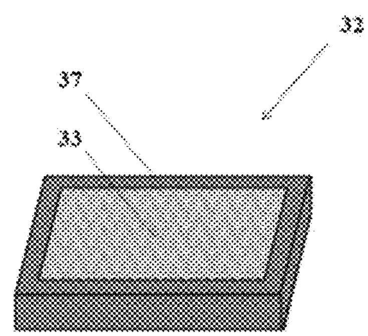
FIG. 5E illustrates a core 33/crown 37 nanoparticle 32.
Figure 5F:
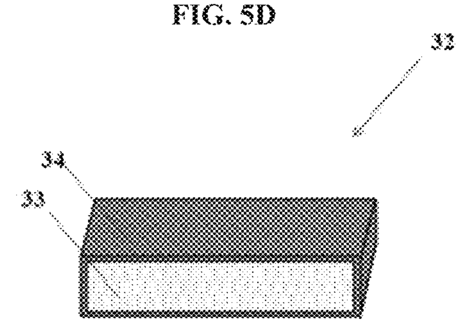
FIG. 5F illustrates a sectional view of a core 33/shell 34 nanoparticle 32 with one shell 34.
Figure 5G:
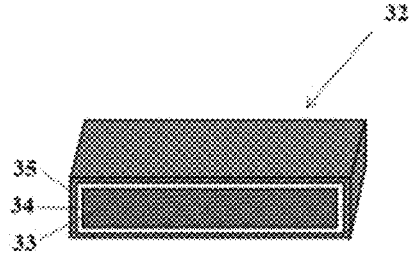
FIG. 5G illustrates a sectional view of a core 33/shell (34, 35) nanoparticle 32 with two different shells (34, 35).
Figure 5H:
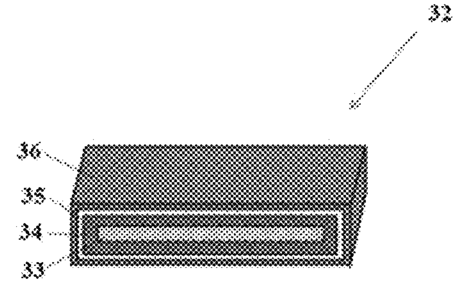
FIG. 5H illustrates a sectional view of a core 33/shell (34, 35, 36) nanoparticle 32 with two different shells (34, 35) surrounded by an oxide insulator shell 36.
Figure 6A:
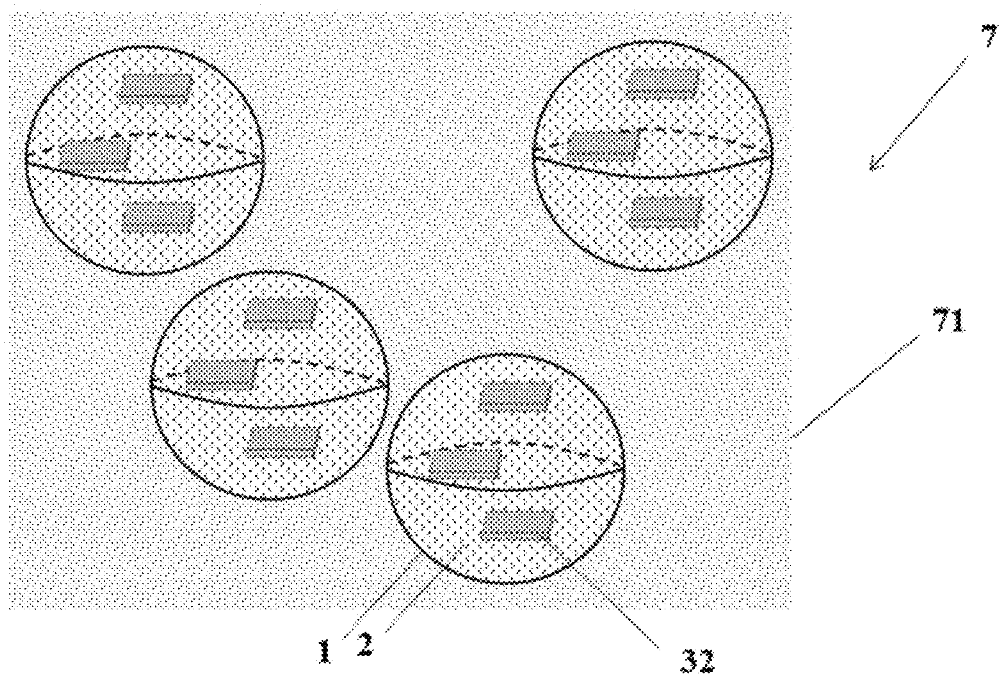
FIG. 6A illustrates a light emitting material 7 comprising a surrounding medium 71 and at least one composite particle 1 of the invention comprising a plurality of 2D nanoparticles 32 encapsulated in an inorganic material 2.
Figure 6B:
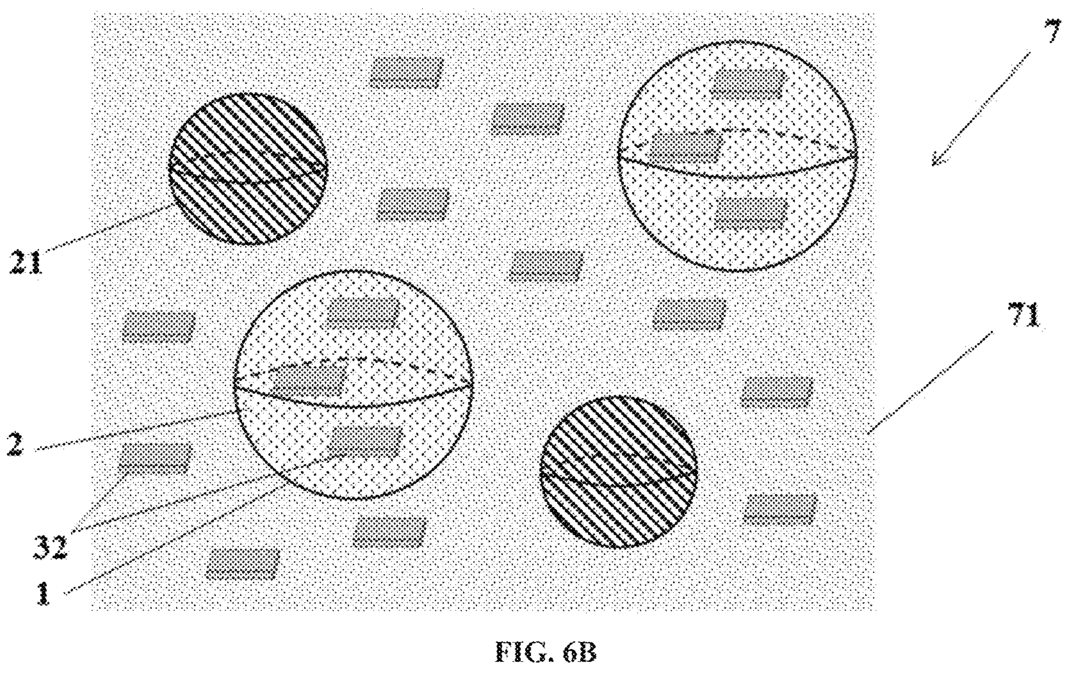
FIG. 6B illustrates a light emitting material 7 comprising a surrounding medium 71; at least one composite particle 1 of the invention comprising a plurality of 2D nanoparticles 32 encapsulated in an inorganic material 2; a plurality of particles comprising an inorganic material 21; and a plurality of 2D nanoparticles 32.
Figure 7A:
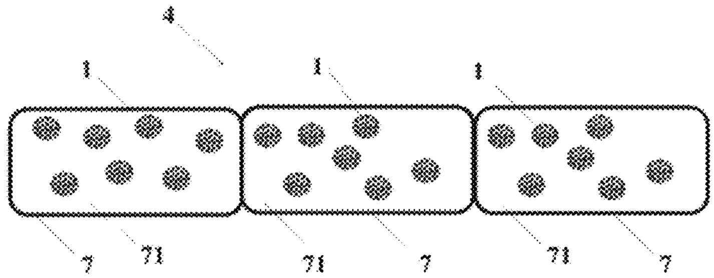
FIG. 7A illustrates a color conversion layer as described in the invention.
Figure 7B:
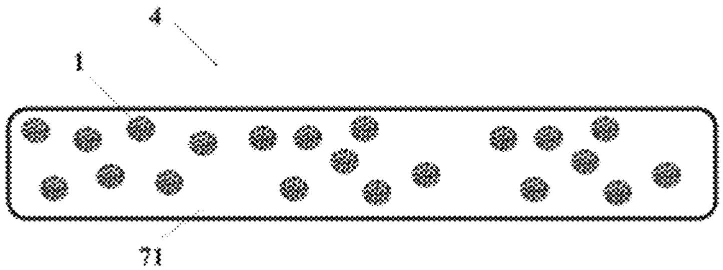
FIG. 7B illustrates a color conversion layer as described in the invention.
Figure 7C:
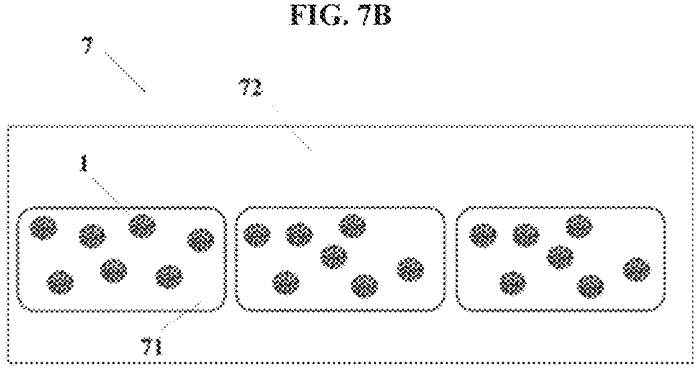
FIG. 7C illustrates a light emitting material comprising at least two surrounding media.
Figure 7D:
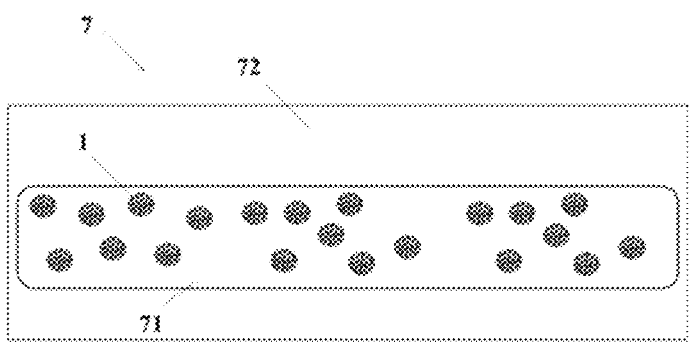
FIG. 7D illustrates a light emitting material comprising at least two surrounding media.
Figure 7E:
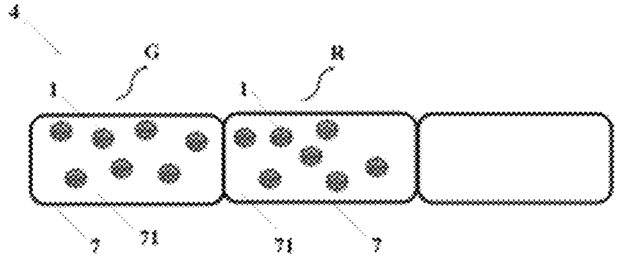
FIG. 7E illustrates a color conversion layer comprising three sub-pixels, wherein the first sub-pixel emits a green secondary light (G), the second sub-pixel emits a red secondary light (R), the third sub-pixel is free of light emitting material 7 or inorganic phosphor.
Figure 8:
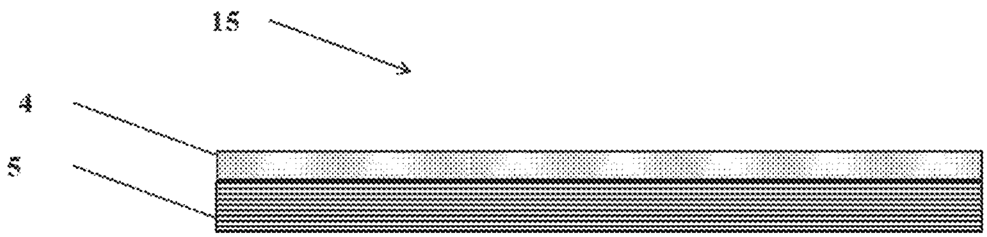
FIG. 8 illustrates an illumination source comprising a light source and a color conversion layer.
Figure 9:
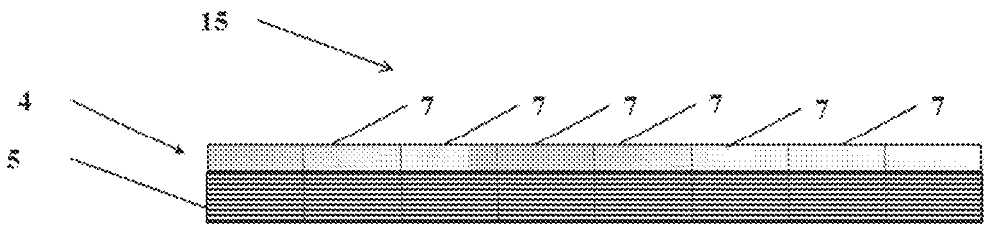
FIG. 9 illustrates an illumination source comprising an array of light source forming pixels and a color conversion layer comprising an array of light emitting materials.
Figure 10:
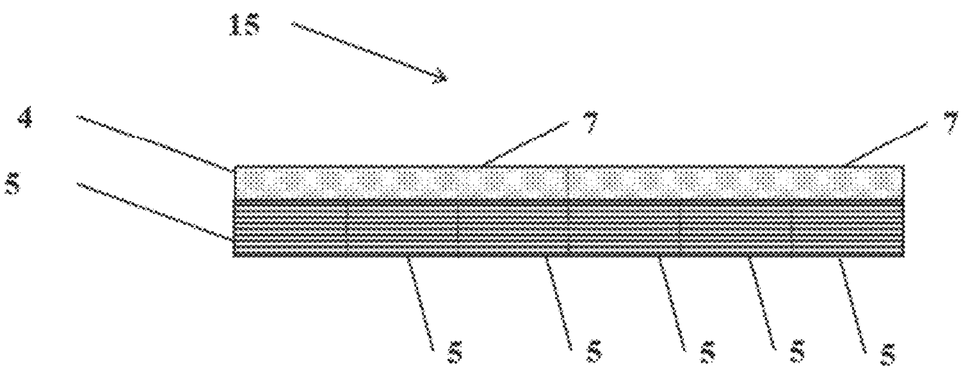
FIG. 10 illustrates an illumination source wherein each pixel of the color conversion layer is illuminated by three light sources.
Figure 11:
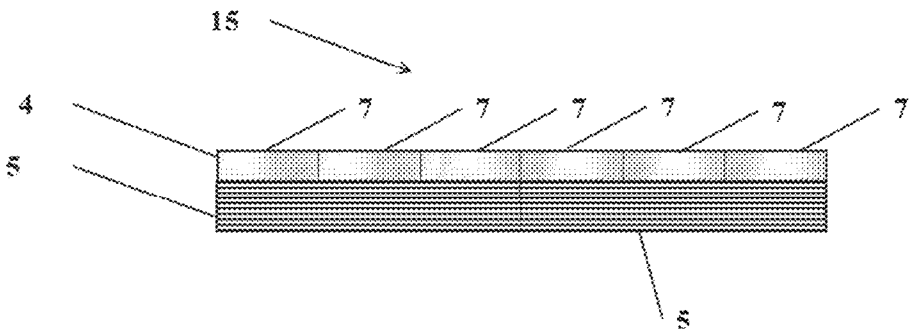
FIG. 11 illustrates an illumination source wherein each light source pixel of the light source is able to illuminate several pixels of the color conversion layer.
Figure 12:
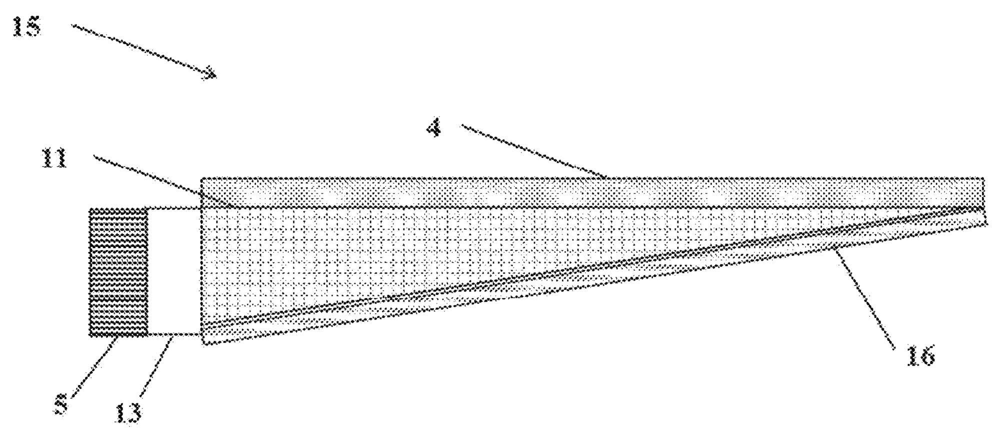
FIG. 12 illustrates an illumination source wherein the color conversion layer is upon a light guide, a reflector and a light source.
Figure 13:
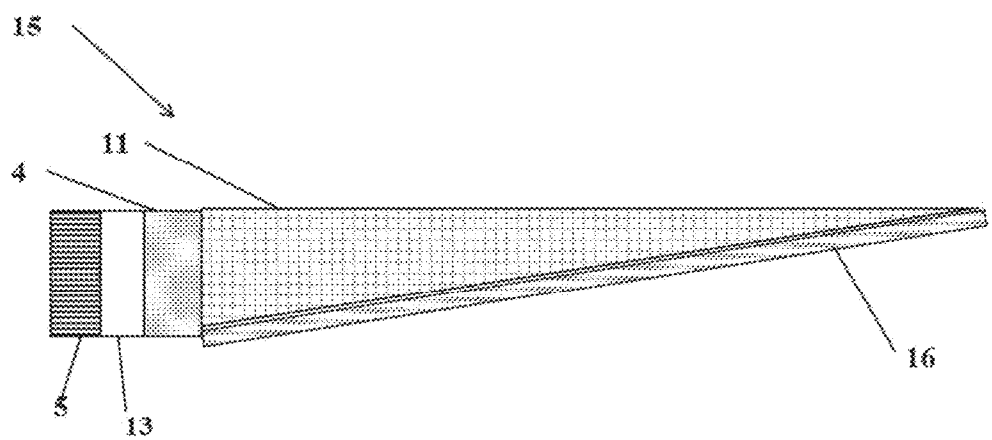
FIG. 13 illustrates an illumination source wherein the color conversion layer is between the light source and the reflector.
Figure 14:
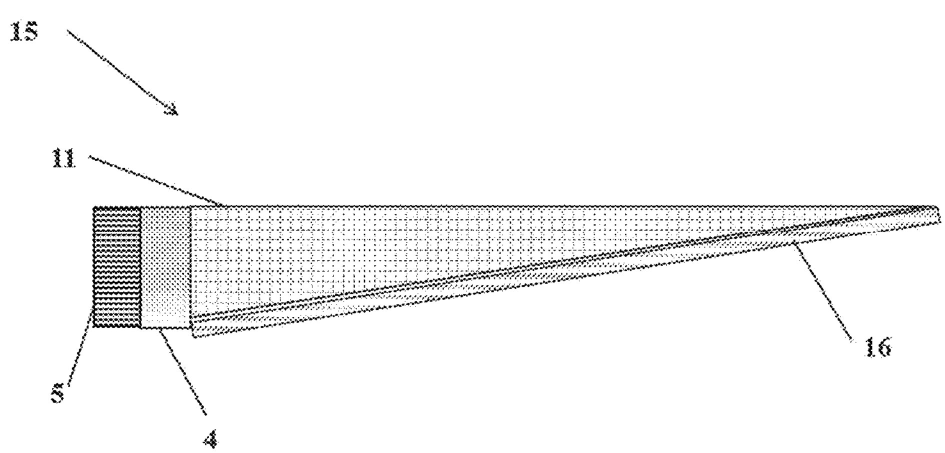
FIG. 14 illustrates an illumination source wherein the color conversion layer is deposited on the light source.
Figure 15:
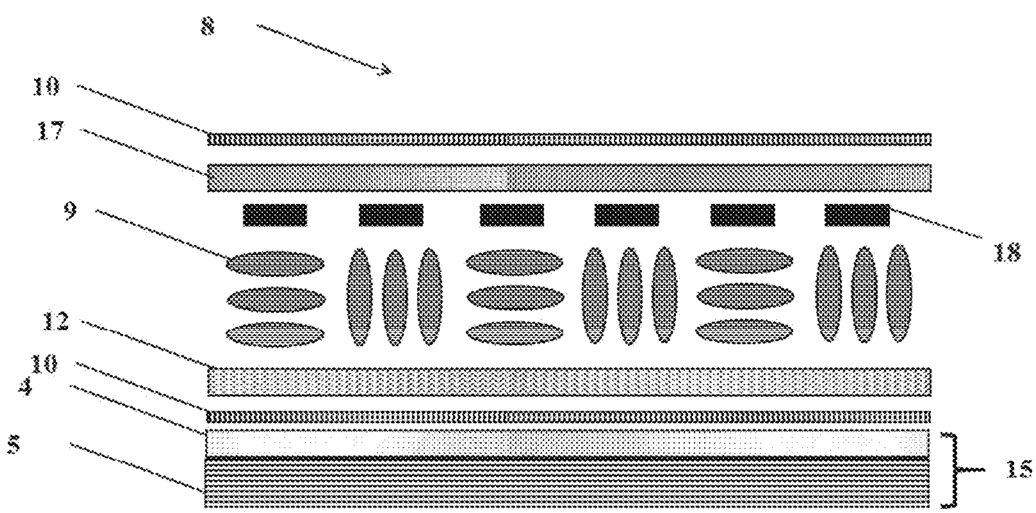
FIG. 15 illustrates a display apparatus comprising a light source, the color conversion layer, polarizers, an active matrix, a layer of liquid crystals material and a color filer layer.
Figure 16A:
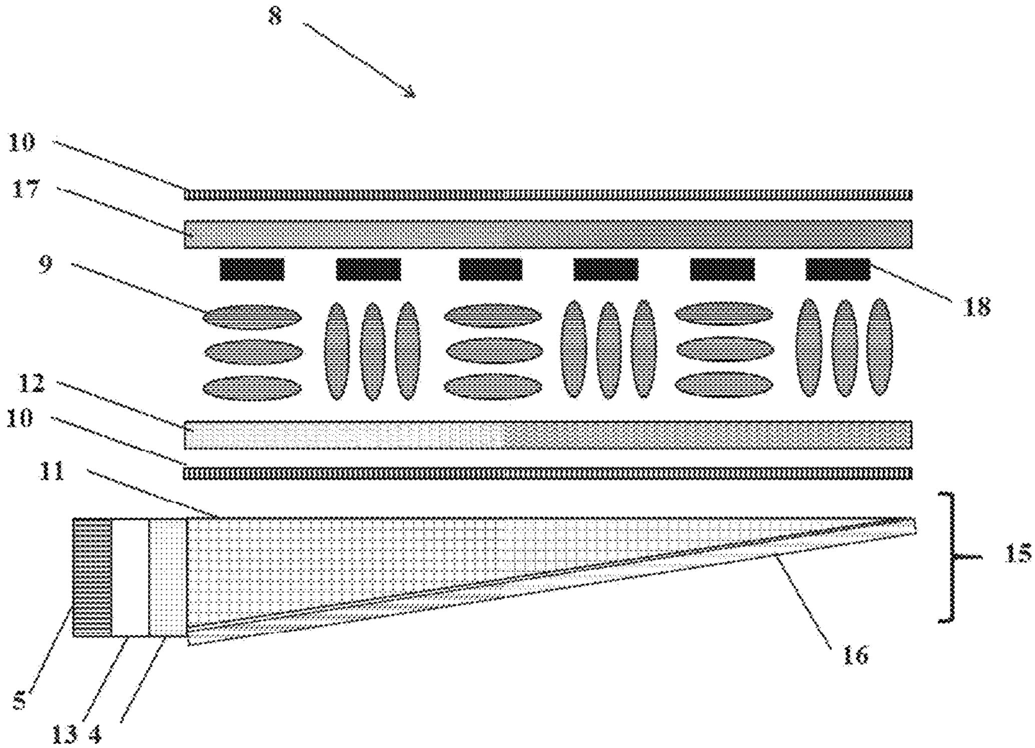
FIGS. 16A and 16B illustrate a display apparatus wherein the light source is a backlight unit comprising a color conversion layer.
Figure 16B:
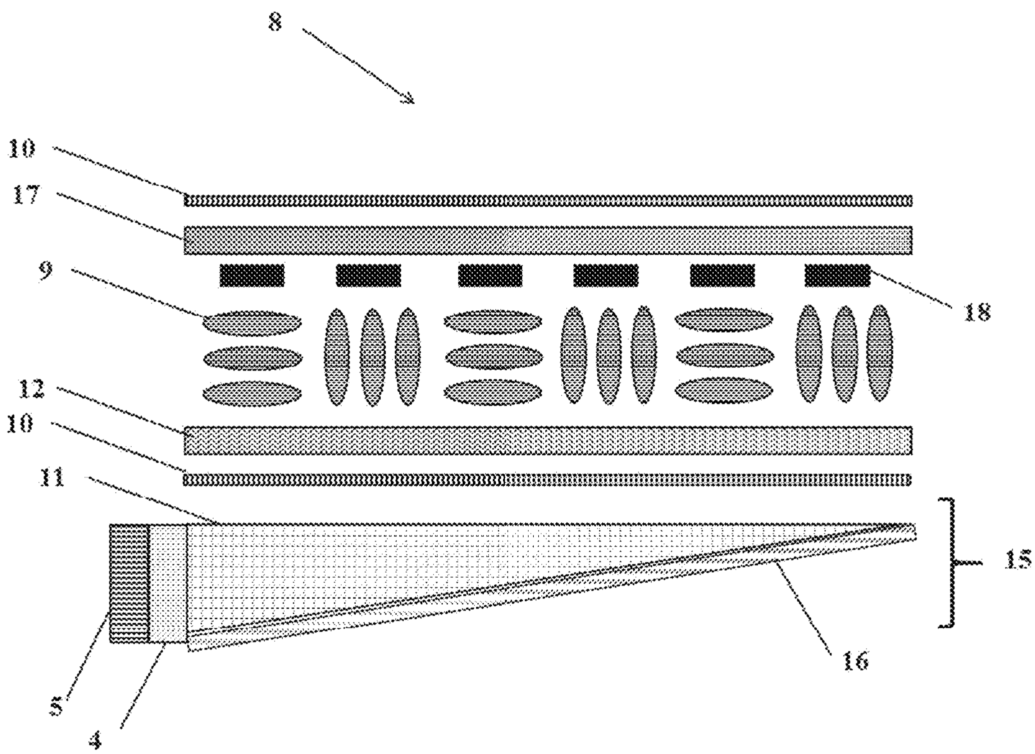
Figure 17:
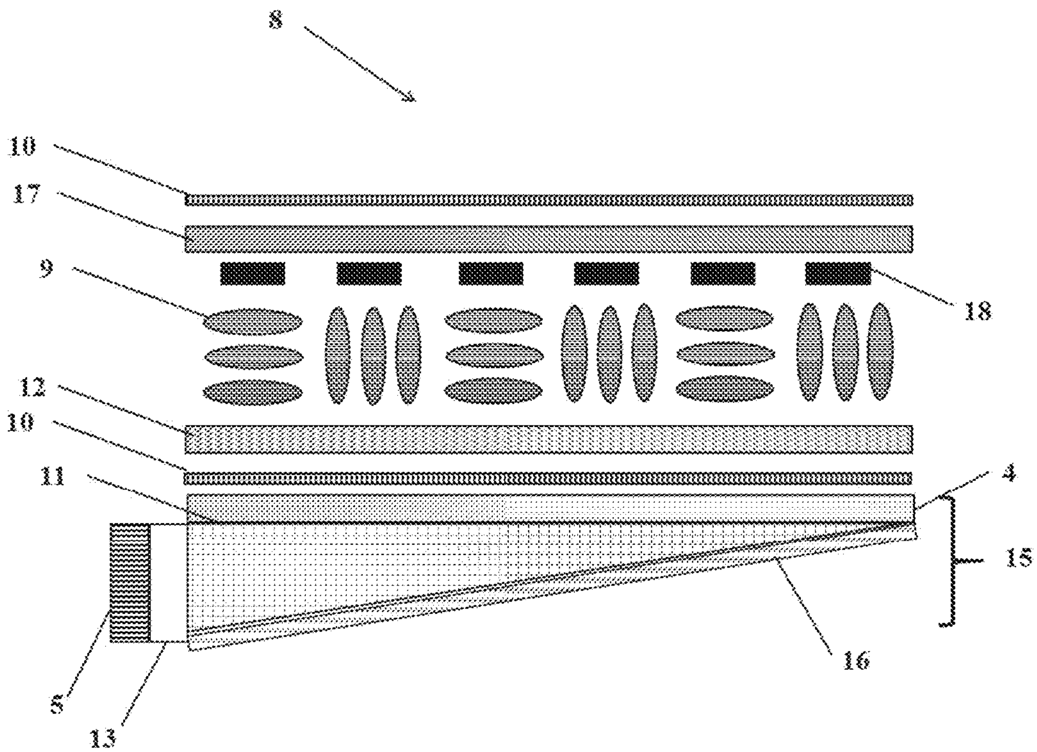
FIG. 17 illustrates a display apparatus wherein the light source is a backlight unit comprising a color conversion layer.
Figure 18:
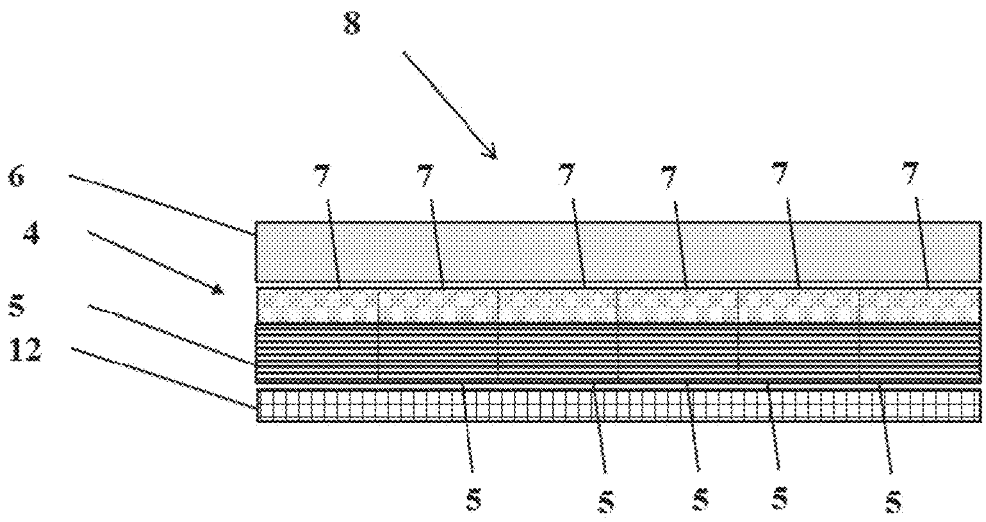
FIG. 18 illustrates a display apparatus comprising a light source and an active matrix.
Figure 19A:
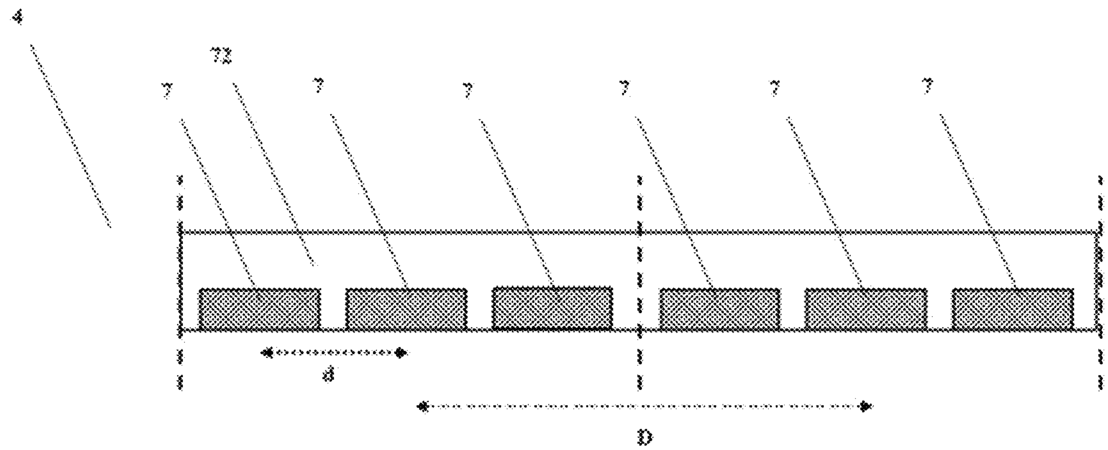
FIGS. 19A and 19B illustrate a color conversion layer comprising an array of light emitting materials surrounded by a surrounding medium.
Figure 19B:
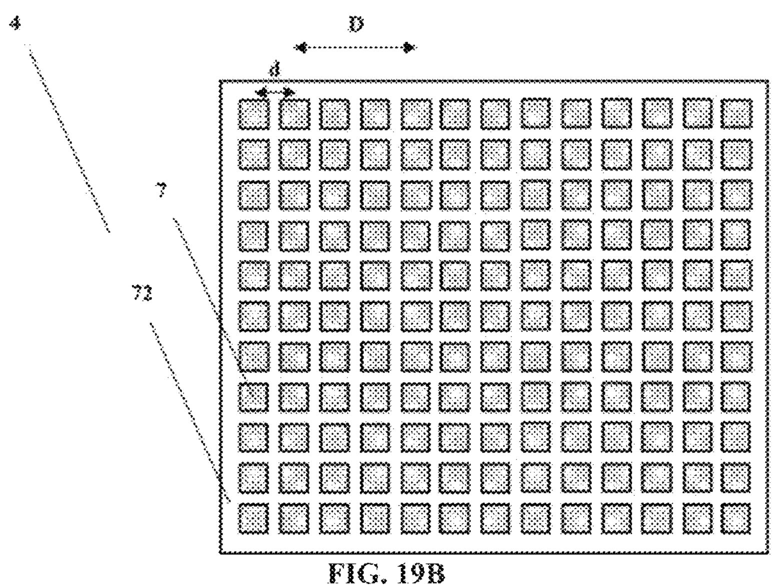
Figure 20A:
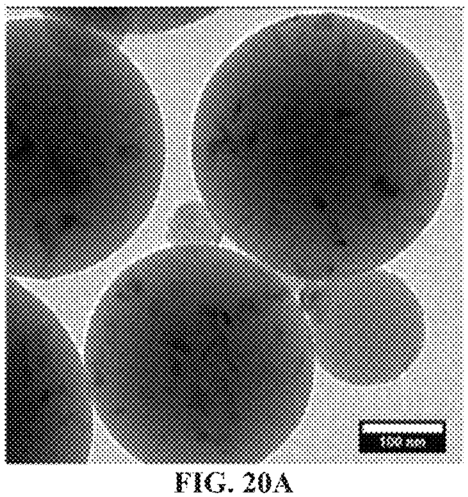
FIG. 20A is TEM images showing CdSe/CdZnS nanoplatelets (dark contrast) uniformly dispersed in $SiO_2$ (bright contrast—@$SiO_2$).
Figure 20B:
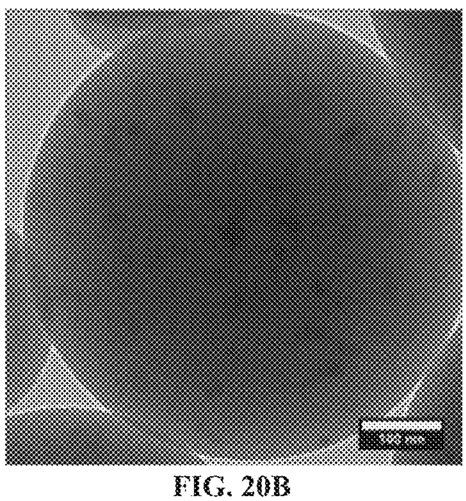
FIG. 20B is TEM images showing CdSe/CdZnS nanoplatelets (dark contrast) uniformly dispersed in $SiO_2$ (bright contrast—@$SiO_2$).
Figure 20C:
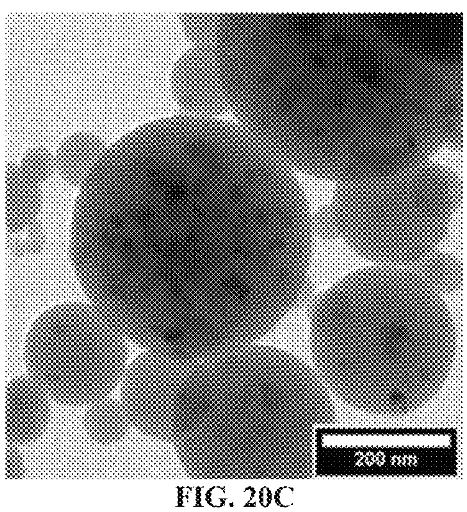
FIG. 20C is TEM images showing CdSe/CdZnS nanoplatelets (dark contrast) uniformly dispersed in $Al_2O_3$ (bright contrast—@$Al_2O_3$).

FIG. 20 A-B show TEM images of the resulting particles.

Figure 21A:
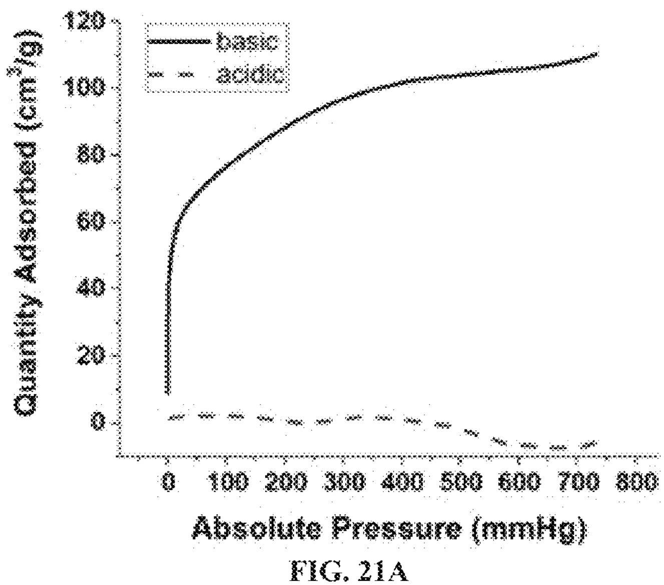
FIG. 21A shows the $N_2$ adsorption isotherm of composite particles 1 CdSe/CdZnS @$SiO_2$ prepared from a basic aqueous solution and from an acidic solution.
Figure 21B:
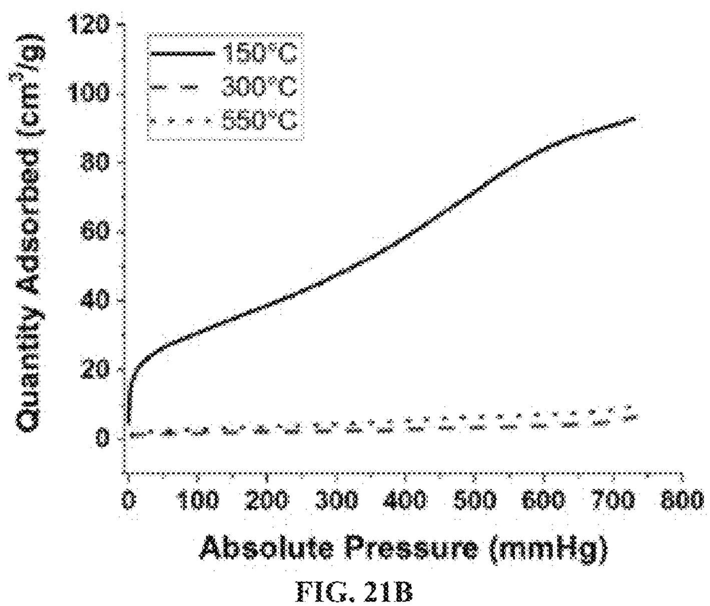
FIG. 21B shows the $N_2$ adsorption isotherm of composite particles 1 CdSe/CdZnS @$Al_2O_3$ obtained by heating droplets at 150° C., 300° C. and 550° C.

FIG. 21 A shows the $N_2$ adsorption isotherm of the resulting particles. Said resulting particles are porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 5: Composite Particles Preparation from an Acidic Aqueous Solution—CdSe/CdZnS@$SiO_2$ 100 μL of CdSe/CdZnS nanoplatelets suspended in an acidic aqueous solution were mixed with an acidic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

FIG. 21 A shows the $N_2$ adsorption isotherm of the resulting particles. Said resulting particles are not porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 6: Composite Particles Preparation from a Basic Aqueous Solution with Hetero-Elements —CdSe/CdZnS@$Si_xCd_yZn_zO_w$ 100 μL of CdSe/CdZnS nanoplatelets suspended in an acidic aqueous solution were mixed with an acidic aqueous solution of TEOS at 0.13M previously hydrolyzed for 24 hours in presence of cadmium acetate at 0.01M and zinc oxide at 0.01M, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 7: Composite Particles Preparation from an Organic Solution and an Aqueous Solution—CdSe/CdZnS @$Al_2O_3$ 100 μL of CdSe/CdZnS nanoplatelets suspended in heptane were mixed with aluminium tri-sec butoxide and 5 mL of pentane, then loaded on a spray-drying set-up. On another side, a basic aqueous solution was prepared and loaded the same spray-drying set-up, but at a different location than the first heptane solution. The two liquids were sprayed simultaneously towards a tube furnace heated at a temperature ranging from the boiling point of the solvent to 1000° C. with a nitrogen flow. The composite particles were collected at the surface of a filter.

FIG. 20 C shows TEM images of the resulting particles.

FIG. 21 B show $N_2$ adsorption isotherms for particles obtained after heating the droplets at 150° C., 300° C. and 550° C. Increasing the heating temperature results in a loss of the porosity. Thus, particles obtained by heating at 150° C. are porous, whereas the particles obtained by heating at 300° C. and 550° C. are not porous.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with ZnTe, $SiO_2$, $TiO_2$, $HfO_2$, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 8: Composite Particles Preparation from an Organic Solution and an Aqueous Solution—InP/ZnS@$Al_2O_3$ 4 mL of InP/ZnS nanoparticles suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

The same procedure was carried out by replacing InP/ZnS nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 9: Composite Particles Preparation from an Organic Solution and an Aqueous Solution—$CH_5N_2$—$PbBr_3$@$Al_2O_3$ 100 μL of $CH_5N_2$—$PbBr_3$ nanoparticles suspended in hexane were mixed with aluminium tri-sec butoxide and 5 mL of hexane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 10: Composite Particles Preparation from an Organic Solution and an Aqueous Solution—CdSe/CdZnS—Au@$SiO_2$ On one side, 100 μL of gold nanoparticles and 100 μL of CdSe/CdZnS nanoplatelets suspended in an acidic aqueous solution were mixed with an acidic aqueous solution of TEOS at 0.13M previously hydrolyzed for 24 hours, then loaded in a spray-drying set-up. The supension was sprayed towards a tube furnace heated at a temperature ranging from the boiling point of the solvent to 1000° C. with a nitrogen flow. The composite particles were collected at the surface of a GaN substrate. The GaN substrate with the deposited composite particles was then cut into pieces of 1 mm×1 mm and electric aly connected to get a LED emitting a mixture of the blue light and the light emitted by the fluorescent nanoparticles.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ with $Al_2O_3$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 11: Composite Particles Preparation from an Organic Solution and an Aqueous Solution—$Fe_3O_4$@$Al_2O_3$—CdSe/CdZnS@$SiO_2$ On one side, 100 μL of $Fe_3O_4$ nanoparticles suspended in an acidic aqueous solution were mixed with an acidic aqueous solution of TEOS at 0.13M previously hydrolyzed for 24 hours. On another side, 100 μL of CdSe/CdZnS nanoplatelets suspended in heptane were mixed with aluminium tri-sec butoxide and 5 mL of heptane, then loaded on the same spray-drying set-up, but at a different location than the first aqueous solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter. The composite particles comprise a core of silica containing $Fe_3O_4$ nanoparticles and a shell of alumina containing CdSe/CdZnS nanoplatelets.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ and/or $SiO_2$ with $SiO_2$, $TiO_2$, $Al_2O_3$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2O_3$ and/or $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 12: Composite Particles Preparation from an Organic Solution and an Aqueous Solution—CdS/ZnS Nanoplatelets@$Al_2O_3$ 4 mL of CdS/ZnS nanoplatelets suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

The same procedure was carried out by replacing CdS/ZnS nanoplatelets with CdSe, CdS, CdTe, CdSe/CdS, CdSe/ZnS, CdSe/CdZnS, CdS/CdZnS, CdTe/ZnS, CdSe/CdZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with $SiO_2$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $Al_2\mathbf{0}_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 13: Composite Particles Preparation from an Organic Solution and an Aqueous Solution—InP/ZnS@$SiO_2$ 4 mL of InP/ZnS nanoparticles suspended in an acidic aqueous solution were mixed with an acidic aqueous solution of TEOS at 0.13M previously hydrolyzed for 24 hours, then loaded in a spray-drying set-up. The suspension was sprayed for forming droplets towards a tube furnace heated a temperature ranging from the boiling point of the solvent to 1000° C. with a nitrogen flow. The composite particles were collected at the surface of a filter.

The same procedure was carried out by replacing InP/ZnS nanoparticles with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, CdSe/CdZnS, InP/CdS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $SiO_2$ with $Al_2O_3$, $TiO_2$, $HfO_2$, ZnTe, ZnSe, ZnO, ZnS or MgO, or a mixture thereof. Reaction temperature of the above procedure is adapted according to the inorganic material chosen.

The same procedure was carried out by replacing $SiO_2$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 14: Particles Preparation from an Organic Solution and an Aqueous Solution, Followed by a Treatment of Ammonia Vapors—CdSe/CdZnS@ZnO 100 μL of CdSe/CdZnS nanoplatelets suspended in heptane were mixed with zinc methoxyethoxide and 5 mL of pentane, then loaded on a spray-drying set-up as described in the invention. On another side, a basic aqueous solution was prepared and loaded on the same spray-drying set-up, but at a different location than the first heptane solution. On another side, an ammonium hydroxide solution was loaded on the same spray-drying system, between the tube furnace and the filter. The two first liquids were sprayed while the third one was heated at 35° C. by an external heating system to produce ammonia vapors, simultaneously towards a tube furnace heated at a temperature ranging from the boiling point of the solvent to 1000° C. with a nitrogen flow. The particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/

ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnO with $SiO_2$, $TiO_2$, $HfO_2$, $Al_2O_3$, ZnTe, ZnSe, ZnS or MgO, or a mixture thereof. Reaction temperature of the above procedure is adapted according to the inorganic material chosen.

The same procedure was carried out by replacing ZnO with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof. Reaction temperature of the above procedure is adapted according to the inorganic material chosen.

Example 15: Particles Preparation from an Organic Solution and an Aqueous Solution, Followed by an Extra Shell Coating—CdSe/CdZnS@$Al_2O_3$@MgO 100 μL of CdSe/CdZnS nanoplatelets suspended in heptane were mixed with zinc methoxyethoxide and 5 mL of pentane, then loaded on a spray-drying set-up as described in the invention. On another side, a basic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The particles were directed towards a tube where an extra MgO shell was coated at the surface of the particles by an ALD process, said particles being suspended in the gas. The particles were finally collected on the inner wall of the tube where the ALD was performed.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 16: Particles Preparation from an Organic Solution and an Aqueous Solution—CdSe/CdZnS—$Fe_3O_4$@$SiO_2$ On one side, 100 μL of $Fe_3O_4$ nanoparticles and 100 μL of CdSe/CdZnS nanoplatelets suspended in an acidic aqueous solution were mixed with an acidic aqueous solution of TEOS at 0.13M previously hydrolyzed for 24 hours, then loaded in a spray-drying set-up as described in the invention. On another side, an acidic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 17:Core/Shell Particles Preparation from an Organic Solution and an Aqueous Solution—Au@$Al_2O_3$ in the Core and CdSe/CdZnS@$SiO_2$ in the Shell On one side, 100 μL of CdSe/CdZnS nanoplatelets suspended in an acidic aqueous solution were mixed with an acidic aqueous solution of TEOS at 0.13M previously hydrolyzed for 24 hours, then loaded on a spray-drying set-up as described in the invention. On another side, 100 μL of Au nanoparticles suspended in heptane were mixed with aluminium tri-sec butoxide and 5 mL of heptane, then loaded on the same spray-drying set-up, but at a different location than the first aqueous solution. The two liquids were sprayed simultaneously towards a tube furnace heated at a temperature ranging from the boiling point of the solvent to 1000° C. with a nitrogen flow. The particles were collected at the surface of a filter. The particles comprise a core of alumina containing gold nanoparticles and a shell of silica containing CdSe/CdZnS nanoplatelets.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 18: Composite Particles Preparation—Phosphor Nanoparticles@$SiO_2$

Phosphor nanoparticles were suspended in a basic aqueous solution were mixed with a basic aqueous solution of TEOS at 0.13M previously hydrolyzed for 24 hours, then loaded on a spray-drying set-up. The liquid mixture was sprayed towards a tube furnace heated at a temperature ranging from the boiling point of the solvent to 1000° C. with a nitrogen flow. The composite particles were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, $((Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluoro silic ate).

Example 19: Composite Particles Preparation—Phosphor Nanoparticles @$Al_2O_3$ Phosphor nanoparticles were suspended in heptane were mixed with aluminium tri-sec butoxide and 400 mL of heptane, then loaded in a spray-drying set-up. On another side, an acidic aqueous solution was prepared and loaded in the same spray-drying set-up, but at a different location than the first hexane solution. The two liquids were sprayed simultaneously with two different means for forming droplets towards a tube furnace heated at a temperature ranging from the boiling point of the solvent to 1000° C. with a nitrogen flow. The composite particles were collected at the surface of a filter.

Phosphor nanoparticles used for this example were: Yttrium aluminium garnet nanoparticles (YAG, $Y_3Al_5O_{12}$), (Ca,Y)-α-SiAlON:Eu nanoparticles, $((Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 20: Composite Particles Preparation—CdSe/CdZnS@$HfO_2$

100 μL of CdSe/CdZnS nanoplatelets suspended in heptane (10 mg/mL) were mixed with Hafnium n-butoxide and 5 mL of pentane, then loaded on a spray-drying set-up. On another side, a basic aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. Composite particles were collected at the surface of a filter.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

Example 21: Composite Particles Preparation—Phosphor Nanoparticles @$HfO_2$

1 μm of phosphor nanoparticles (cf. list below) suspended in heptane (10 mg/mL) were mixed with hafnium n-butoxide and 5 mL of pentane, then loaded on a spray-drying set-up. On another side, an aqueous solution was prepared and loaded on the same spray-drying set-up, but at a different location than the first heptane solution. The two liquids were sprayed simultaneously towards a tube furnace heated at a temperature ranging from the boiling point of the solvent to 1000° C. with a nitrogen flow. The resulting particles phosphors particles@$HfO_2$ were collected at the surface of a filter.

Phosphor nanoparticles used for this example were: Yttrium aluminium garnet nanoparticles (YAG, $Y_3Al_5O_{12}$), (Ca,Y)-a-SiAlON:Eu nanoparticles, $((Y,Gd)_3(Al,Ga)_5O_{12}$:Ce) nanoparticles, $CaAlSiN_3$:Eu nanoparticles, sulfide-based phosphor nanoparticles, PFS:$Mn^{4+}$ nanoparticles (potassium fluorosilicate).

Example 22: Composite Particles Preparation from an Organometallic Precursor 100 μL of CdSe/CdZnS nanoplatelets suspended in heptane were mixed with an organometallic precursor selected in the group below in pentane under controlled atmosphere, then loaded on a spray-drying set-up. On another side, an aqueous solution was prepared and loaded on the same spray-drying set-up, but at a different location than the first heptane solution. The two liquids were sprayed simultaneously towards a tube furnace heated from room temperature to 300° C. with a nitrogen flow. The composite particles were collected at the surface of a filter.

The procedure was carried out with an organometallic precursor selected in the group comprising: $Al[N(SiMe_3)_2]_3$, trimethyl aluminium, triisobutylaluminum, trioctylaluminum, triphenylaluminum, dimethyl aluminium, trimethyl zinc, dimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), $Hf[C_5H_4(CH_3)]_2(CH_3)_2$, $HfCH_3(OCH_3)[C_5H_4(CH_3)]_2$, $[[(CH_3)_3Si]_2N]_2HfCl_2$, $(C_5H_5)_2Hf(CH_3)_2$, $[(CH_2CH_3)_2N]_4Hf$, $[(CH_3)_2N]_4Hf$, $[(CH_3)_2N]_4Hf$, $[(CH_3)(C_2H_5)N]_4Hf$, $[(CH_3)(C_2H_5)N]_4Hf$, 2,2',6,6'-tetramethyl-3,5-heptanedione zirconium ($Zr(THD)_4$), $C_{10}H_{12}Zr$, $Zr(CH_3C_5H_4)_2CH_3OCH_3$, $C_{22}H_{36}Zr$, $[(C_2H_5)_2N]_4Zr$, $[(CH_3)_2N]_4Zr$, $[(CH_3)_2N]_4Zr$, $Zr(NCH_3C_2H_5)_4$, $Zr(NCH_3C_2H_5)_4$, $C_{18}H_{32}O_6Zr$, $Zr(C_8H_{15}O_2)_4$, $Zr(OCC(CH_3)_3CHCOC(CH_3)_3)_4$, $Mg(C_5H_5)_2$, or $C_{20}H_{30}Mg$, or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing $Al_2O_3$ with ZnO, $TiO_2$, MgO, $HfO_2$ or $ZrO_2$. The same procedure was carried out by replacing $Al_2O_3$ with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing the aqueous solution with another liquid or vapor source of oxidation.

Example 23: Composite Particles Preparation from an Organometallic Precursor—CdSe/CdZnS@ZnTe 100 μL of CdSe/CdZnS nanoplatelets suspended in heptane were mixed with two organometallic precursors selected in the group below in pentane under inert atmosphere then loaded on a spray-drying set-up. The suspension was sprayed towards a tube furnace heated from RT to 300° C. with a nitrogen flow. The composite particles were collected at the surface of a filter.

The procedure was carried out by with a first organometallic precursor selected in the group comprising: dimethyl telluride, diethyl telluride, diisopropyl telluride, di-t-butyl telluride, diallyl telluride, methyl allyl telluride, or dimethyl sulfur, or a mixture thereof. Reaction temperature of the above procedure is adapted according to the organometallic precursor chosen.

The procedure was carried out by with a second organometallic precursor selected in the group comprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, or $Zn(TMHD)_2$ (β-diketonate), or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnTe with ZnS or ZnSe, or a mixture thereof.

The same procedure was carried out by replacing ZnTe with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

Example 24: Composite Particles Preparation from an Organometallic Precursor—CdSe/CdZnS@ZnS 100 μL of CdSe/CdZnS nanoplatelets suspended in heptane were mixed with an organometallic precursor selected in the group below in pentane under inert atmosphere, then loaded on a spray-drying set-up. On another side, a vapor source of $H_2S$ was inserted in the same spray-drying set-up. The suspension was sprayed towards a tube furnace heated from RT to 300° C. with a nitrogen flow. The composite particles were collected at the surface of a filter.

The procedure was carried out with an organometallic precursor selected in the group omprising: dimethyl zinc, trimethyl zinc, diethylzinc, $Zn[(N(TMS)_2]_2$, $Zn[(CF_3SO_2)_2N]_2$, $Zn(Ph)_2$, $Zn(C_6F_5)_2$, $Zn(TMHD)_2$ (β-diketonate), or a mixture thereof. Reaction temperature of the above procedure is adapted according to the organometallic precursor chosen.

The same procedure was carried out by replacing CdSe/CdZnS nanoplatelets with CdSe, CdS, CdTe, CdSe/CdS, CdSe/ZnS, CdSe/CdZnS, CdS/ZnS, CdS/CdZnS, CdTe/ZnS, CdTe/CdZnS, CdSeS/ZnS, CdSeS/CdS, CdSeS/CdZnS, $CuInS_2$/ZnS, $CuInSe_2$/ZnS, InP/CdS, InP/ZnS, InZnP/ZnS, InP/ZnSeS, InP/ZnSe, InP/CdZnS, CdSe/CdZnS/ZnS, CdSe/ZnS/CdZnS, CdSe/CdS/ZnS, CdSe/CdS/CdZnS, CdSe/ZnSe/ZnS, CdSeS/CdS/ZnS, CdSeS/CdS/CdZnS, CdSeS/CdZnS/ZnS, CdSeS/ZnSe/ZnS, CdSeS/ZnSe/CdZnS, CdSeS/ZnS/CdZnS, CdSe/ZnS/CdS, CdSeS/ZnS/CdS, CdSe/ZnSe/CdZnS, InP/ZnSe/ZnS, InP/CdS/ZnSe/ZnS, InP/CdS/ZnS, InP/ZnS/CdS, InP/GaP/ZnS, InP/GaP/ZnSe, InP/CdZnS/ZnS, InP/ZnS/CdZnS, InP/CdS/CdZnS, InP/ZnSe/CdZnS, InP/ZnS/ZnSe, InP/GaP/ZnSe/ZnS, InP/ZnS/ZnSe/ZnS, nanoplatelets or quantum dots, or a mixture thereof.

The same procedure was carried out by replacing CdSe/CdZnS nanoplatelets with organic nanoparticles, inorganic nanoparticles such as metal nanoparticles, halide nanoparticles, chalcogenide nanoparticles, phosphide nanoparticles, sulfide nanoparticles, metalloid nanoparticles, metallic alloy nanoparticles, phosphor nanoparticles, perovskite nanoparticles, ceramic nanoparticles such as for example oxide nanoparticles, carbide nanoparticles, nitride nanoparticles, or a mixture thereof.

The same procedure was carried out by replacing ZnS with ZnSe or ZnTe, or a mixture thereof.

The same procedure was carried out by replacing ZnS with a metal material, halide material, chalcogenide material, phosphide material, sulfide material, metalloid material, metallic alloy material, ceramic material such as for example oxide, carbide, nitride, glass, enamel, ceramic, stone, precious stone, pigment, cement and/or inorganic polymer, or a mixture thereof.

The same procedure was carried out by replacing $H_2S$ with $H_2Se$, $H_2Te$ or other gas.

Example 25: Color Conversion Layer Preparation

Blue emitting composite particles comprising core-shell CdS/ZnS nanoplatelets encapsulated in $Al_2O_3$, green emitting composite particles comprising core-shell CdSeS/CdZnS nanoplatelets encapsulated in $Al_2O_3$, and red emitting composite particles comprising core-shell CdSe/CdZnS nanoplatelets encapsulated in $Al_2O_3$ were dispersed and mixed together in a zinc oxide matrix and drop-casted onto a UV LED. The UV LED coated by the composite particles was then annealed at 200° C. for 1 hour before it was introduced in the display apparatus described in the invention. The resulting light was polychromatic with a mixture of blue, green and red when illuminated with the UV light from the LED source.

The same procedure was carried out by replacing ZnO with a resin, silicone, PMMA, MgO, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 26: Color Conversion Layer Preparation

Green emitting core-shell CdSeS/CdZnS nanoplatelets and red emitting core-shell CdSe/CdZnS nanoplatelets were dispersed and mixed together in silicone and deposited onto a substrate. The substrate was then annealed at 180° C. for 2 hours before it was introduced in the display apparatus described in the invention. The resulting light was polychromatic with a mixture of blue, green and red when illuminated with the light source.

The same procedure was carried out by replacing silicone with a resin, ZnO, PMMA, MgO, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 27: Color Conversion Layer Preparation

Green emitting composite partricles comprising core-shell CdSeS/CdZnS nanoplatelets encapsulated in $Al_2O_3$ and red emitting composite particles comprising core-shell CdSe/CdZnS nanoplatelets encapsulated in $Al_2O_3$ were dispersed and mixed together in silicone and drop-casted onto a blue LED. The blue LED was then annealed at 180° C. for 2 hours before it was introduced in the display apparatus described in the invention. The resulting light was polychromatic with a mixture of blue, green and red when illuminated with the blue light from the LED source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 28: Color Conversion Layer Preparation

Green emitting composite partricles comprising core-shell CdSeS/CdZnS nanoplatelets encapsulated in $Al_2O_3$ and red emitting composite particles comprising core-shell CdSe/CdZnS nanoplatelets encapsulated in $Al_2O_3$ were dispersed and mixed together in a magnesium oxide matrix and drop-casted onto a blue LED. The blue LED was then annealed at 200° C. for 1 hour before it was introduced in the display apparatus described in the invention. The resulting light was polychromatic with a mixture of blue, green and red when illuminated with the blue light from the LED source.

The same procedure was carried out by replacing MgO with silicone, a resin, ZnO, PMMA, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 29: Color Conversion Layer Preparation

Green and red emitting composite partricles comprising a core with green emitting core-shell CdSeS/CdZnS nanoplatelets encapsulated in $Al_2O_3$ and a shell with red emitting core-shell CdSe/CdZnS nanoplatelets encapsulated in $Al_2O_3$, were dispersed in a magnesium oxide matrix and drop-casted onto a blue LED. The blue LED was then annealed at 180° C. for 2 hours before it was introduced in the display apparatus described in the invention. The resulting light was polychromatic with a mixture of blue, green and red when illuminated with the blue light from the LED source.

The same procedure was carried out by replacing MgO with silicone, a resin, ZnO, PMMA, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 30: Color Conversion Layer Preparation

Green emitting composite partricles comprising a core with gold nanoparticles encapsulated in $SiO_2$ and a shell with core-shell CdSeS/CdZnS nanoplatelets encapsulated in $Al_2O_3$, and red emitting composite particles comprising core-shell CdSe/CdZnS nanoplatelets encapsulated in $Al_2O_3$ were dispersed and mixed together in silicone and drop-casted onto a blue LED. The blue LED was then annealed at 180° C. for 2 hours before it was introduced in the display apparatus described in the invention. The resulting light was polychromatic with a mixture of blue, green and red when illuminated with the blue light from the LED source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 31:Color Conversion Layer Preparation

Green emitting composite partricles comprising core-shell InP/ZnS quantum dots encapsulated in $SiO_2$, and red emitting composite particles comprising core-shell InP/ZnSe/ZnS quantum dots encapsulated in $SiO_2$ were dispersed and mixed together in silicone and drop-casted onto a blue LED. The blue LED was then annealed at 180° C. for 2 hours before it was introduced in the display apparatus described in the invention. The resulting light was polychromatic with a mixture of blue, green and red when illuminated with the blue light from the LED source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 32: Color Conversion Layer Preparation

Green emitting composite partricles comprising core-shell InP/ZnS nanoplatelets encapsulated in $Al_2O_3$, and red emitting composite particles comprising core-shell InP/ZnSe/ZnS nanoplatelets encapsulated in $Al_2O_3$ were dispersed and mixed together in silicone and drop-casted onto a blue LED. The blue LED was then annealed at 180° C. for 3 hours before it was introduced in the display apparatus described in the invention. The resulting lights were green and red depending on the composite particles illuminated with the blue light from the LED source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

Example 33:Color Conversion Layer Preparation

Green emitting composite partricles comprising core-shell CdSeS/CdZnS nanoplatelets encapsulated in $Al_2O_3$ and red emitting composite particles comprising core-shell CdSe/CdZnS nanoplatelets encapsulated in $Al_2O_3$ were dispersed separately in a MgO matrix and deposited onto a blue LED, such that each film of composite particles was around 1-10 μm in thickness. The blue LED was then annealed at 180° C. for 2 hours before it was introduced in the display apparatus described in the invention. The resulting lights were green and red depending on the composite particles illuminated with the blue light from a light source.

The same procedure was carried out by replacing silicone with a resin, ZnO, MgO, PMMA, Polystyrene, $Al_2O_3$, $TiO_2$, $HfO_2$ or $ZrO_2$, or a mixture thereof.

The same procedure was carried out with composite particles prepared in the examples hereabove.

The same procedure was carried out using inkjet printing; or traditional lithography: the entire surface was coated with blue emitting composite particles, followed by the subtractive photolithography patterning process. The process is then repeated for the red emitting composite particles and for the green emitting composite particles.

REFERENCES

1—Composite particle

11—Core of composite particle

12—Shell of composite particle
2—Inorganic material
21—Inorganic material
3—Nanoparticle
31—Spherical nanoparticle
32—2D nanoparticle
33—Core of a nanoparticle
34—Shell of a nanoparticle
35—Shell of a nanoparticle
36—Insulator shell of a nanoparticle
37—Crown of a nanoparticle
4—Color conversion layer
5—Light source
6—Glass substrate
7—Light emitting material
71—Surrounding medium
72—Surrounding medium
8—Display apparatus
9—Layer of liquid crystal material
10—Polarizer
11—Light guide
12—Active matrix
13—Space
15—Illumination source
16—Reflector
17—Substrate
18—Color Filter
D—Pixel pitch
d—Sub-pixel pitch
G—Green secondary light
R—Red secondary light

The invention claimed is:

1. An illumination source (15) comprising at least one light source (5) and at least one color conversion layer (4) comprising at least one light emitting material (7) comprising at least one composite particle (1) surrounded partially or totally by at least one surrounding medium (71); wherein said light emitting material (7) is configured to emit a secondary light in response to an excitation and the at least one composite particle (1) comprises a plurality of nanoparticles (3) encapsulated in an inorganic material (2); and said inorganic material (2) has a difference of refractive index compared to the at least one surrounding medium (71) superior or equal to 0.02 at 450 nm; and wherein the nanoparticles (3) comprise at least 1% of semiconductor nanoplatelets.

2. The illumination source (15) according to claim 1, further comprising a light guide (11), wherein the at least one color conversion layer (4) is located between the light source (5) and said light guide (11).

3. The illumination source (15) according to claim 1, further comprising a reflector (16) configured to reflect the light from the light source (5) and/or from the at least one color conversion layer (4).

4. The illumination source (15) according to claim 1, wherein the light source (5) comprises at least one light-emitting diode (LED) or an array of LEDs.

5. A display apparatus (8) comprising an illumination source (15) comprising at least one light source (5) and at least one color conversion layer (4) comprising at least one light emitting material (7) comprising at least one composite particle (1) surrounded partially or totally by at least one surrounding medium (71); wherein said light emitting material (7) is configured to emit a secondary light in response to an excitation and the at least one composite particle (1) comprises a plurality of nanoparticles (3) encapsulated in an inorganic material (2); and said inorganic material (2) has a difference of refractive index compared to the at least one surrounding medium (71) superior or equal to 0.02 at 450 nm; and wherein the nanoparticles (3) comprise at least 1% of semiconductor nanoplatelets.

6. The display apparatus (8) according to claim 5, wherein the illumination source (15) further comprises a light guide (11), wherein the at least one color conversion layer (4) is located between the light source (5) and said light guide (11).

7. The display apparatus (8) according to claim 5, wherein the illumination source (15) further comprises a reflector (16) configured to reflect the light from the light source (5) and/or from the at least one color conversion layer (4).

8. The display apparatus (8) according to claim 5, wherein the light source (5) comprises at least one light-emitting diode (LED) or an array of LEDs.

9. The display apparatus (8) according to claim 5, further comprising at least one color filter (18).

10. The display apparatus (8) according to claim 9, comprising at least one layer of activation between the illumination source (15) and the at least one color filter (18).

11. The illumination source (15) according to claim 1, wherein the inorganic material (2) limits or prevents the diffusion of outer molecular species or fluids (liquid or gas) into said inorganic material (2).

12. The illumination source (15) according to claim 1, wherein the at least one composite particle (1) in the at least one surrounding medium (71) is configured to scatter light.

13. The illumination source (15) according to claim 1, wherein the nanoparticles (3) comprised in the at least one composite particle (1) are semiconductor nanocrystals comprising a material of formula $M_x N_y E_z A_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

14. The illumination source (15) according to claim 1, wherein the nanoparticles (3) comprised in the at least one composite particle (1) are semiconductor nanocrystals comprising at least one shell (34) comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

15. The illumination source (15) according to claim 1, wherein the nanoparticles (3) comprised in the at least one composite particle (1) are semiconductor nanocrystals comprising at least one crown (37) comprising a material of formula $M_xN_yE_zA_w$, wherein: M is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; N is selected from the group consisting of Zn, Cd, Hg, Cu, Ag, Au, Ni, Pd, Pt, Co, Fe, Ru, Os, Mn, Tc, Re, Cr, Mo, W, V, Nd, Ta, Ti, Zr, Hf, Be, Mg, Ca, Sr, Ba, Al, Ga, In, Tl, Si, Ge, Sn, Pb, As, Sb, Bi, Sc, Y, La, Ce, Pr, Nd, Sm, Eu, Gd, Tb, Dy, Ho, Er, Tm, Yb, Cs or a mixture thereof; E is selected from the group consisting of O, S, Se, Te, C, N, P, As, Sb, F, Cl, Br, I, or a mixture thereof; A is selected from the group consisting of O, S, Se, Te, C, N, P, As, Sb, F, Cl, Br, I, or a mixture thereof; and x, y, z and w are independently a decimal number from 0 to 5; x, y, z and w are not simultaneously equal to 0; x and y are not simultaneously equal to 0; z and w may not be simultaneously equal to 0.

16. The illumination source (15) according to claim 1, wherein the nanoparticles (3) comprised in the at least one composite particle (1) are semiconductor nanoplatelets.

17. The illumination source (15) according to claim 1, wherein the at least one surrounding medium (71) is optically transparent.

18. The illumination source (15) according to claim 1, wherein the at least one surrounding medium (71) has a thermal conductivity at standard conditions of at least 0.1 W/(m·K).

* * * * *